United States Patent [19]

Wiggins, Jr. et al.

[11] 4,331,836

[45] May 25, 1982

[54] SPEECH SYNTHESIS INTEGRATED CIRCUIT DEVICE

[75] Inventors: Richard H. Wiggins, Jr., Dallas; George L. Brantingham, Lubbock, both of Tex.

[73] Assignee: Texas Instruments Incorporated, Dallas, Tex.

[21] Appl. No.: 95,180

[22] Filed: Nov. 16, 1979

Related U.S. Application Data

[60] Division of Ser. No. 901,393, Apr. 28, 1978, Pat. No. 4,209,836, which is a continuation-in-part of Ser. No. 807,461, Jun. 17, 1977, abandoned.

[51] Int. Cl.[3] .......... G10L 1/00

[52] U.S. Cl. .......... 179/1 SM; 179/1 D; 364/724

[58] Field of Search .......... 179/1 SM, 1 SA, 1 D; 364/513, 718, 723, 724, 725; 333/18; 370/86, 109

[56] References Cited

U.S. PATENT DOCUMENTS

| | | | |
|---|---|---|---|
| 3,870,818 | 3/1975 | Barton et al. | 179/1 SM |
| 4,022,974 | 5/1977 | Kohut et al. | 179/1 SM |
| 4,038,495 | 7/1977 | White | 179/1 SA |
| 4,052,563 | 10/1977 | Noda et al. | 179/1 SA |
| 4,060,848 | 11/1977 | Hyatt | 179/1 SA X |

OTHER PUBLICATIONS

Anonymous, "Talking Board Offers Speech Synthesis", Computer Design, Jul. 1976, pp. 46, 48.

M. Sambur et al., "On Reducing the Buzz in LPC Synthesis", J. Ac. Soc. Am., Mar. 1978, pp. 918–924.

*Primary Examiner*—Mark E. Nusbaum

*Attorney, Agent, or Firm*—William E. Hiller; Melvin Sharp; James T. Comfort

[57] ABSTRACT

A system incorporating an integrated circuit device or chip which digitally synthesizes human speech using a linear predictive filter. The linear predictive filter comprises a single filter stage only which contains a single multiplier for selectively multiplying a plurality of coefficients, initiating the multiplication of one coefficient at a time, by using a feedback loop with multiplexing techniques so as to input multiplexed signals to the multiplier—as contrasted to a cascade of filter stages. Thus, the single multiplier of the linear predictive filter is utilized repetitively to provide the calculations required. The system also includes a memory for storage of digital filter coefficients, a controller for selectively accessing the coefficients, and a speaker for generating audible sounds.

29 Claims, 55 Drawing Figures

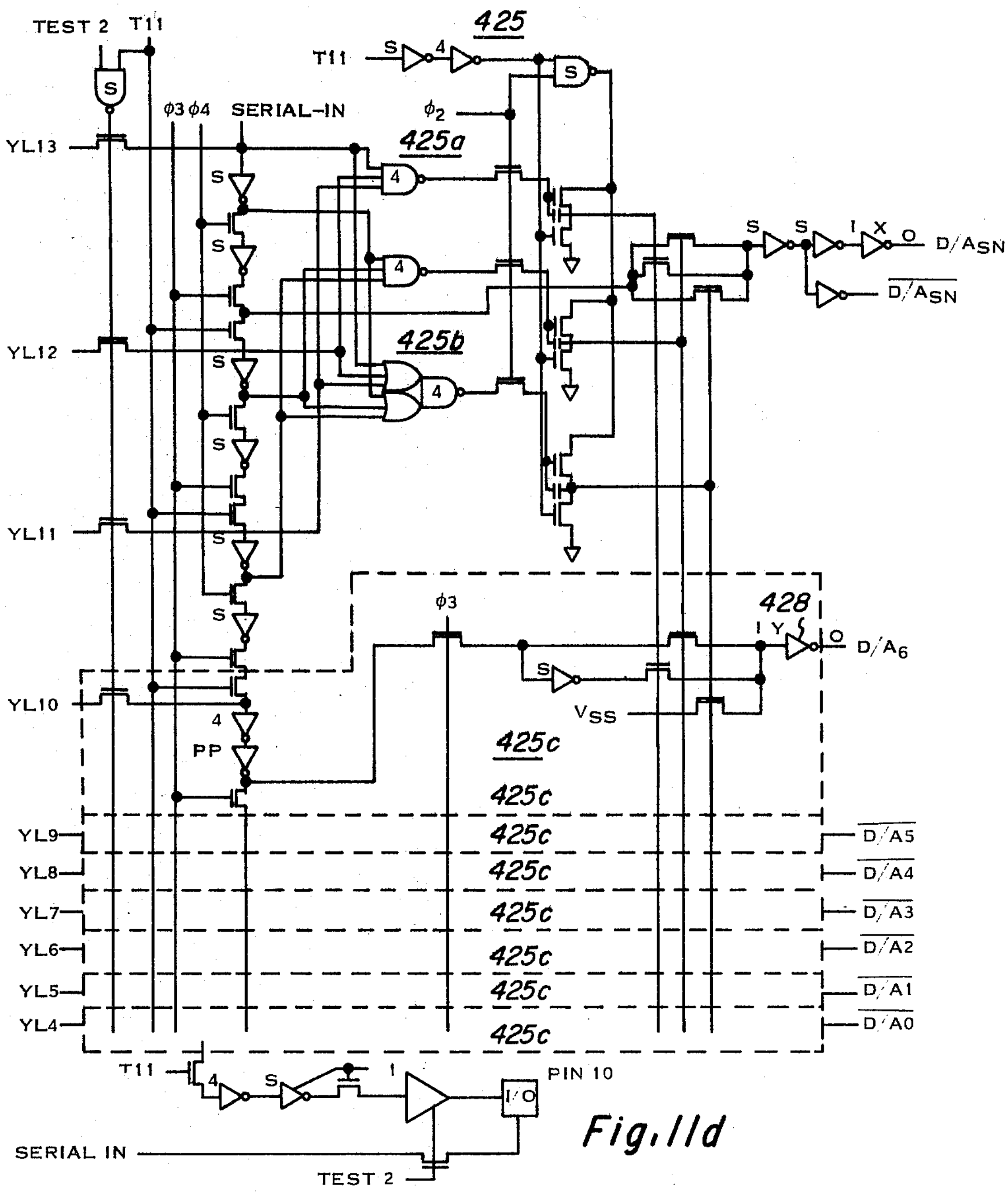
Fig. 11d
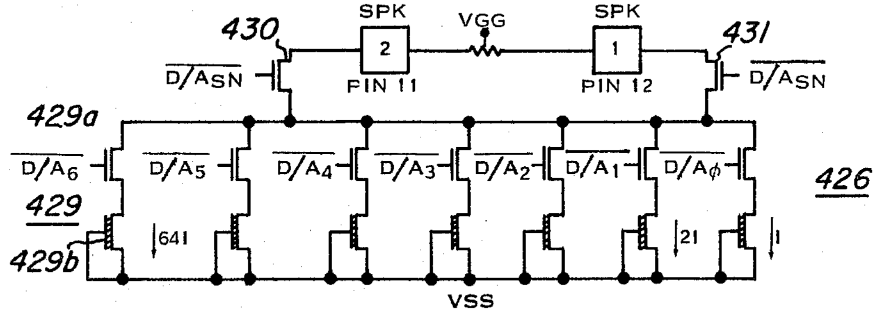

202

ROM ADDRESS BUFFERS 625

SPEECH SYNTHESIS INTEGRATED CIRCUIT DEVICE

This application is a division of U.S. application Ser. No. 901,393 filed Apr. 28, 1978, now U.S. Pat. No. 4,209,836 issued June 24, 1980, which is a continuation-in-part of U.S. application Ser. No. 807,461 filed June 17, 1977, now abandoned.

BACKGROUND OF THE INVENTION

This invention relates to the implementation of a digital speech synthesis system which utilizes a miniature electronic semiconductor device or chip comprising an integrated circuit speech synthesizer for digitally synthesizing human speech.

Several techniques are known in the prior art for digitizing human speech. For example, pulse code modulation, differential pulse code modulation, adaptive predictive coding, delta modulation, channel vocoders, cepstrum vocoders, format vocoders, voice excited vocoders and linear predictive coding techniques of speech digitalization are known. The techniques are briefly explained in "Voice Signals: Bit by Bit" on pages 28–34 of the October 1973 issue of IEEE Spectrum.

In certain applications and particularly those in which the digitized speech is to be stored in a memory, most researchers tend to use the linear predictive coding technique because it produces very high quality speech using rather low data rates. Linear predictive coding systems usually make use of a multi-stage digital filter. In the past, the digital filter has typically been implemented by appropriately programming a large scale digital computer. However, there has been a proposal for implementing a speech synthesis chip which is discussed in "Progress in the Development of Digital Vocoder Employing an Itakura Adaptive Predictor" published in "Telecommunications Conference Records", IEEE publication no. 73 (1973). In U.S. Pat. No. 4,209,844 there is taught a particularly useful digital filter for a speech synthesis circuit, which digital filter may be implemented on an integrated circuit using standard MOS or equivalent technology. A theoretical discussion of linear predictive coding can be found in "Speech Analysis and Synthesis by Linear Prediction of the Speech Wave" at Volume 50, number 2 (part 2) of *The Journal of the Acoustical Society of America.*

Disclosed herein is a talking learning aid which utilizes speech synthesis technology for producing human speech. A complete talking learning aid is disclosed, so, in addition to describing the speech synthesis circuits in detail, the details of the controller for the learning aid and the Read-Only-Memory devices used to store the digitized speech are also disclosed. Of course, those practicing the present invention may wish to practice the invention in conjunction with a talking learning aid, such as that described herein, other learning aids or in any other application wherein the generation of human speech from digital data is desirable. Using the techniques described in the aforementioned U.S. Pat. No. 4,209,844 and the teachings disclosed herein will permit those desiring to make use of digital speech technology to do so with one, or a small number, of relatively inexpensive integrated circuit devices.

This invention relates to a speech synthesis system which includes a small size integrated circuit or chip for digitally synthesizing human speech, as previously mentioned. An object of this invention was to improve speech synthesis technology. Another object was to implement a digital speech synthesis system by employing as a component thereof a speech synthesizer chip on a small size integrated circuit which chip can be produced using conventional fabrication techniques. It was yet another object of this invention to bring digital speech synthesis technology into a price range where the ordinary consumer may take advantage of it.

The foregoing objects are achieved as is now described. The system includes a speech synthesis chip which includes a linear predictive filter, excitation generators, circuits for receiving and analyzing inputted digital data and appropriate timing circuitry, all of which are integrated on a single semiconductor chip. The linear predictive filter comprises only a single filter stage containing a single multiplier for selectively multiplying a plurality of coefficients, initiating the multiplication of one coefficient at a time, by using a feedback loop with multiplexing techniques so as to input multiplexed signals to the multiplier. Thus, the single multiplier of the linear predictive filter is utilized repetitively to provide the calculations required.

BRIEF DESCRIPTION OF THE DRAWINGS

The novel features believed characteristic of the invention are set forth in the appended claims. The invention itself, however, as well as a preferred mode of use, further objects and advantages thereof, will be best understood by reference to the following detailed description of an illustrative embodiment when read in conjunction with the accompanying drawings, wherein:

FIGS. 11*a*–11*d* form a composite logic diagram of the speech synthesizer's lattice filter and excitation generator;

FIGS. 21a–21d form a composite logic diagram of the X and Y address decoders and the array of memory cells;

FIGS. 23a–23c depict embodiments of the voice coil connection.

GENERAL DESCRIPTION

Figure 1:
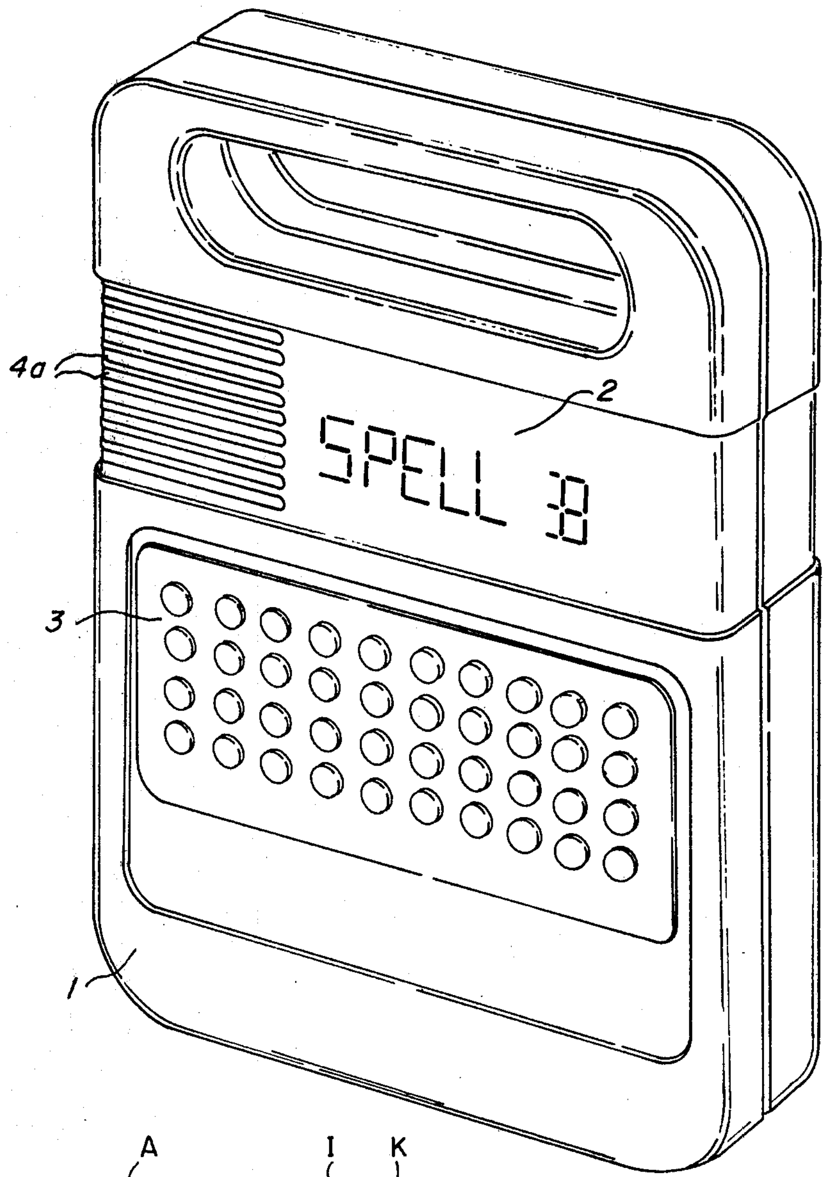
FIG. 1 is a front view of a talking learning aid.

FIG. 1 is a front view of a talking learning aid of the type which may embody the present invention. The learning aid includes a case 1 which encloses electronic circuits preferably implemented on integrated circuits (not shown in this figure). These circuits are coupled to a display 2, a keyboard 3 and a speaker 4 or other voice coil means (also not shown in FIG. 1). However, the openings 4a are shown behind which speaker 4 is preferably mounted. The display is preferably of the vacuum fluorescent type in the embodiment to be described; however, it will be appreciated by those skilled in the art that other display means, such as arrays of light emitting diodes, liquid crystal devices, electrochromic devices, gas discharge devices or other display means alternatively may be used if desired. Also, in this embodiment, as a matter of design choice, the display has eight character positions. The keyboard 3 of the learning aid of this embodiment has forty key switch positions, twenty-six of which are used to input the letters of the alphabet into the learning aid. Of the remaining fourteen key switch positions, five are utilized for mode keys (on/spelling mode, learn mode, word guesser game mode, code breaker mode and random letter mode), another five are used to control functions performed by the learning aid in its modes (enter, say again, replay, erase and go) and the remaining four are used for an apostrophe key, a blank space key, a word list select key and an off key. The words spoken by the learning aid, as well as the correct spelling of those words, are stored as digital information in one or more Read-Only-Memories.

The learning aid depicted in FIG. 1 may be battery powered or powered from a source of external electrical power, as desired. The case is preferably made from two injection molded plastic and the keyboard switches may be provided by two 5 by 8 arrays of key switches of the type disclosed in U.S. Pat. No. 4,005,293, if desired. Of course, other types of case materials or switches alternatively may be used.

Having described the outward appearance of the learning aid, the modes in which the learning aid may operate will be first described followed by a description of the block diagrams and detailed logic diagrams of the various electronic circuits used to implement the learning aid of FIG. 1.

MODES OF OPERATION

The learning aid of this embodiment has five modes of operation which will be subsequently described. It will be evident to those skilled in the art, however, that these modes of operation may be modified, reduced in number or expanded in capability. As a matter of design choice, the present talking and learning aid is provided with the following modes of operation.

The first mode, the spelling mode, is automatically entered when the "on" key is depressed. In the spelling mode the learning aid randomly selects ten words from a selected word list and at a selected difficulty category within the selected word list. The word list may be changed by depressing the "word list select" key which is coupled to a software implemented flip flop circuit which flips each time the "word list select" key is depressed. The word list select flip flop then determines, as will be seen, which pair of read-only-memories from which the ten words will be randomly selected. Each word list preferably includes words arranged in four levels of difficulty. This embodiment of the learning automatically enters the least difficult level of difficulty. The fact that the least difficulty level has been selected is shown by displaying "SPELL A" in display 2. The level difficulty may be increased by depressing the B, C or D keys, and display 2 will show, in response, "SPELL B", "SPELL C" or "SPELL D", respectively. Having selected the word list and level difficulty, the "go" key is depressed upon which the learning aid commences to randomly select ten words and to say the word "spell" followed by the first randomly selected word. A dash, that being segment D in display 2 (FIG. 2), comes up in the left hand most character position. At this time the student may either (1) enter his or her spelling of the word and then depress the "enter" key or (2) depress the "say again" key. The student may also depress the "erase" key if he or she realizes that the spelling being inputted is incorrect before having depressed the "enter" key; the student may then again try to input the correct spelling. The "say again" key causes the word to be spoken by the learning aid again. In some embodiments a subsequent depression of the "say again" key may cause the selected word to be repeated once more, however, then at a slower rate. As the student enters his or her spelling of the word using the alphabet keys at keyboard 3, the inputted spelling appears at display 2 and the shifts from left to right as the letters are inputted. Following the depression the "enter" key, the learning aid compares the student's spelling with a correct spelling, which is stored in one of the Read-Only-Memories, and verbally indicates to the student whether the student spelling was correct or incorrect. The verbal response is also stored as digital information in a Read-Only-Memory. Of course, a visual response may likewise or alternatively be used, if desired. In this embodiment the student is given two opportunities to spell the word correctly and if the student has still failed to correctly spell the word, the learning aid then verbally (via speaker 4) and visually (via display 2) spells the word for the student and goes on to the next word from the group of ten randomly selected words.

At the end the test of the spelling of the ten randomly selected words, the learning aid then verbally and visually indicates the number of right and wrong answers. Further, in order to give the student additional reinforcement, the learning aid preferably givesa audible response which is a function of the correctness of the spellings. In this embodiment the learning aid plays a tune, the number of notes of which is a function of the correctness of the student's spellings for the group of selected words. The use of the "enter", "say again", "erase", and "go" function keys has just been described with reference to the spelling mode of operation. There is an additional function key, "replay", whose function has not yet been described. The "replay" key causes the learning aid to repeat the group of ten randomly selected words after the group has been completed or causes the learning aid to start over with the first word of the group of ten words if it is depressed during the progression through the group. Alternatively, at the end of a group of ten words, the student may depress the "go" which initiates the random selection of another group of ten words from the selected word list.

An exemplary set of spell mode problems is shown in Table I; exemplary key depressions, which a student might make during the exemplary set of problems, are listed along with the responses made by the learning aid at display 2 and speaker 4.

The learn mode is entered by depressing the "learn" key. In the learn mode, after the "go" key is depressed the learning aid randomly selects ten words from the selected word list at the selected difficulty level and then proceeds to display the first randomly selected word at display 2 and approximately one second later to speak "say it". Approximately two seconds thereafter the learning aid proceeds to pronounce the word shown in display 2. During this interval the student is given the opportunity to try to pronounce the word spelled at display 2; the learning aid then goes on to demonstrate how the word should be pronounced. After going through the ten randomly selected words the learning automatically returns to the aforementioned spell mode, but the ten words tested during the spell mode are the ten words previously presented during the learn mode. While in the learn mode the "say again", "erase", "repeat" and "enter" keys are invalid. The difficulty level is selected as in the spelling mode, but in the learn mode the learning aid displays the various levels as "SAY IT A", "SAY IT B", etc. Depressing the "go" key causes the learning aid to select another group of ten words in the learn mode. An exemplary set of learn mode problems are set forth in Table II.

The word guesser mode is entered by depressing the "word guesser" mode key. In the word guesser mode the learning aid randomly selects a word from the selected word list and displays dashes in a number of character positions at display 2, the number of character positions corresponding to the number of letters in the randomly selected word. Thus, if the learning aid randomly selects the word "course" for instance, then the dashes will appear in six of the eight character positions in display 2, starting with the left most position and proceeding to the right for six character positions. The dash is shown in the characters of the display by energizing the Dsegments in those character positions (see FIG. 2). The child may then proceed to enter his or her guesses of the letters in the randomly selected word by depressing the letter keys at keyboard 3. For a correct choice, the learning aid gives an audible response of four tones and shows every place the chosen letter occurs in the randomly selected word. Once letters have been correctly guessed, they remain in the display until the end of the game. For incorrect guesses the learning aid preferably makes no response, but may alternatively say something like "incorrect guess." In this embodiment the child is given six incorrect guesses. Upon the seventh incorrect guess the learning says "I win". On the other hand, if the child correctly guesses all the letters before making seven incorrect guesses the learning aid speaks "you win" and gives an audible response of four tones. Thus in the word guesser mode, the learning aid permits the child to play the traditional spelling game known as "hangman" either by himself or herself or along with other children. Exemplary word guesser problems are set forth in Table III.

The disclosed learning aid has another mode of operation known as "code breaker" which is entered by depressing the "code breaker" mode key. In this mode the child may enter any word of his or her choice and upon depressing the "enter key" the letters in the display are exchanged according to a predetermined code. Thus, in the code breaker mode the learning aid may be used to encode words selected by the child. Further in the code breaker mode the learning aid may be used to decode the encoded words by entering the encoded word and depressing the "enter key".

Another mode with which the learning aid may be provided is the "random letter" mode which is entered by depressing the "random letter" key. In the random letter mode the learning aid automatically displays in response to depression of the "go" key a randomly selected letter of the alphabet in the first character position of display 2. The letters of the alphabet occur in approximate proportion to the frequency of their occurrence in the English language; thus, the more commonly letters are displayed more frequently than uncommonly used letters. If the "go" key is again depressed then another randomly selected letter is displayed in the first character position and the previously selected letter moves right to the second character position and so forth in response to further depressions of the "random letter" key.

Figure 2:
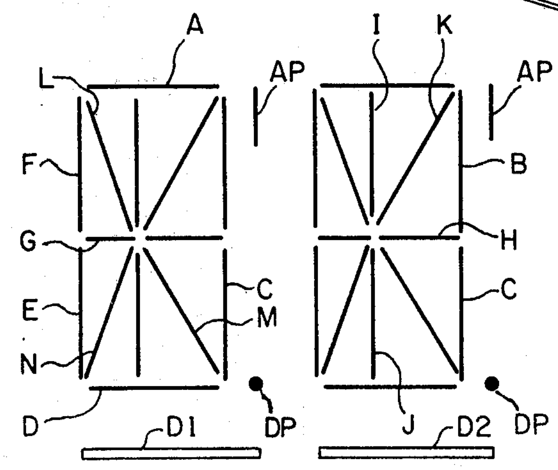
FIG. 2 depicts the segment details of the display.

Referring now to FIG. 2, there is shown a preferred arrangement of the segments of display 2. Display 2 preferably has eight character positions each of which is provided by a sixteen segment character which has fourteen segments arranged somewhat like a "British flag" with an additional two segments for an apostrophe and a decimal point. In FIG. 2, segments A-n are arranged more or less in the shape of the "British flag" while segment AP provides apostrophe and segment DP provides a decimal point. Segment conductors Sa through Sn, Sdp and Sap are respectively coupled to segments A through N, DP and AP in the eight character positions of display 2. Also, for each character position, there is a common electrode, labeled as D1-D8. When display 2 is provided by a vacuum fluorescent display device, the segment electrodes are provided anodes in the vacuum fluorescent display device while each common electrode is preferably provided by a grid associated with each character position. By appropriately multiplexing signals on the segment conductors (Sa-Sn, Sdp and Sap) with signals on the character common electrodes (D1-D8) the display may be caused to show the various letters of the alphabet, a period, and an apostrophe and various numerals. For instance, by appropriately energizing segment conductors A,B,C,E,F,G, and H when character common electrode D1 is appropriately energized the letter A is actuated in the first character position of display 2. Further, by appropriate strobing segment conductors A,B,C,D,H,I and J when character common electrode D2 is appropriately energized, the letter B is caused to be actuated in the second character position of display 2. It should be evident to those skilled in the art that the other letters of the alphabet as well as the apostrophe, period and numerals may be formed by appropriate energization of appropriate segment conductors and common electrodes. In operation, the character common electrodes D1–D8 are sequentially energized with an appropriate voltage potential as selected segment conductors are energized to their appropriate voltage potential to produce a display of characters at display 2. Of course, the segment electrodes could alternatively be sequentially energized as the digit electrodes are selectively energized in producing a display at display 2.

BLOCK DIAGRAM OF THE LEARNING AID

Figure 3:
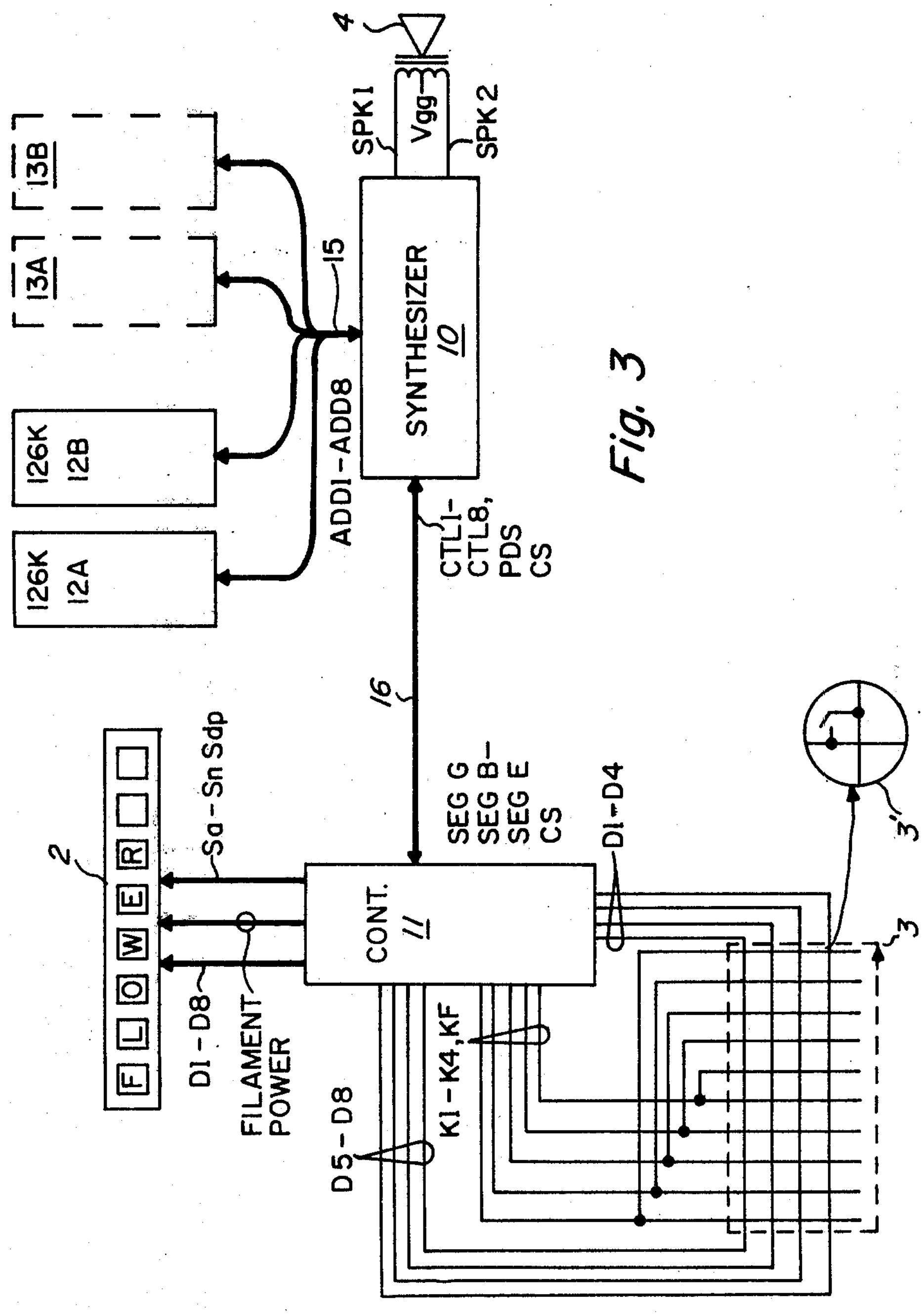
FIG. 3 is a block diagram of the major components preferably making up the learning aid.

FIG. 3 is a block diagram of the major components making up the disclosed embodiment of a speaking learning aid. The electronics of the disclosed learning aid may be divided into three major functional groups, one being a controller 11, another being a speech synthesizer 10, and another being a read-only-memory (ROM) 12. In the embodiment disclosed, these major electronic functional groups are each integrated on separate integrated circuit chips except for the ROM functional group which is integrated onto two integrated circuit chips. Thus, the speech synthesizer 10 is preferably impelemented on a single integrated circuit denoted by the box labeled 10 in FIG. 3 while the controller is integrated on a separate integrated circuit denoted by a box 11 in FIG. 3. The word list for the learning aid is stored in the ROM functional group 12, which stores both the correct spellings of the words as well as frames of digital coding which are converted by speech synthesizer 10 to an electrical signal which drives speaker or other voice coil means 4. In the embodiment disclosed, ROM functional group 12 is preferably provided with 262,144 bits of storage. As a matter of design choice, the 262,144 bits of data are divided between two separate read-only-memory chips, represented in FIG. 3 at numerals 12A and 12B. The memory capacity of ROM functional group 12 is a design choice; however, using the data compression features which are subsequentially discussed with reference to FIG. 6, the 262,144 bits of read-only-memory may be used to store on the order of 250 words of spoken speech and their correct spellings as well as various tones, praise phrases and correction phases spoken by the learning aid.

As is discussed with reference to FIG. 1, the "word list select" key causes the learning aid to select words from another word list. In FIG. 3, the basic word list used with the learning aid is stored in ROMs 12A and 12B along with their spellings and appropriate phraseology which the learning aid speaks during its different modes of operation. The second word list, which may be selected by depressing the "word list select" key, is preferably stored in another pair of ROMs 13A and 13B. In FIG. 3 these are depicted by dashed lines because these read-only-memories are preferably plugged into the learning aid by a person using the system (of course, when children use the system it is preferable that an adult change the read-only-memories since children may not have the required manual dexterity) ratherthan normally packaged with the learning aid. In this manner many different "libraries" of word lists may be made available for use with the learning aid.

Of course, the number of chips on which the learning aid is implemented is a design choice and as large scale integration techniques are improved (using electron beam etching and other techniques), the number of integrated circuit chips may be reduced from four to as few as a single chip.

Synthesizer chip 10 is interconnected with the read-only-memories via data path 15 and is interconnected with controller 11 via data path 16. The controller 11, which may be provided by an appropriately programmed microprocessor type device, preferably actuates display 2 by providing segment information on segment conductors Sa-Sn, Sdp and Sap along with character position information on connectors D1–D8. In the embodiment herein disclosed, controller 11 preferably also provides filament power to display 2 when a vacuum fluorescent device is used therefor. Of course, if a liquid crystal, electrochromic, light emitting diode or gas discharge display were used such filament power would not be required. Controller 11 also scans keyboard 3 for detecting key depressions thereat. Keyboard 3 has forty switch positions which are shown in representative form in FIG. 3, the switch locations occurring where the conductors cross within the dashed line at numeral 3 in FIG. 3. A switch closure causes the conductors shown as crossing in FIG. 3 to be coupled together. At numeral 3' the switch occurring at a crossing of conductors at numeral 3 is shown in detail. In addition to actuating display 2 and sensing key depression at keyboard 3, controller 11 also performs such functions as providing addresses for addressing ROMs 12A and 12B (via synthesizer 10), comparing the correct spellings from ROMs 12A or 12B with spellings input by a student at keyboard 3, and other such functions which will become apparent. Addresses from controller 11 are transmitted to ROMs 12A and 12B by synthesizer 10 because, as will be seen, synthesizer 10 preferably is equipped with buffers capable of addressing a plurality of read-only-memories. Preferably, only one of the pairs of ROMs will output information in response to this addressing because of a chip select signal which is transmitted from synthesizer 10 to all the Read-Only-Memories. Controller 11, in this embodiment, transmits addresses to the ROMs via synthesizer 10 so that only synthesizer 10 output buffers need be sized to transmit addresses to a plurality of ROMs simultaneously. Of course, controller 11 output buffers could also be sized to transmit information to a plurality of read-only-memories simultaneously and thus in certain embodiments it may be desirable to also couple controller 11 directly to the ROMs.

As will be seen, synthesizer chip 10 synthesizes human speech or other sounds according to frames of data stored in ROMs 12A–12B or 13A–13B. The synthesizer 10 employs a digital lattice filter of the type described in U.S. Pat. No. 4,209,844. U.S. Pat. No. 4,209,844 is hereby incorporated herein by reference. As will also be seen, synthesizer 10 also includes a digital to analog (D to A) converter for converting the digital output from the lattice filter to analog signals for driving speaker 4 or other voice coil means with those analog signals. Synthesizer 10 also includes timing, control and data storage and data compression systems which will be subsequently described in detail.

SYNTHESIZER BLOCK DIAGRAM

FIGS. **4*a* and 4*b* form a composite block diagram of the synthesizer 10. Synthesizer 10 is shown as having six major functional blocks, all but one of which are shown in greater detail in block diagram form in FIGS. 4*a* and 4*b*. The six major functional blocks are timing logic 20; ROM-Controller interface logic 21; parameter loading, storage and decoding logic 22; parameter interpolotor 23; filter and excitation generator 24 and D to A and output section 25. Subsequently, these major functional blocks will be described in detail with respect to FIGS. 5, 6, 7*a*–7*d*, 8*a*–8*f*, 9*a*–9*d*, 10*a*–10*c* and 11*a*–11*d***;

Rom/Controller Interface Logic

Referring again to FIGS. 4a and 4b, ROM/Controller interface logic 21 couples synthesizer 10 to read-only-memories 12a and 12b and to controller 11. The control 1–8 (CTL1–CTL8), chip select (CS) and processor data clock (PDC) pins are coupled, in this embodiment, to the controller while the address 1–8 (ADD1–ADD8) and instruction 0-1 (I0-I1) pins are connected to ROMs 12A and 12B (as well as ROMs 13A–13B, if used). ROM/Controller interface logic 21 sends address information from controller 11 to the Read-Only-Memories 12A–12B and preferably returns digital information from the ROMs back to the controller 11; logic 21 also brings data back from the ROMs for use by synthesizer 10 and initiates speech. A Chip Select (CS) signal enables tristate buffers, such as buffers 213, and a three bit command latch 210. A Processor Data Clock (PDC) signal sets latch 210 to hold the data appearing at CTL1–CTL4 pins from the controller. Command latch 210 stores a three bit command from controller 11, which is decoded by command decoder 211. Command decoder 211 is responsive to eight commands which are: speak (SPK) or speak slowly (SPKSLW) for causing the synthesizer to access data from the Read-Only-Memory and speak in response thereto either at a normal rate or at a slow rate; a reset (RST) command for resetting the synthesizer to zero; a test talk (TSTTALK) so that the controller can assertain whether or not the synthesizer is still speaking; a load address (LA) where four bits are received from the controller chip at the CTL1–CTL8 pins and transferred to the ROMs as an address via the ADD1–ADD8 pins and associated buffers 214; a read and branch (RB) command which causes and Read-Only-Memory to take the contents of the present and subsequent address and use that for a branch address; a read (RE) command which causes the Read-Only-Memory to output one bit of data on ADD1, which data shifts into a four bit data input register 212; and an output command which transfers four bits of data in the data input register 212 to controller 11 via buffers 213 and the CTL1–CTL8 pins.Once the synthesizer 10 has commenced speaking in response to a SPK or SPKSLW command it continues speaking until ROM interface logic 21 encounters a RST command or an all ones gate 207 (see FIGS. 8a–8f) detects an "energy equal to fifteen" code and resets talk latch 216 in response thereto. As will be seen, an "energy equal to 15" code is used as the lastframe of data in a plurality of frames of data for generating words, phases or sentences. The LA, RE and RB commands decoded by decoder 211 are re-encoded via ROM control logic 217 and transmitted to the read-only-memories via the instruction (I0-I1) pins.

The processor Data Clock (PDC) signal serves other purposes than just setting latch 210 with the data on CTL1-CTL4. It signals that an address is being transferred via CTL1-CTL8 after an LA or OUTPUT command has been decoded or that the TSTTALK test is to be performed and outputted on pin CTL8. A pair of latches 218a and 218b (FIGS. 8a–8f) associated with decoder 211 disable decoder 211 when the aforementioned LA, TSTTALK and OUTPUT commands have been decoded and a subsequent PDC occurs so that the data then on pins CTL1-CTL8 is not decoded.

A TALK latch 216 is set in response to a decoded SPK or SPKSLW command and is reset: (1) during a power up clear (PUC) which automatically occurs whenever the synthesizer is energized; (2) by a decoded RST command or (3) by an "energy equals fifteen" code in a frame of speech data. The TALKD output is delayed output to permit all speech parameters to be inputed into the synthesizer before speech is attempted. The slow talk latch 215 is set in response to a decoded SPKLSW command and reset in the same manner as latch 216. The SLOWD output is similarly a delayed output to permit all the parameters to be inputted into the synthesizer before speech is attempted.

Parameter Loading, Storage and Decoding Logic

The parameter loading, storage and decoding logic 22 includes a six bit long parameter input register 205 which receives serial data from the read-only-memory via pin ADD1 in response to a RE command outputted to the selected read-only-memory via the instruction pins. A coded parameter random access memory (RAM) 203 and condition decoders and latches 208 are connected to receive the data inputted into the parameter input register 205. As will be seen, each frame of speech data is inputted in three to six bit portions via parameter input register 205 to RAM 203 in a coded format where the frame is temporarily stored. Each of the coded parameters stored in RAM 203 is converted to a ten bit parameter by parameter ROM 202 and temporarily stored in a parameter output register 201.

As will be discussed with respect to FIG. 6, the frames of data may be either wholly or partially inputted into parameter input register 205, depending upon the length of the particular frame being inputted. Condition decoders and latches 208 are responsive to particular portions of the frame of data for setting repeat, pitch equal zero, energy equal zero, old pitch and old energy latches. The function of these latches will be discussed subsequently with respect to FIGS. 8a–8f. The condition decoders and latches 208 as well as various timing signals are used to control various interpolation control gates 209. Gates 209 generate an inhibit signal when interpolation is to be inhibited, a zero parameter signal when the parameter is to be zeroed and a parameter load enable signal which, among other things, permits data in parameter input register 205 to be loaded into the coded parameter RAM 203.

Parameter Interpolator

The parameters in parameter output reigster 201 are applied to the parameter interpolator functional block 23. The inputted K1–K10 speech parameters, including speech energy are stored in a K-stack 302 and E10 loop 304, while the pitch parameter is stored in a pitch register 305. The speech parameters and energy are applied via recoding logic 301 to array multipler 401 in the filter and excitation generator 24. As will be seen, however, when a new parameter is loaded into parameter output register 201 it is not immediately inserted into K-stack 302 or E10 loop 304 or register 305 but rather the corresponding value in K-stack 302, E10 loop 304 or register 305 goes through eight interpolation cycles during which a portion of the difference between the present value in the K-stack 302, E10 loop 304 or register 305 and the target value of that parameter in parameter output register 201 is added to the present value in K-stack 302, E10 loop 304 or register 305.

Essentially the same logic circuits are used to perform the interpolation of pitch, energy and the K1–K10 speech parameters. The target value from the parameter output register 201 is applied along with the present value of the corresponding parameter to a subtractor 308. A selector 307 selects either the present pitch from pitch logic 306 or present energy or K coefficient data from KE10 transfer register 303, according to which parameter is currently in parameter output register 201, and applies the same to subtractor 308 and a delay circuit 309. As will be seen, delay circuit 309 may provide anywhere between zero delay to three bits of delay. The output of delay circuit 309 as well as the output of subtractor 308 is supplied to an adder 310whose output is applied to a delay circuit 311. When the delay associated with delay circuit 309 is zero the target value of the particular parameter in parameter output register 201 is effectively inserted into K-stack 302, E10 loop 304 or pitch register 305, as is appropriate. The delay in delay circuit 311 is three to zero bits, being three bits when the delay in the delay circuit 309 is zero bits, whereby the total delay through selector 307, delay circuits 309 and 311, adder 310 and substractor 308 is constant. By controlling the delays in delay circuits 309 and 311, either all, $\frac{1}{2}$, $\frac{1}{4}$ or $\frac{1}{8}$ of the difference outputted from subtractor 308 (that being the difference between the target value and the present value) is added back into the present value of the parameter. By controlling the delays in the fashion set forth in Table IV, a relatively smooth eight step parameter interpolation is accomplished.

U.S. Pat. No. 4,209,844) discusses with reference to FIG. 7 thereof a speech synthesis filter wherein speech coefficients K1–K9 are stored in the K-stack continuously, until they are updated, while the K10 coefficient and the speech energy (referred to by the letter A in U.S. Pat. No. 4,209,844 ) are periodically exchanged. In parameter interpolator 23, speech coefficients K1–K9 are likewise stored in stack 302, until they are updated, whereas the energy parameter and the K10 coefficient effectively exchange places in K-stack 302 during a twenty time period cycle of operations in the filter and excitation generator 24. To accomplish this function, E10 loop 304 stores both the energy parameter and the $K_{10}$ coefficient and alternately inputs the same into the appropriate location in K-stack 302. KE10 transfer register 303 is either loaded with the K10 or energy parameter from E10 loop 304 or the appropriate K1–K9 speech coefficient from K-stack 302 for interpolation by logics 307–311.

As will be seen, recoding logic 301 preferably performs a Booth's algorithm on the data from K-stack 302, before such data is applied to array multiplier 401. Recoding logic 301 thereby permits the size of the array multipler 401 to be reduced compared to the array multipler described in U.S. Pat. No. 4,209,844.

Filter and Excitation Generator

The filter excitation generator 24 includes the array multiplier 401 whose output is connected to a summer multiplexer 402. The output of summer multiplexer 402 is coupled to the input of summer 404 whose output is coupled to a delay stack 406 and multiplier multiplexer 415. The output of the delay stack 406 is applied as an input to summer multiplexer 402 and to Y latch 403. The output of Y latch 403 is coupled to an input of multiplier multiplexer 415 and is applied as an input to truncation logic 425. The output of multiplier multiplexer 415 is applied as an input to array multiplier 401. As will be seen filter and excitation generator 24 make use of the lattice filter described in U.S. Pat. No. 4,209,844. Various minor interconnections are not shown in FIG. 4*b* for sake of clarity, but which will be described with reference to FIGS. 10*a*–10*c* and 11*a*–11*d*. The arrangement of the foregoing elements generally agrees with the arrangement shown in FIG. 7 of U.S. Pat. No. 4,209,844; thus array multiplier 401 corresponds to element 30', summer multiplexer 402 corresponds to elements 37*b'*, 37*c'* and 37*d'*, gates 414 (FIGS. 11*a* and 11*b*) correspond to element 33', delay stack 406 corresponds to elements 34' and 35', Y latch 403 corresponds to element 36' and multiplier multiplexer 415 corresponds to elements 38*a'*, 38*b'*, 38*c'* and 38*d'*.

The voice excitation data is supplied from unvoiced/-voice gate 408. As will be subsequently described in greater detail, the parameters inserted into parameter input register 205 are supplied in a compressed data format. According to the data compression scheme used, when the coded pitch parameter is equal to zero in input register 205, it is interpreted as an unvoiced condition by condition decoders and latches 208. Gate 408 responds by supplying randomized data from unvoiced generator 407 as the excitation input. When the coded pitch parameter is of some other value, however, it is decoded by parameter ROM 202, loaded into parameter output register 201 and eventually inserted into pitch register 305, either directly or by the interpolation scheme previously described. Based on the period indicated by the number in pitch register 305, voiced excitation is derived from chirp ROM 409. As discussed in U.S. Pat. No. 4,209,844 the voiced excitation signal may be an impulse function or some other repeating function such as a repeating chirp function. In this embodiment, a chirp has been selected as this tends to reduce the "fuzziness" from the speech generated (because it apparently more closely models the action of the vocal cords than does a impulse function) which chirp is repetitively generated by chirp ROM 409. Chirp ROM 409 is addressed by counter latch 410, whose address is incremented in an add one circuit 411. The address in counter latch 410 continues to increment in add one circuit 411, recirculating via reset logic 412 until magnitude comparator 413, which compares the magnitude of the address being outputted from add one circuit 411 and the contents of the pitch register 305, indicates that the value in counter latch 410 then compares with or exceeds the value in pitch register 305, at which time reset logic 412 zeroes the address in counter latch 410. Beginning at address zero and extending through approximately fifty addresses is the chirp function in chirp ROM 409. Counter latch 410 and chirp ROM 409 are set up so that addresses larger than fifty do not cause any portion of the chirp function to be outputted from chirp ROM 409 to UV gate 408. In this manner the chirp function is repetitively generated on a pitch related period during voiced speech.

SYSTEM TIMING

Figure 5:
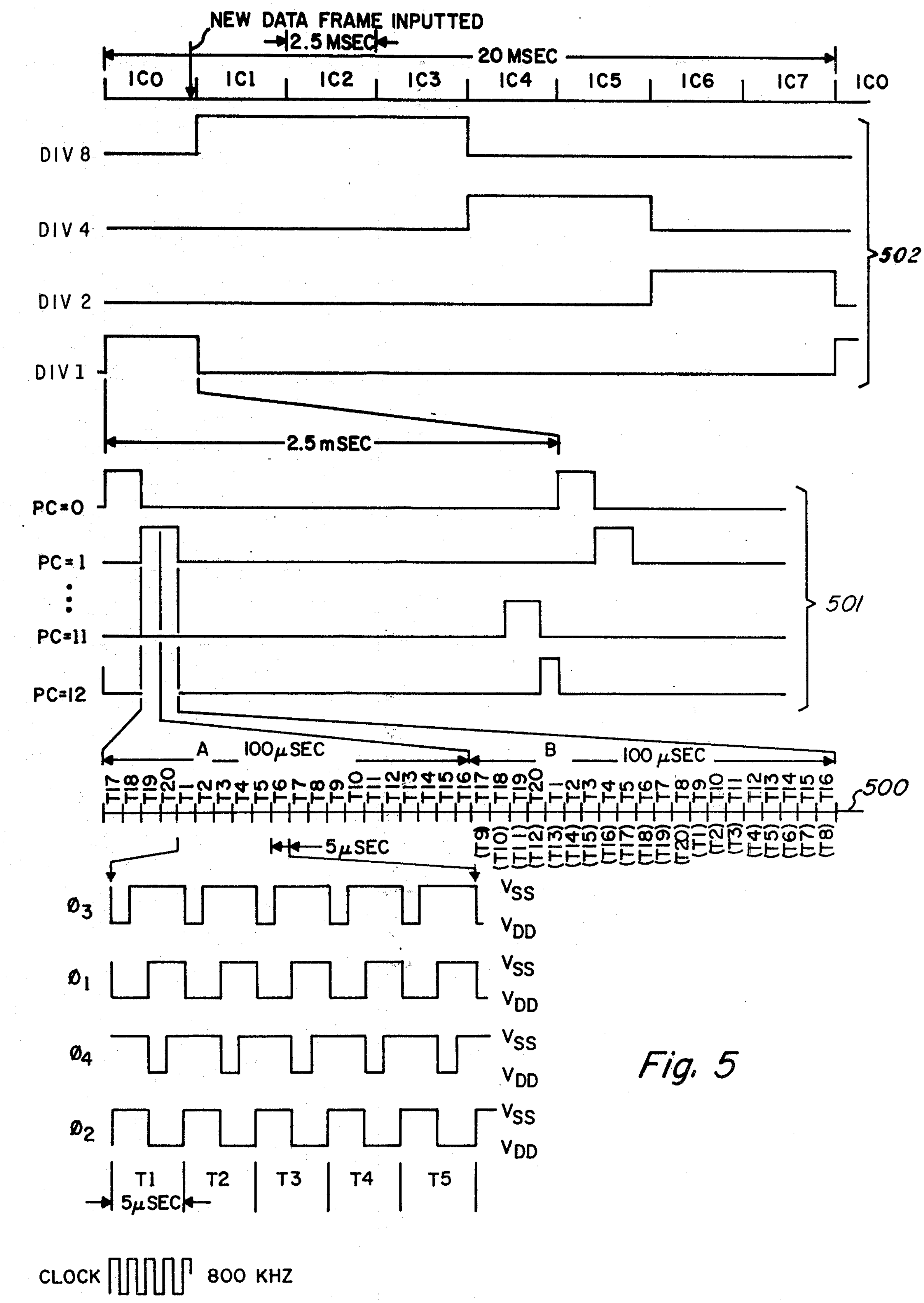
FIG. 5 is a timing diagram of various timing signals preferably used on the synthesizer.

FIG. 5 depicts the timing relationships between the occurrences of the various timing signals generated on synthesizer chip 10. Also depicted are the timing relationships with respect to the time new frames of data are inputted to synthesizer chip 10, the timing relationship with respect to the interpolations performed on the inputted parameters, the timing relations with respect to the foregoing with the time periods of the lattice filter and the relationship of all the foregoing to the basic clock signals.

The synthesizer is preferably implemented using precharged, conditional discharge type logics and therefore FIG. 5 shows clocks Φ1–Φ4 which may be appropriately used with such precharge-conditional discharge logic. There are two main clock phases (Φ1 and Φ2) and two precharge clock phases (Φ3 and Φ4). Phase Φ3 goes low during the first half of phase Φ1 and serves as a precharge therefor. Phase Φ4 goes low during the first half of phase Φ2 and serves as a precharge therefore. A set of clocks Φ1–Φ4 is required to clock one bit of data and thus corresponds to one time period.

The time periods are labeled T1–T20 and each preferably has a time period on the order of five microseconds. Selecting a time period on the order of five microseconds permits, as will be seen, data to be outputted from the digital filter at a ten kilohertz rate (i.e., at a 100 microsecond period) which provides for a frequency response of five kilohertz in the D to A output section 25 (FIG. 4*b*). It will be appreciated by those skilled in the art, however, that depending on the frequency response which is desired and depending upon the number of Kn speech coefficients used, and also depending upon the type of logics used, that the periods or frequencies of the clocks and clock phases shown in FIG. 5 may be substantially altered, if desired.

As is explained in U.S. Pat. No. 4,209,844, one cycle time of the lattice filter in filter excitation generator 24, preferably comprises twenty time periods, T1–T20. For reasons not important here, the numbering of these time periods differs between this application and U.S. Pat. No. 4,209,844. To facilitate an understanding of the differences in the numbering of the time periods, both numbering schemes are shown at the time period time line 500 in FIG. 5. At time line 500, the time periods, T1–T20 which are not enclosed in parentheses identify the time periods according to the convention used in this application. On the other hand, the time periods enclosed in parentheses identify the time periods according to the convention used in U.S. Pat. No. 4,209,844. Thus, time period T17 is equivalent to time period (T9).

At numeral 501 is depicted the parameter count (PC) timing signals. In this embodiment there are thirteen PC signals, PC=0 through PC=12. The first twelve of these, PC=0 through PC=11 correspond to times when the energy, pitch, and K1–K10 parameters, respectively, are available in parameter output register 201. Each of the first twelve PC's comprise two cycles, which are labeled A and B. Each such cycle starts at time period T17 and continues to the following T17. During each PC the target value from the parameter output register 201 is interpolated with the existing value in K-stack 302 in parameter interpolator 23. During the A cycle, the parameter being interpolated is withdrawn from the K-stack 302, E10 loop 304 or pitch register 305, as appropriate, during an appropriate time period. During the B cycle the newly interpolated value is reinserted in the K-stack (or E10 loop or pitch register). The thirteenth PC, PC=12, is provided for timing purposes so that all twelve parameters are interpolated once each during a 2.5 milliseconds interpolation period.

As was discussed with respect to the parameter interpolator 23 of FIG. 4*b* and Table IV, eight interpolations are performed for each inputting of a new frame of data from ROMs 12A–12B into synthesizer 10. This is seen at numeral 502 of FIG. 5 where timing signals DIV 1, DIV 2, DIV 4 and DIV 8 are shown. These timing signals occur during specific interpolation counts (IC) as shown. There are eight such interpolation counts, IC0–IC7. New data is inputted from the ROMs 12*a-b* into the synthesizer during IC0. These new target values of the parameters are then used during the next eight interpolation counts, IC1 through IC0; the existing parameters in the pitch register 305 K-stack 302 and E10 loop 304 are interpolated once during each interpolation count. At the last interpolation count, IC0, the present value of the parameters in the pitch register 305, K-stack 302 and E10 loop 304 finally attain the target values previously inputted toward the last IC0 and thus new target values may then again be inputted as a new frame of data. Inasmuch as each interpolation count has a period of 2.5 milliseconds, the period at which new data frames are inputted to the synthesizer chip is 20 microseconds or equivalent to a frequency of 50 hertz. The DIV 8 signal corresponds to those interpolation counts in which one-eighth of the difference produced by subtractor 308 is added to the present values in adder 310 whereas during DIV 4 one-fourth of the difference is added in, and so on. Thus, during DIV 2, ½ of the difference from subtractor 308 is added to the present value of the parameter in adder 310 and lastly during DIV 1 the total difference is added in adder 310. As has been previously mentioned, the effect of this interpolation scheme can be seen in Table IV.

PARAMETER DATA COMPRESSION

It has been previously mentioned that new parameters are inputted to the speech synthesizer at a 50 hertz rate. It will be subsequently seen that in parameter interpolator 23 and excitation generator 24 (FIG. 4*b*) the pitch data, energy data and $K_I$–Kn parameters are stored and utilized as ten bit digital binary numbers. If each of these twelve parameters were updated with a ten bit binary number at a fifty hertz rate from an external source, such as ROMs 12A and 12B, this would require a 12×10×50 or 6,000 hertz bit rate. Using the data compressiontechniques which will be explained, this bit rate required for synthesizer 10 is reduced to on the order of 1,000 to 1,200 bits per second. And more importantly, it has been found that the speech compression schemes herein disclosed do not appreciably degrade the quality of speech generated thereby in comparison to using the data uncompressed.

Figure 6:
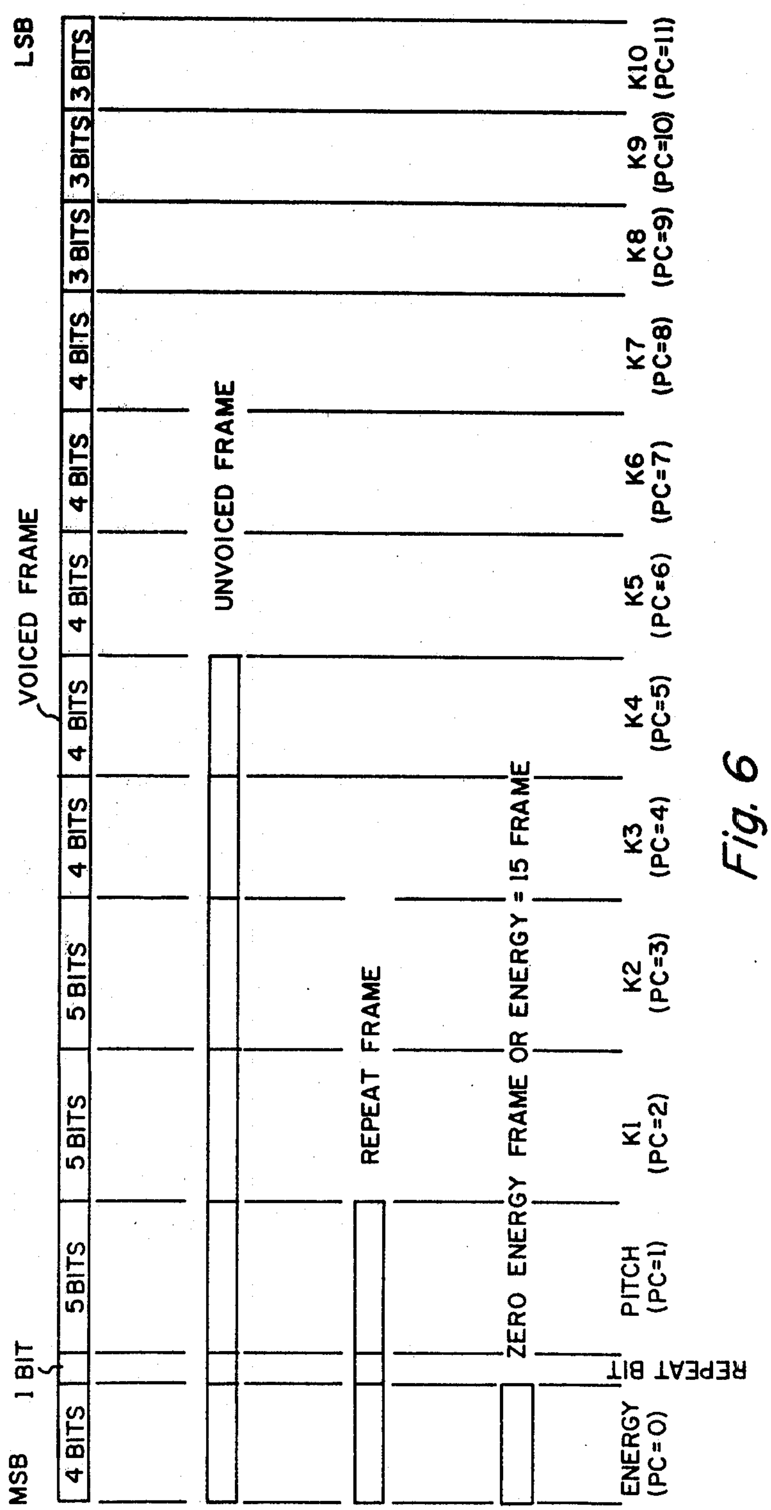
FIG. 6 pictorially shows the data compression scheme preferably used to reduce the data rate required by the synthesizer.

The data compression scheme used is pictorially shown in FIG. 6. Referring now to FIG. 6, it can be seen that there is pictorially shown four different lengths of frames of data. One, labeled voiced frame, has a length of 49 bits while another entitled unvoiced frame, has a length of 28 bits while still another called "repeat frame" has a length of ten bits and still another which may be alternatively called zero energy frame or energy equals fifteen frame has the length of but four bits. The "voiced frame" supplies four bits of data for a coded energy parameter as well as coded four bits for each of five speech parameters K3 through K7. Five bits of data are reserved for each of three coded parameters, pitch, K1 and K2. Additionally, three bits of data are provided for each of three coded speech parameters K8–K10 and finally another bit is reserved for a repeat bit.

In lieu of inputting ten bits of binary data for each of the parameters, a coded parameter is inputted which is converted to a ten bit parameter by addressing parameter ROM 202 with the coded parameter. Thus, coefficient K1, for example, may have any one of thirty-two different values, according to the five bit code for K1, each one of the thirty-two values being a ten bit numerical coefficient stored in parameter ROM 202. Thus, the actual values of coefficients K1 and K2 may have one of thirty-two different values while the actual values of coefficients K3 through K7 may be one of sixteen different values and the values of coefficients K8 through K10 may be one of eight different values. The coded pitch parameter is five bits long and therefore may have up to thirty-two different values. However, only thirty-one of these reflect actual pitch values, a pitch code of 00000 being used to signify an unvoiced frame of data. The coded energy parameter is four bits long and therefore would normally have sixteen available ten bit values; however, a coded energy parameter equal to 0000 indicates a silent frame such as occur as pauses in and between words, sentences and the like. A coded energy parameter equal to 1111 (energy equals fifteen), on the other hand, is used to signify the end of a segment of spoken speech, thereby indicating that the synthesizer is to stop speaking. Thus, of the sixteen codes available for the coded energy parameter, fourteen are used to signify different ten bit speech energy levels.

Coded coefficients K1 and K2 have more bits than coded coefficients K3–K7 which is turn have more bits than coded coefficients K8 through K10 because coefficient K1 has a greater effect on speech than K2 which has a greater effect on speech than K3 and so forth through the lower order coefficients. Thus given the greater significance of coefficients K1 and K2 than coefficients K8 through K10, for example, more bits are used in coded format to define coefficients K1 and K2 than K3–K7 or K8–K10.

Also it has been found that voiced speech data needs more coefficients to correctly model speech than does unvoiced speech and therefore when unvoiced frames are encountered, coefficients K5 through K10 are not updated, but rather are merely zeroed. The synthesizer realizes when an unvoiced frame is being outputted because the encoded pitch parameter is equal to 00000.

It has also been found that during speech there often occur instances wherein the parameters do not significantly change during a twenty millisecond period; particularly, the K1–K10 coefficients will often remain nearly unchanged. Thus, a repeat frame is used wherein new energy and new pitch are inputted to the synthesizer, however, the K1–K10 coefficients previously inputted remain unchanged. The synthesizer recognizes the ten bit repeat frame because the repeat bit between energy and pitch then comes up whereas it is normally off. As previously mentioned, there occur pauses between speech or at the end of speech which are preferably indicated to the synthesizer; such pauses are indicated by a coded energy frame equal to zero, at which time the synthesizer recognizes that only four bits are to be sampled for that frame. Similarly, only four bits are sampled when an "energyequals 15" frame is encountered.

Using coded values for the speech in lieu of actual values, alone would reduce the data rate to 48×50 or 2400 bits per second. By additionally using variable frame lengths, as shown in FIG. 6, the data rate may be further reduced to on the order of one thousand to twelve hundred bits per second, depending on the speaker and on the material spoken.

The effect of this data compression scheme can be seen from Table V where the coding for the work "HELP" is shown. Each line represents a new frame of data. As can be seen, the first part of the word "HELP", "HEL", is mainly voiced while the "P" is unvoiced. Also note the pause between "HEL" and "P" and the advantages of using the repeat bit. Table VI sets forth the encoded and decoded speech parameter. The 3, 4 or 5 bit code appears as a hexadecimal number in the left-hand column, while the various decoded parameter values are shown as ten bit, two's complement numbers expressed as hexadecimal numbers in tabular form under the various parameters. The decoded speech parameter is stored in ROm 203. The repeat bit is shown in Table V between the pitch and K parameters for sake of clarity; preferably, according to the embodiment of FIG. 6, the repeat bit occurs as quist before the most significant bit (MSB) of the pitch parameter.

SYNTHESIZER LOGIC DIAGRAMS

The various portions of the speech synthesizer of FIGS. 4*a* and 4*b* will now be described with reference to FIGS. 7*a* through 14*b* which, depict, in detail, the logic circuits implemented on a semiconductor chip, for example, to form the synthesizer 10. The following discussion, with reference to the aforementioned drawings, refers to logic signals available at many points in the circuit. It is to be remembered that in P channel MOS devices a logical zero corresponds to a negative voltage, that is, Vdd, while a logical one refers to a zero voltage, that is, Vss. It should be further remembered that P-channel MOS transistors depicted in the aforementioned figures are conductive when a logical zero, that is, a negative voltage, is applied at their respective gates. When a logic signal is referred to which is unbarred, that is, has no bar across the top of it, the logic signal is to be interpreted as "TRUE" logic; that is, a binary one indicates the presence of the signal (Vss) whereas a binary zero indicates the lack of the signal (Vdd). Logic signal names including a bar across the top thereof are "FALSE" logic; that is, a binary zero (Vdd voltage) indicates the presence of the signal whereas a binary one (Vss voltage) indicates that the signal is not present. It should also be understood that a numeral three in clocked gates indicates that phase Φ3 is used as a precharge whereas a four in a clocked gate indicates that phase Φ4 is used as a precharge clock. An "S" in the gate indicates that the gate is statically operated.

Timing Logic Diagram

Referring now to FIGS. 7*a*–7*d*, they form a composite, detailed logic diagram of the timing logic for synthesizer 10. Counter 501 is a pseudorandom shift counter including a shift register 510*a* and feed back logic 510*b*. The counter 510 counts into pseudorandom fashion and the TRUE and FALSE outputs from shift register 510*a* are supplied to the input section 511 of a timing PLA. The various T time periods decoded by the timing PLA are indicated adjacent to the output lines thereof. Section 511*c* of the timing PLA is applied to an output timing PLA 512 generating various combinations and sequences of time period signals, such as T odd, $\overline{\text{T10}}$–$\overline{\text{T18}}$, and so forth. Sections 511*a* and 511*b* of timing PLA 511 will be described subsequently.

The parameter count in which the synthesizer is operating is maintained by a parameter counter 513. Parameter counter 513 includes an add one circuit and circuits which are responsive to SLOW and SLOW D. In SLOW, the parameter counter repeats the A cycle of the parameter count twice (for a total of three A cycles) before entering the B cycle. That is, the period of the parameter count doubles so that the parameters applied to the lattice filter are updated and interpolated at half the normal rate. To assure that the inputted parameters are interpolated only once during each parameter count during SLOW speaking operations each parameter count comprises three A cycles followed by one B cycle. It should be recalled that during the A cycle the interpolation is begun and during the B cycle the interpolated results are reinserted back into either K-stack 302, E10 loop 304 or pitch register 305,as appropriate. Thus, merely repeating the cycle has no affect other than to recalculate the same value of a speech parameter but since it is only reinserted once back into either K-stack 302, E10 loop 304 or pitch register 305 only the results of the interpolation immediately before the B cycle are retained.

Inasmuch as parameter counter 513 includes an add one circuit, the results outputted therefrom, PC1–PC4, represent in binary form, the particular parameter count in which the synthesizer is operating. Output PC0 indicates in which cycle, A or B, the parameter count is. The parameter counter outputs PC1–PC4 are decoded by timing PLA 514. The particular decimal value of the parameter count is decoded by timing PLA 514 which is shown adjacent to the timing PLA 514 with nomenclature such as PC=0, PC=1, PC=7 and so forth. The relationship between the particular parameters and the value of PC is set forth in FIG. 6. Output portions 511*a* and 511*b* of timing PLA 511 are also interconnected with outputs from timing PLA 514 whereby the Transfer K (TK) signal goes high during T9 of PC=2 or T8 of PC=3 or T7 of PC=4 and so forth through T1 of PC=10. Similarly, a LOAD Parameter (LDP) timing signal goeshigh during T5 of PC=0 or T1 of PC=1 or T3 of PC=2 and so forth through T7 of PC=11. As will be seen, signal TK is used in controlling the transfer of data from parameter output register 201 to subtractor 308, which transfer occurs at different T times according to the particular parameter count the parameter counter 513 is in to assure that the appropriate parameter is being outputted from KE10 transfer register 303. Signal LDP is, as will be seen, used in combination with the parameter input register to control the number of bits which are inputted therein according to the number of bits associated with the parameter then being loaded according to the number of bits in each coded parameter as defined in FIG. 6.

Interpolation counter 515 includes a shift register and an add one circuit for binary counting the particular interpolation cyclein which the synthesizer 10 is operating. The relationship between the particular interpolation count in which the synthesizer is operating and the DIV1, DIV2, DIV4 and DIV8 timing signals derived therefrom is explained in detail with reference to FIG. 5 and therefore additional discussion here would be superfluous. It will be noted, however, that interpolation counter 515 includes a three bit latch 516 which is loaded at TI. The output of three bit latch 516 is decoded by gates 517 for producing the aforementioned DIV1 throgh DIV8 timing signals. Interpolation counter 515 is responsive to a signal RESETF from parameter counter 513 for permitting interpolation counter 515 to increment only after PC=12 has occurred.

ROM/Controller Interface Logic Diagram

Turning now to FIGS. 8*a*–8*f*, which form a composite diagram, there is shown a detailed logic diagram of ROM/Controller interface logic 21. Parameter input register 205 is coupled, at its input to address pin ADD1. Register 205 is a six bit shift register, most of the stages of which are two bits long. The stages are two bits long in this embodiment inasmuch as ROMs 12*a* and *b* output, as will be seen, data at half the rate at which data is normally clocked in synthesizer 10. At the input of parameter input register 205 is a parameter input control gate 220 which is responsive to the state of a latch 221. Latch 221 is set in response to LDP, PC0 and DIV1 all being a logical one. It is reset at T14 and in response to parameter load enable from gate 238 being a logical zero. Thus, latch 221 permits gate 220 to load data only during the A portion (as controlled by PC0) of theappropriate parameter count and at an appropriate T time (as controlled by LDP) of IC0 (as controlled by DIV1) provided parameter load enable is at a logical one. Latch 221 is reset by T14 after the data has been inputted into parameter register 205.

The coded data in parameter input register 205 is applied on lines IN0 IN4 to coded parameter RAM 203, which is addressed by PC1–PC4 to indicate which coded parameter is then being stored. The contents of register 205 is tested by all one's gate 207, all zeroes gate 206 and repeat latch 208*a*. As can be seen, gate 206 tests for all zeroes in the four least significant bits of register 205 whereas gate 207 tests for all ones in those bits. Gate 207 is also responsive to PC0, DIV1, T16 and PC=0 so that the zero condition is only tested during the time that the coded energy parameter is being loaded into parameter RAM 203. The repeat bit occurs in this embodiment immediately in front of the coded pitch parameter; therefore, it is tested during the A cycle of PC=1. Pitch latch 208*b* is set in response to all zeroes in the coded pitch parameter and is therefore responsive to not only gate 206 but also the most significant bit of the pitch data on line 222 as well as PC=1. Pitch latch 208*b* is set whenever the loaded coded pitch parameter is a 00000 indicating that the speech is to be unvoiced.

Energy=0 latch 208*c* is responsive to the output of gate 206 and PC=0 for testing whether all zeroes have been inputted as the coded energy parameter and is set in response thereto. Old pitch latch 208*d* stores the output of the pitch=0 latch 208*b* from the prior frame of speech data while old energy latch 208*e* stores the output of energy=0 latch 208*c*from the prior frame of speech data. The contents of old pitch latch 208*d* and pitch=0 latch 208*b* are compared in comparison gates 223 for the purpose of generating an INHIBIT signal. As will be seen, the INHIBIT signal inhibits interpolations and this is desirable during changes from voiced to unvoiced or unvoiced to voiced speech so that the new speech parameters are automatically inserted into K-stack 302, E10 loop 304 and pitch register 305 as opposed to being more slowly interpolated into those memory elements. Also, the contents of old energy latch 208*e* and energy=0 latch 208*c* is tested by NAND gate 224 for inhibiting interpolation for a transition from a non-speaking frame to a speaking frame of data. The outputs of NAND gate 224 and gates 223 are coupled to a NAND gate 235 whoseoutput is inverted to INHIBIT by an inverter 236. Latches 208*a*–208*c* are reset by gate 225 and latches 208*d* and 208*e* are reset by gate 226. When the excitation signal is unvoiced, the K5–K10 coefficients are set to zero, as aforementioned. This is accomplished, in part, by the action of gate 237 which generates a ZPAR signal when pitch is equal to zero and when the parameter counter is greater than five, as indicated by PC 5 from PLA 514.

Also shown in FIGS. *8a–8f* is a command latch 210 which comprises three latches 210*a, b,* and *c* which latch in the data at CTL2,4 and 8 in response to a processor data clock (PDC) signal in conjunction with a chip select (CS) signal. The contents of command latch 210 is decoded by command decoder 211 unless disabled by latches 218*a* and 218*b*. As previously mentioned, these latches are responsive to decoded LA, output and TTALK commands for disabling decoder 211 from decoding whatever data happens to be on the CTL2–CTL8 pins when subsequent PDC signals are received in conjunction with the LA, output and TTALK commands. A decoded TTALK command sets TTALK latch 219. The output of TTALK latch 219, which is reset by a Processor Data Clock Leading Edge (PDCLE) signal or by an output from latch 218*b*, controls along with the output of latch 218*a* NOR gates 227*a* and *b*. The output of NOR gate 227*a* is a logical one if TTALK latch 219 is set, thereby coupling pins CTL1 to the talk latch via tristate buffer 228 and inverters 229. Tristate latch 228 is shown in detail in FIG. 8*d*. NOR gate 227*b*, on the other hand, outputs a logical one if an output code has been detected, setting latch 228*a* and thereby connecting pins CTL1 to the most significant bit of data input register 212.

Data is shifted into data input register 212 from address pin 8 in response to a decoded read command by logics 230. RE, RB and LA instructions are outputted to ROM via instruction pins $I_0$–$I_1$ from ROM control logic 217 via buffers 214*c*. The contents of data input register 212 is outputted to CTL1–CTL4 pins via buffers 213 and to the aforementioned CTL1 pin via buffer 228 when NOR gate 227*b* inputs a logical one. CTL1–CTL4 pins are connected to address pins ADD-1–ADD4 via buffers 214*a* and CTL8 pin is connected to ADD8 pin 8 via a control buffer 214*b* which is disabled when addresses are being loaded on the ADD1–ADD8 pins by the signal on line 231.

Figure 8A:
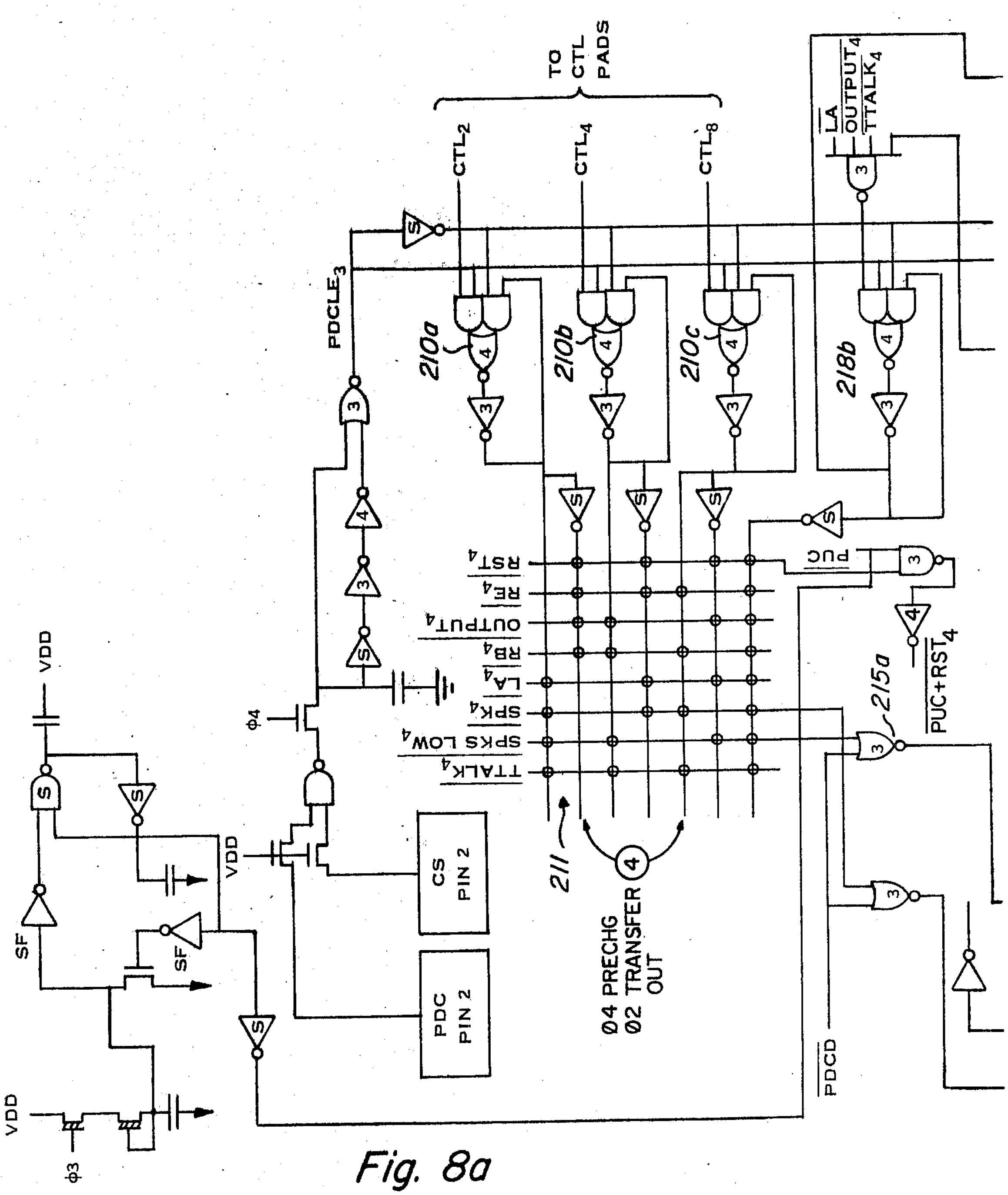
FIGS. 8*a*–8*f* form a composite logic diagram of the synthesizer's ROM/Controller interface logics.
Figure 8B:
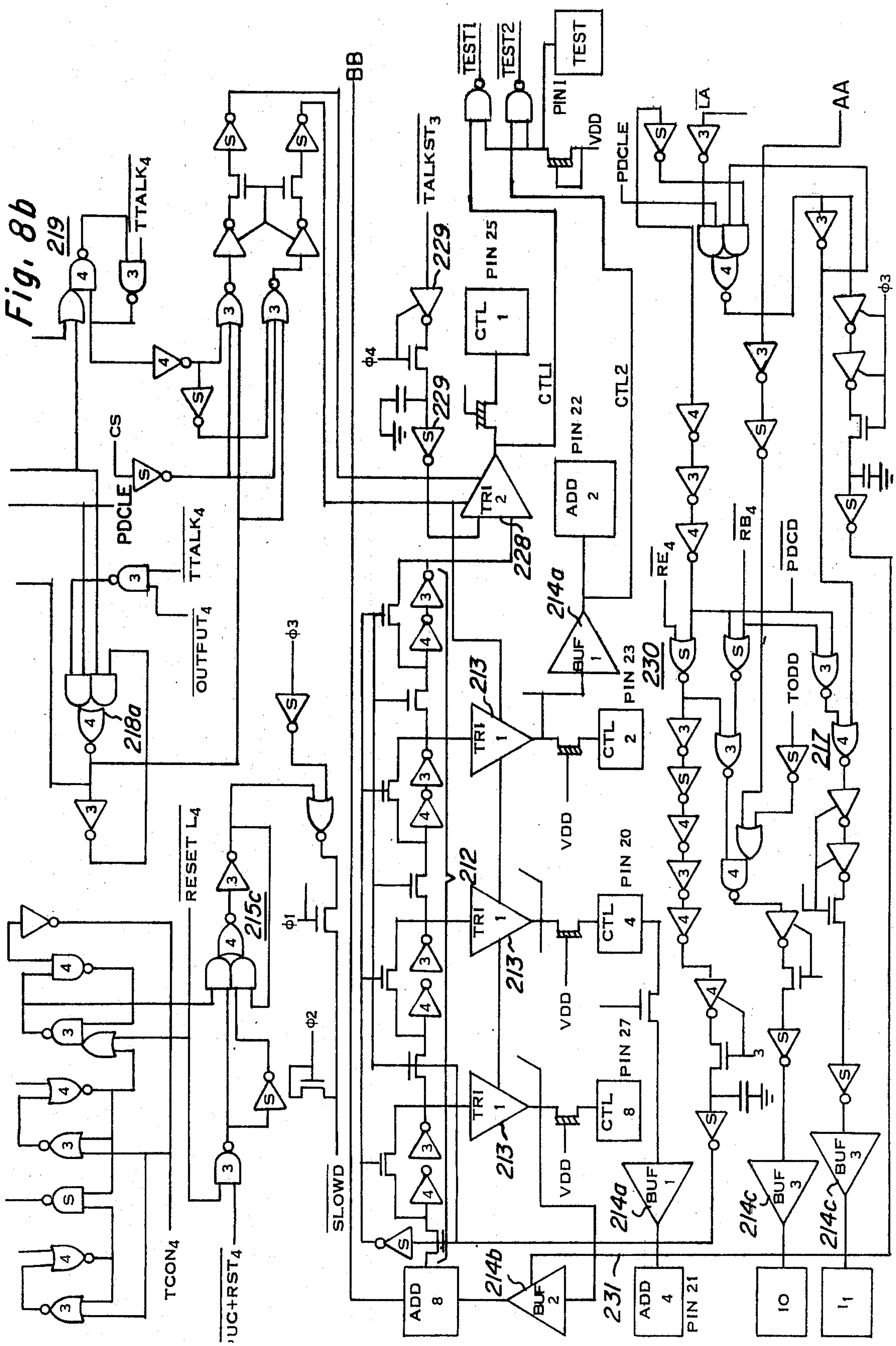
Figure 8C:
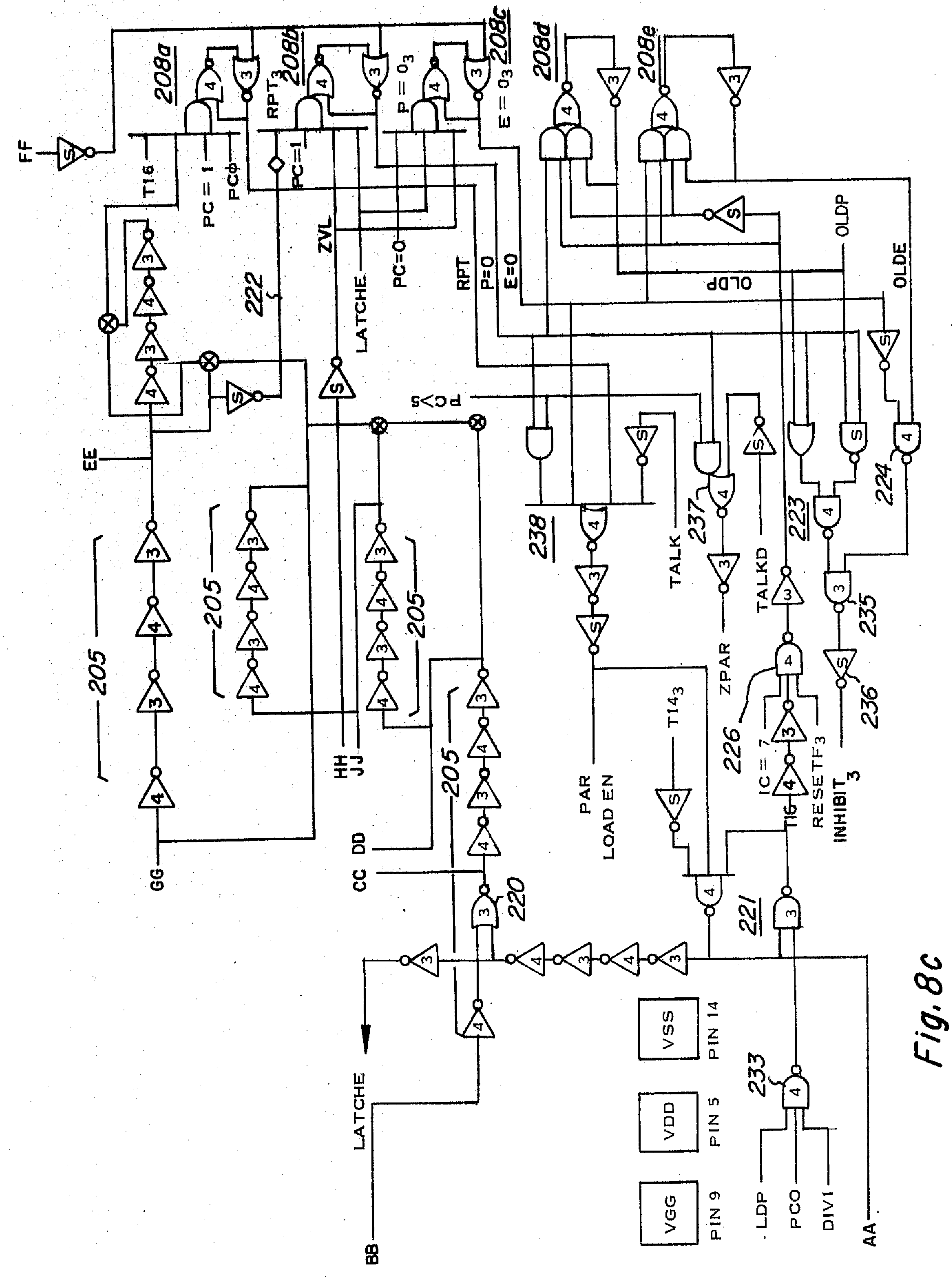
Figure 8D:
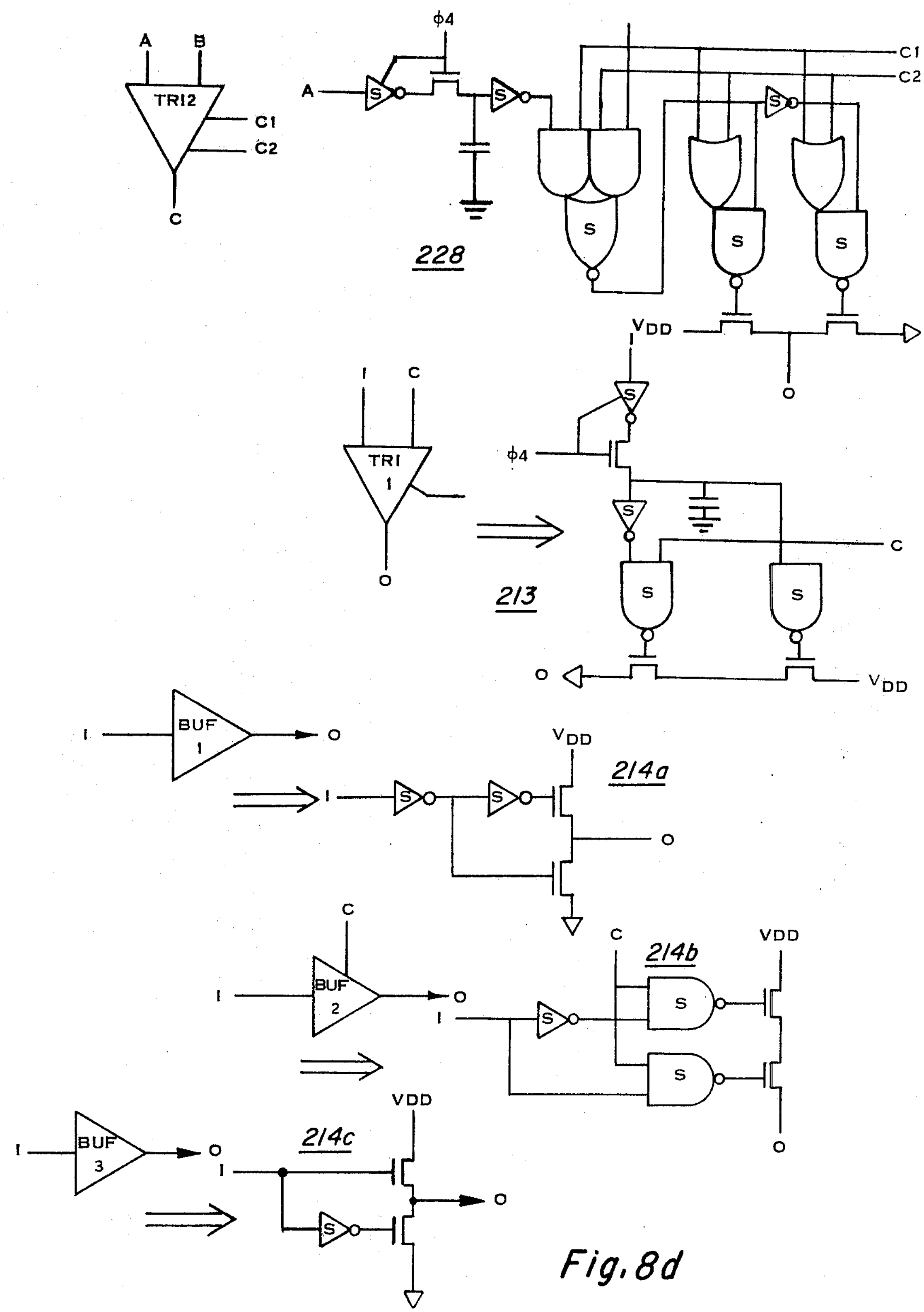
Figure 8E:
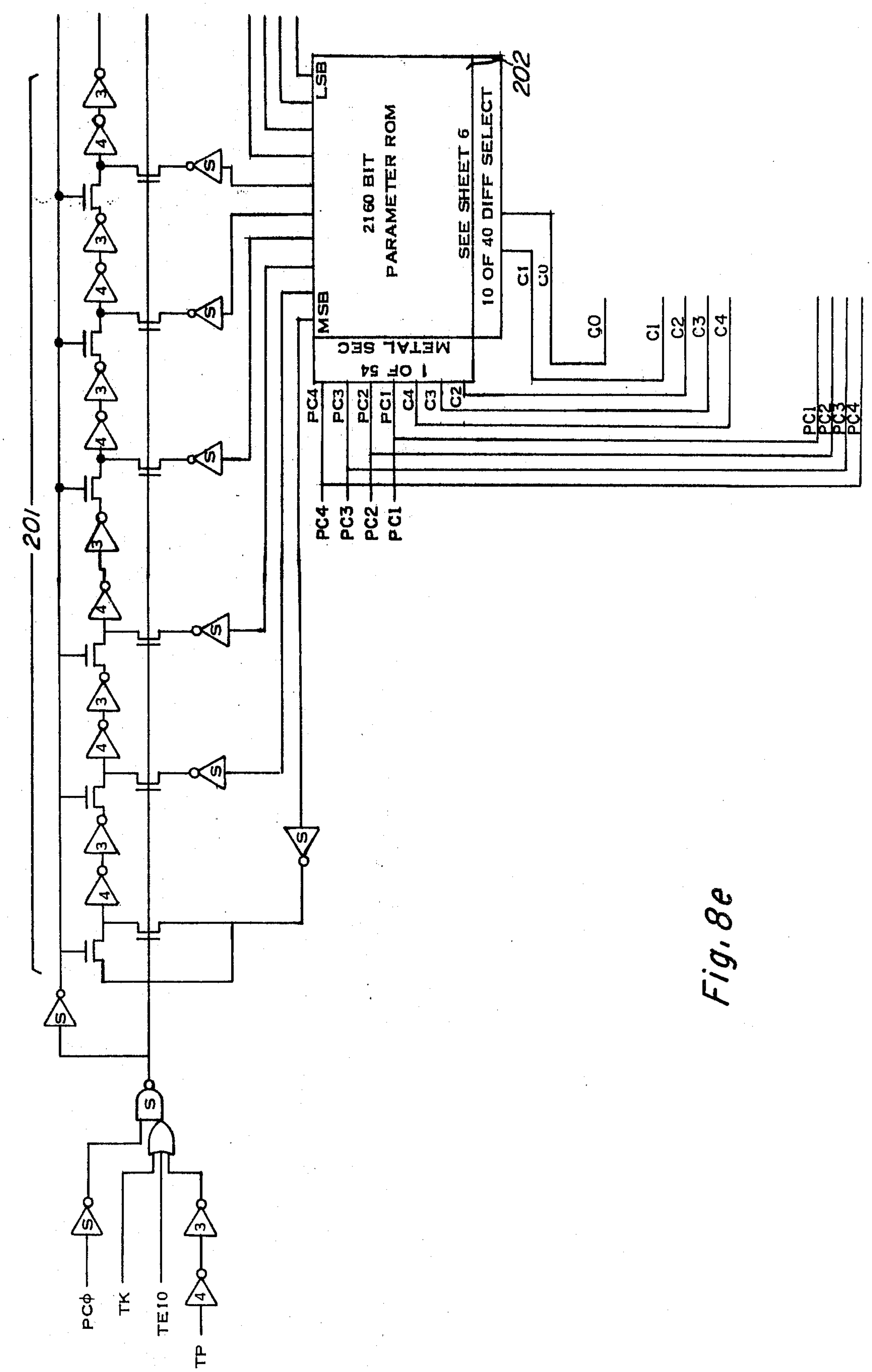
Figure 8F:
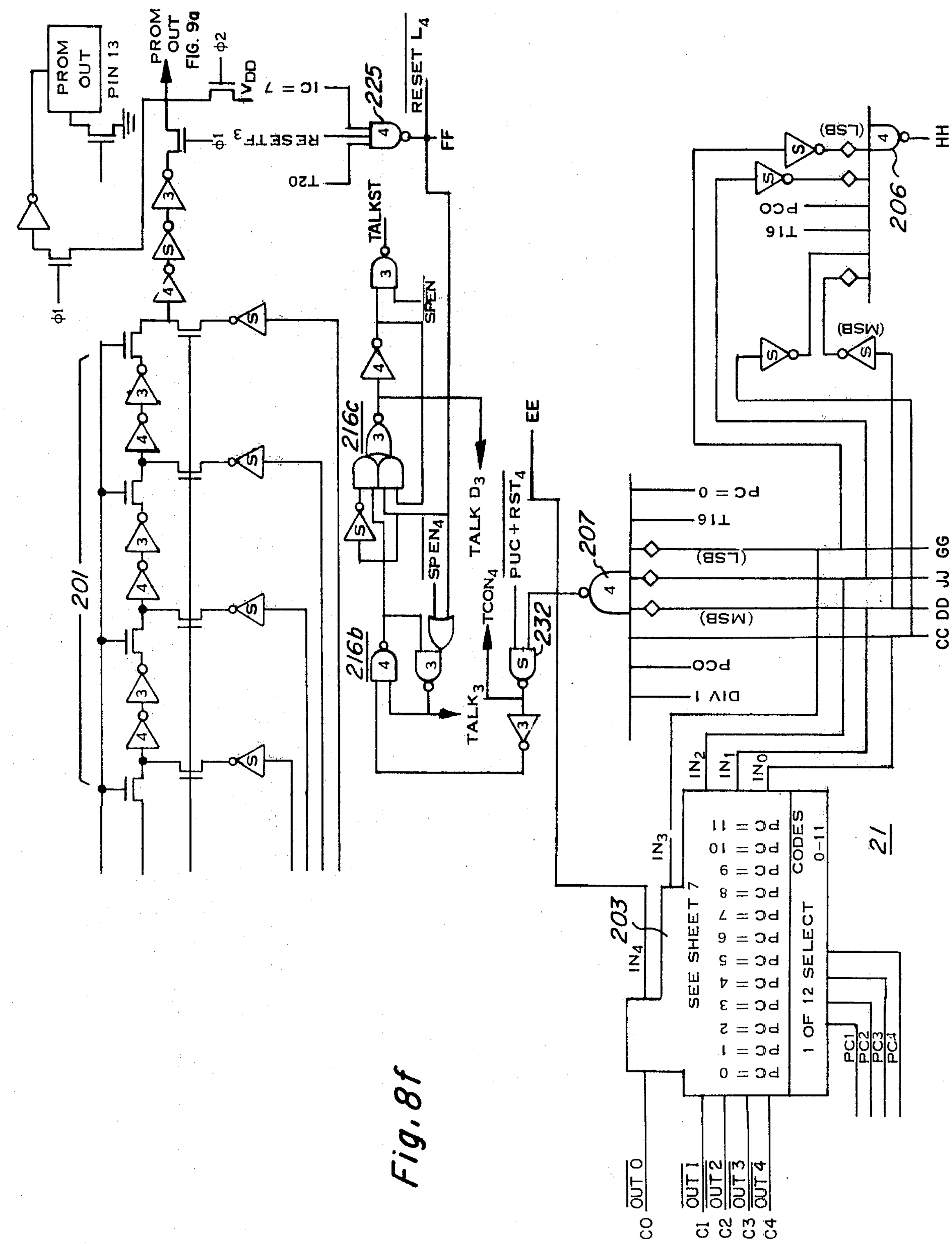

The Talk latch 216 shown in FIG. 8*f* preferably comprises, three latches 216*a*, 216*b* and 216*c*. Latch 216*a* is set in response to a decoded SPK command and generates, in response thereto, a speak enable (SPEN) signal. As will be seen, SPEN is also generated in response to adecoded SPKSLOW command by latch 215*a*. Latch 216*b* is set in response to speak enable during IC7 as controlled by gate 225. Latches 216*a* and 216*b* are reset in response to (1) a decoded reset command, (2) an energy equals fifteen code or (3) on a power-up clear by gate 232. Talk delayed latch 216*c* is set with the contents of latch 216*b* at the following IC7 and retains that data through eight interpolation counts. As was previously mentioned, the talk delayed latch permits the speech synthesizer to continue producing speech data for eight interpolation cycles after a coded energy=0 condition has been detected setting latch 208*c*. Likewise, slow talk latch 215 is implemented with latches 215*a* , 215*b* and 215*c* . Latch 215*a* enables the speak enable signal while latches 215*b* and 215*c* enable the production of the SLOWD signal in much the same manner as latches 216*b* and 216*c* enable the production of the TALKD signal.

Considering now, briefly, the timing interactions for inputting data into parameter input register 205, it will be recalled that this is controlled chiefly by a control gate 220 in response to the state of a parameter input latch 221. Of course, the state of the latch is controlled by the LDP signal applied to gate 233. The PC0 and DIV1 signals applied to gate 233 to assure that the parameters are loaded during the A cycle of a particular parameter count during IC0. The particular parameter and the parameter T-Time within the parameter count is controlled by LDP according to the portion 511*a* of timing PLA 511 (FIGS. *7a–7d*). The first parameter inputted (Energy) is four bits long and therefore LDP is initiated during time period T5 (as can be seen in FIGS. *7a–7d*). During parameter count 1, the repeat bit and pitch bits are inputted, this being six bits which are inputted according to LDP which comes up at time period T1. Of course, there four times periods difference between T1 and T5 but only two bits difference in the length of the inputted information. This occurs because it takes two time periods to input each bit into parameter input register 205 (which has two stages per each inputted bit) due to the fact that ROMs 12*A*–12*B* are preferably clocked at half the rate at that which synthesizer 10 is clocked. By clocking the ROM chips athalf the rate, that the synthesizer 10 chip is clocked simplifies the addressing of the read-only-memories in the aforesaid ROM chips and yet, as can be seen, data is supplied to the synthesizer 10 in plenty of time for performing numerical operations thereon. Thus, in section 511*a* of timing PLA 511, LDP comes up at T1 when the corresponding parameter count indicates that a six bit parameter is to be inputted, comes up at T3 when the corresponding parameter count indicates that a five bit parameter is to be inputted, comes up at T5 when the corresponding parameter count indicates that a four bit parameter is to be inputted and comes up at time period T7 when the corresponding parameter count (EG parameter counts 9, 10, and 11) which correspond to a three bit coded parameter. ROMs 12*A*–12*B* are signaled that the addressed parameter ROM is to output informationwhensignaled via $I_0$ instruction pin, ROM control logic 217 and line 234 which provides information to ROM control logic 217 from latch 221.

Parameter Interpolator Logic Diagram

Figure 9A:
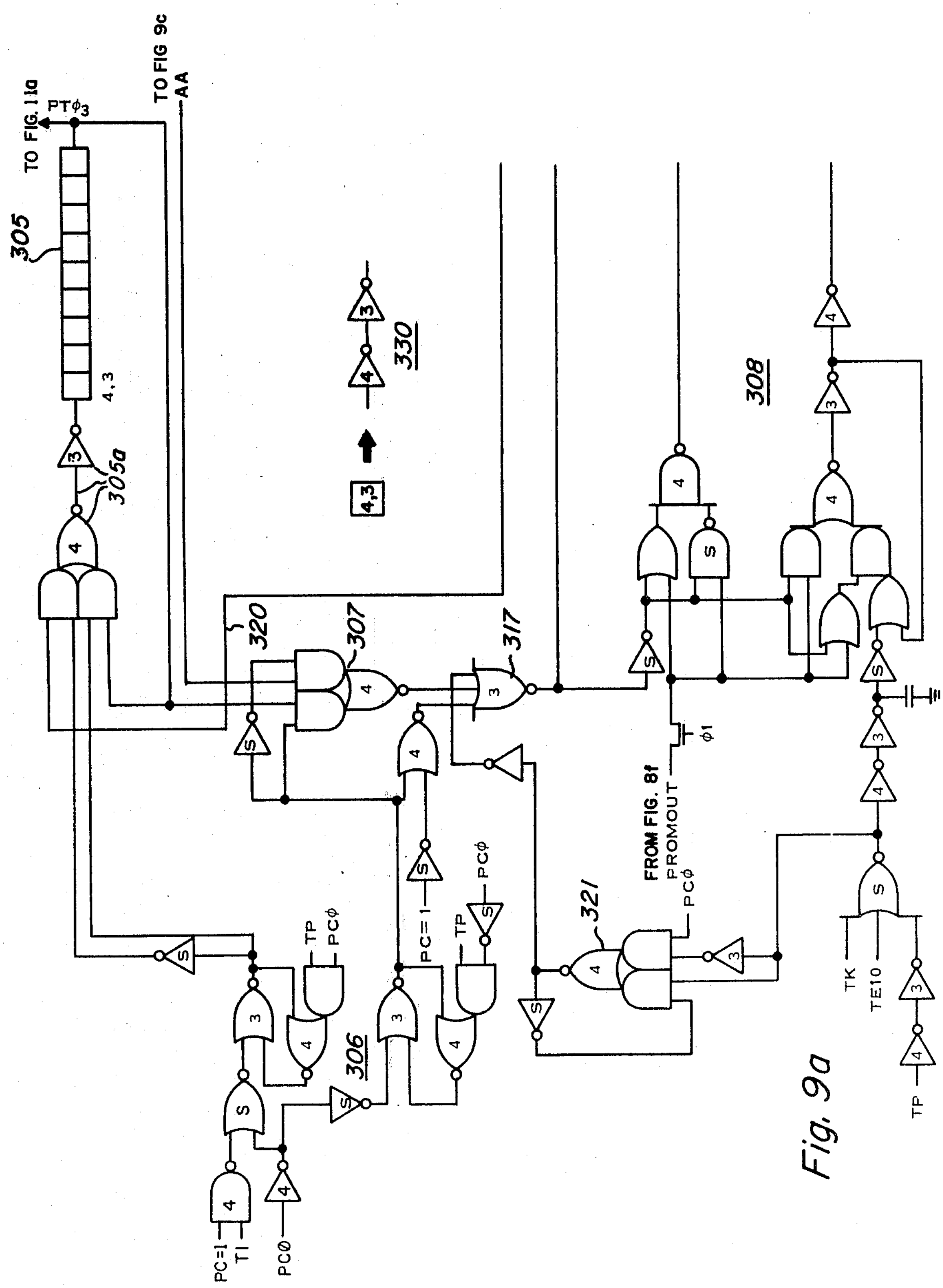
FIGS. 9*a*–9*d* form a composite logic diagram of the interpolator logics.
Figure 9B:
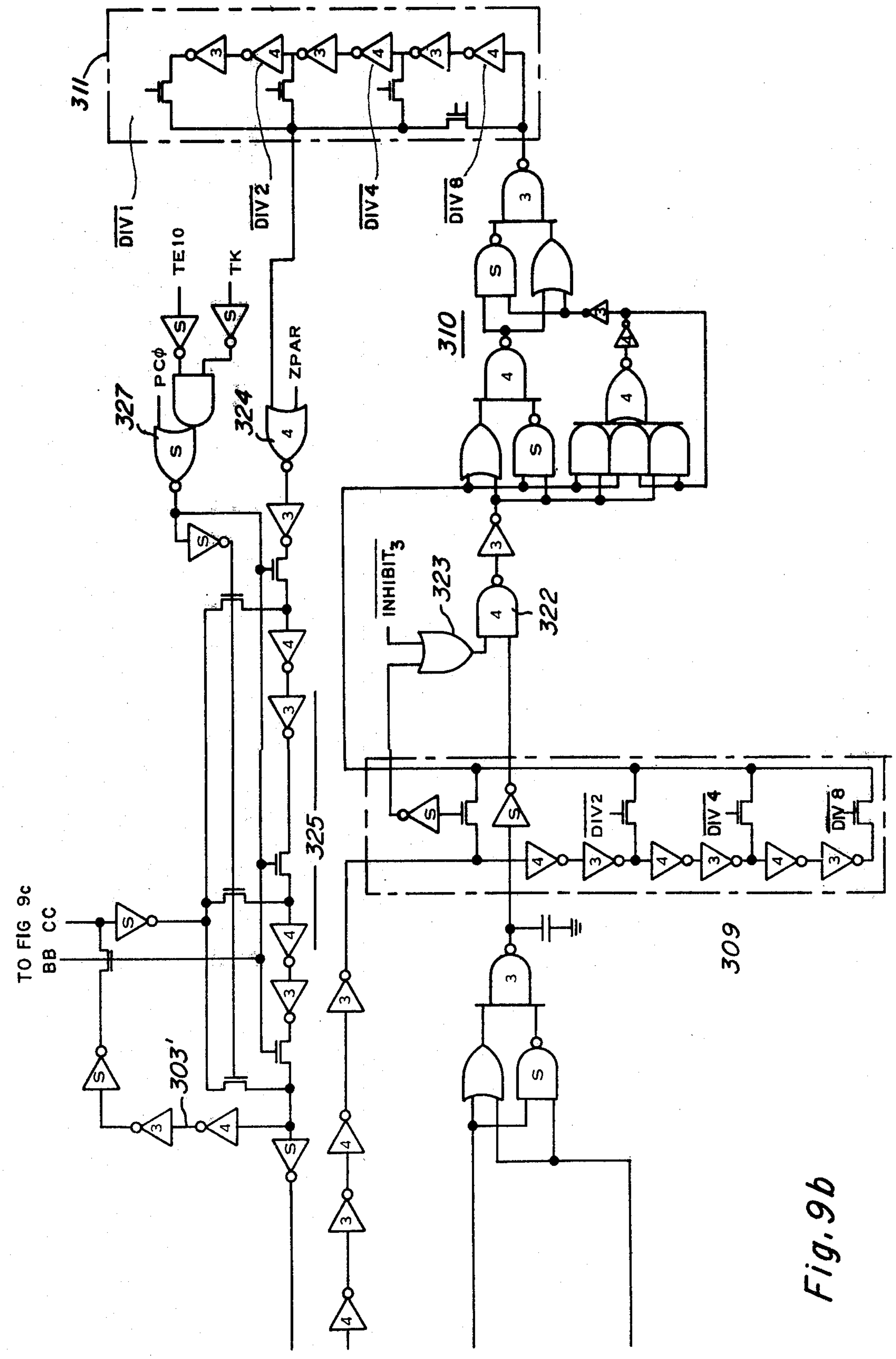
Figure 9C:
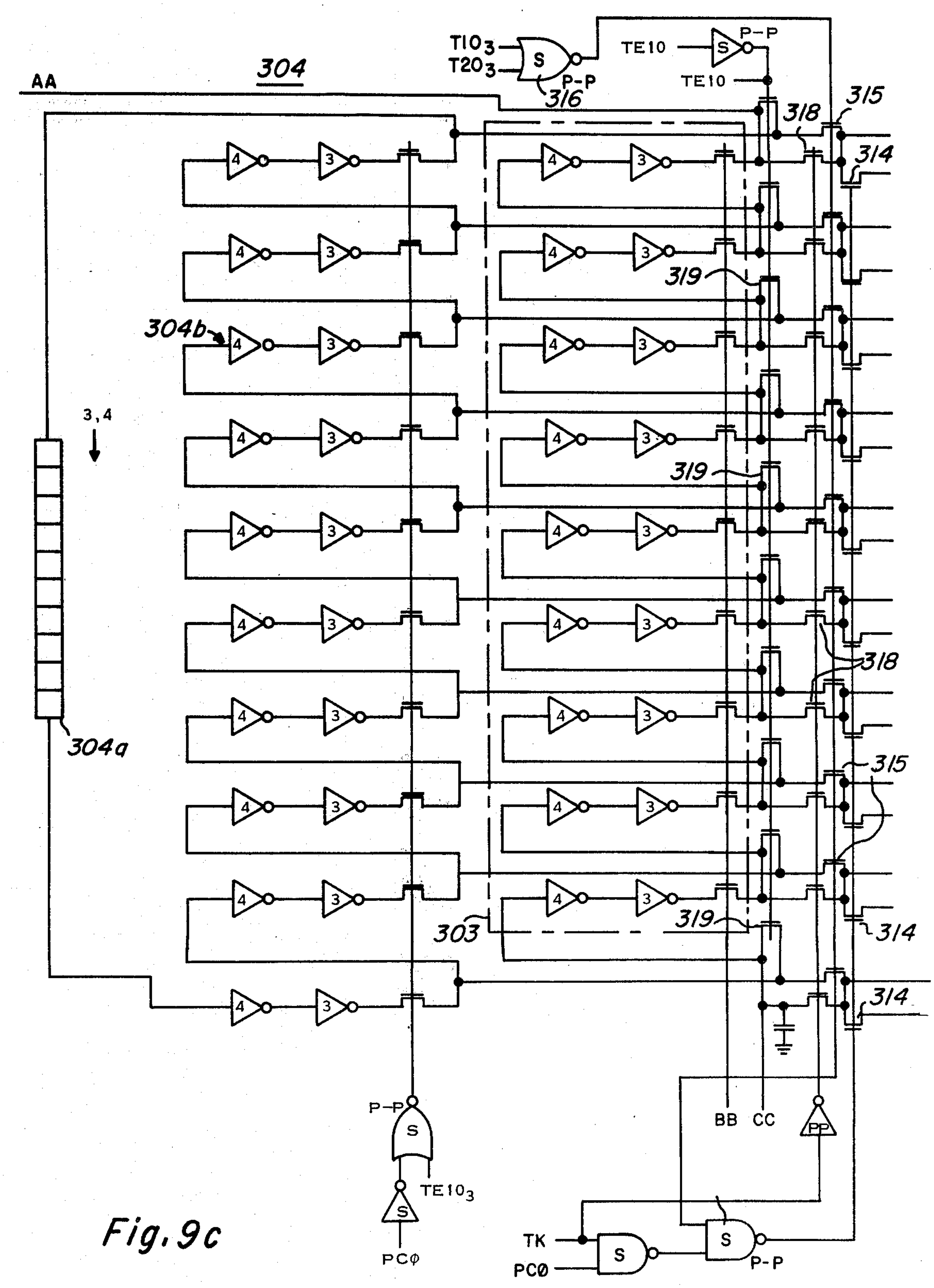
Figure 9D:
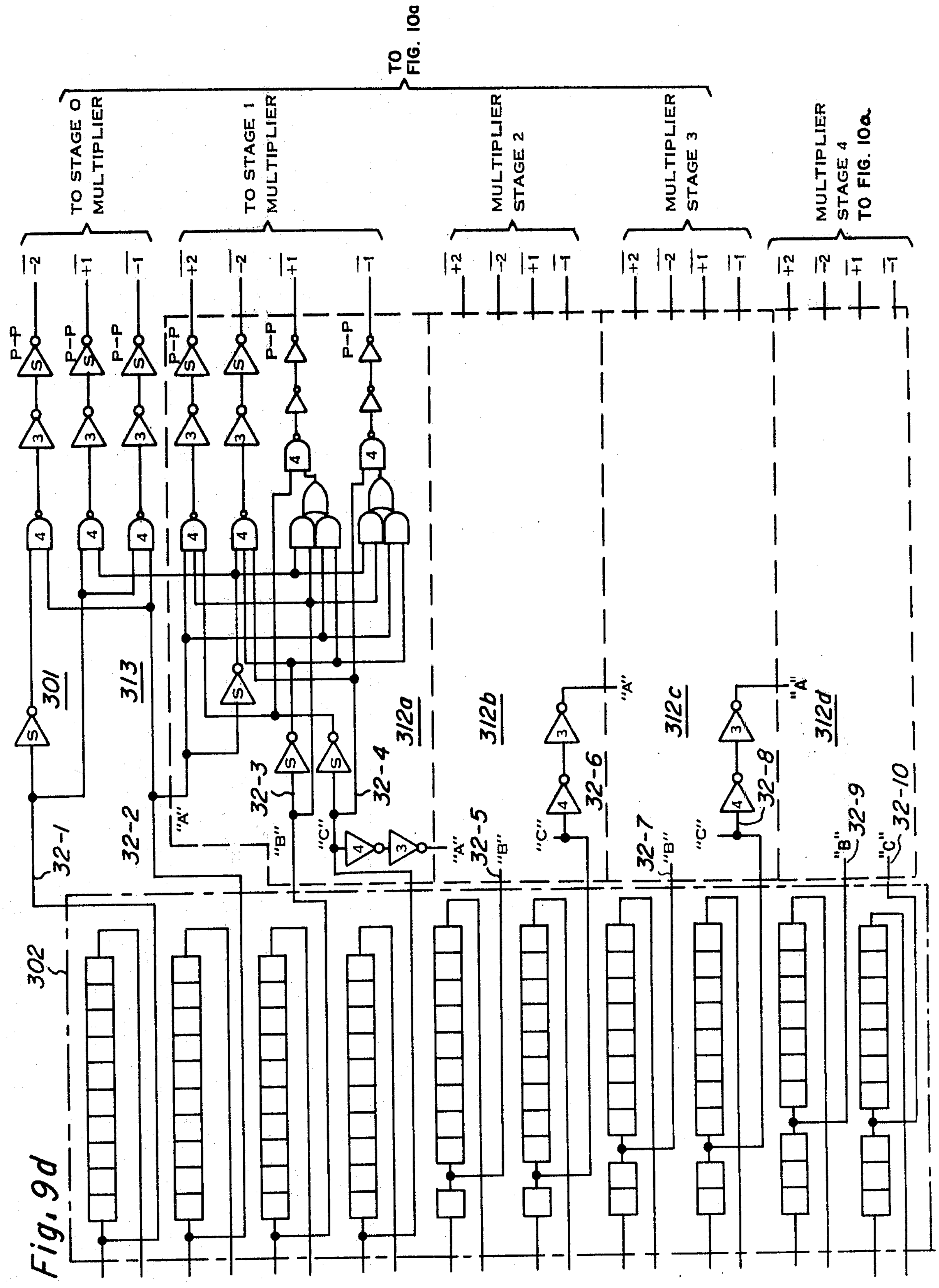

Referring now to FIGS. 9*a* and 9*d*, which form a composite diagram the parameter interpolator logic 23 is shown in detail. K-stack 302 comprises ten registers each of which store ten bits of information. Each small square represents one bit of storage, according to the convention depicted at numeral 330. The contents of each shift register is arranged to recirculate via recirculation gates 314 under control of a recirculation control gate 315. K-stack 302 stores speech coefficients K1–K9 and temporarily stores coefficient K10 or the energy parameter generally in accordance with the speech synthesis apparatus of FIG. 7 of U.S. Pat. No. 4,209,844. The data outputtedfrom K-stack 302 to recoding logic 301 at various time periods is shown in Table VII. In Table III of U.S. Pat. No. 4,209,844 is shown the data outputted from the K-stack of FIG. 7 thereof. Table VII of this patent differs from Table III of the aforementioned patent because of (1) recoding logic 301 receives the same coefficient on lines 32-1 through 32-4, on lines 32-5 and 32-6, on lines 32-7 and 32-8 and on lines 32-9 and 32-10 because, as will be seen, recoding logic 301 responds to two bits of information for each bit which was responded to by the array multiplier of the aforementioned U.S. Patent; (2) because of the difference in time period nomenclature as was previously explained with reference to FIG. 5; and (3) because of the time delay associated with the recoding logic 301.

Figure 10A:
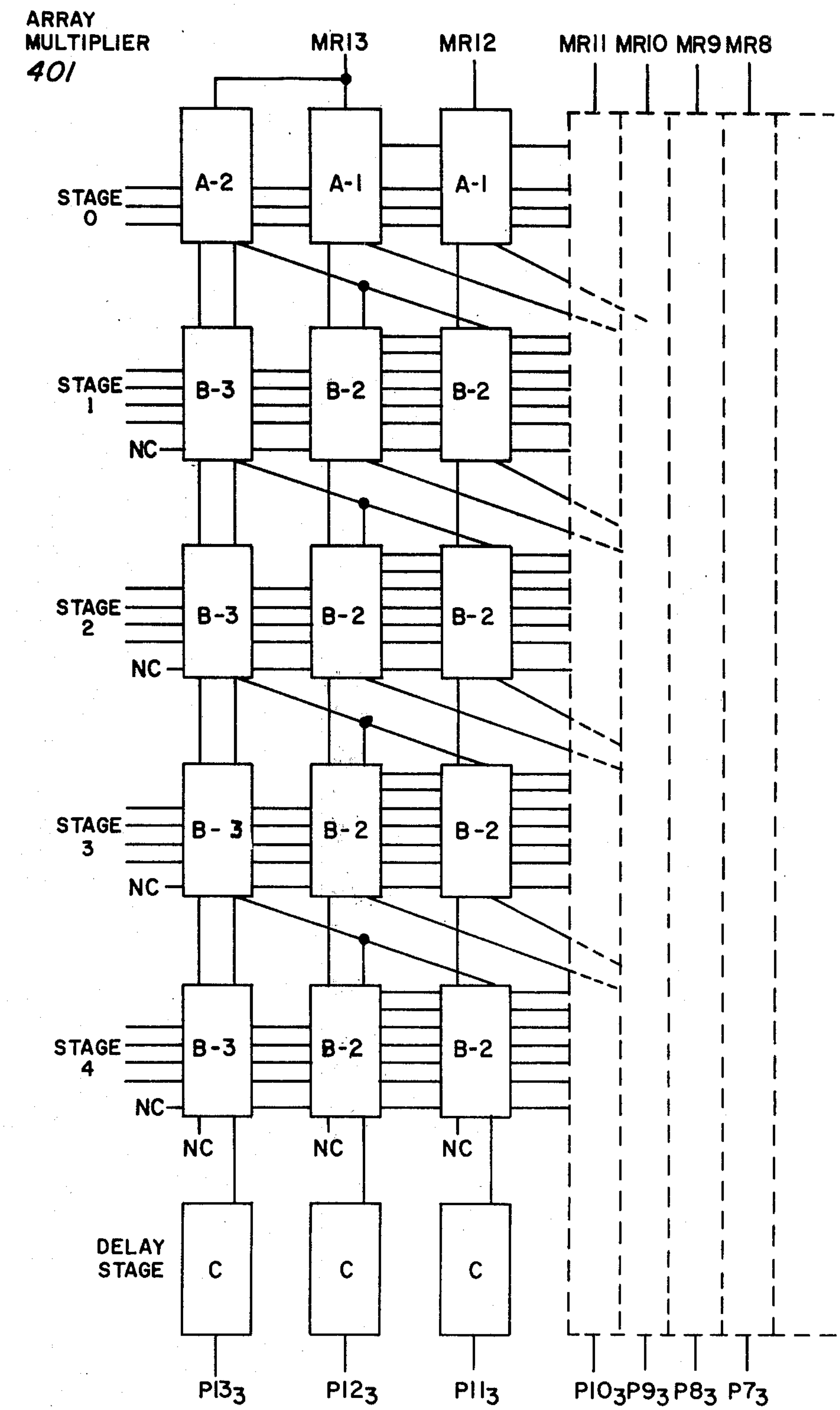
FIGS. 10*a*–10*c* form a composite logic diagram of the array multiplier.
Figure 10B:
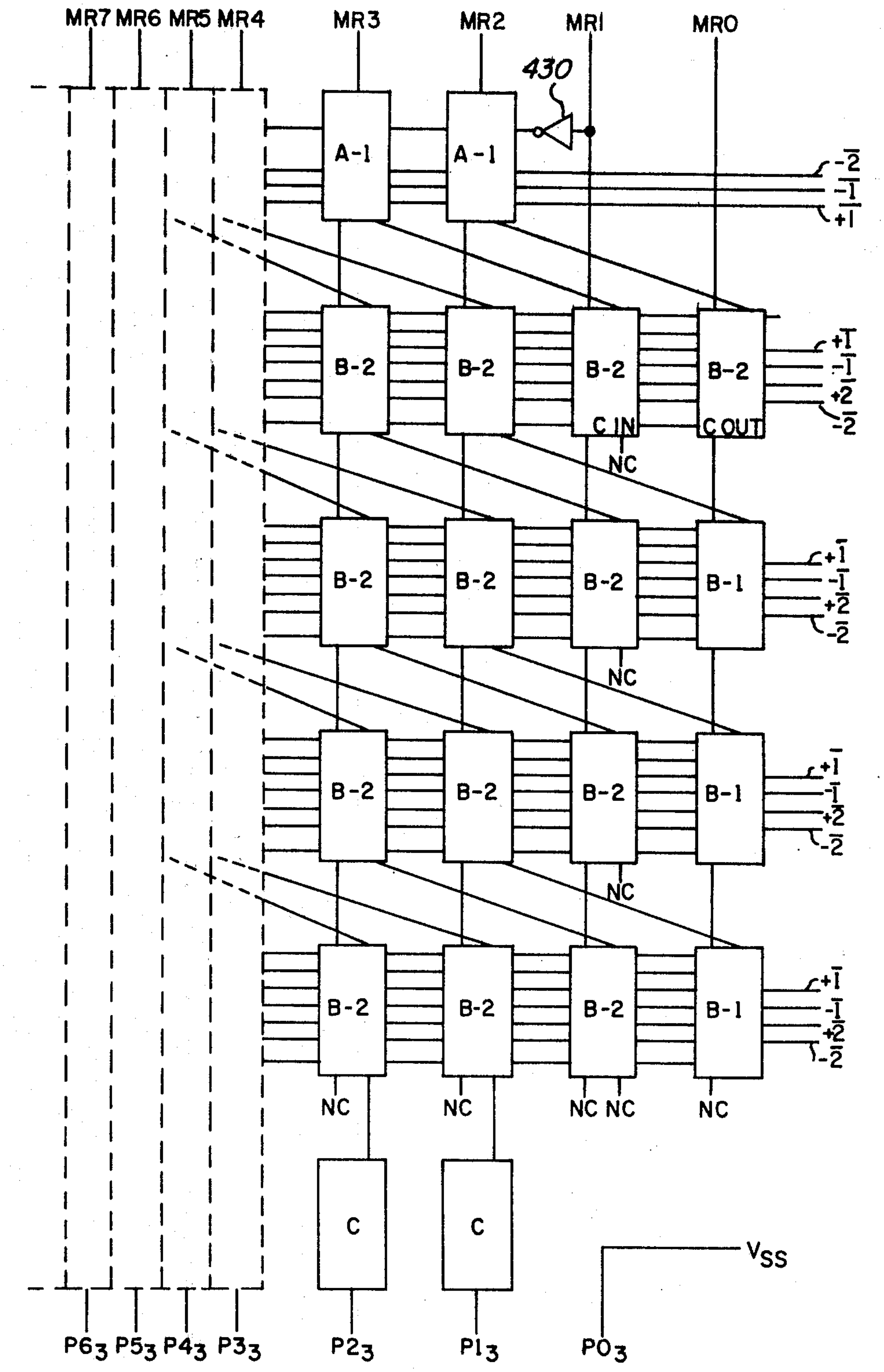
Figure 10C:
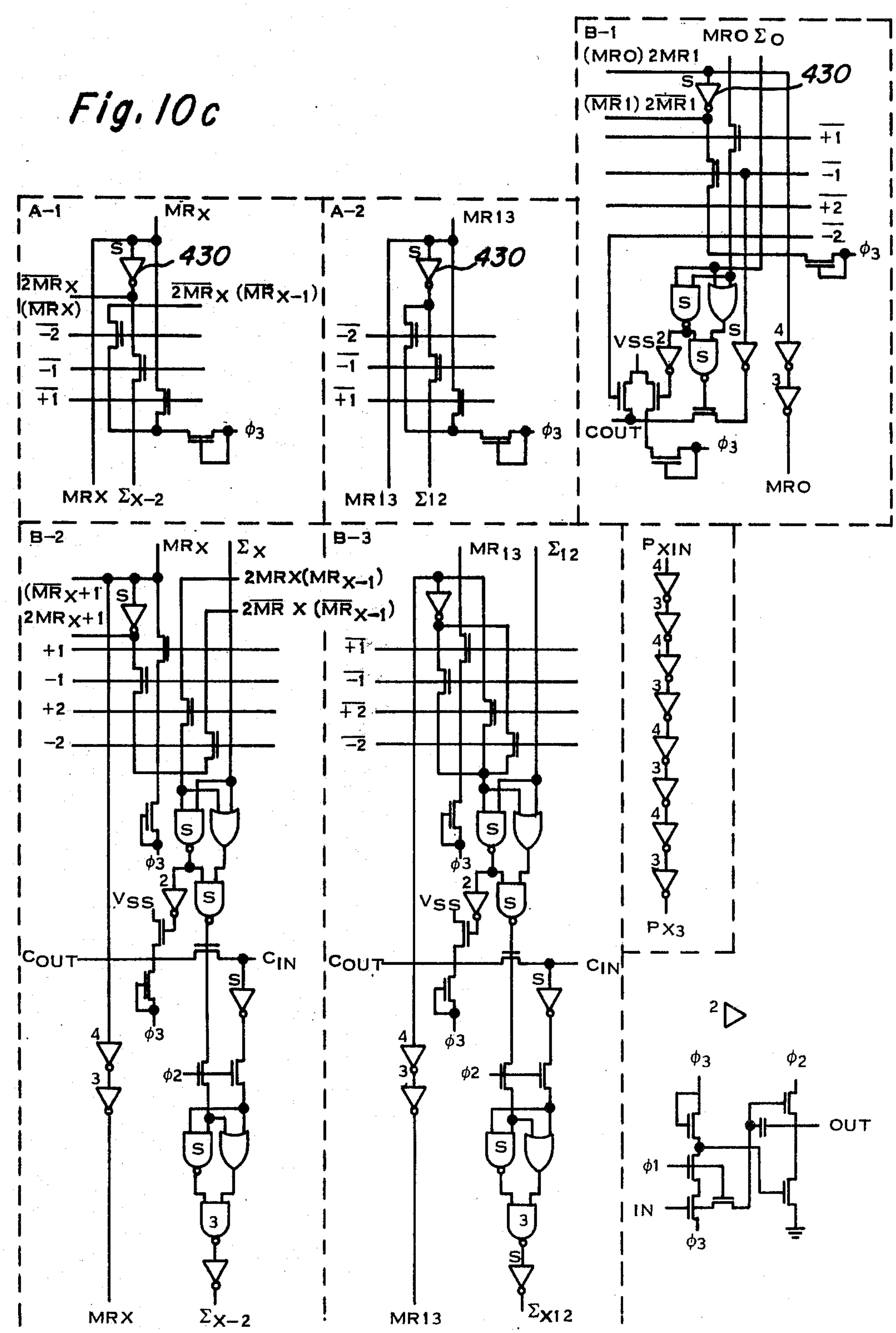
Figure 11A:
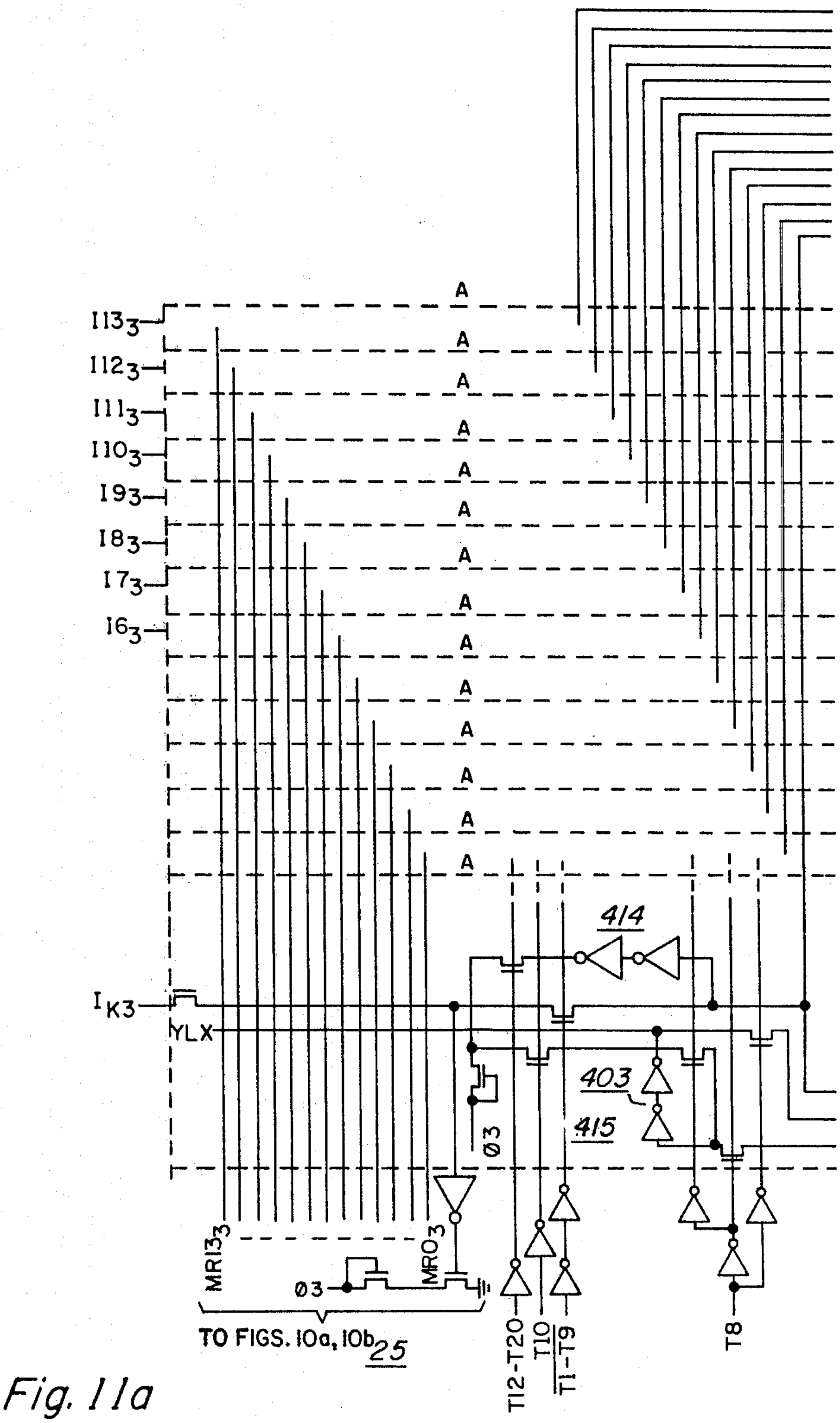
Figure 11B:
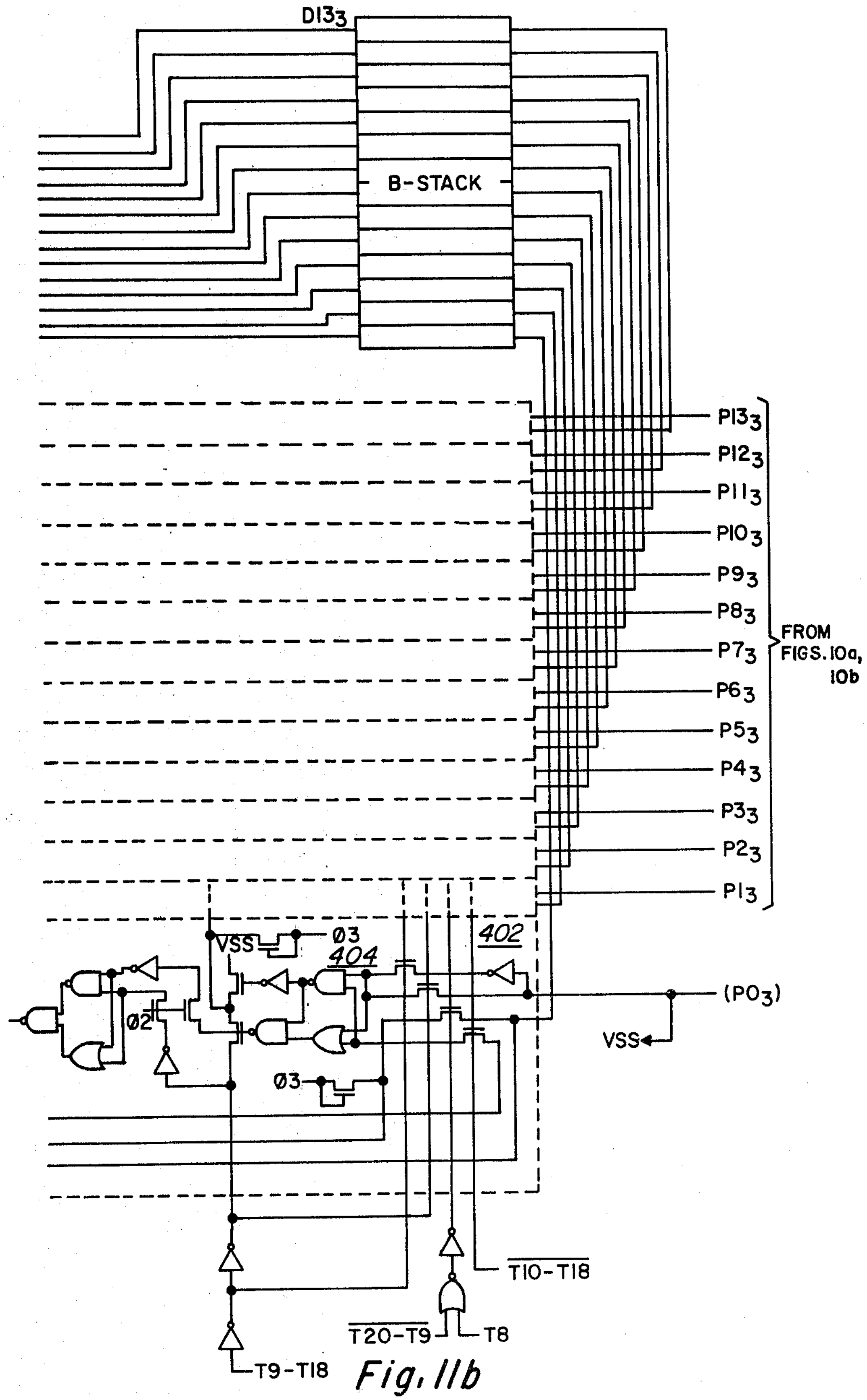
Figure 11C:
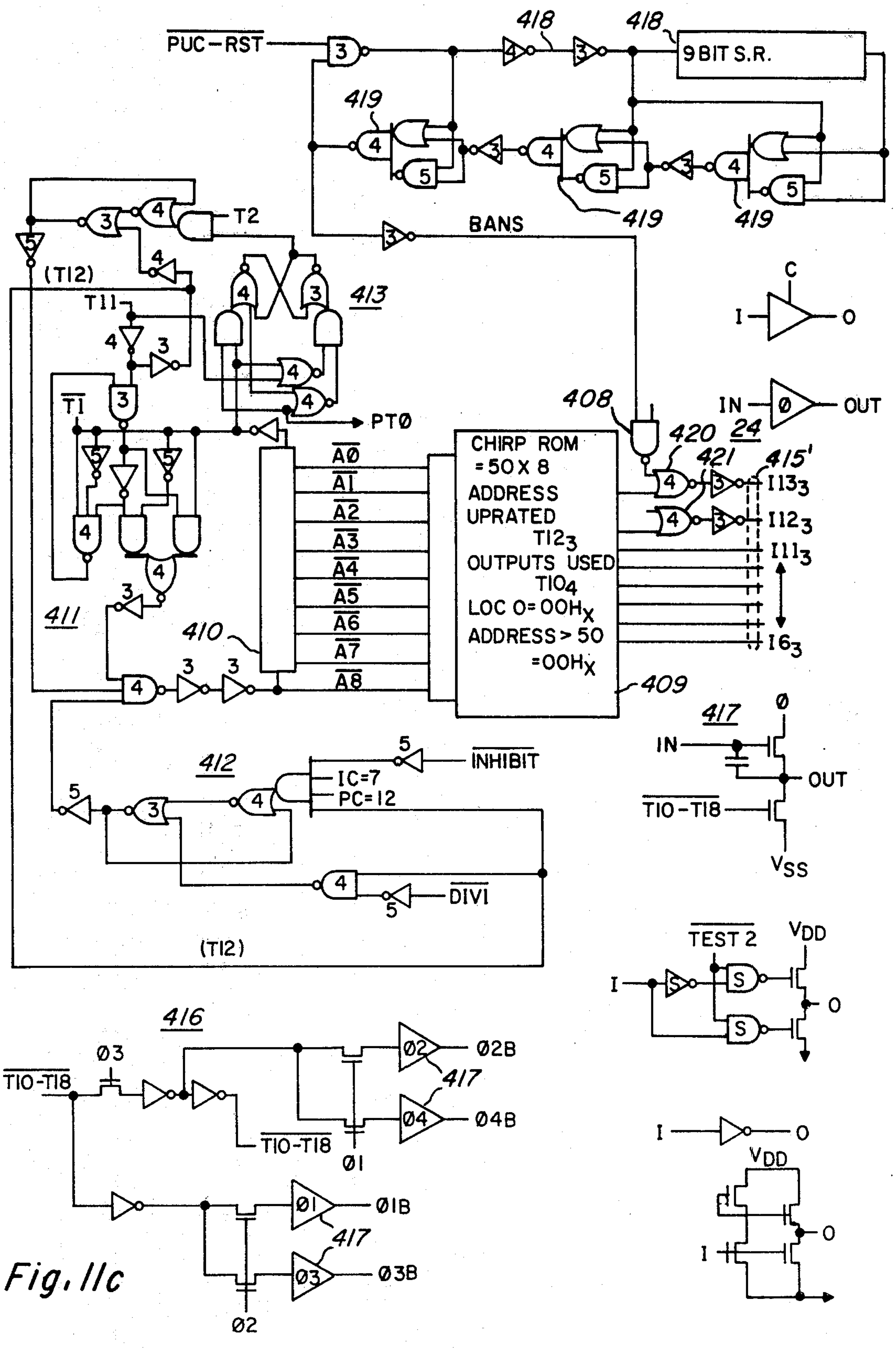
Figures 12A, 12B:
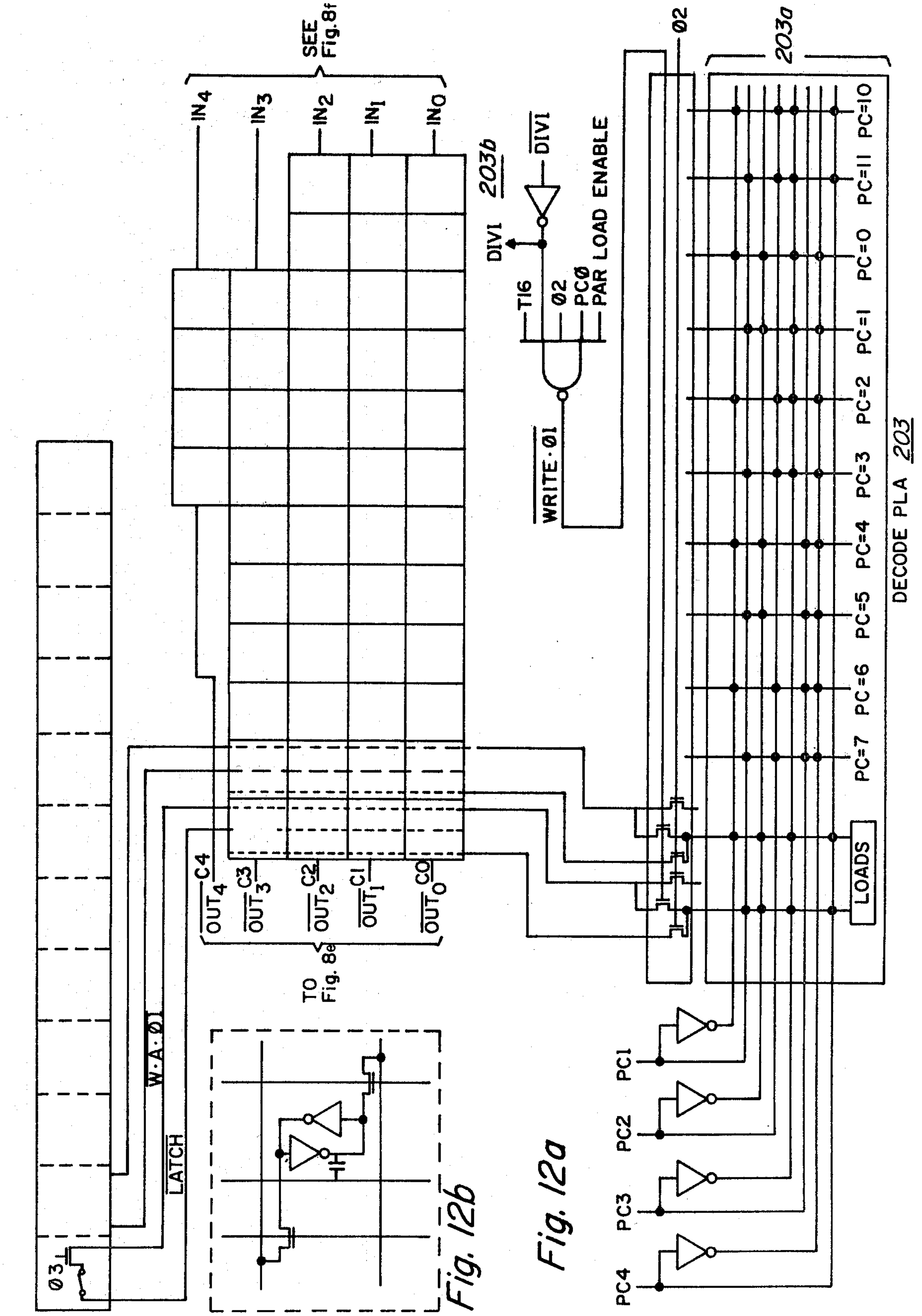
FIGS. 12*a* and 12*b* are schematic diagrams of the parameter.

Recoding logic 301 couples K-stack 302 to array multiplier 401 (FIGS. 10*a*–10*c*). Recoding logic 301 includes four identical recoding stages 312*a*–312*d*, only one of which, 312*a*, is shown in detail. The first stage of the recoding logic, 313, differs from stages 312*a*–312*d* basically because there is, of course, no carry, such as occurs on input A in stages 312*a*–312*d*, from a lower order stage. Recoding logicoutputs $\overline{+2}$, $\overline{-2}$, $\overline{+1}$ and $\overline{-1}$ to each stage of a five stage array multiplier 401, except for stage zero which receives only $\overline{-2}$, $\overline{+1}$ and $\overline{-1}$ outputs. Effectively recoding logic 301 permits array multiplier to process, in each stage thereof, two bits in lieu of one bit of information, using Booth's algorithm. Booth's algorithm is explained in "Theory and Application of Digital Signal Processing", published by Prentice-Hall 1975, at pp. 517–18.

The K10 coefficient and energy are stored in E10 loop 304. E10 loop preferably comprises a twenty stage serial shift register; ten stages 304*a* of E10 loop 304 are preferably coupled in series and another ten stages 304*b* are also coupled in series but also have parallel outputs and inputs to K-stack 302. The appropriate parameter, either energy or the K10 coefficient, is transferrred from E10 loop 304 to K-stack 302 via gates 315 which are responsive to a NOR gate 316 for transferring the energy parameter from E10 loop 304 to K-stack 302 at time period T10 and transferring coefficient K10 from E10 loop 304 to K-stack 302 at time period T20. NOR gate 306 also controls recirculation control gate 316 for inhibiting recirculation in K-stack 302 when data is being transferred.

KE10 transfer register 303 facilitates the transferring of energy or the K1–K10 speech coefficients which are stored in E10 loop 304 or K-stack 302 to subtractor 308 and delay circuit 309 via selector 307. Register 303 has nine stages provided by paired inverters and a tenth stage being effectively provided by selector 307 and gate 317 for facilitating the transfer of ten bits of information either from E10 loop 304 or K-stack 302. Data is transferred from K-stack 302 to register 303 via transfer gates 318 which are controlled by a Transfer K (TK) signal generated by decoder portion 511*b* of timing PLA 511 (FIGS. 7*a*–7*d*). Since the particular parameter to be interpolated and thus shifted into register 303 depends upon the particular parameter count in which the synthesizer is operating and since the particular parameter available to be outputted from K-stack 302 is a function of particular time period the synthesizer is operating in, the TK signal comes up at T9 for the pitch parameter, T8 for the K1 parameter, T7 for the K2 parameter and so forth, as is shown in FIGS. 7*a*–7*d*). The energy parameter or the K10 coefficient is clocked out of E10 loop 304 into register 303 via gates 319 in response to a TE10 signal generated by a timing PLA 511. After each interpolation, that is during the B cycle,data is transferred from register 303 into (1) K-stack 302 via gates 318 under control of signal TK, at which time recirculation gates 314 are turned off by gate 315, or (2) E10 loop 304 via gates 319.

A ten bit pitch parameter is stored in a pitch register 305 which includes a nine stage shift register as well as recirculation elements 305*a* which provide another bit of storage. The pitch parameter normally recirculates in register 305 via gate 305*a* except when a newly interpolated pitch parameter is being provided on line 320, as controlled by pitch interpolation control logics 306. The output of pitch 305 (PT0) or the output from register 303 is applied by selector 307 to gate 317. Selector 307 is also controlled by logics 306 for normally coupling the output of register 303 to gate 317 except when the pitch is to be interpolated. Logics 306 are responsive for outputting pitch to subtractor 308 and delay 309 during the A cycle of PC=1 and for returning the interpolated pitch value on line 320 on the B cycle of PC=1 to register 305. Gate 317 is responsive to a latch 321 for only providing pitch, energy or coefficient information to subtractor 308 and delay circuit 309 during the interpolation. Since the data is serially clocked, the information may be started to be clocked during an A portion and PC0 may switch to a logical one sometime during the transferring of the information from register 303 or 305 to subtractor 308 or delay circuit 309, and therefore, gate 317 is controlled by an A cycle latch 321, which latch is set with PC0 at the time a transfer coefficient (TK)transfer E10 (TE10) or transfer pitch (TP) signal is generated by timing PLA 511.

Figure 7A:
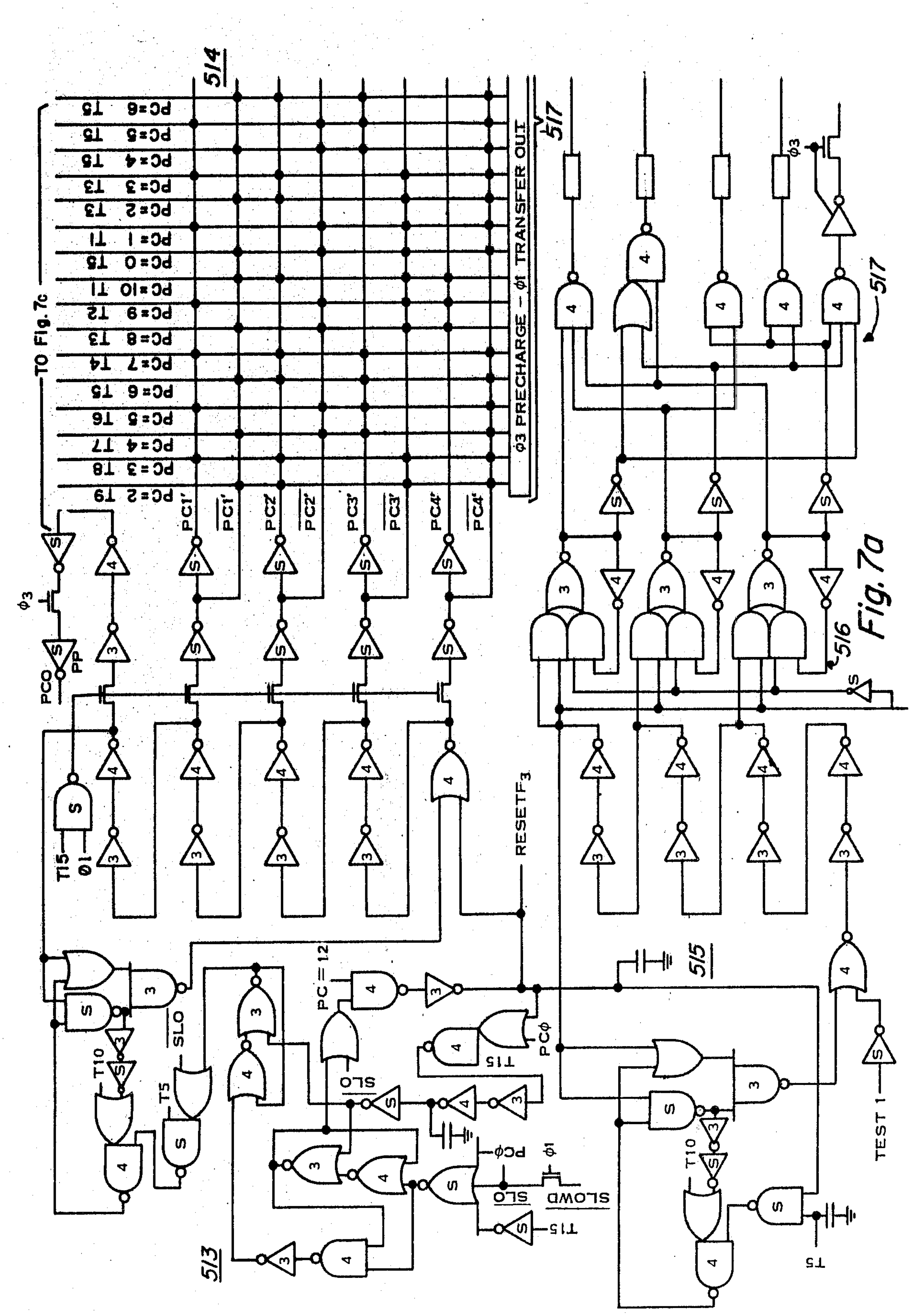
FIGS. 7*a*–7*d* form a composite logic diagram of the synthesizer's timing circuits.

The output of gate 317 is applied to subtractor 308 and delay circuit 309. The delay in delay circuit 309 depends on the state of DIV1–DIV8 signals generated by interpolation counter 515 (FIG. 7*a*). Since the data exits gate 317 with the least significant bit first, by delaying the data in delay circuit 309 a selective amount, and applying the output to adder 310 along with the output of subtractor 308, the more delay there is in circuit 309, the smaller the effective magnitude of the difference from subtractor 308 which is subsequently added back in by adder 310. Delay circuit 311 couples adder 310 back into registers 303 and 305. Both delay circuits 309 and 311 can insert up to three bits of delay and when delay circuit 309 is at its maximum, delay circuit 311 isat its minimum delay and vice versa. A NAND gate 322 couples the output of subtractor 308 to the input of adder 310. Gate 322 is responsive to the output of an OR gate 323 which is in turn responsive to INHIBIT from inverter 236 (FIGS. 8*c* and 9*b*). Gates 322 and 323 act to zero the output from subtractor 308 when the INHIBIT signal comes up unless the interpolation counter is at IC0 in which case the present values in K-stack 302, E10 loop 304 and pitch register 305 are fully interpolated to their new target values in a one step interpolation. When an unvoiced frame (FIG. 6) is supplied to the speech synthesis chip, coefficients K5–K10 are set to zero by the action of gate 324 which couples delay circuit 311 to shift register 325 whose output is then coupled to gates 305*a* and 303′. Gate 324 isresponsive to the zero parameter (ZPAR) signal generated by gate 237 (FIGS. 8*c* and 9*b*).

Gate 326 disables shifting in the 304*b* portion of E10 loop 304 when a newly interpolated value of energy or K10 is being inputted into portion 304*b* from register 303. Gate 327 controls the transfer gates coupling the stages of register 303, which stages are inhibited from serially shifting data therebetween when TK or TE10 goes high during the A cycle, that is, when register 303 is to be receiving data from either K-stack 302 or E10 loop 304 as controlled by transfer gates 318 or 319, respectively. The output of gates 327 is also connected to various stages of shift register 325 and to a gate coupling 303′ with register 303. Whereby up to the three bits which may trail the ten most significant bits after an interpolation operation may be zeroed.

Array Multiplier Logic Diagram

FIGS. 10*a*–10*c* form a composite logic diagram of array multiplier 401. Array multipliers are sometimes referred to as Pipeline Multipliers. For example, see "Pipeline Multiplier" by Granville E. Ott, published by the University of Missouri.

Array multiplier 401 has five stages, stage 0 through stage 4, and a delay stage. The delay stage is used in array multiplier 401 to give it the same equivalent delay as the array multiplier shown in U.S. Pat. No. 4,209,844. The input to array multiplier 401 is provided by signals $MR_0$–$MR_{13}$, from multiplier multiplexer 415. $MR_{13}$ is the most significant bit while $MR_0$ is the least significant bit. Another input to array multiplier are the aforementioned +2, −2, +1 and −1 outputs from recoding logic 301 (FIG. 9*d*). The output from array multiplier 401, $P_{13}$–$P_0$, is applied to summer multiplexer 402. The least significant bit thereof, P0, is in this embodiment always made a logical one because doing so establishes the mean of the truncation error as zero instead of $-\frac{1}{2}$ LSB which value would result from a simple truncation of a two's complement number.

Array multiplier 401 is shown by a plurality of box elements labeled A-1, A-2, B-1, B-2, B-3 or B-C. The specific logic elements making up these box elements are shown on the right-hand side of composite FIGS. 10*a* and 10*b* in lieu of repetitively showing these elements and making up a logic diagram of array multiplier 401, for simplicity sake. The A-1 and A-2 block elements make up stage zero of the array multiplier and thus are each responsive to the −2, +1 and −1 signals outputted from decoder 313 and are further responsive to MR2-MR13. When multiplies occur in array multiplier 401, the most significant bit is always maintained in the left most column elements while the partial sums are continuously shifted toward the right. Inasmuch as each stage of array multiplier 401 operates on two binary bits, the partial sums, labeled Σn, are shifted to the right two places. Thus no A type blocks are provided for the MR0 and MR1 data inputs to the first stage. Also, since each block in array multiplier 401 is responsive to two bits of information from K-stack 302 received via recoding logic 301, each block is alsoresponsive to two bits from multiplier multiplexer 415, which bits are inverted by inverters 430, which bits are also supplied in true logic to the B type blocks.

Filter and Excitation Generator Logic Diagram

FIGS. 11*a*–11*d* form a composite, detailed logic diagram of lattice filter and excitation generator 24 (other than array multiplier 401) and output section 25. In filter and excitation generator 24 is a summer 404 which is connected to receive at one input thereof either the true or inverted output of array multiplier 401 (see FIGS. 10*a*–10*c*) on line P0–P13 via summer multiplexer 402. The other input of adder 404 is connected via summer multiplexer 402 to receive either the output of adder 404 (at T10–T18), the output of delay stack 406 on lines 440–453 at T20–T7 and T9), the output of Y-latch 403 (at T8) or a logical zero from Φ3 precharge gate 420 (at T19 when no conditional discharge is applied to this input). The reasons these signals are applied at these times can be seen from FIG. 8 of the aforementioned U.S. Pat. No. 4,209,844; it is to be remembered of course, that the time period designations differ as discussed with reference to FIG. 5 hereof.

The output of adder 404 is applied to delay stack 406, multiplier multiplexer 415, one period delay gates 414 and summer multiplexer 402. Multiplier multiplexer 415 includes one period delay gates 414 which are generally eqivalent to one period delay 34′ of FIG. 7 in U.S. Pat. No. 4,209,844. Y-latch 403 is connected to receive the output of delay stack 406. Multiplier multiplexer 415 selectively applies the output from Y-latch 403, one period delay gates 414, or the excitation signal on bus 415′ to the input MR0–MR13 of array multiplier 401. The input D0–D13 to delay stack 406 are derived from the outputs of adder 404. The logics for summer multiplier 402, adder 404, Y-latch 403, multiplier multiplexer 415 and one period delay circuit 414 are only shown in detail for the least significant bit as enclosed by dotted line reference A. The thirteen most significant bits in the lattice filter also are provided by logics such as those enclosed by the reference line A, which logics are denoted by long rectangular phantom line boxes labeled "A". The logics for each parallel bit being processed in the lattice filter are not shown in detail for sake of clarity. The portions of the lattice filter handling bits more significant than the least significant bit differ from the logic shown for elements 402, 403, 404, 415, and 414 only with respect to the interconnections made with truncation logics 425 and bus 415′ which connects to UV gate 408 and chirp ROM 409. In this respect, the output from UV gate 408 and chirp ROM 409 is only applied to inputs I13–I6 and therefore the input labeled $I_x$ within the reference A phantom line is not needed for the six least significant bits in the lattice filter. Similarly, the output from the Y-latch 403 is only applied for the ten most significaint bits, $YL_{13}$ through $YL_4$, and therefore the connection labeled YLx within the reference line A is not required for the four least significant bits in the lattice filter.

Delay stack 406 comprises 14 nine bit long shift registers, each stage of which comprise inverters clocked on Φ4 and Φ3 clocks. As is discussed is U.S. Pat. No. 4,209,844, the delay stack 406 which generally corresponds to shift register 35′ of FIG. 7 of the aforementioned patent, is only shifted on certain time periods. This is accomplished by logics 416 whereby Φ1B–Φ4B clocks are generated from T10–T18 timing signal from PLA 512 (FIGS. 7*a* and 7*d*). The clock buffers 417 in circuit 416 are also shown in detail in FIG. 11*c*.

Delay stack 406 is nine bits long whereas shift register 35′ in FIG. 7 of U.S. Pat. No. 4,209,844 was eight bits long; this difference occurs because the input to delay stack 406 is shown as being connected from the outputof adder 404 as opposed to the output of one period delay circuit 414. Of course, the input to delay stack 406 could be connected from the outputs of one period delay circuit 414 and the timing associated therewith modified to corespond with that shown in U.S. Pat. No. 4,209,844.

The data handled in delay stack 406, array multiplier 401, adder 404, summer multiplexer 402, Y-latch 403, and multiplier multiplexer 415 is preferably handled in two's complement notation.

Unvoiced generator 407 is a random noise generator comprising a shift register 418 with a feedback term supplied by feedback logics 419 for generating pseudorandom terms in shift register 418. An output is taken therefrom and is applied to UV gate 408 which is also responsive to OLDP from latch 208*d* (FIG. 8*c*). Old pitch latch 208*d* controls gate 408 because pitch=0 latch 208*b* changes state immediatelywhen the new speech parameters are inputted to register 205. However, since this occurs during interpolation count ICO and since, during an unvoiced condition the new values are not interpolated into K-stack 302, E10 loop 304 and pitch register 305 until the following ICO, the speech excitation value cannot change from a periodic excitation from chirp ROM 409 to a random excitation from unvoiced generator 407 until eight interpolation cycles have occurred. Gate 420 nors the output of gate 408 into the most significant bit of the excitation signal, $I_{13}$, thereby effectively causing the sign bit to randomly change during unvoiced speech. Gate 421 effectively forces the most significant bit of the excitation signal, $I_{12}$, to a logical one during unvoiced speech conditions. Thus the combined effect of gates 408, 420 and 421 is to cause a randomly changing sign to be associated with a steady decimal equivalent value of 0.5 to be applied to the lattice filter and Filtering Excitation Generator 24.

During voiced speech, chirp ROM 409 provides an eight bit output on lines $I_6$–$I_{13}$ to the lattice filter. This output comprises forty-one successively changing values which, when graphed, represent a chirp function. The contents of ROM 409 are listed in Table VIII; ROM 409 is set up to invert its outputs and thus the data is stored therein in complemented format. The chirp function value and the complemented value stored in the chirp ROM are expressed in two's complement hexadecimal notation. ROM 409 is addressed by an eight bit register 410 whose contents are normally updated during each cycle through the lattice filter by add one circuit 411. The output of register 410 is compared with the contents of pitch register 305 in a magnitude comparator 403 for zeroing the contents of 410 when the contents of register 410 become equal to or greater than the contents of register 305. ROM 409, which is shown in greater detail in FIGS. **14*a*–14*b*, is arranged so that addresses greater than 110010 cause all zeroes to be outputted on lines $I_{13}$–$I_6$ to multiplier multiplexer 415. Zeros are also stored in address locations 41–51**. Thus, the chirp may be expanded to occupy up to address location fifty, if desired.

RANDOM ACCESS MEMORY LOGIC DIAGRAM

Referring now to FIGS. **12*a*–12*b*, there is shown a composite detailed logic diagram of RAM 203. RAM 203 is addressed by address on PC1–PC4, which address is decoded in a PLA 203*a* and defines which coded parameter is to be inputted into RAM 203. RAM 203 stores the twelve decoded parameters, the parameters having bit lengths varing between three bits and five bits according to the decoding scheme described with reference to FIG. 6. Each cell, reference B, of RAM 203 is shown in greater detail in FIG. 12*b*. Read/-Write control logic 203*b* is responsive to T1, DIV1, PC0 and parameter load enable for writing into the RAM 203 during the A cycle of each parameter count during interpolation count zero when enabled by parameter load enable from logics 238 (FIG. 8*c*). Data is inputted to RAM 203 on lines IN0–IN4 from register 205 as shown in FIGS. 8*c* and 8*f* and data is outputted on lines C0–C4 toROM 202 as is shown in FIGS. 8*f* and 8*e***.

Parameter Read-Only-Memory Logic Diagram

In FIGS. **13*a*–13*c*, there is shown a logic diagram of ROM 202. ROM 202 is preferably a virtual ground ROM of the type disclosed in U.S. Pat. No. 3,934,233. Address information from ROM 202 and from parameter counter 513 are applied to address buffers 202*b* which are shown in detailat reference A. The NOR gates 202*a* used in address buffers 202*b* are shown in detail at reference B. The outputs of the address buffers 202*b* are applied to an X-decoder 202*c* or to a Y-decoder 202*d*. The ROM is divided into ten sections labeled reference C, one of which is shown in greater detail. The outline for output line from each of the sections is applied to register 201 via inverters as shown in FIGS. 8*e* and 8*f*. X-decoder selects one of fifty-four X-decode lines while Y-decoder 202*d* tests for the presence or nonpresence of a transistor cell between an adjacent pair of diffusion lines, as is explained in greater detail in the aforementioned U.S. Pat. No. 3,934,233. The data preferably stored in ROM 202** of this embodiment is listed in Table VI.

Chirp Read-Only-Memory Logic Diagram

FIGS. **14*a*–14*b* form a composite diagram of chirp ROM 409. ROM 409 is addressed via address lines $\overline{A_0}$–$\overline{A_8}$ from register 410 (FIG. 11*c*) and output information on lines $I_6$–$I_{11}$ to multiplier multiplexer 415 and lines $I_{m1}$ and $I_{m2}$ to gates 421 and 420, all which are shown in FIGS. 11*a*–11*d*. As was previously discussed with reference to FIGS. 11*a*–11*d*, chirp ROM outputs all zeros after a predetermined count is reached in register 410, which, in this case is the count equivalent to a decimal 51. ROM 409 includes a Y-decoder 409*a* which is responsive to the address on lines $\overline{A_0}$ and $\overline{A_1}$ (and $A_0$ and $A_1$) and an X-decoder 409*b*** which is responsive to the address on lines $\overline{A_2}$ through $\overline{A_5}$ (and $A_2$–$A_5$).

ROM 409 also includes a latch **409*c* which is set when decimal 51 is detected on lines $\overline{A_0}$–$\overline{A_5}$ according to line 409*c* from a decoder 409*e*. Decoder 409*e* also decodes a logical zero on lines $\overline{A_0}$–$\overline{A_8}$ for resetting latch 409*c*. ROM 409 includes timing logics 409*f* which permit data to be clocked in via gates 409*g* at time period T12. At this time decoder 409*e* checks to determine whether either a decimal 0 or decimal 51 is occurring on address lines $\overline{A_0}$–$\overline{A_8}$. If either condition occurs, latch 409*c***, which is a static latch, is caused to flip.

An address latch **409*h* is set at time period T13 and reset at time period T11. Latch 409*h* permits latch 409*c* to force a decimal 51 onto lines $\overline{A_0}$–$\overline{A_5}$ when latch 409*c* is set. Thus, for addresses greater than 51 address register 410, the address is first sampled at time period T12 to determine whether it has been reset to zero by reset logic 412 (FIG. 11*c*) for the purpose of resetting latch 409*c* and if the address has not been reset to zero then whatever address has been inputted on lines $\overline{A_0}$–$\overline{A_8}$ is written over by logics 409*j* at T13. Of course, at location 51 in ROM 409 will be stored all zeros on the output lines I6–I11, IM1 and IM2. Thus by the means of logics 409*c*, 409*h* and 409*j* addresses of a preselected value, in this case a decimal 51, are merely tested to determine whether a reset has occurred but are not permitted to address the array of ROM cells via decoders 409*a* and 409*b*. Addresses between a decimal 0 and 50 address the ROM normally via decoders 409*a* and 409*b*. The ROM matrix is preferably of the virtual ground type described in U.S. Pat. No. 3,934,233. As aforementioned, the contents of ROM 409 are listed in Table VIII. The chirp function is located at addresses 00–40 while zeros are located at addresses 41–51**.

Truncation Logic and Digital-To-Analog Converter

Turning again to FIGS. **11*a*–11*d*, the truncation logic 425 and Digital-to-Analog (D/A) converter are shown in detail. Truncation logic 425 includes circuitry for converting the two's complement data on $YL_{13}$–$YL_{14}$ to sign magnitude data. Logics 425*a* test the MSB from Y-latch 403** on line $YL_{13}$ for the purpose of generating a sign bit and for controlling the two's complement to sign magnitude conversion accomplished by logics 425*c*. The sign bit is supplied in true and false logic on lines D/Asn and D/Asn to D/A converter 426.

Logics 425*c* convert the two's complement data from Y-latches 403 in lines $YL_{10}$–$YL_4$ to simple magnitude notation on lines $D/A_6$–$D/A_0$. Only the logics 425*c* associated with YL10 are shown in detail for sake of simplicity.

Logics 425*b* sample the $YL_{12}$ and $YL_{11}$ bits from the Y-latches 403 and perform a magnitude truncation function thereon by forcing outputs $\overline{D/A_6}$ through $\overline{D/A_0}$ to a logical zero (i.e., a value of one if the outputs were in true logic) wherever either $YL_{12}$ or $YL_{11}$ is a logical one and $YL_{13}$ is a logical zero, indicating that the value is positive or either $YL_{12}$ or $YL_{11}$ is a logical zero and $YL_{13}$ is a logical one, indicating thatthe value is negative (and complemented, of course). Whenever one of these conditions occurs, a logical zero appears on line 427 and Vss is thereby coupled to the output buffer 428 in each of logics 425*c*. The magnitude function effectively truncates the more significant bits on $YL_{11}$ and $YL_{12}$. It is realized that this is somewhat unorthodox trucation, since normally the less significant bits are truncated in most other circuits where truncation occurs. However, in this circuit, large positive or negative values are effectively clipped. More important digital speech information, which has smaller magnitudes, is effectively amplified by a factor of four by this truncation scheme.

Figure 23A:
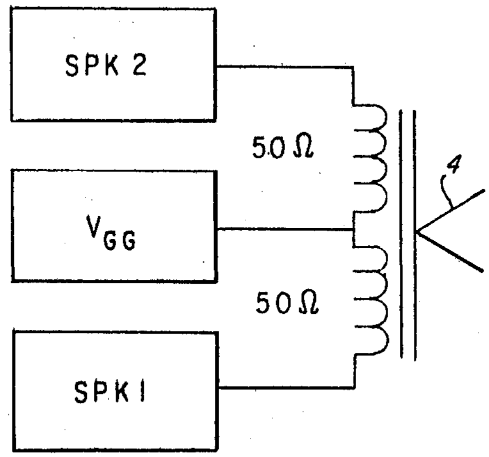

The outputs $\overline{D/A_6}$–$\overline{D/A_0}$, along with $\overline{D/Asn}$ and D/Asn, are coupled to D/A converter 426. D/A converter 426 preferably has seven MOS devices 429 coupled to the seven lines $D/A_6$ through $D/A_0$ from truncation logics 425. Each device 429 preferably includes a MOS transistor whose gates is coupled to one of the lines $D/A_6$–$D/A_0$ and a series connected implanted load transistor 429*b*. Devices 429 are arranged, by controlling their length to width ratios, to act as current sources, the device 429 coupled to $D/A_6$ sourcing twice as much current (when on) as the device 429 coupled to $D/A_5$. Likewise the devices 429 coupled to $D/A_5$ is capable of sourcing twice as much current as the device 429 coupled to $D/A_4$. This two to one current sourcing capability similarly applies to the remaining devices 429 coupled to the remaining lines $D/A_3$–$D/A_0$. Thus, device 429 coupled to $D/A_1$, is likewise capable of sourcing twice as much current as the device 429 coupled to $D/A_0$, but only one-half of that source by the device 429 coupled to $D/A_2$. All devices 429 are connected in parallel, one side of which are preferably coupled to Vss and the other side is preferably coupled to either side of the speaker 4 via transistors 430 and 431. Transistor 430 is controlled by D/Asn which is applied to its gates; transistor 431 is turned off and on in response to D/Asn. Thus, either transistor 430 or 431 is on depending on the state of the sign bit, D/Asn. The voice coil of speaker 4 preferably has a 100 ohm impedance and has a center tap connected to Vgg as shown in FIG. 23*a*. Thus, the signals on lines $D/A_6$–$D/A_0$ control the magnitude of current flow through the voice coil while the signals on lines D/Asn and D/Asn control the direction of that flow.

Figure 23B:
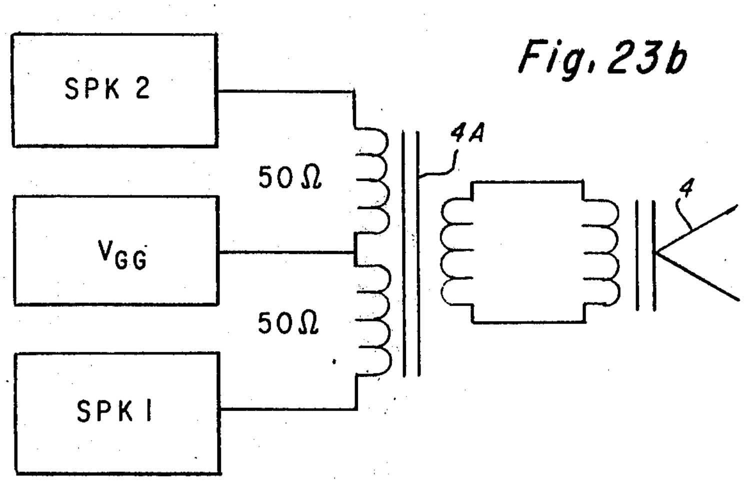

Alternatively to using a center-topped 100 ohm voice coil, a more conventional eight ohm speaker may be used along with a transformer having a 100 ohm center topped primary (connected to Vgg and transistors 430 and 431) and an eight ohm secondary (connected to the speaker's terminals) as shown in FIG. 23*b*.

It should now be appreciated by those skilled in the art that D/A converter 426 not only converts digital sign magnitude information on lines $\overline{D/A_6}$–$\overline{D/A_0}$ and D/Asn—$\overline{D/Asn}$ to an analog signal, but has effectively amplified this analog signal to sufficient levels to permit a speaker to be driven directly from the MOS synthesis chip 10 (or via the aforementioned transformer, if desired). Of course, those skilled in the art will appreciate that simple D/A converters, such as that disclosed here, will find use in other applications in addition to speech synthesis circuits.

THE SPEECH SYNTHESIZER CHIP

Figure 4A:
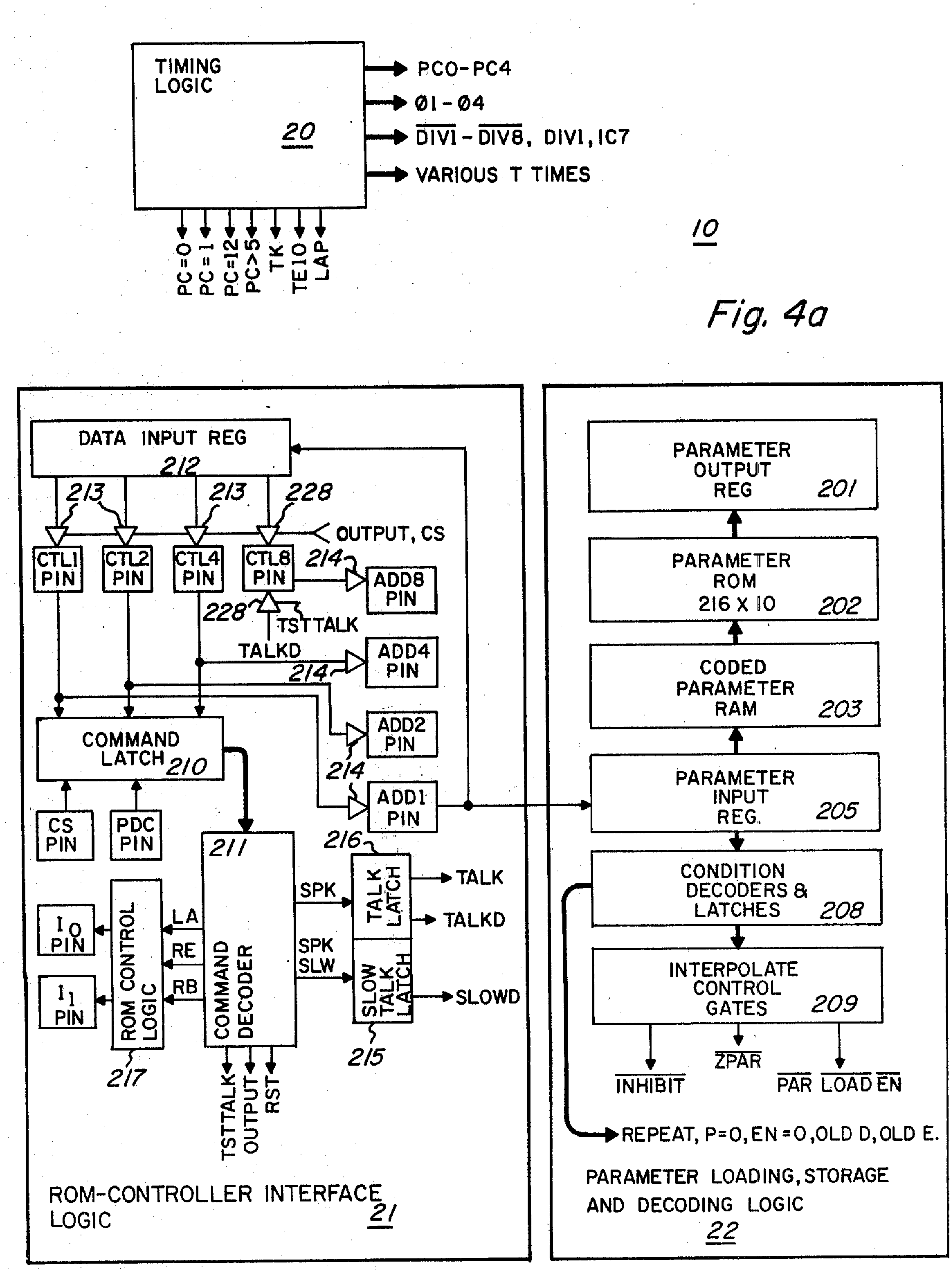
FIGS. 4*a* and 4*b* form a composite block diagram (when placed side by side) of the speech synthesizer chip.
Figure 4B:
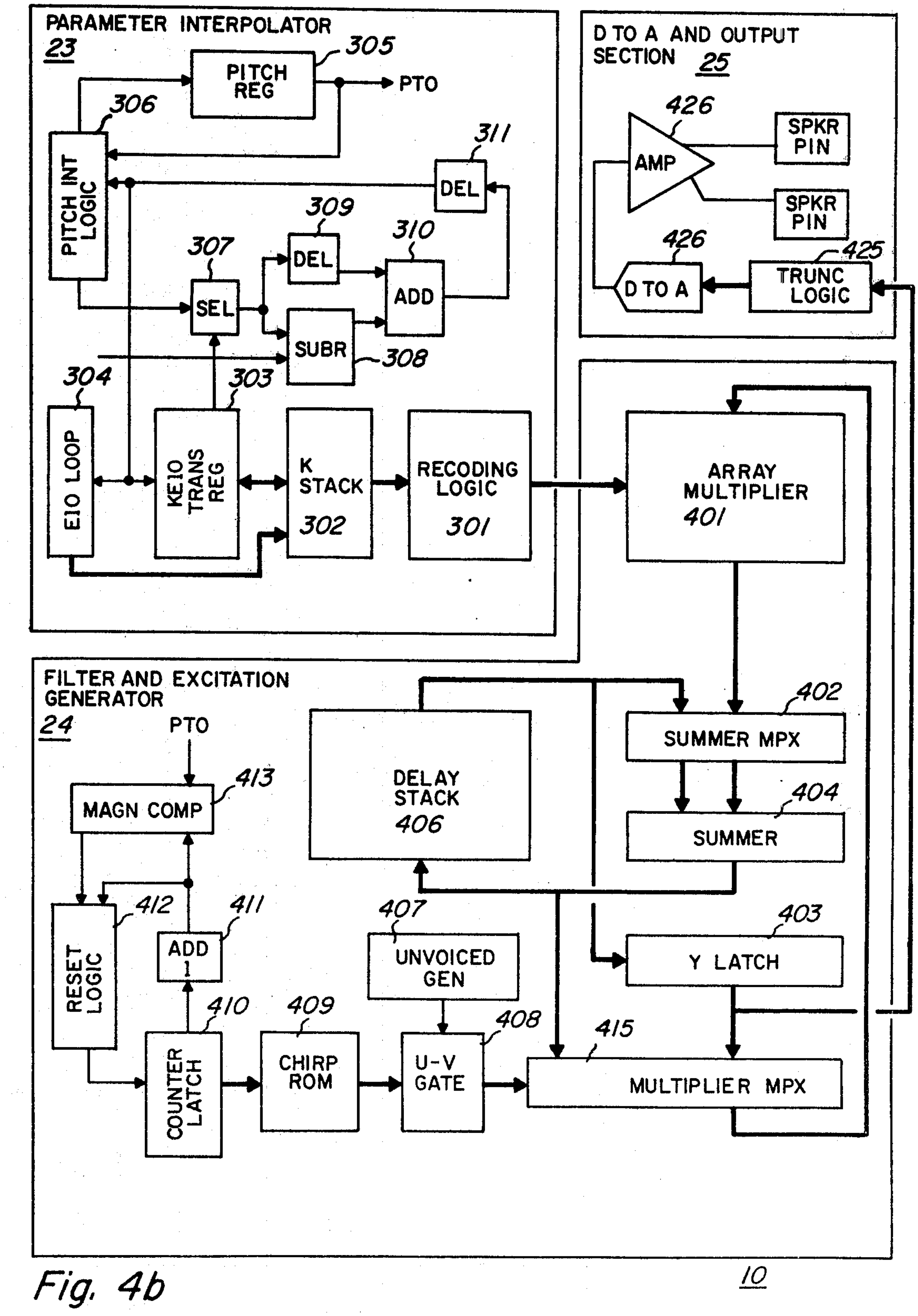
Figure 22:
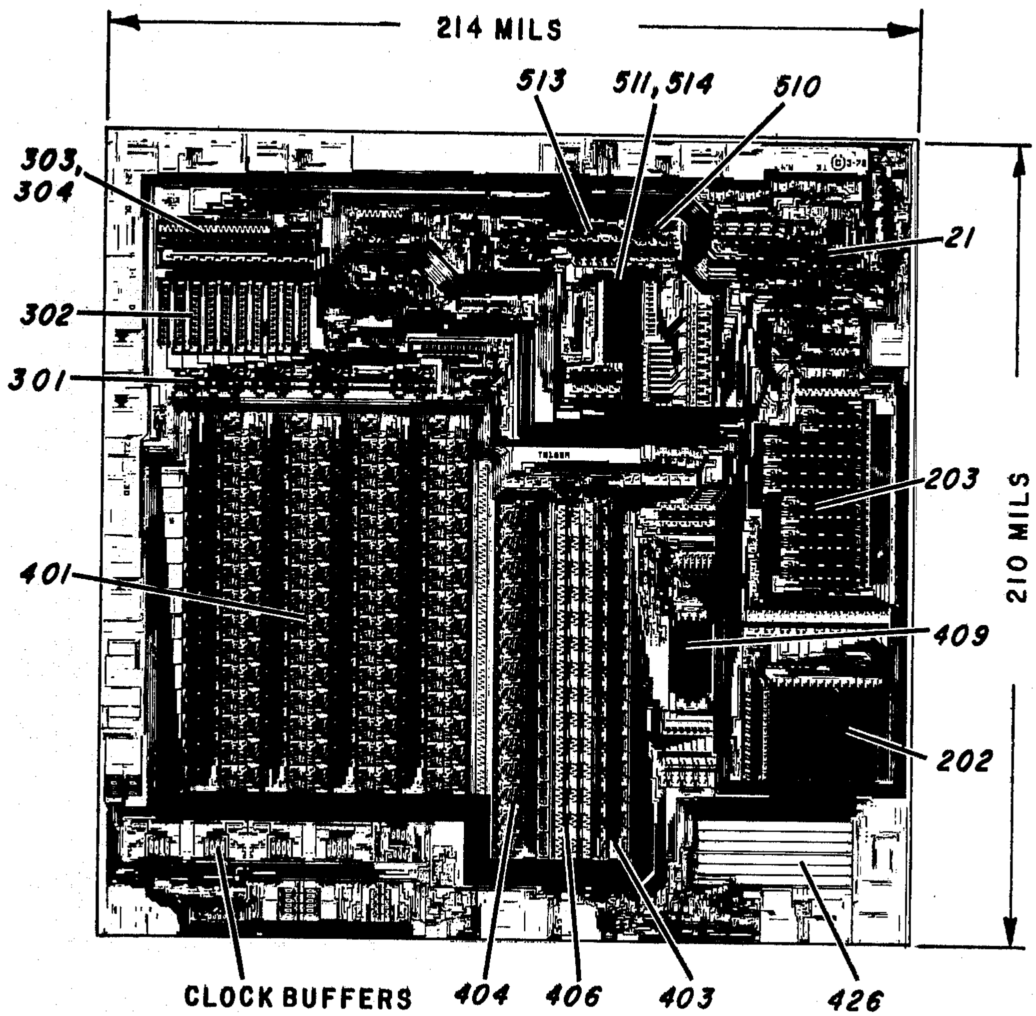
FIG. 22 is a plan view of the synthesizer chip herein described, showing the metal mask or metal pattern, enlarged about fifty times.

In FIG. 22 a greatly enlarged plan view of a semiconductor chip which contains the entire system of FIGS. 4*a* and 4*b* is illustrated. The chip is only about two hundred fifteen mils (about 0.215 inches) on a side. In the example shown, the chip is manufactured by the P-channel metal gate process using the following design rules: metal line width 0.25 mil; metal line spacing 0.25 mil; diffusion line width 0.15 mil; and diffusion line spacing 0.30 mil. Of course, as design rules are tightened with the advent of electron beam mask production or slice writing, and other techniques, it will be possible to further reduce the size of the synthesizer chip. The size of the synthesizer chip can, of course also be reduced by not taking advantage of some of the features preferably used on the synthesizer chip.

The total active area of speech synthesizer chip 10 is approximately 45,000 square mils.

It will also be appreciated by those skilled in the art, that other MOS manufacturing techniques, such as N-channel, complementary MOS (CMOS) or silicon gate processes may alternatively be used.

The various parts of the system are labeled with the same reference numerals previously used in this description.

CONTROLLER LOGIC DIAGRAMS

The controller used in the learning aid is preferably a microprocessor of the type described in U.S. Pat. No. 4,074,355, with modifications which are subsequently described. U.S. Pat. No. 4,074,355 is hereby incorporated herein by reference. It is to be understood, of course, that other microprocessors, as well as future microprocessors, may well find use in applications such as the speaking learning aid described herein.

The microprocessor of U.S. Pat. No. 4,074,355 is an improved version of an earlier microprocessor described in U.S. Pat. No. 3,991,305. One of the improvements concerned the elimination of digit driver devices so that arrays of light emitting diodes (LED's) forming a display could be driven directly from the microprocessor. As a matter of design choice, the display used with this learning aid is preferably a vacuum fluorescent (VF) display device. Those skilled in the art will appreciate that when LED's are directly driven, the display segments are preferably sequentially actuated while the display's common character position electrodes are selectively actuated according to information in a display register or memory. When VF displays are utilized, on the other hand, the common character position electrodes are preferably sequentially actuated while the segments are selectively actuated according to information in the display register or memory. Thus, the microprocessor of U.S. Pat. No. 4,074,355 is preferably altered to utilize digit scan similar to that used in U.S. Pat. No. 3,991,305.

The microprocessor of U.S. Pat. No. 4,074,355 is a four bit processor and to process alphanumeric information, additional bits are required. By using six bits, which can represent $2^6$ or 64 unique codes, the twenty-six characters of the alphabet, ten numerals as well as several special characters can be handled with ease. In lieu of converting the microprocessor of U.S. Pat. No. 4,074,355 directly to a six bit processor, it was accomplished indirectly by software pairing the four bit words into eight bit bytes and transmitting six of those bits to the display decoder.

Figure 7B:
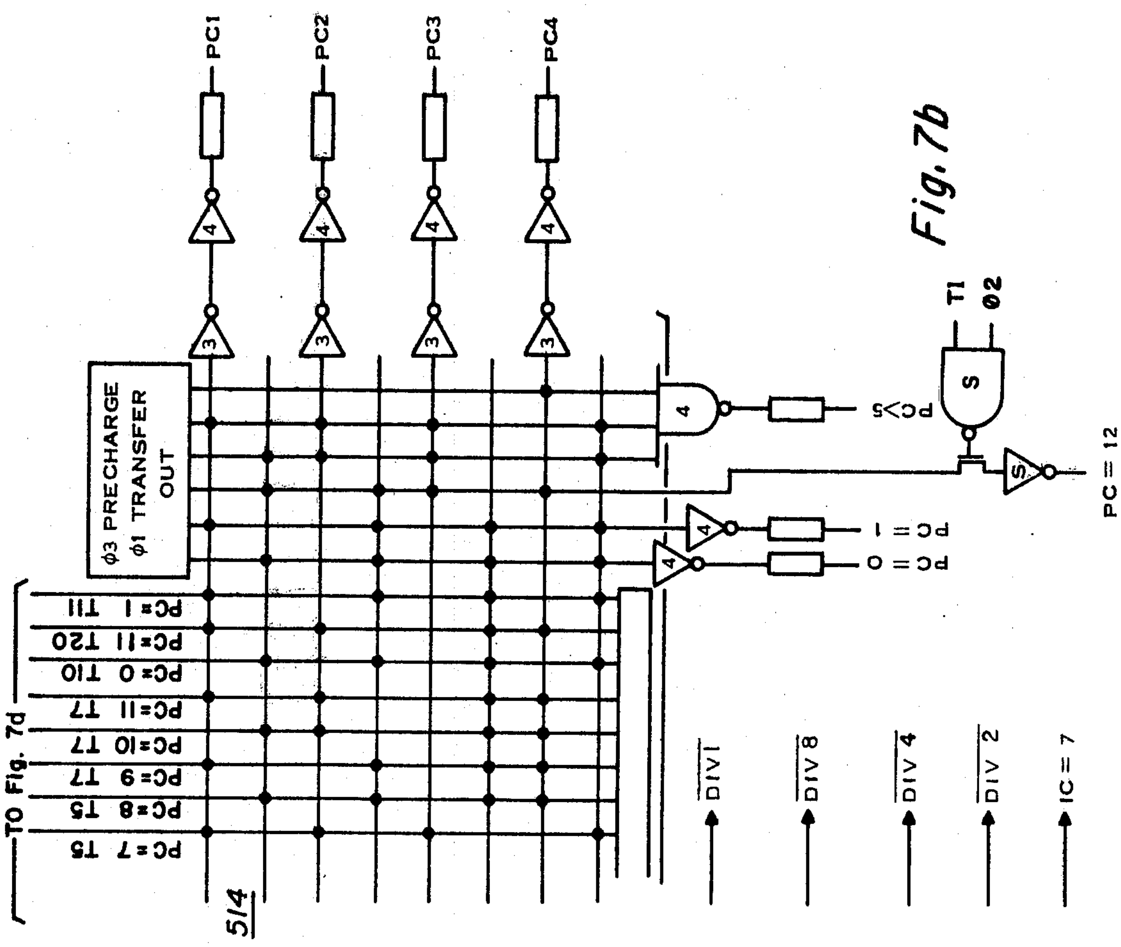
Figure 7C:
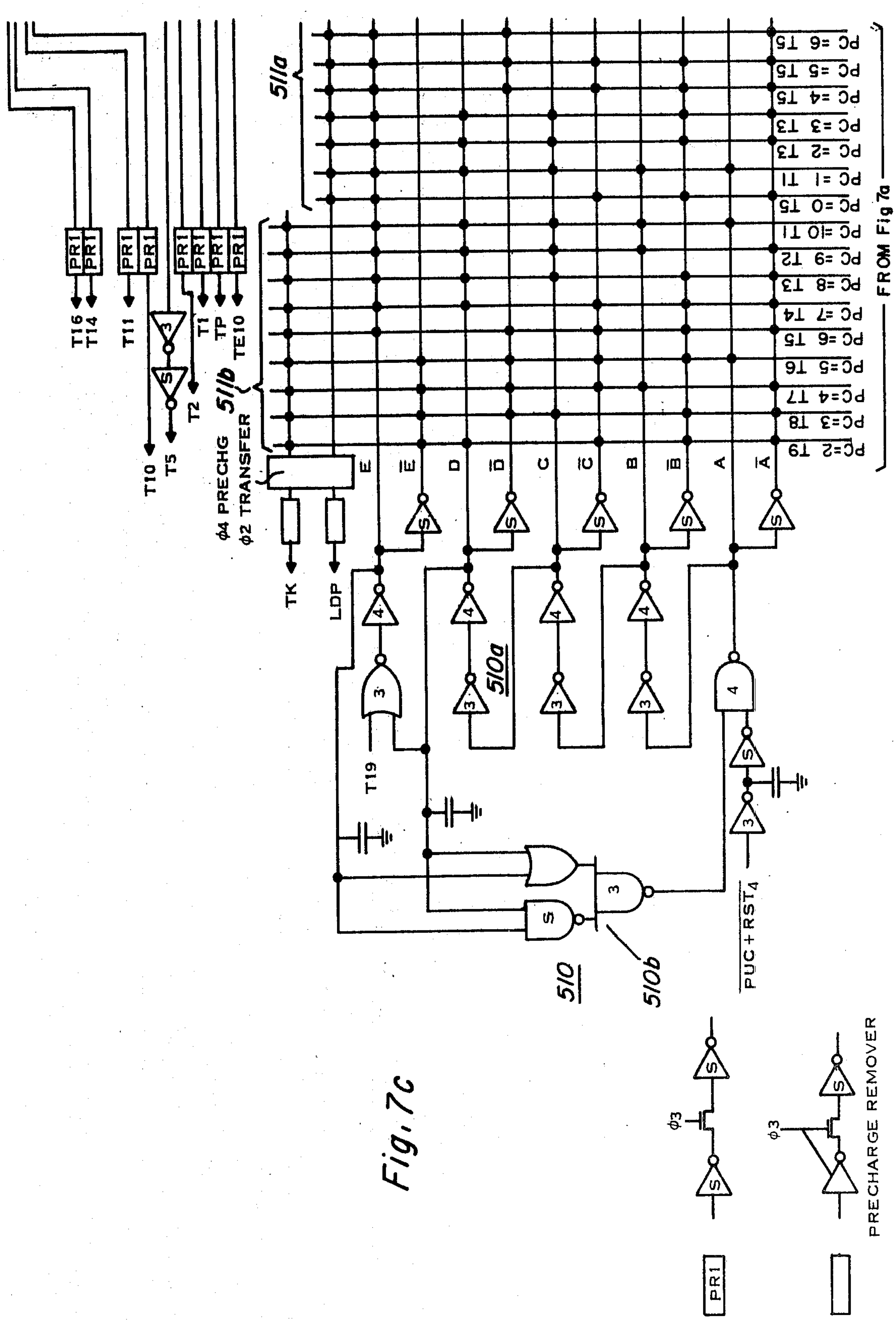
Figure 7D:
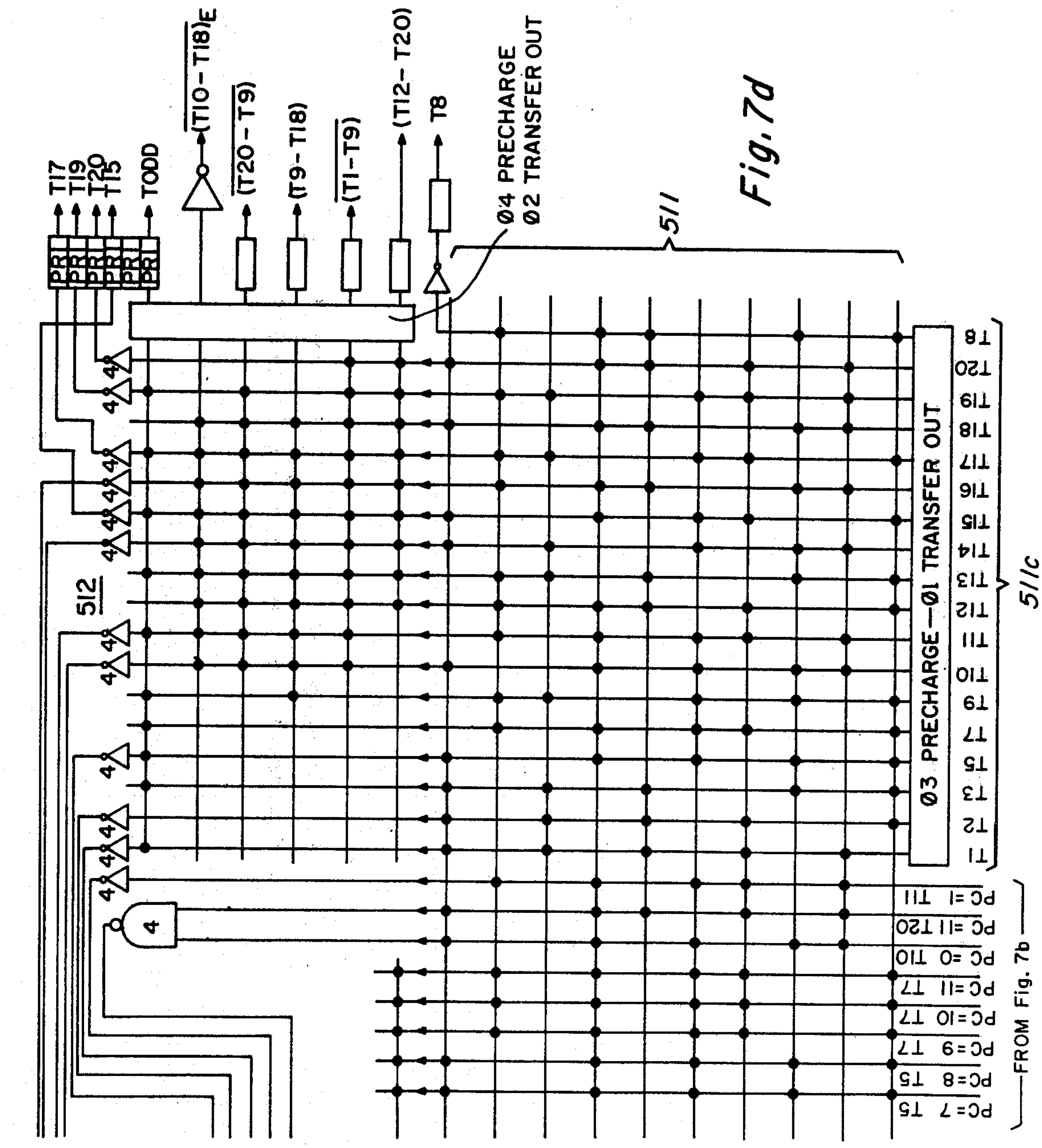
Figure 15A:
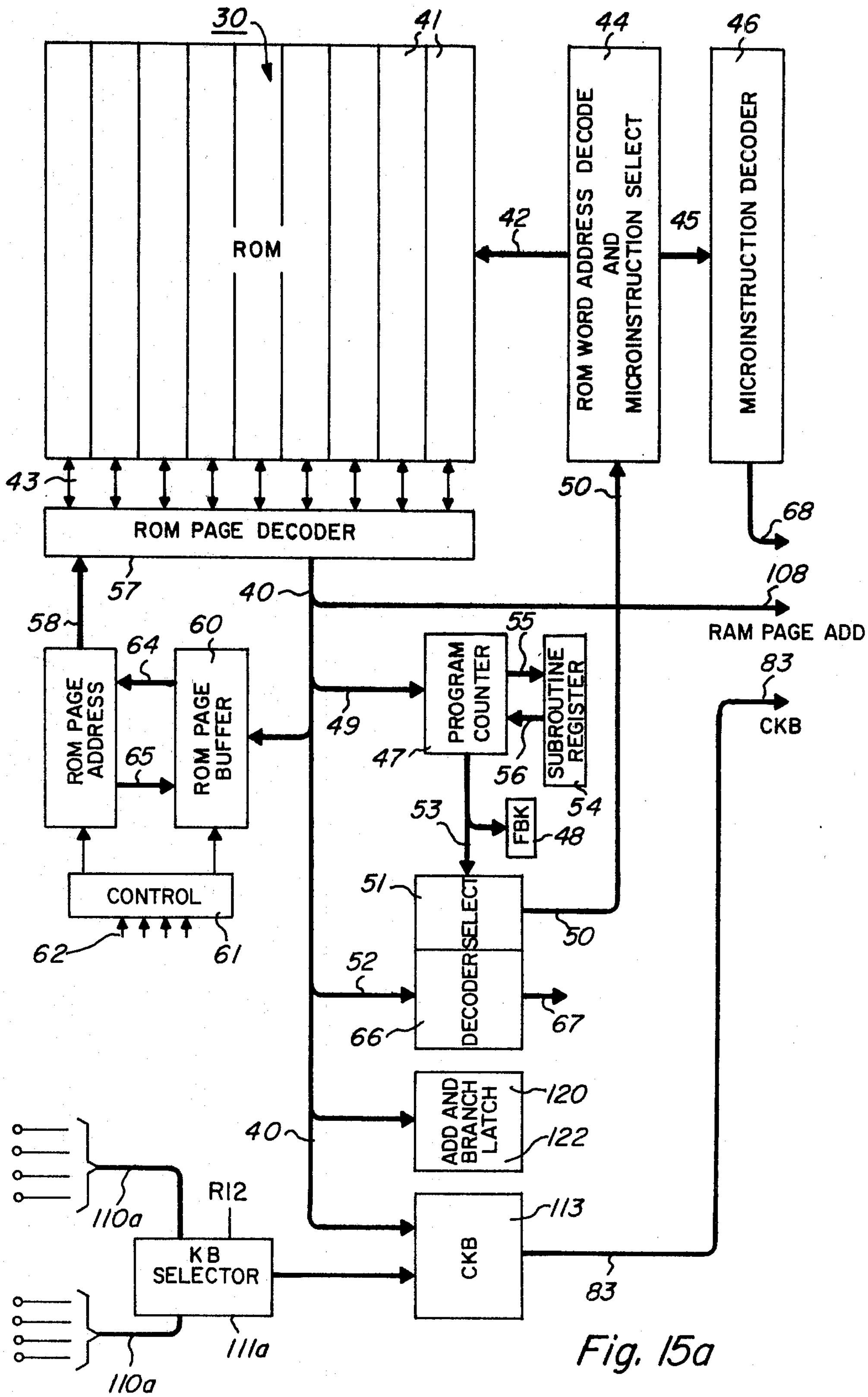
FIGS. 15*a* and 15*b* form a composite block diagram of a microprocessor which may be utilized as the controller.
Figure 15B:
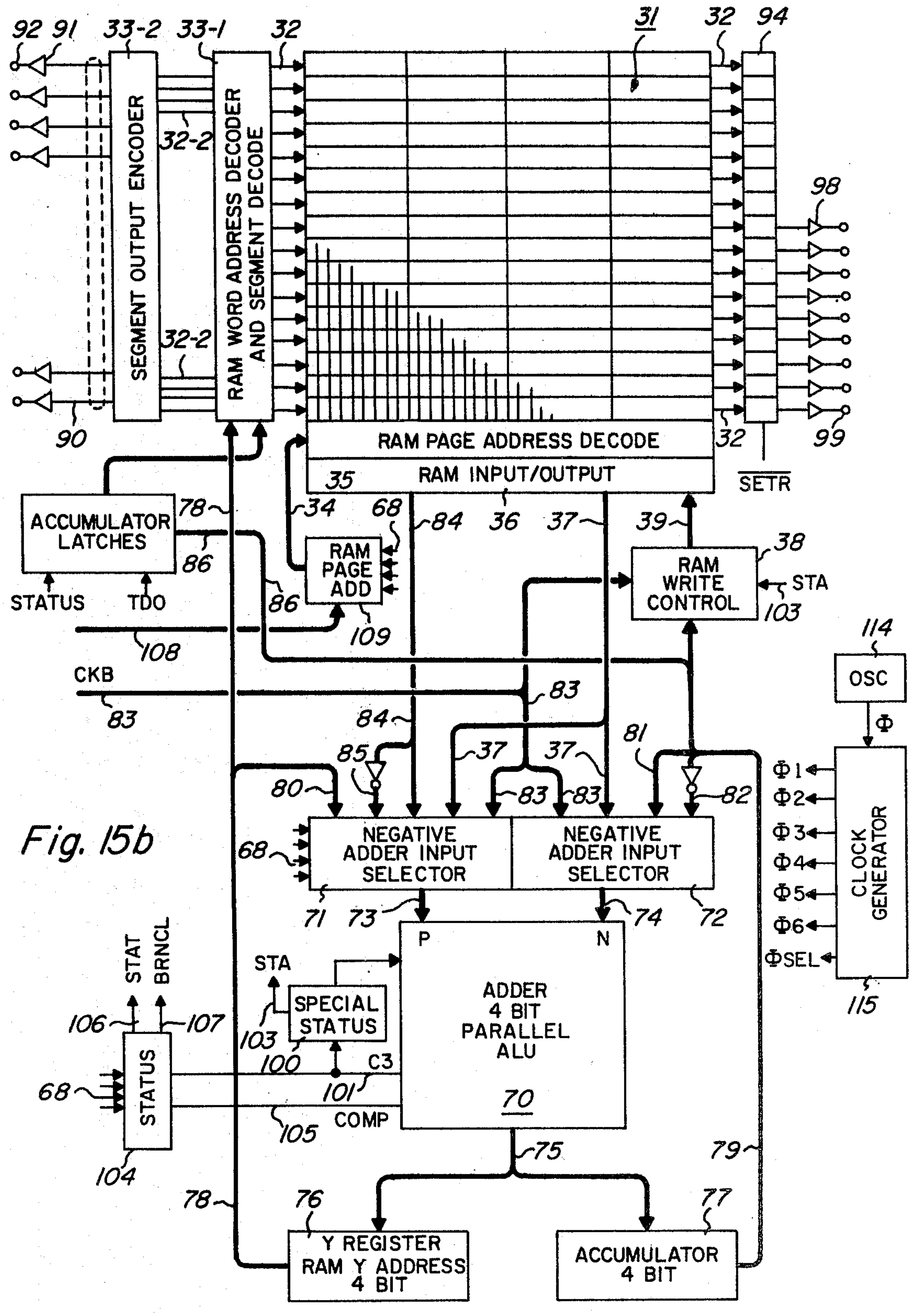

Referring now to FIGS. 15*a*–15*b*, which form a composite block diagram of the microprocessor preferably used in the learning aid, it should be appreciated that this block diagram generally corresponds with the block diagram of FIGS. 7*a* and 7*b* of U.S. Pat. No. 4,074,355; several modifications to provide the aforementioned features of six bit operation and VF display compatability are also shown. The numbering shown in FIGS. 15*a* and 15*b* generally agrees with that of U.S. Pat. No. 4,074,355. The modifications will now be described in detail.

Figure 13A:
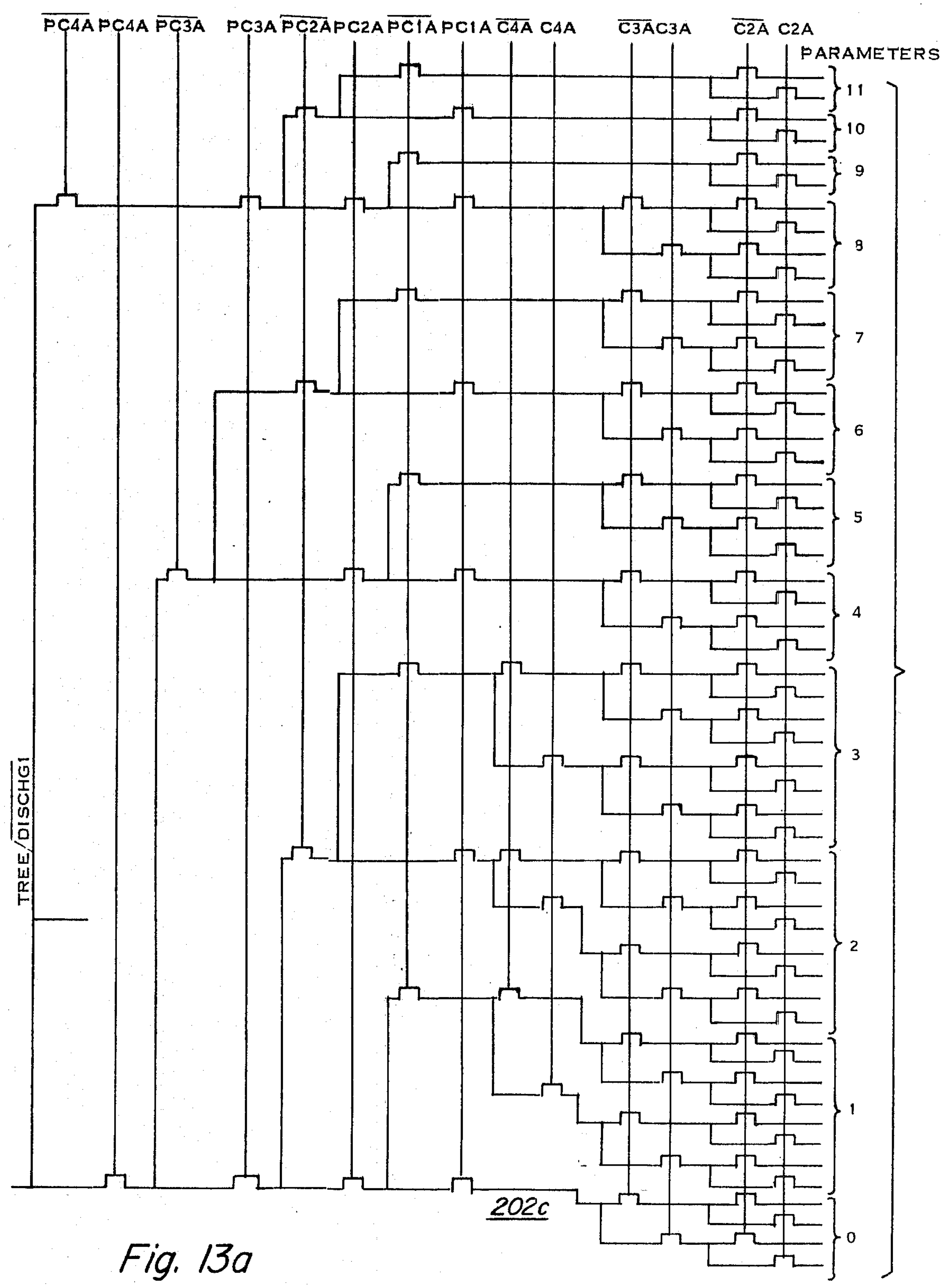
FIGS. 13*a*–13*c* are schematic diagrams of the parameter ROM.
Figure 13B:
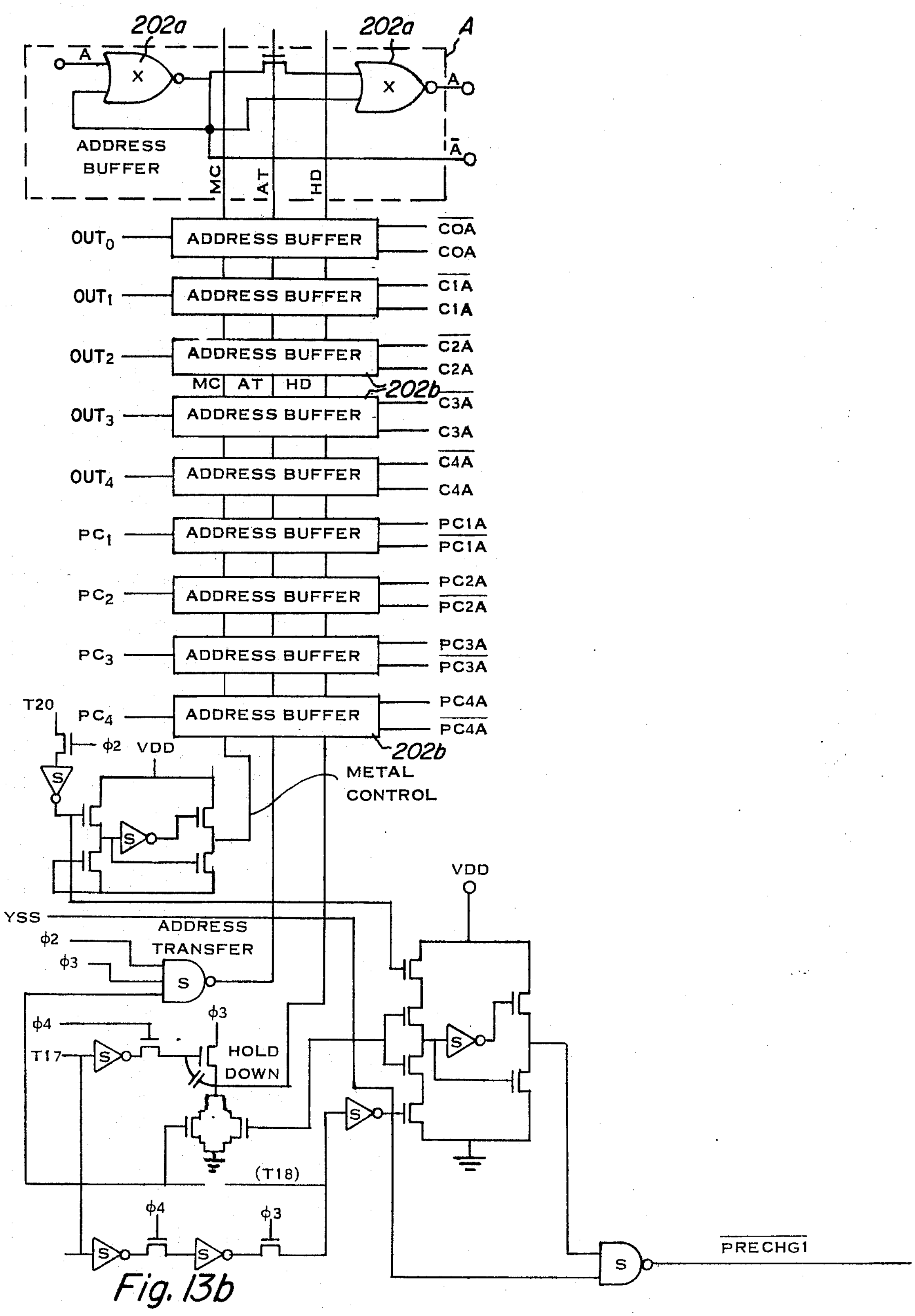
Figure 13C:
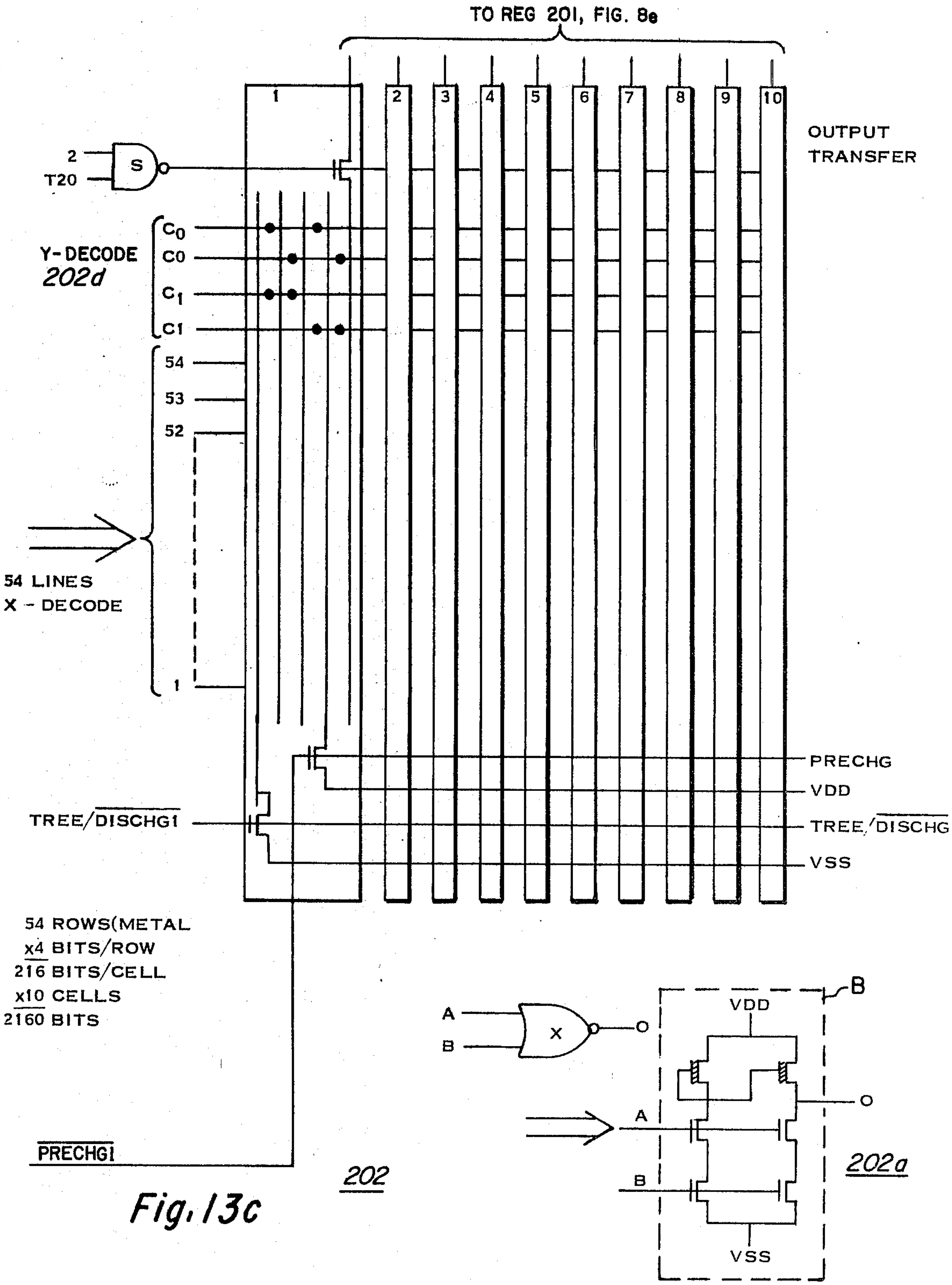
Figure 16A:
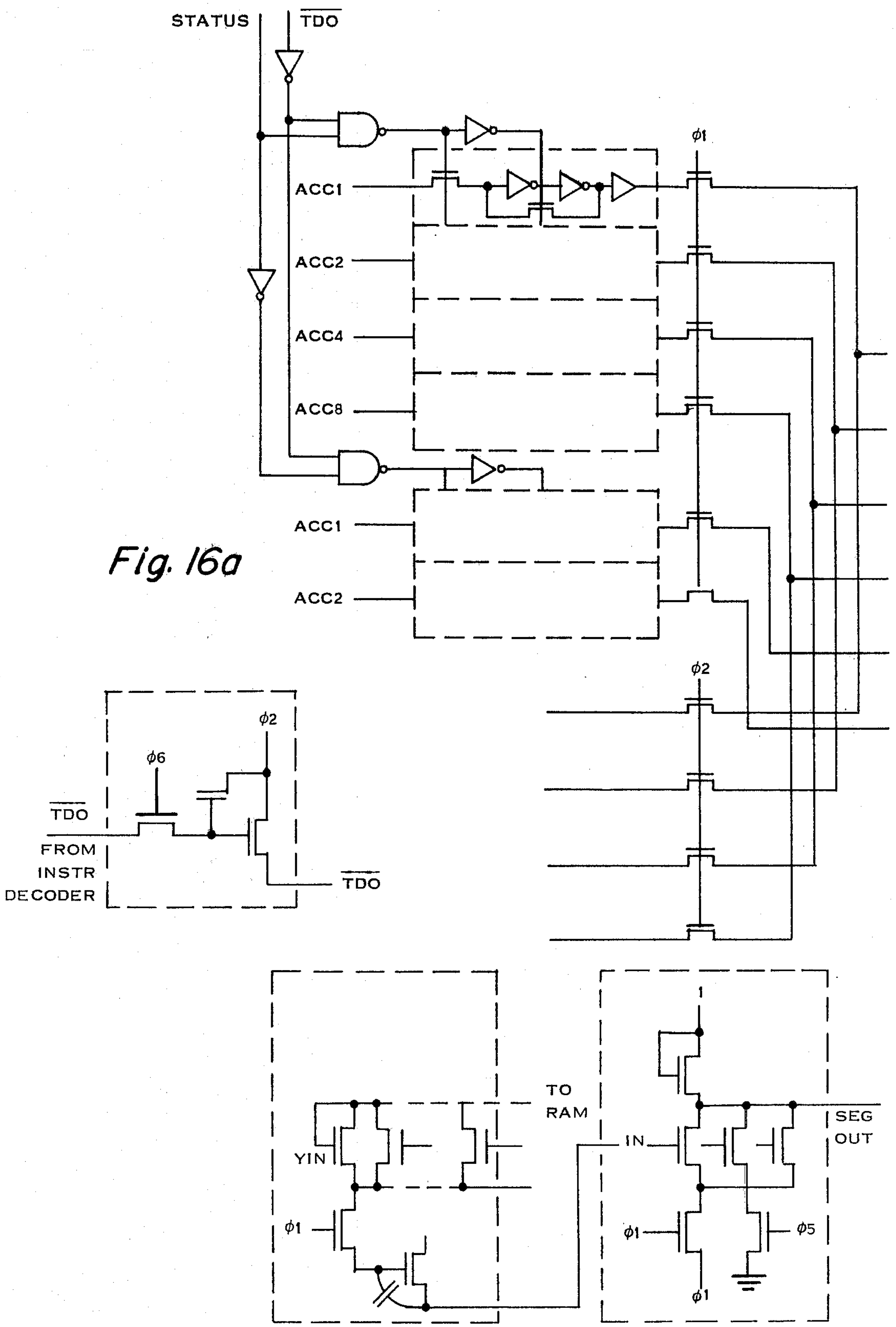
FIGS. 16*a*–16*b* form a composite logic diagram of the segment decoder of the microprocessor.
Figure 16B:
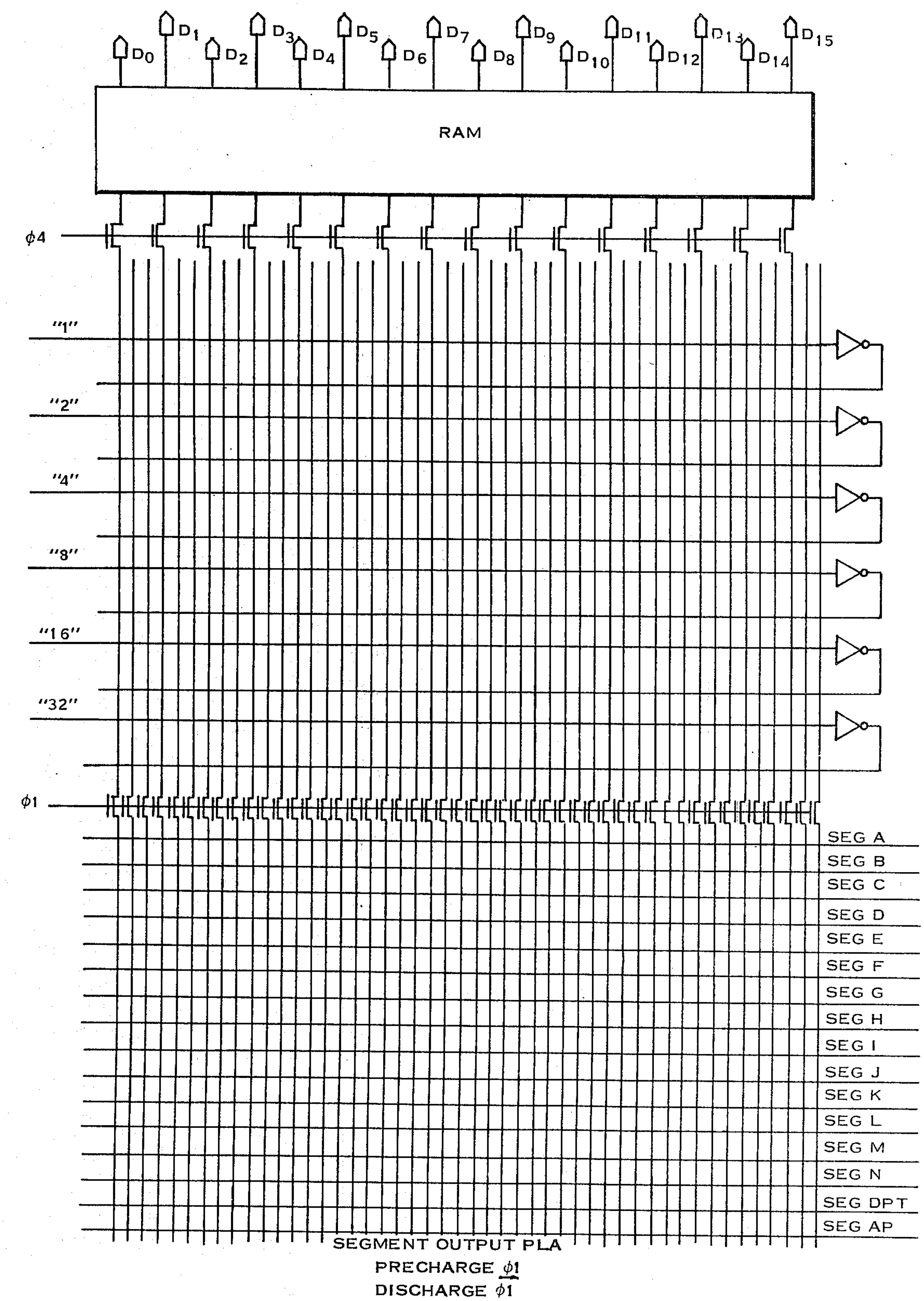
Figure 16C:
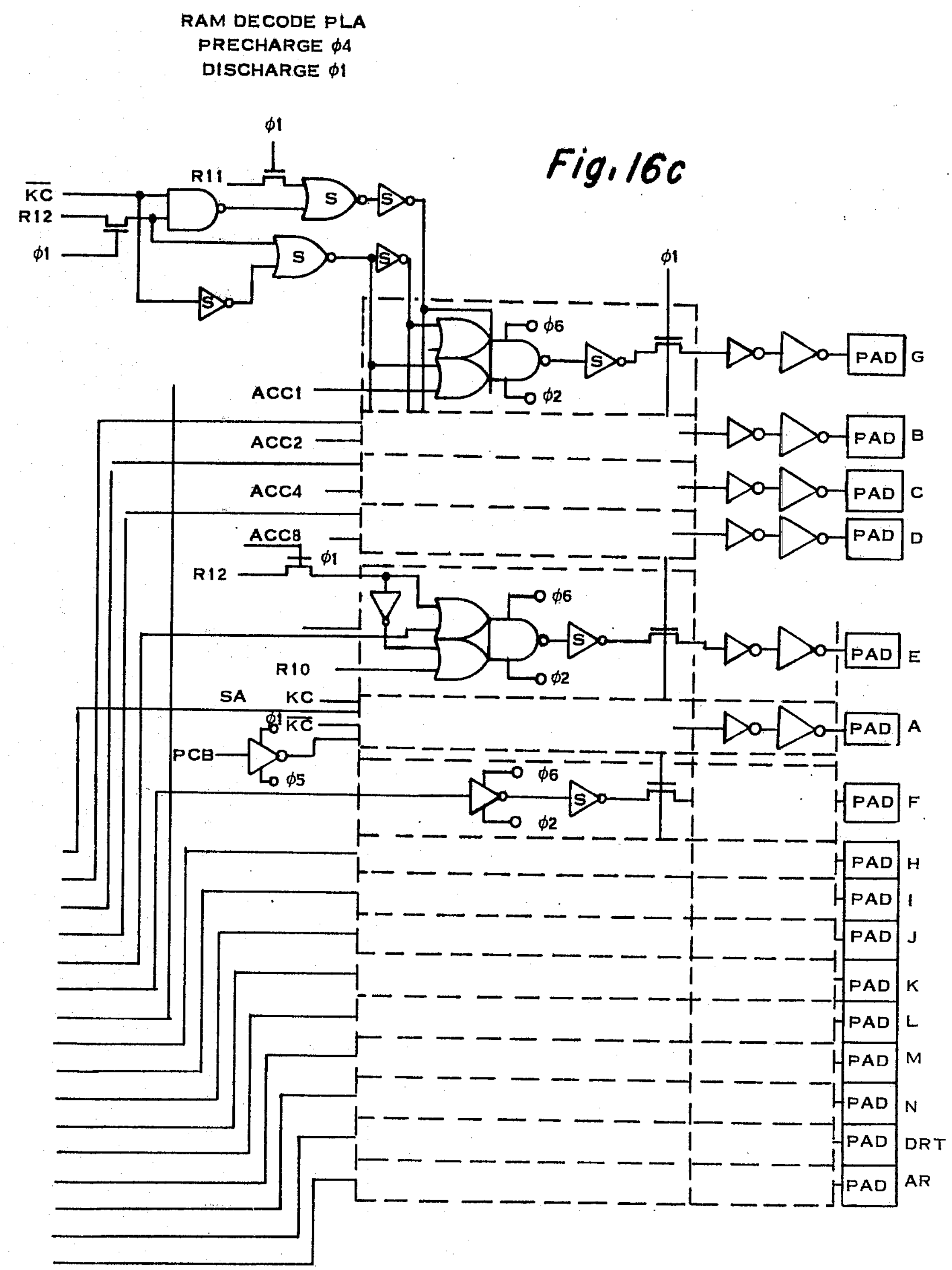

Referring now to the composite diagram formed by FIGS. 16*a*–16*c*, which replace FIG. 13 of U.S. Pat. No. 4,074,355, there can be seen the segment decoder and RAM address decoder 33–1 which decodes RAMY for addressing RAM 31 or ACC1–ACC8 for decoding segment information. Decoder 33–1 generally corresponds to decoder 33 in the aforementioned U.S. patent. The segment information is re-encoded into particular segment line information in output section 32–2 and outputted on bus 90 to segment drivers 91. Six bits of data from the processor's four bit accumulator 77 are decoded in decoder 33–1 as is now described. First, four bits on bus 86 are latched into accumulator latches 87–1 through 87–8 on a TDO (Transfer Data Out) instruction when status is a logical one. Then, two bits on bus 86 (from lines 86–1 and 86–2) are latched into accumulator latches 87–16 and 86–32, respectively, on another TDO instruction when status is a logical zero. Then the six bits in latches 87–1 through 87–32 are decoded in decoder 33–1. Segment drivers 91 may preferably be of one of three types, 91A, 91B or 91C as shown in FIGS. 16*a*–16*c*. The 91A type driver permits the data on ACC-1–ACC8 to be communicated externally via pins SEG G, SEG B, SEG C and SEG D. The 91B type driver coupled to pin SEG E permits the contents of digit register 94–10 to be communicated externally when digit register 94–12 is set. The 91C type driver coupled to pin SEG A permits the contents of the program counter to be outputted during test operations.

Figure 14A:
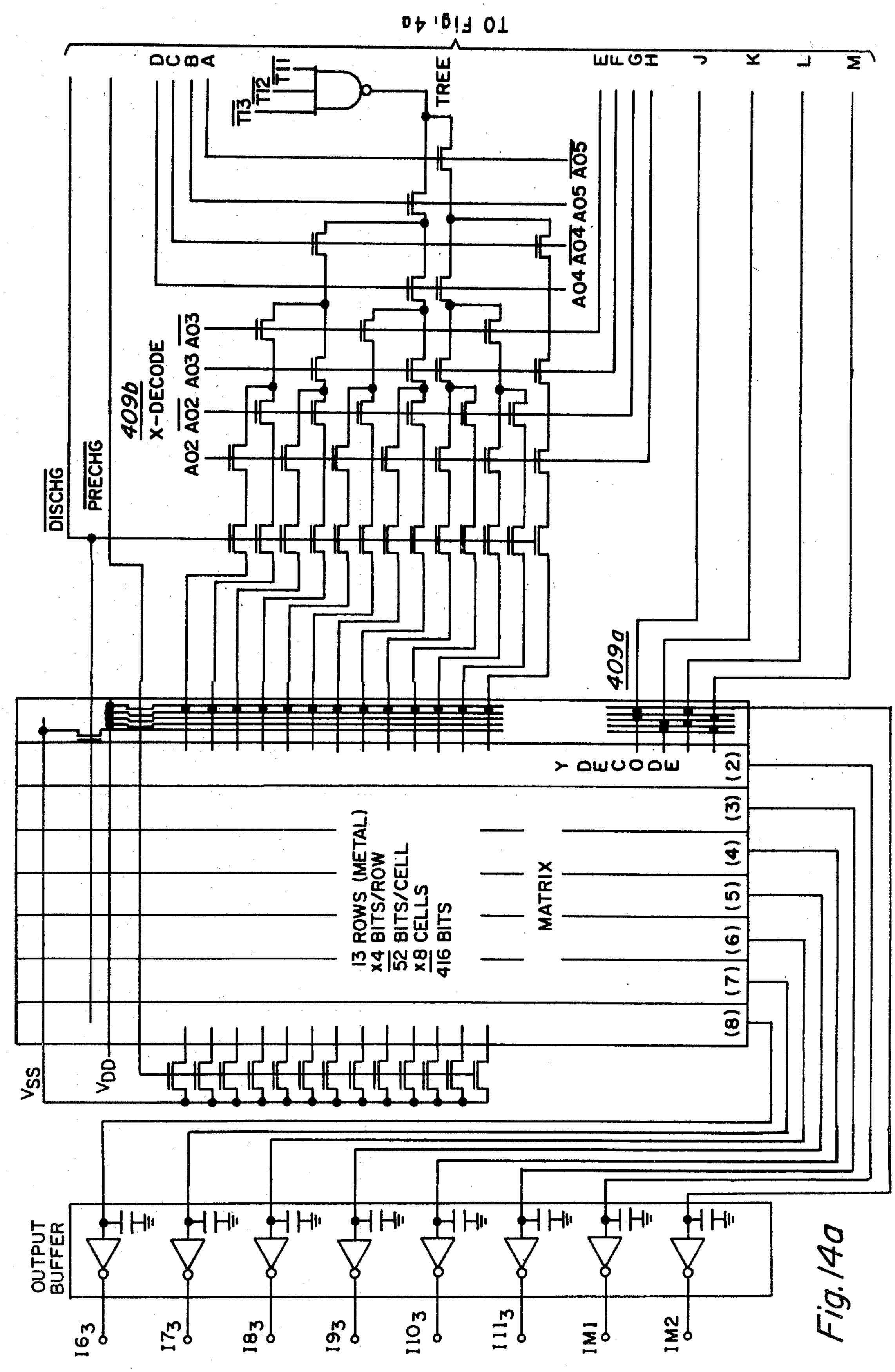
FIGS. 14*a* and 14*b* form a composite diagram of the chirp ROM.
Figure 14B:
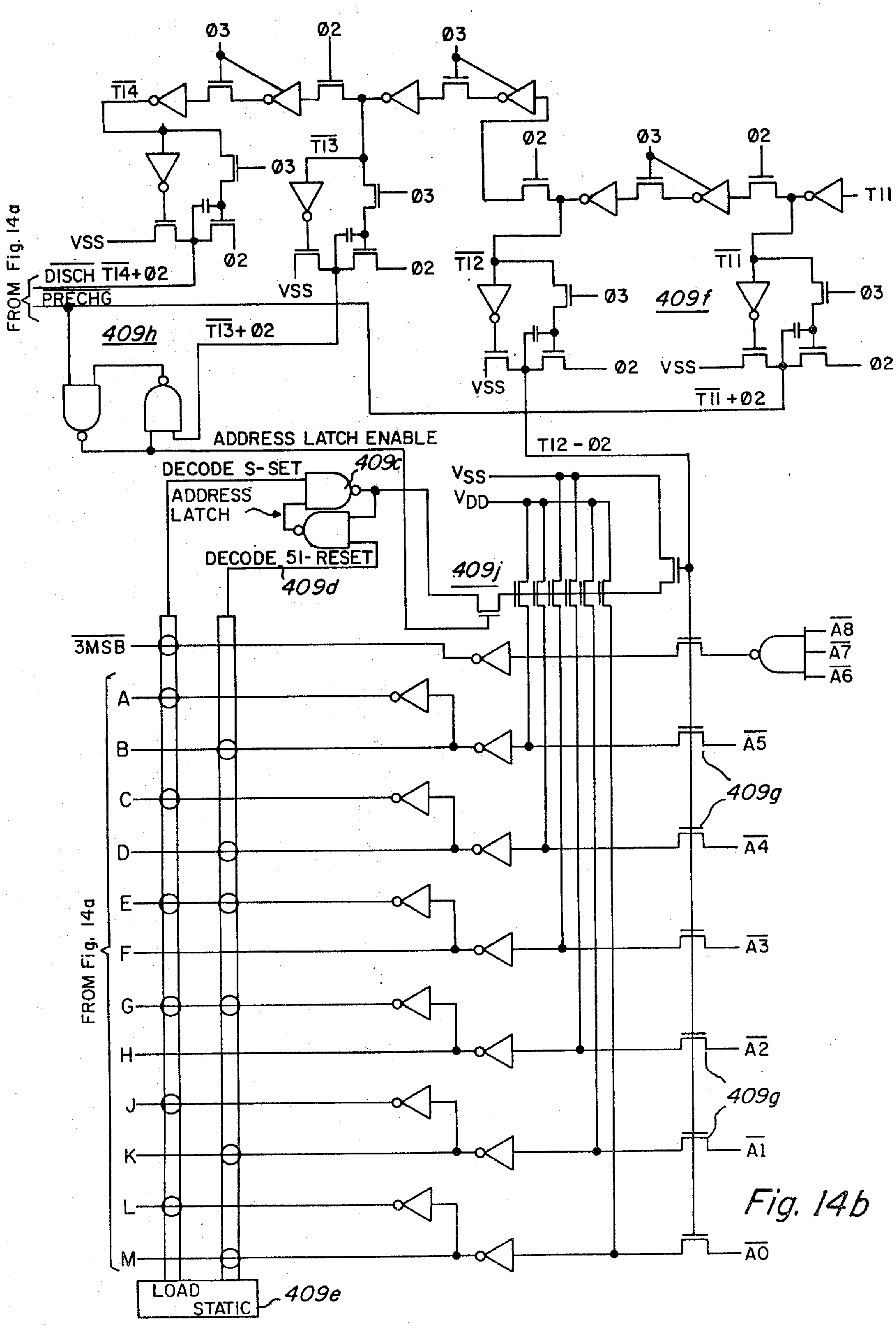
Figure 17:
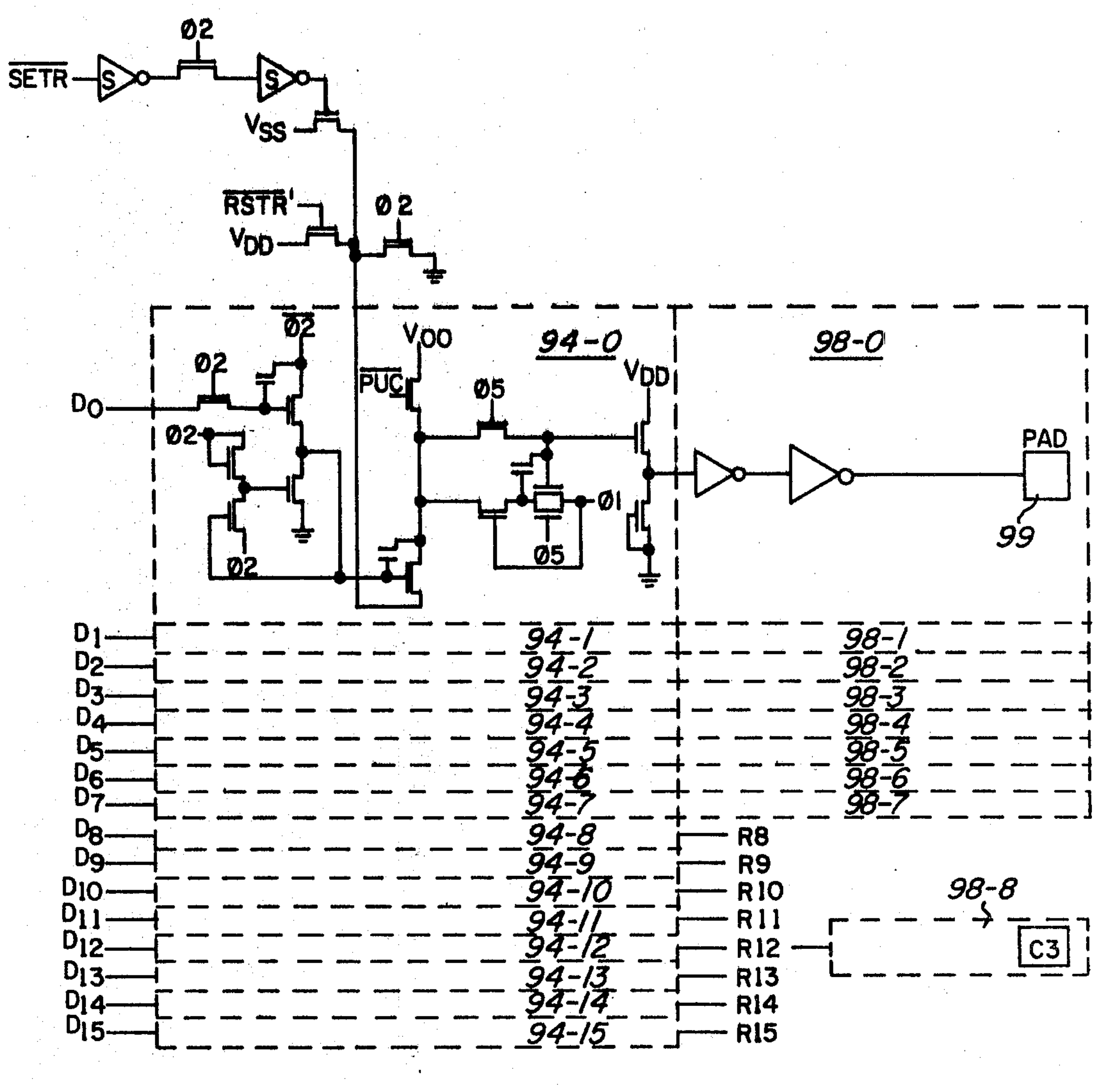
FIG. 17 depicts the digit output buffers and digit registers of the microprocessor.

The digit buffers registers and TD0 latches of FIG. 14 of U.S. Pat. No. 4,074,355 are also preferably replaced with the digit buffers registers of FIG. 17 herein inasmuch as (1) the DDIG signal is no longer used and (2) the digit latches (elements 97 in U.S. Pat. No. 4,074,355) are no longer used. For simplicity's sake, only one of the digit output buffer registers 94 is shown in detail. Further, since in this embodiment of the learning aid, display 3 preferably has eight character positions, eight output buffers 98–0 through 98–7 connect $D_0$–$D_7$ to the common electrodes of display 2 via registers 94–0 through 94–7 is shown in FIG. 17. An additional output buffer 98–8 communicates the contents of register 94–12, which is the chip select signal, to synthesizer 10.

Figure 18:
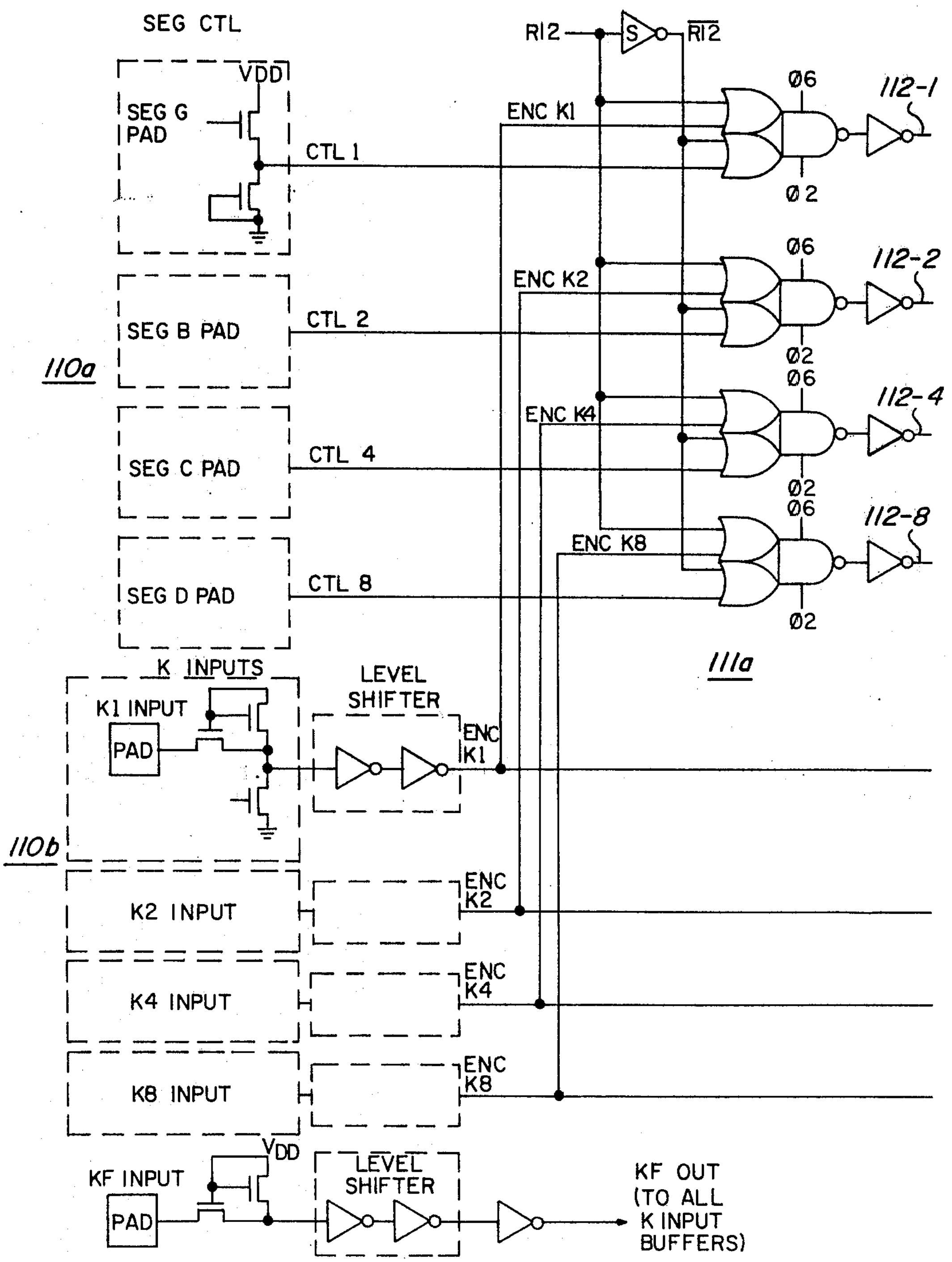
FIG. 18 depicts the KB selector circuit of the microprocessor.

To facilitate bi-directional communication with synthesizer 10, the microprocessor of U.S. Pat. No. 4,074,355 is preferably modified to permit bi-directional communication on pins SEG G, SEG B, SEG C and SEG D. Thus, in FIG. 18, these SEG pins are coupled to the normal K lines, 112–1 through 112–8, via an input selector 111*a* for inputting information when digit register 94–12 (R12) is set. Further, these pins are also coupled to ACC1–ACC8 via segment drivers 91A when digit registers 94–12 (R12) and 94–11 (R11) are set for outputting information in accumulator 77.

Thus, when digit latch 94–12 (which communicates the chip select signal externally) is set, SEG E is coupled to R10 (digit register 94–10) for communicating the PDC signal to synthesizer 10. Also, ACC1–ACC8 is outputted on SEG G and SEG B-SEG D, during the time R12 and R11 are set. When R11 is a logical 0, i.e., is reset, segment drivers 91A are turned off and data may be read into CKB circuit 113 for receiving data from ROMs 12A and 12B via synthesizer 10, for instance, FIG. 18 replaces the keyboard circuit 111 shown in FIG. 22 of U.S. Pat. No. 4,064,554.

Preferably, pins SEG G and SEG B-SEG D are coupled to CTL1–CTL8 pins of synthesizer 10, while pin SEG E is coupled to the PDC pin of synthesizer 10.

In Table IX (which comprises Tables 0 through IX-15) is listed the set of instructions which may be stored in the main Read-Only-Memory 30 of FIGS. 15*a*–15*b* to provide controller 11. Referring now to Table IX, there are several columns of data which are, reading from left to right: PC (Program Counter), INST (Instruction), BRLN (Branch Line), Line and Source Statement (which includes Name, Title and Comments). In U.S. Pat. No. 4,074,355, it can be seen that main Read-Only-Memory 30 is addressed with a seven bit address in program counter 47 and a four bit address in a buffer 60. The address in buffer 60 is referred to as a page address in the main Read-Only-Memory. The instructions listed on Table IX-0 correspond to page zero in the microprocessor while the instructions listed in Table IX-1 are those on page one and so forth through to the instructions in Table IX-15 which are stored on page fifteen in the microprocessor.

The program counter 47 of the aforementioned microprocessor is comprised of a feedback shift register and therefore counts in a pseudorandom fashion, thus the addresses in the left-hand column of Table IX, which are expressed as a hexadecimal number, exhibit such pseudorandomness. If the instruction starting at page zero were read out sequentially from the starting position in the program counter (00) then the instructions would be read out in the order shown in Table IX. In the "Line" column is listed a sequentially increasing decimal number associated with each source statement and its instruction and program counter address as well as those lines in which only comments appear. The line number starts at line 55 merely for reasons of convenience not important here. When an instruction requiring either a branch or call is to be performed, the address to which the program counter will jump and the page number to which the buffer will jump, if required, is reflected by the binary code comprising the instruction or instructions performing the branch or call. For sake of convenience, however, the branch line column indicates the line number in Table IX to which the branch or call will be made. For example, the instruction on line 59 (page 0, Program Counter Address OF) is a branch instruction, with a branch address of 1010111 (57 in hexadecimal). To facilitate finding the 57 address in the program counter, the branch line column directs the reader to line 80, where the 57 address is located.

READ-ONLY-MEMORY LOGIC DIAGRAMS

Figure 19:
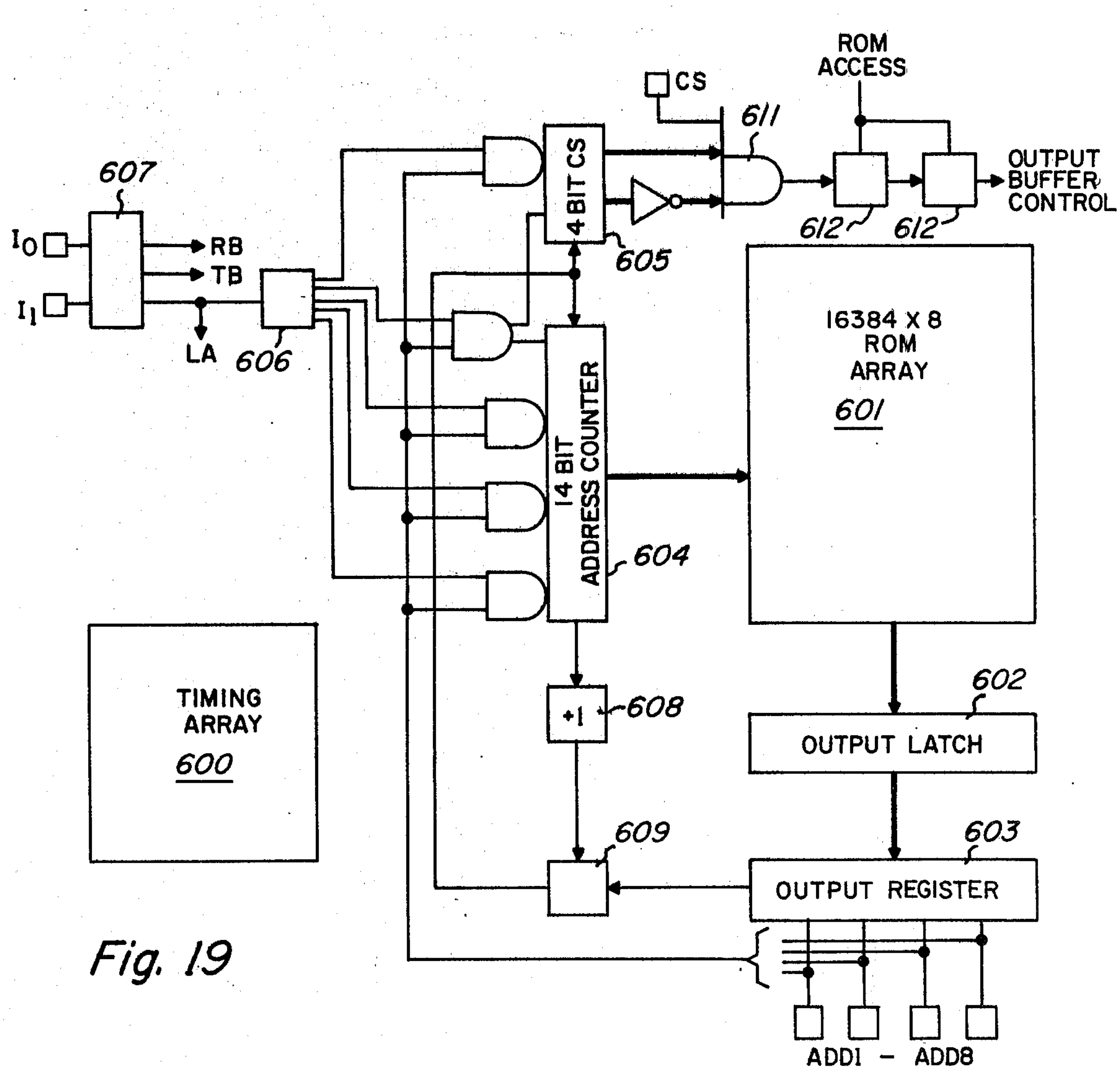
FIG. 19 is a block diagram of a ROM employed as a memory of the learning aid.
Figure 20A:
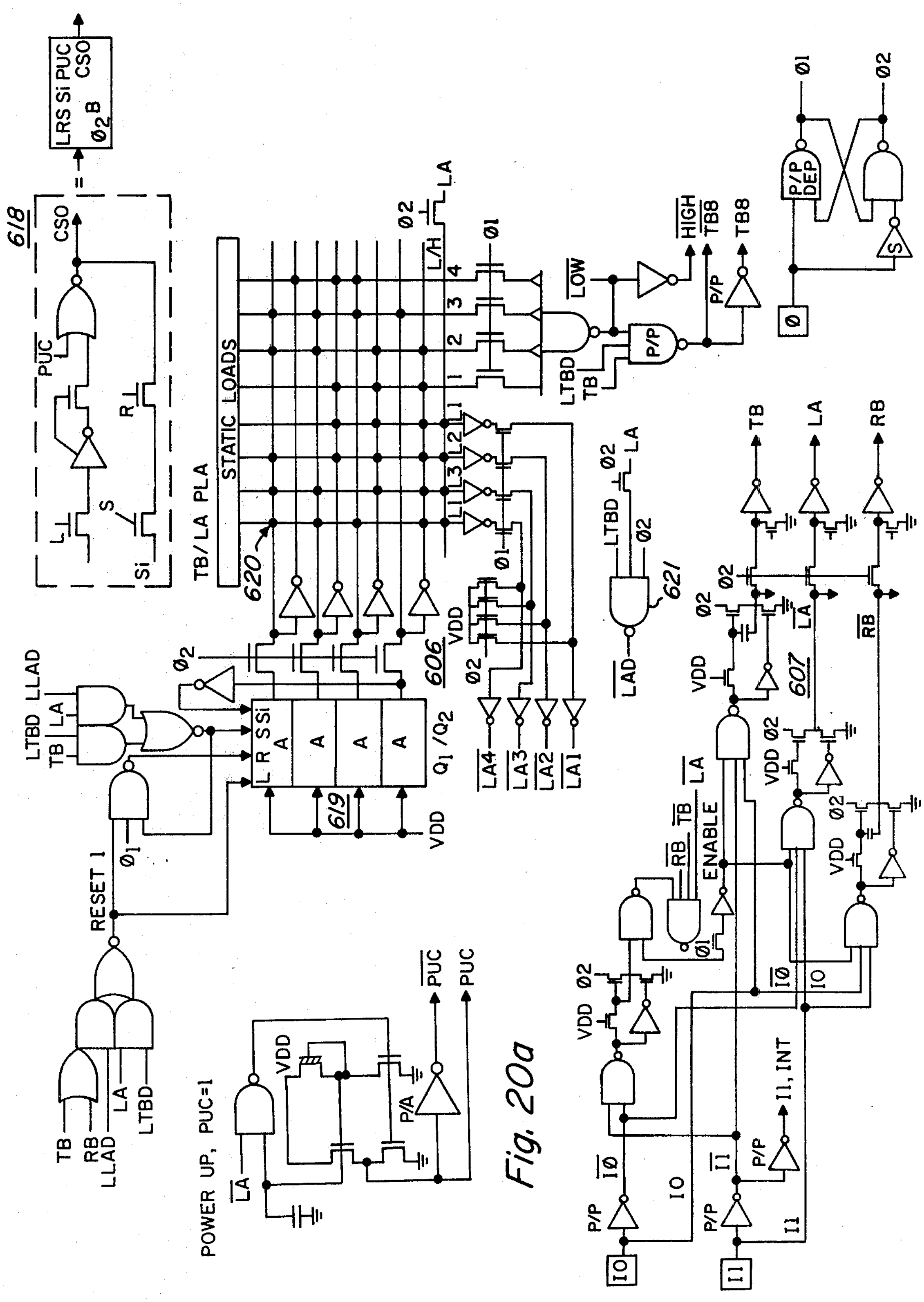
FIGS. 20a–20f form a composite logic diagram of the control logic for the ROM of FIG. 19.
Figure 20B:
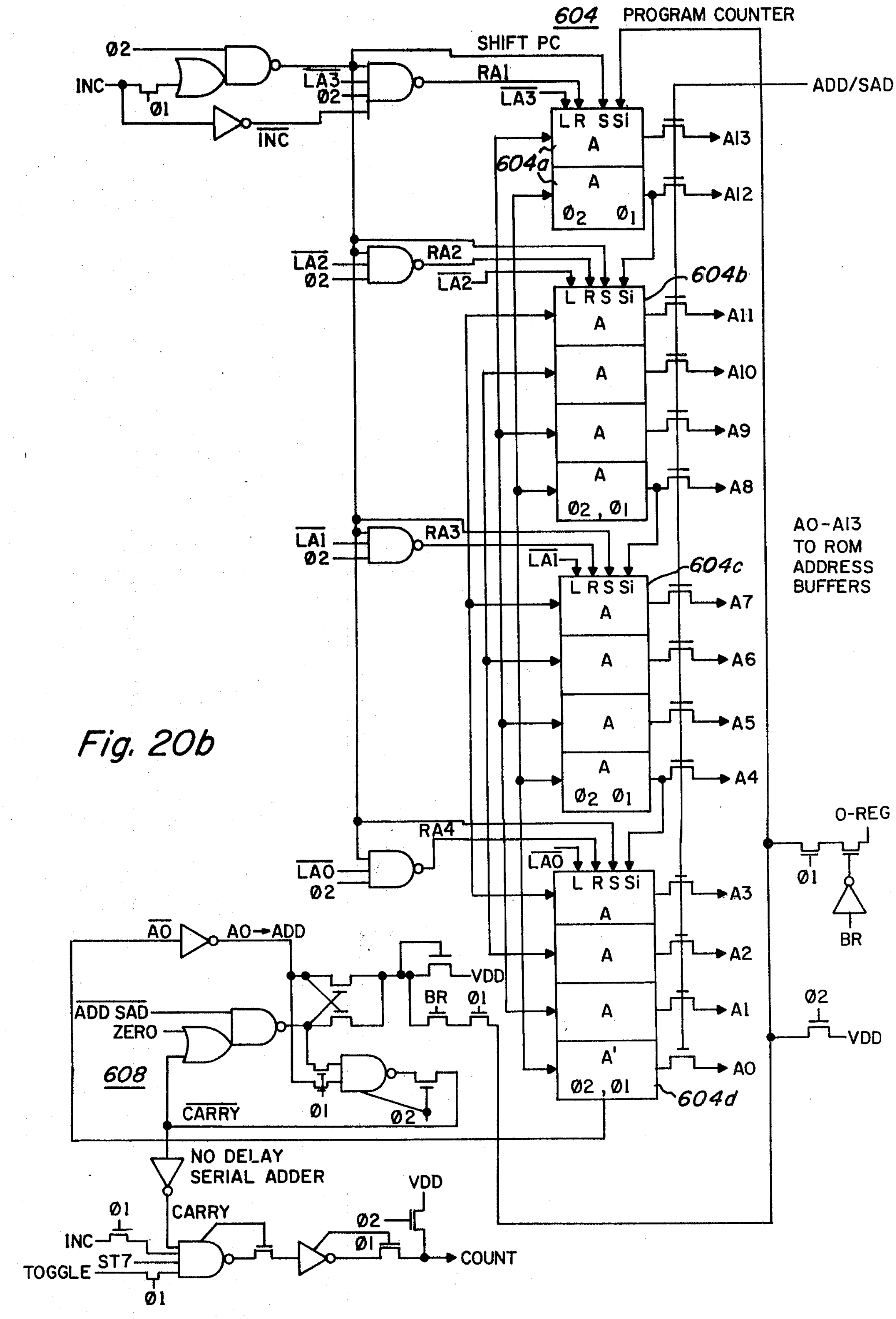
Figure 20C:
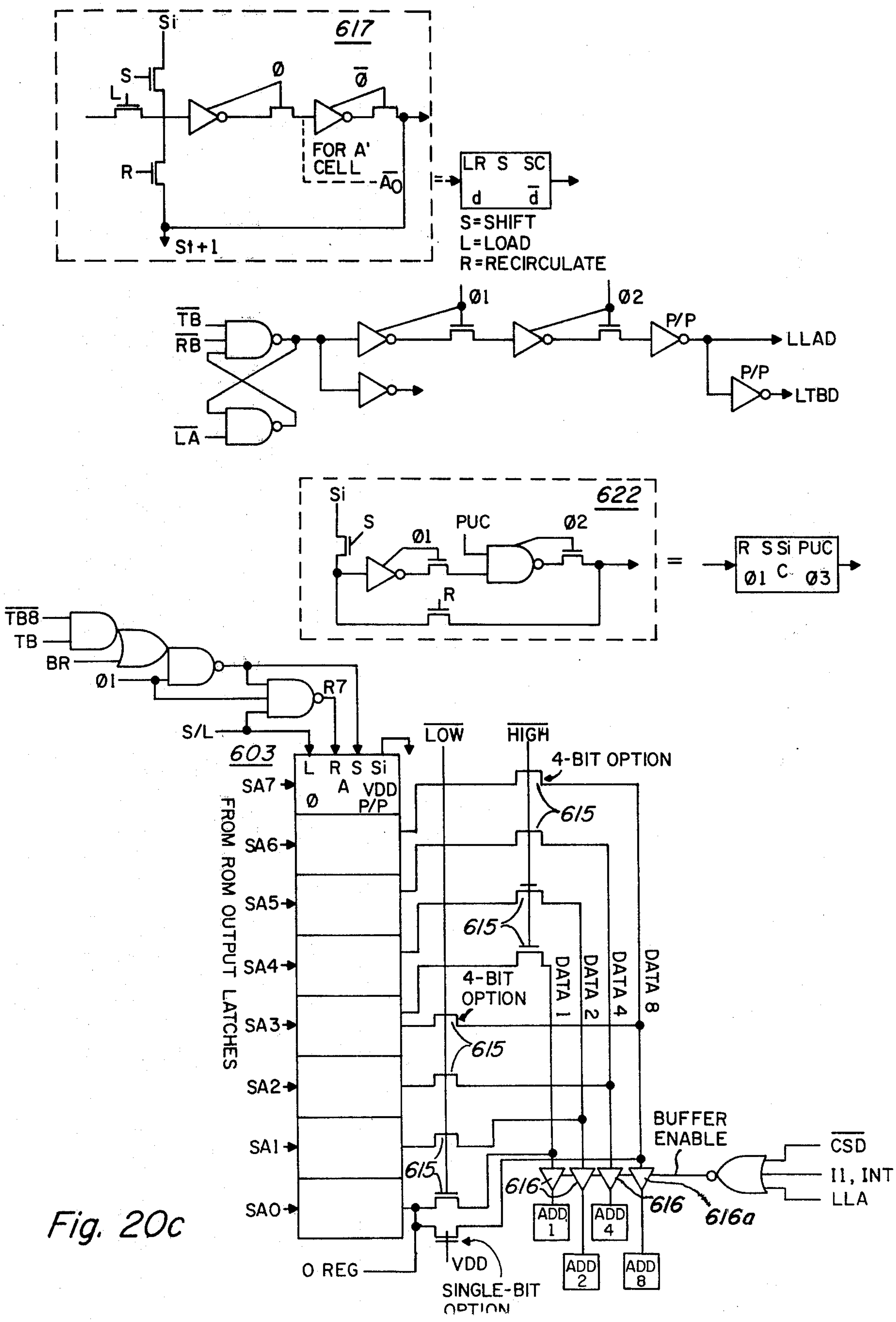
Figure 20D:
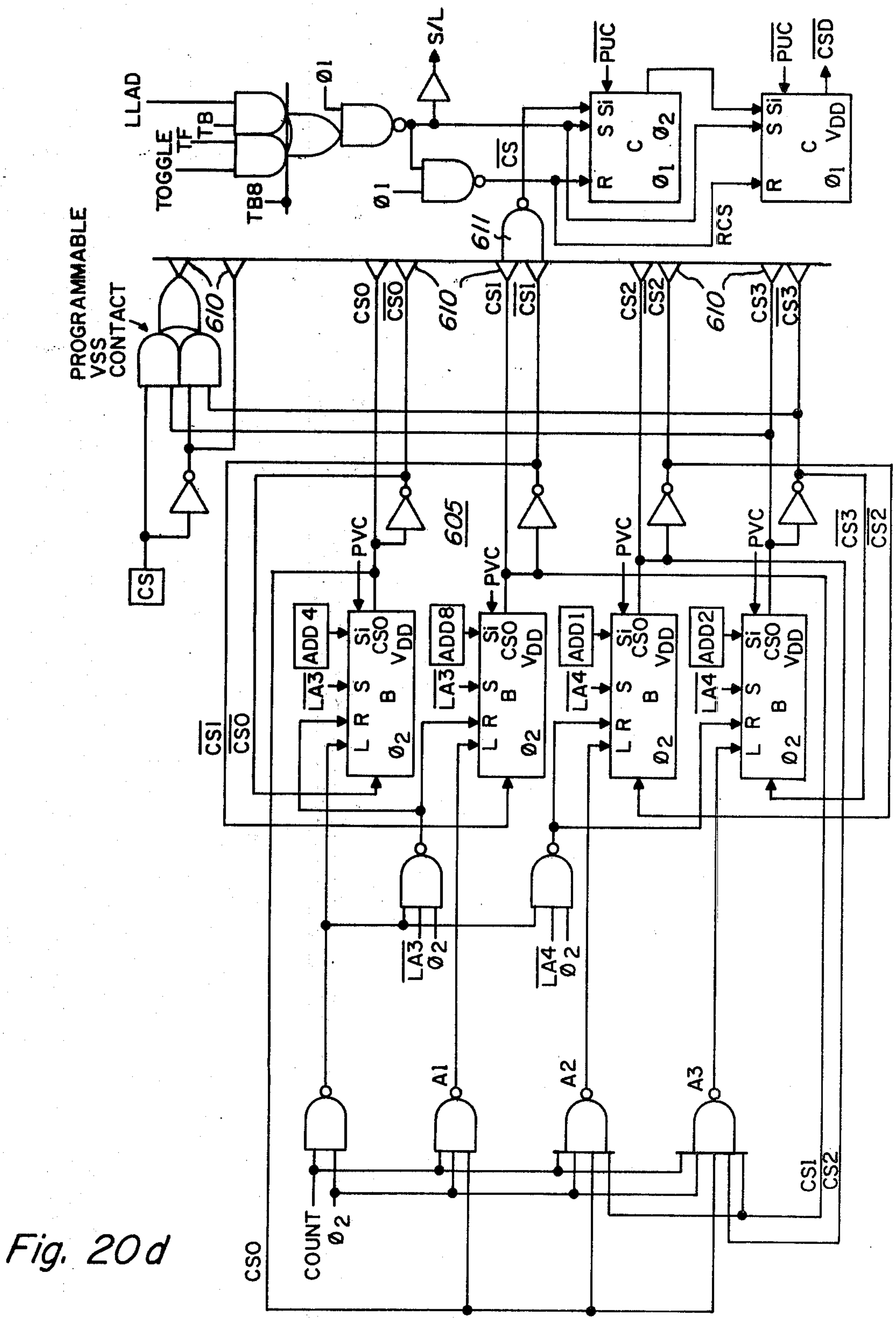
Figure 20E:
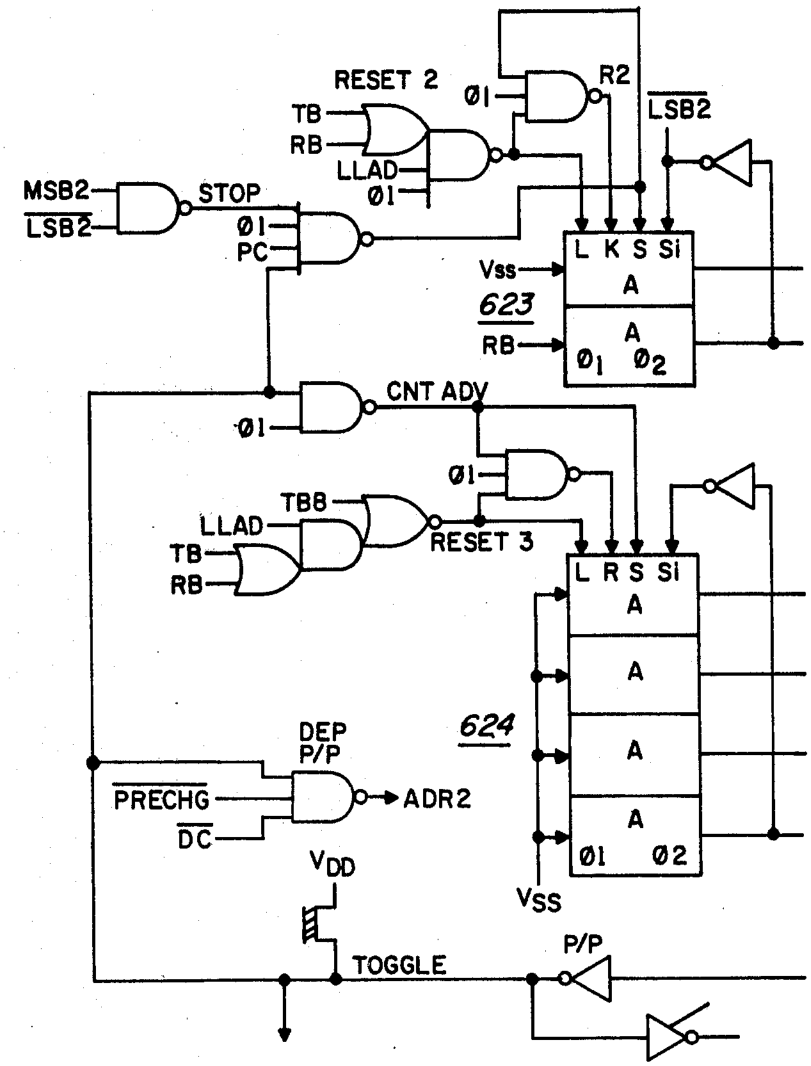
Figure 20E:
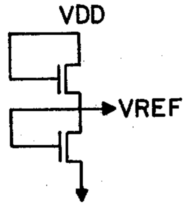
Figure 20F:
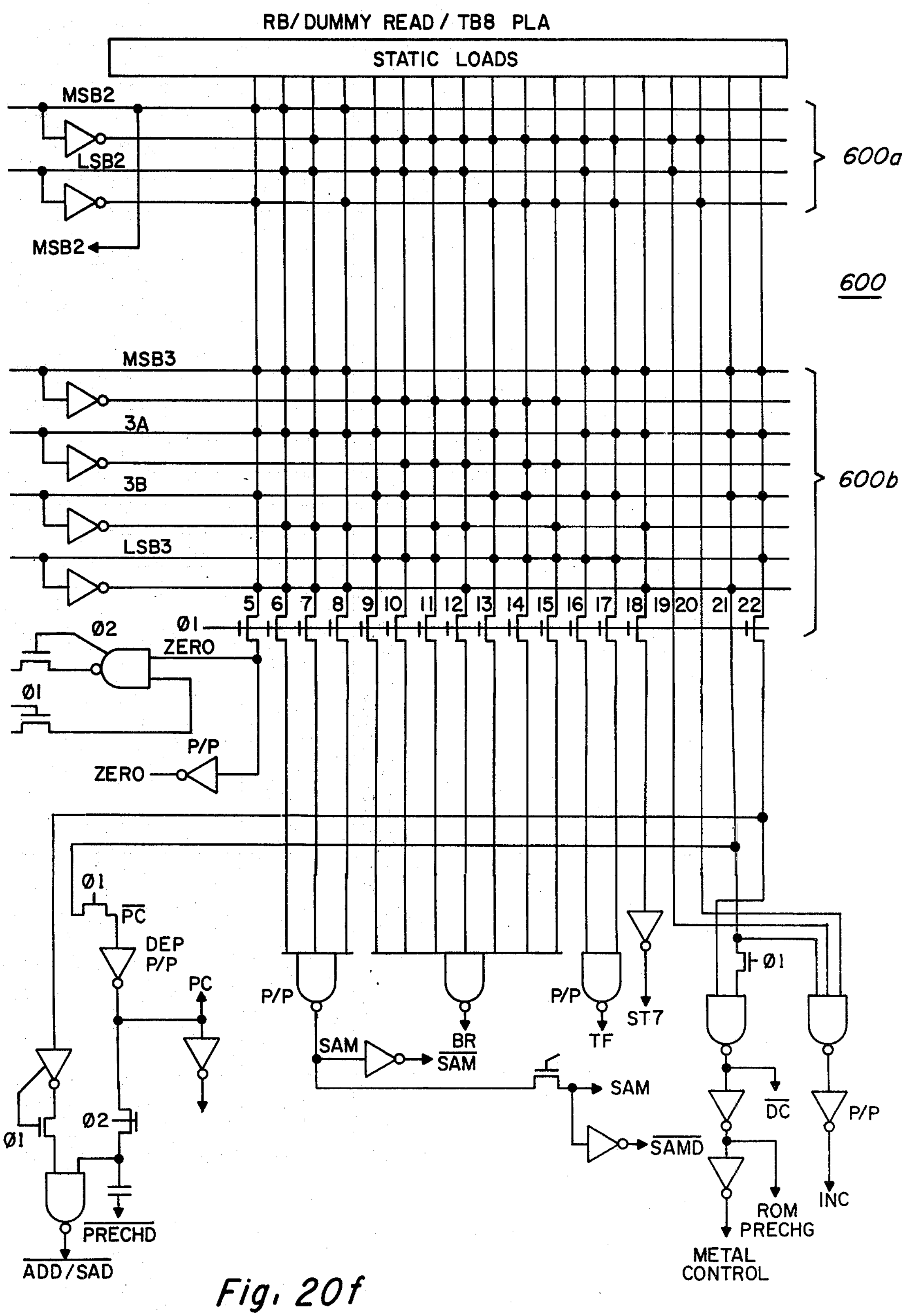
Figure 2B:
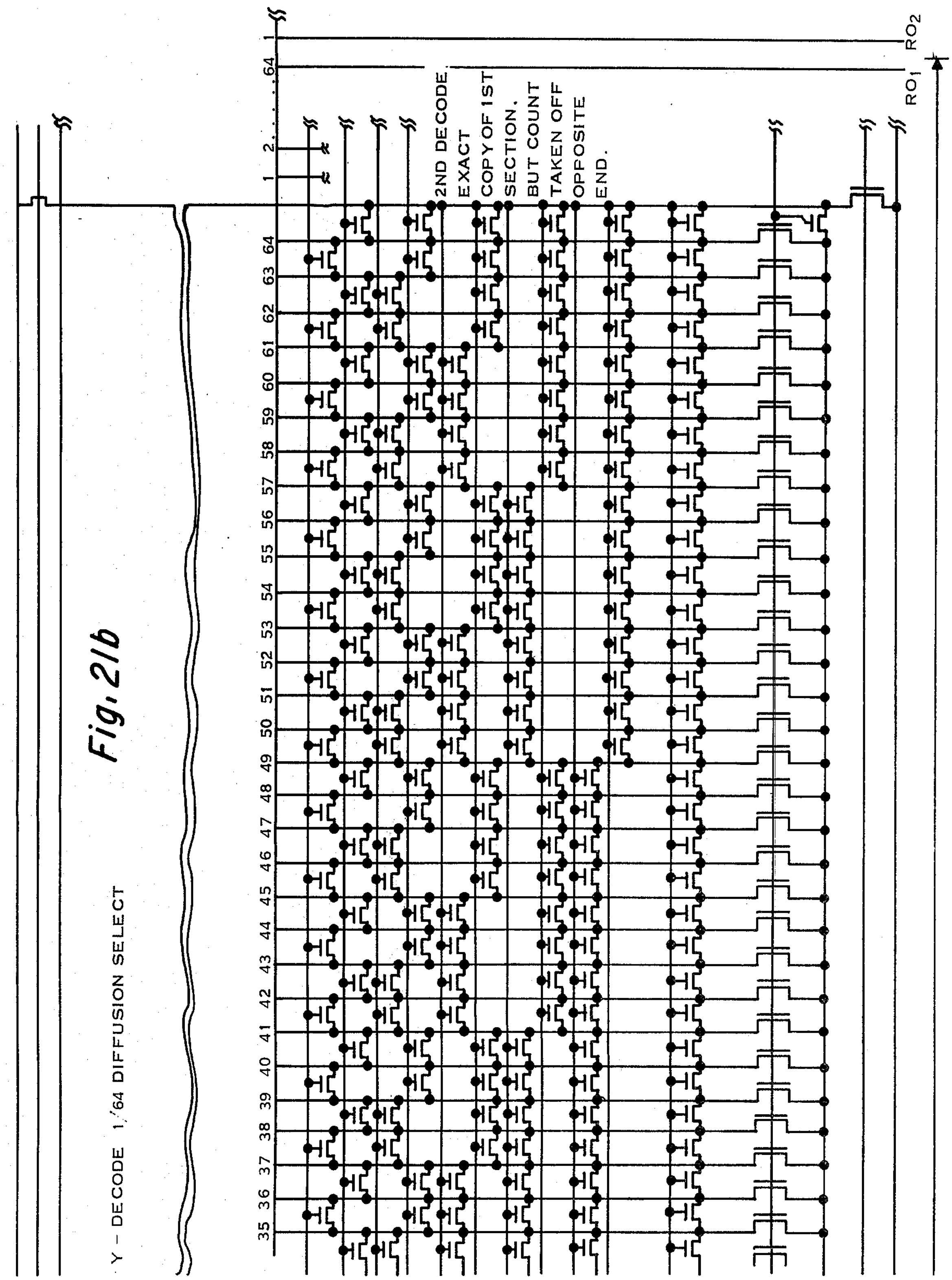

Read-Only-Memories 12A–12B or 13A and 13B is shown in FIGS. 19, 20*a*–20*f*, and 21*a*–21*d*. FIG. 19 is a block diagram of any one of these ROMs. FIGS. 20*a*–20*f* form a composite logic diagram of the control logic for the ROMs while FIGS. 21*a*–21*d* form a composite logic diagram of the X and Y address decoders and pictorially show the array of memory cells.

Referring now to FIG. 19, the ROM array 601 is arranged with eight output lines, one output line from each section of 16,384 bits. The eight output lines from ROM array 601 are connected via an output latch 602 to an eight bit output register 603. The output register 603 is interconnected with pins ADD1–ADD8 and arranged either to communicate the four high or low order bits from output register 603 via the four pins ADD1–ADD8 or alternatively to communicate the bit serially from output register 603 via pin ADD1. The particular alternative used may be selective according to mask programmable gates.

ROM array 601 is addressed via a 14 bit address counter 604. The address counter 604 has associated therewith a four bit chip select counter 605. Addresses in address counter 604 and chip select counter 605 are loaded four bits at a time from pins ADD1–ADD8 in response to a decoded Load Address (LA) command. The first LA command loads the four least significant bits in address counter 604 (bits $A_0$–$A_3$), and subsequent LA commands load the higher order bits, ($A_4$–$A_7$, $A_8$–$A_{11}$ and $A_{12}$–$A_{13}$). During the fourth LA cycle the $A_{12}$ and $A_{13}$ bits are loaded at the same time the CS0 and CS1 bits in chip select counter 605 are loaded. Upon the fifth LA command the two most significant bits in chip select counter 605 are loaded from ADD1 and ADD2. A counter 606 counts consecutively received LA commands for indicating where the four bits on ADD-1–ADD8 are to be inputted into counters 604 and/or 605.

Commands are sent to the ROM chip via $I_0$ and $I_1$ pins to a decoder 607 which outputs the LA command a TB (transfer bit) and a RB (read and branch) command.

Address register 604 and chip select register 605 have an add-one circuit 608 associated therewith for incrementing the address contained therein. When a carry occurs outside the fourteen bit number stored in address register 604 the carry is carried into chip select register 605 which may enable the chip select function if not previously enabled or disable the chip select function if previously enabled, for example. Alternatively, the eight bit contents of output register 603may be loaded into address register 604 by means of selector 609 in response to an RB command. During an RB command, the first byte read out of array 601 is used as the lower order eight bits while the next successive byte is used for the higher order six bits in counter 604.

The output of chip select register 605 is applied via programmable connectors 610 to gate 611 for comparing the contents of chip select counter 605 with a preselected code entered by the programming of connectors 610. Gate 611 is also responsive to a chip select signal on the chip select pin for permitting the chip select feature to be based on either the contents of the four bit chip select register 605 and/or the state of the chip select bit on the CS pin. The output of gate 611 is applied to two delay circuits 612, the output of which controls the output buffers associated with outputting information fromoutput register 603 to pins ADD1–ADD8. The delay imposed by delay circuits 612 effect the two byte delay in this embodiment, because the address information inputted on pins ADD1–ADD8 leads the data outputted in response thereto by the time to require to access ROM array 601. The CS pin is preferably used in the embodiment of the learning aid disclosed herein.

A timing PLA 600 is used for timing the control signals outputted to ROM array 601 as well as the timing of other control signals.

Referring now to the composite drawing formed by FIGS. 20*a*–20*f*, output register 603 is formed by eight "A" bit latches, an exemplary one of which is shown at 617. The output of register 603 is connected in parallel via a four bit path controlled on LOW or HIGH signals to output buffers 616 for ADD1–ADD4 and 616*a* for ADD8. Buffers 616 and 616*a* are shown in detail in FIGS. 21*c* and 21*d*.

Gates 615 which control the transferring of the parallel outputs from register 603 via in response to LOW and HIGH are preferably mask level programmable gates which are preferably not programmed when this chip is used with the learning aid described herein. Rather the data in register 603 is communicated serially via programmable gate 614 to buffer 616*a* and pin ADD8. The bits outputted to ADD1–ADD8 in response to a HIGH signal are driven from the third through sixth bits in register 603 rather that the fourth through seventh bits inasmuch as a serial shift will normally be accomplished between a $\overline{\text{LOW}}$ and $\overline{\text{HIGH}}$ signal.

Address register 604 comprises fourteen of the bit latches shown at 617. The address in address 604 on lines $A_0$–$A_{13}$ is communicated to the ROM X and Y address buffers shown in FIGS. 21*c* and 21*d*. Register 604 is divided into four sections 604*a*–604*d*, the 604*d* section loading four bits from ADD1–ADD8 in response an $\overline{\text{LA0}}$ signal, the 604*c* section loading four bits from ADD1–ADD8 in response to an $\overline{\text{LA1}}$ signal and likewise for section 604*b* in response to an $\overline{\text{LA2}}$ signal. Section 604*a* is two bits in length and loads the ADD1 and ADD2 bits in response to an $\overline{\text{LA3}}$ signal. The chip select register 605 comprise four B type bit latches of the type shown at 618. The low order bits, CS0 and CS1 are loaded from ADD4 and ADD8 in response to an $\overline{\text{LA3}}$ signal while the high order bits CS2 and CS3 are loaded from ADD1 and ADD2 on an $\overline{\text{LA4}}$ signal. The $\overline{\text{LA0}}$–$\overline{\text{LA4}}$ signals are generated by counter 606. Counter 606 includes a four bit register 619 comprised of four A bit latches 617. The output of the four bit counter 619 is applied to a PLA 620 for decoding the $\overline{\text{LA1}}$–$\overline{\text{LA4}}$ signals. The $\overline{\text{LA0}}$ signal is generated by a NAND gate 621. As can be seen, the $\overline{\text{LA0}}$ signal comes up in response to an LA signal being decoded immediately after a TB signal. The gate 621 looks for a logical one on the LA signal and a logical one on an LTBD (latched transfer bit delay) signal from latch 622. Decoder 607 decodes the $I_0$ and $I_1$ signals applied to pins $I_0$ and $I_1$ for decoding the TB, LA and RB control signals. The signals on the $I_0$ and $I_1$ pins are set out in Table X. Latch circuit 622 is responsive to LA, RB and TB for indicating whether the previously received instruction was either an LA or a TB or RB command.

In addition to counting successive LA commands, four bit counter 619 and PLA 620 are used to count successive TB commands. This is done because in this embodiment each TB command transfers one bit from register 603 on pin ADD8 to the synthesizer chip 10 and output register 603 is loaded once each eight successive TB commands. Thus, PLA 620 also generates a TB8 command for initiating a ROM array addressing sequence. The timing sequence of counter 619 and PLA 620 are set forth in Table XI. Of course, the $\overline{\text{LA1–LA4}}$ signal is only generated responsive to successive LA commands while the TB8 signals only generate in response to successive TB commands.

Figure 21A:
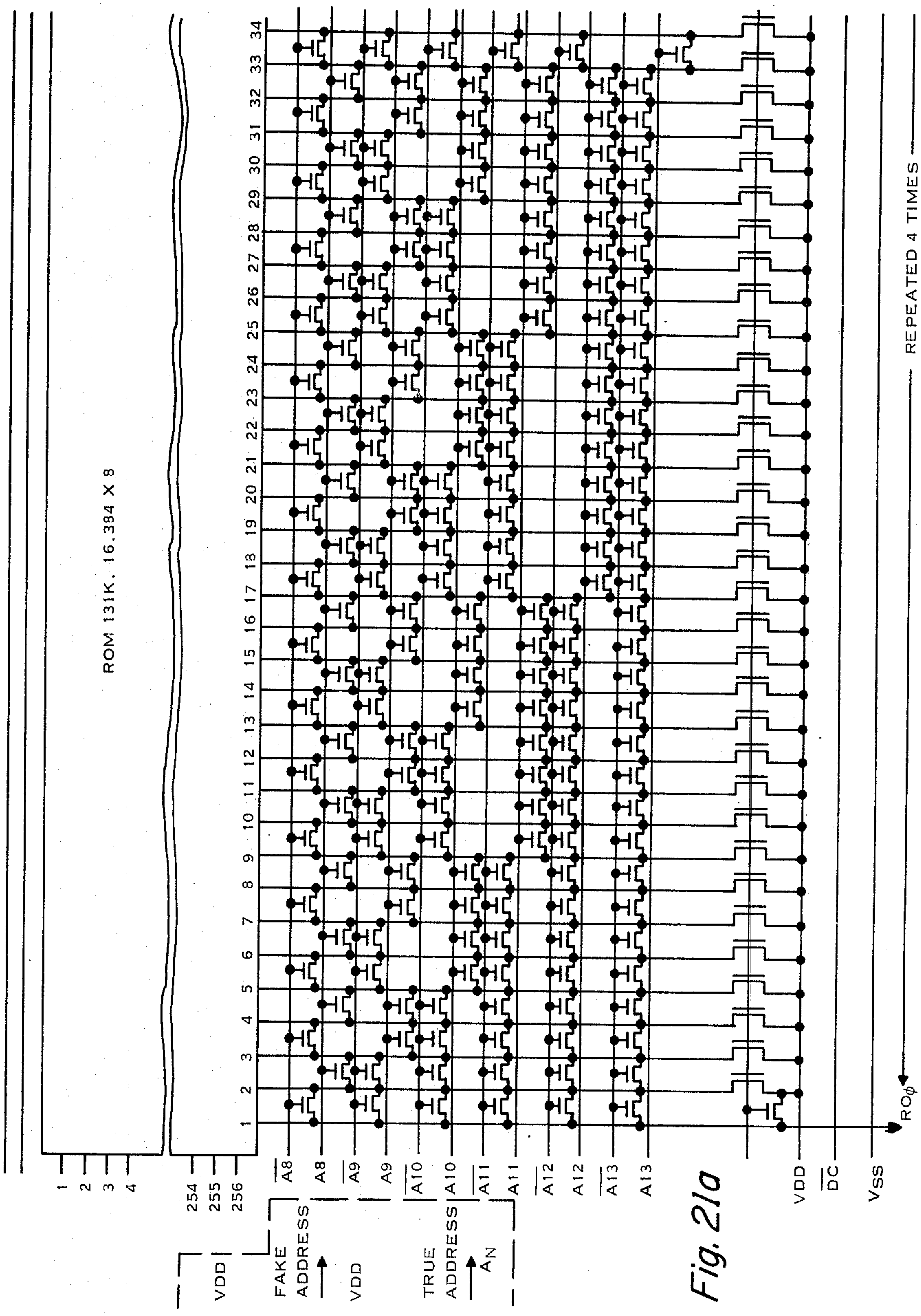
Figure 21C:
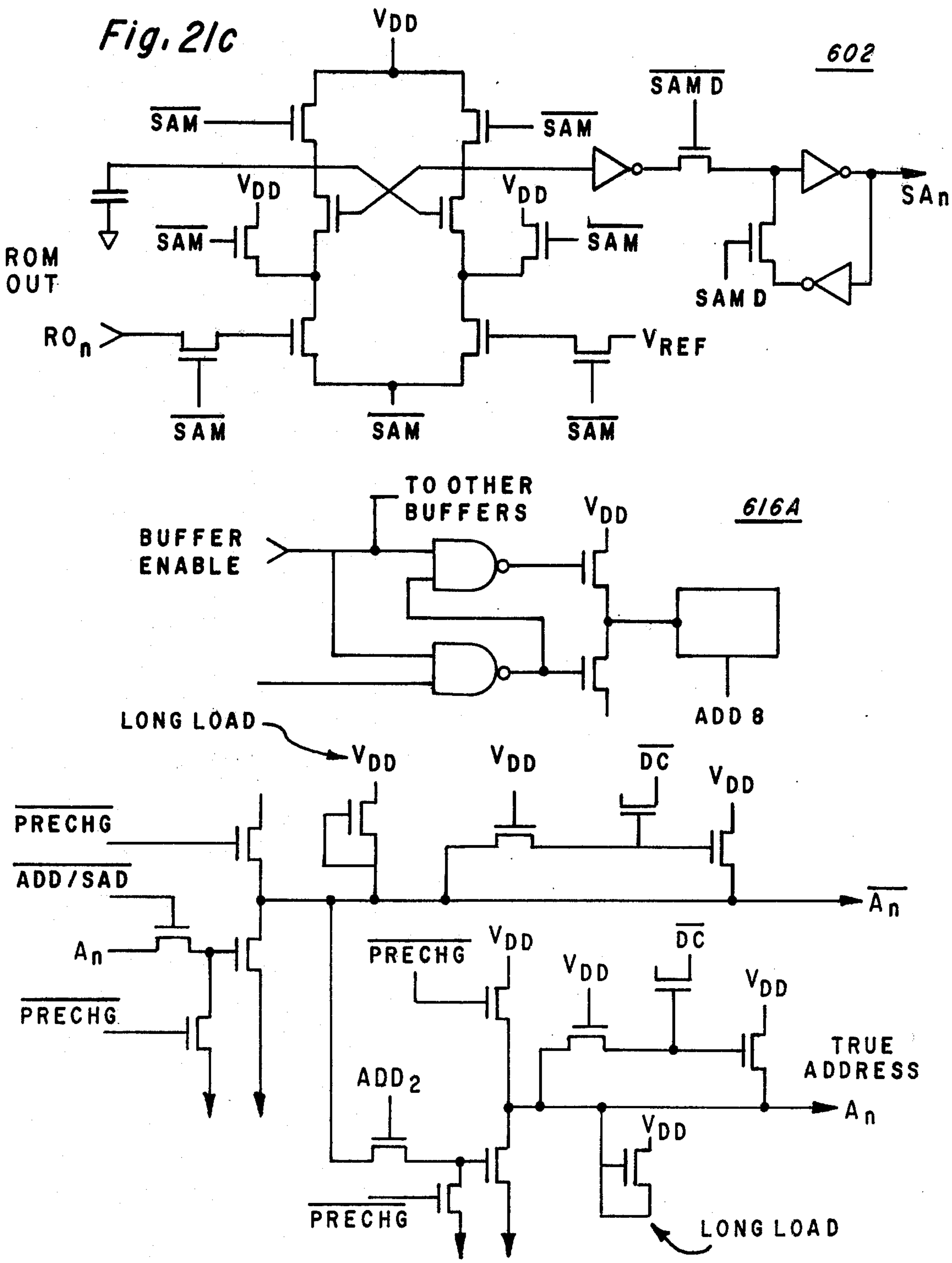
Figure 21D:
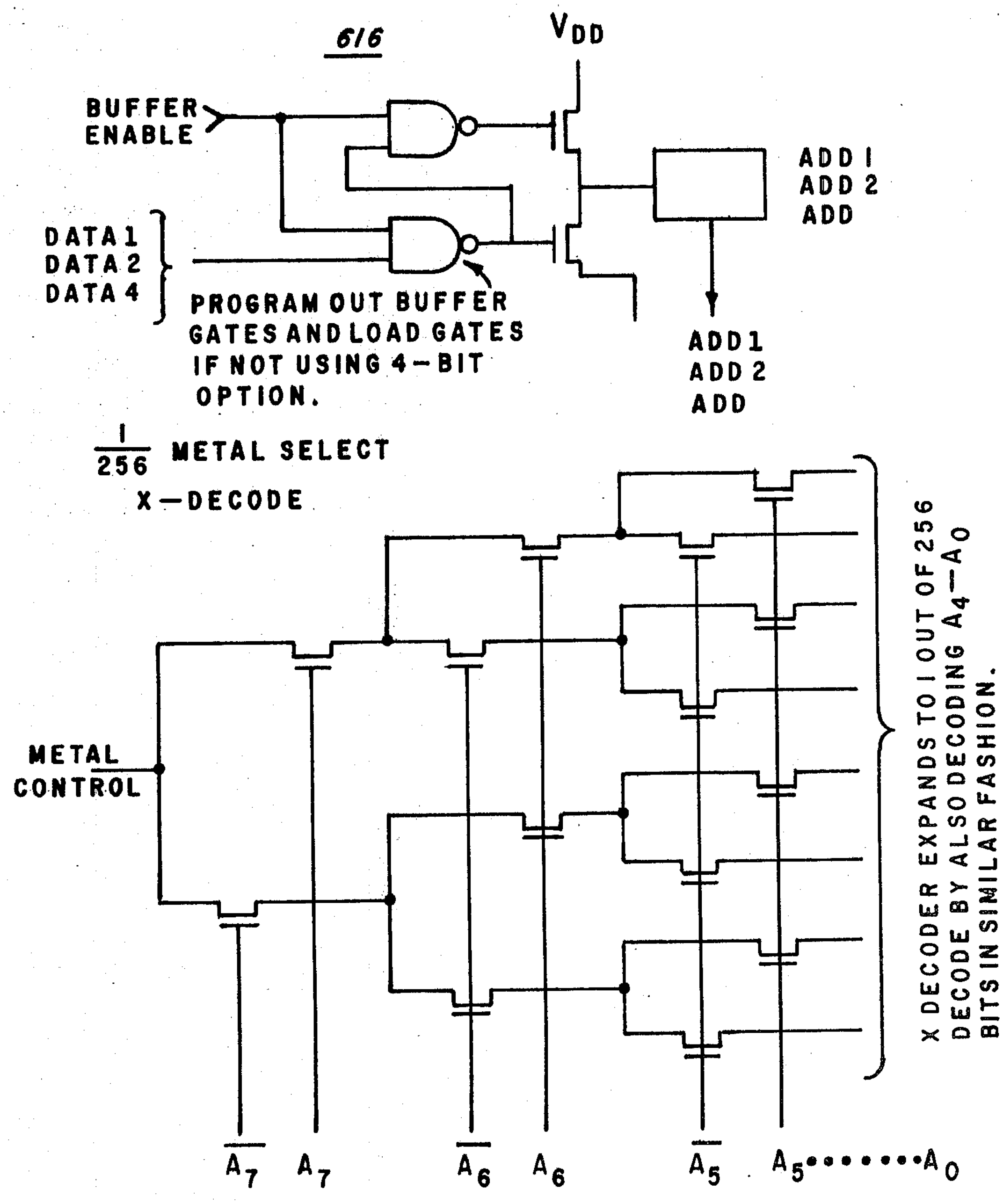

Add-one circuit 608 increments the number in program counter 604 in response to a TB command or an RB command. Since two successive bytes are used as a new address during an RB cycle, the card address and the present address incremented by one must be used to generate these two bytes. The output of add-one circuit 608 is applied via selector 609 for communicating the results of the incrementation back to the input of counter 604. Selector 609 permits the bits in output register 603 to be communicated to program counter 604 during an RB cycle as controlled by signal BR from array 600. Add-one circuit 608 is also coupled via COUNT to chip select counter 605 for incrementing the number stored therein whenever a CARRY would occur outside the fourteen bits stored in program counter 604. The output of chip select counter 605 is applied via programmable gate 610 to gate 611. The signal on the CS pin may also be applied to gate 611 or compared with the contents of CS3. Thus, gate 611 can test for either (1) the state of the CS signal, (2) a specific count in counter 605 or (3) a comparison between the state on the chip select and the state of CS3 or (4) some combination of the foregoing, as may be controlled by those knowledgeable in the art according to how programmable links 610 are programmed during chip manufacture. The output of gate 611 is applied via two bit latches of the C type, which are shown at 622. Timing array 600 controls the timing of ROM sequencing during RB and TB sequences. Array 600 includes PLA sections **600*a* and 600*b* and counters 623 and 624. Counter 623 is a two bit counter comprising two A type bit latches shown at 617. Counter 623 counts the number of times a ROM access is required to carry out a particular instruction. For instance, a TB command requires one ROM access while an RB command requires three ROM accesses. Counter 624, which comprises four "A" type bit latches of the type shown at 617, counts through the ROM timing sequence for generating various control signals used in accessing ROM array 601. The timing sequence for a TB command is shown in Table XII which depicts the states in counter 623 and 624 and the signals generated in response thereto. A similar timing sequence for an RB command is shown in Table XIII. The various signals generated by PLA 600*a* and 600*b* will now be briefly described. The BR signal controls the transfer of two serial bits from the output register 603 to the program counter 604. The TF signal controls the transfer of eight bits from the sense amp output latch 602 (FIGS. 19 and 21*c*) to output register 603 on lines SA0–SA7. INC controls the serial incrementing of the program counter, two bits for each INC signal generated. PC is the precharge signal for the ROM array and normally exists for approximately ten microseconds. The DC signal discharges the ROM 601 array and preferably lasts for approximately ten microseconds for each DC signal. This particular ROM array uses approximately seventy microseconds to discharge and thus seven DC signals are preferably generated during each addressing sequence. SAM gates the data outputted from the ROM into the sense amp output latch 602 while SAD sets the address lines by gating the address from the program counter into the ROM address buffers 625 (FIG. 21*c***).

ALTERNATIVE EMBODIMENTS

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

TABLE I

THE FOLLOWING SEQUENCE IS AN EXAMPLE OF THE LEARNING AID IN THE SPELLING MODE.

| KEY | DISPLAY | SPEAKER |
|---|---|---|
| COMPUSPELL | | 4 RANDOM TONES |
| | SPELL A | |
| B | SPELL B | B |
| C | SPELL C | C |
| D | SPELL D | D |
| P | SPELL D | P |
| A | SPELL A | A |
| GO | - | SPELL DO AS IN DO NOT |
| D | D- | D |
| O | DO- | O |
| ENTER | DO | THAT IS CORRECT, NOW SPELL |
| | - | WAS |
| W | W- | W |
| U | WU- | U |
| S | WUS- | S |
| ERASE | - | |
| W | W- | W |
| A | WA- | A |
| S | WAS- | S |
| ENTER | WAS | THAT IS RIGHT, NEXT SPELL |
| | - | ANY |
| A | A- | A |
| N | AN- | N |
| I | ANI- | I |
| ENTER | ANI | TRY AGAIN, |
| | - | ANY |
| | - | |
| REPEAT | - | ANY |
| REPEAT | - | ANY (½ SPEED) |
| E | E- | E |
| N | EN- | N |
| Y | ENY- | Y |
| ENTER | ENY | THAT IS INCORRECT, THE CORRECT SPELLING OF ANY IS |
| | A | A |
| | AN | N |
| | ANY | Y |
| | ANY | ANY |
| | | NOW TRY |
| | - | FULL |
| F | F- | F |
| U | FU- | U |
| L | FUL- | L |
| L | FULL- | L |
| | FULL | THAT IS CORRECT, TRY SHOE MEANING FOOTWEAR |
| | - | |
| S | S- | S |
| H | SH- | H |
| O | SHO- | O |
| E | SHOE- | E |
| ENTER | SHOE | YOUR ARE CORRECT, |

TABLE I-continued

| THE FOLLOWING SEQUENCE IS AN EXAMPLE OF THE LEARNING AID IN THE SPELLING MODE. | | |
|---|---|---|
| KEY | DISPLAY | SPEAKER |
| | | SPELL COMB |
| C | C- | C |
| O | CO- | O |
| M | COM- | M |
| E | COME- | E |
| ENTER | COME | TRY AGAIN, |
| | - | COMB |
| C | C- | |
| O | CO- | |
| M | COM- | |
| B | COMB- | |
| ENTER | COMB | YOU ARE CORRECT, NOW SPELL FOUR AS IN THE NUMBER |
| | - | |
| F | F- | F |
| O | FO- | O |
| U | FOU- | U |
| R | FOUR- | R |
| ENTER | FOUR | THAT IS CORRECT, |
| | - | NEXT SPELL WHO |
| W | W- | W |
| H | WH- | H |
| O | WHO- | O |
| ENTER | WHO | YOU ARE RIGHT, |
| | - | NOW TRY SOUP |
| S | S- | S |
| O | SO- | O |
| U | SOU- | U |
| P | SOUP- | P |
| ENTER | SOUP | THAT IS RIGHT, |
| | - | TRY MOST |
| M | M- | M |
| O | MO- | O |
| S | MOS- | S |
| T | MOST- | T |
| ENTER | MOST | YOU ARE CORRECT |
| | +8 −2 | 4 TONES |
| | +8 −2 | 4 TONES |
| +8 −2 | HERE IS YOUR SCORE, | |
| | | EIGHT CORRECT, TWO DID NOT COMPUTE. |

TABLE II

| LEARN MODE | | |
|---|---|---|
| KEY | DISPLAY | SPEAKER |
| | BUSY | (1 SECOND PAUSE) SAY IT (2 SECOND PAUSE) BUSY |
| | MANY | (1 SECOND PAUSE) SAY IT (2 SECOND PAUSE) MANY |
| | CARRY | (1 SECOND PAUSE) SAY IT (2 SECOND PAUSE) CARRY |
| | YOUR | (1 SECOND PAUSE) SAY IT (2 SECOND PAUSE) YOUR |
| | WILD | (1 SECOND PAUSE) SAY IT (2 SECOND PAUSE) WILD |
| | LOVE | (1 SECOND PAUSE) SAY IT (2 SECOND PAUSE) LOVE |
| | BUSH | (1 SECOND PAUSE) SAY IT (2 SECOND PAUSE) BUSH |
| REPEAT REPEAT REPEAT } IGNORED | | |

TABLE II-continued

| LEARN MODE | | |
|---|---|---|
| KEY | DISPLAY | SPEAKER |
| REPEAT | EARN | (1 SECOND PAUSE) SAY IT (2 SECOND PAUSE) EARN |
| | — | SPELL MANY |
| M | M— | M |
| A | MA— | A |
| N | MAN— | N |
| Y | MANY— | Y |
| ENTER | MANY | YOU ARE CORRECT, NOW SPELL EARN |
| | — | |
| THE LEARNING AID CONTINUES THROUGH THE REMAINING 9 WORDS AS IN THE SPELLING MODE. | | |

TABLE III

| IN THE WORD GUESSER MODE THE LEARNING AID RANDOMLY SELECTS A WORD FROM LEVEL C OR D AND DISPLAYS DASHES TO REPRESENT THE NUMBER OF LETTERS IN THE CHOSEN WORD. THE USER TRIES TO GUESS THE WORD. THE USER MUST COMPLETE THE WORD BEFORE MAKING SEVEN INCORRECT GUESSES. THE FOLLOWING IS AN EXAMPLE OF THE FUNCTION OF THE LEARNING AID IN THE SPELLING MODE. | | |
|---|---|---|
| KEY | DISPLAY | SPEAKER |
| HANGMAN | -------- | 4 TONES |
| A | -------- | |
| E | E-E----E | 4 TONES |
| I | E-E----E | |
| O | E-E--O-E | 4 TONES |
| U | E-E--O-E | |
| B | E-E--O-E | |
| C | E-E--O-E | |
| D | E-E--O-E | |
| F | E-E--O-E | |
| | EVERYONE | 4 TONES, I WIN |
| | ------ | |
| A | ------ | |
| E | -----E | 4 TONES |
| I | -----E | |
| O | -O---E | 4 TONES |
| U | -OU--E | 4 TONES |
| B | -OU--E | |
| C | COU--E | 4 TONES |
| R | COUR-E | 4 TONES |
| S | COURSE | 4 TONES |
| | COURSE | 4 TONES, YOU WIN |

TABLE IV

The synthesizer 10 includes interpolation logics to accomplish a nearly linear interpolation of all twelve speech parameters at eight points within each frame, that is, once each 2.5 msec. The parameters are interpolated one at a time as selected by the parameter counter. The interpolation logics calculate a new value of a parameter from its present value (i.e. the value currently stored in the K-stack, pitch register or E-10 loop) and the target value stored in encoded form in RAM 203 (and decoded by ROM 202). The value computed by each interpolation is listed below.

Where $P_i$ is the present value of the parameter, $P_{i+1}$ is the new parameter value $P_t$ is the target value $N_i$ is an integer determined by the interpolation counter The values of $N_i$ for specific interpolation counts and the values $$\frac{P_i - P_o}{P_t - P_o}$$

($P_0$ is initial parameter value) are as follows:

| INTERPOLATION COUNT | $N_i$ | $\frac{P_i - P_o}{P_t - P_o}$ |
|---|---|---|
| 1 | 8 | 0.125 |
| 2 | 8 | 0.234 |
| 3 | 8 | 0.330 |
| 4 | 4 | 0.498 |
| 5 | 4 | 0.623 |
| 6 | 2 | 0.717 |
| 7 | 2 | 0.859 |
| 0 | 1 | 1.000 |

TABLE V

"HELP"

φφφφ
φ 1φφφφφφφφ 1φφ 1 1φ 1 1 1φ 1φφ 1φ 1 1 1
φ 1 1 1φφφφφ 1
1 1φ 1 1φφ 1φφ 1φφφφ 1φ 1φφ 1φφφφ 1 1φφ 1 1 1 1φφφ 1φ 1φ 1φφ 1φ 1φ 1φ
1 1φ 1 1φφ 1 1 1
1 1 1φ 1φφ 1 1 1
1 1φ 1 1φ 1φφφφ 1 1φ 1φ 1 1 1 1 1φ 1φ 1φ 1φ 1φφ 1φ 1 1 1 1φφφ 1φφ 1φ 1 1φ 1
1 1φ 1 1φ 1φφφφ 1 1 1φφ 1φ 1 1 1φφφ 1 1φφ 1 1φ 1 1φφφφ 1φφ 1φφφ 1 1 1φ 1
1 1φ 1 1φφ 1 1φ 1φφφ 1φ 1φ 1φφ 1 1φ 1φφ 1 1 1 1 1 1φ 1 1φ 1φ 1φ 1φφφφ 1 1φ
1φ 1 1 1φφ 1φ 1
1φ 1φ 1φφ 1φφφ 1 1φ 1φφ 1 1 1 1φφφ 1 1φφ 1 1 1 1φ 1 1 1φφ 1φφφ 1φ 1φ 1 1φ
1φφ 1 1φφφφ 1
1φφ 1φ 1 1 1φ 1
1φφφφ 1 1φ 1 1
φφ 1φφ 1 1 1φφφφ 1φ 1φφ 1φ 1 1 1φ 1 1φφ 1 1 1 1φφ 1φ 1φ 1 1 1φφ 1φ 1 1φ 1 1
(HEL)
φφφφ
φφφφ
φφφφ
φ 1 1 1φφφφφφ 1φ 1φφφ 1φ 1 1 1φ 1 1 1φφφ
φ 1 1 1φφφφφφ 1φφφ 1φ 1φ 1 1 1φ 1 1φ 1 1φ
φ 1φ 1φφφφφ 1
φφ 1 1φφφφφφ 1φφ 1 1φφ 1 1 1 1φ 1φφ 1 1φ
φφ 1φφφφφφφ 1φφ 1φφφ 1φ 1 1φ 1 1φ 1φ 1
(P)
φφφφ
1 1 1 1

ENERGY | PITCH | REPEAT | K1 | K2 | K3 | K4 | K5 | K6 | K7 | K8 | K9 | K10

TABLE VI

| | | | | | | DECODED PARAMETERS | | | | | | | |
|---|---|---|---|---|---|---|---|---|---|---|---|---|---|
| CODE | E | P | K1 | K2 | K3 | K4 | K5 | K6 | K7 | K8 | K9 | K10 |
| 00 | 000 | 000 | 20B | 2A3 | 273 | 28F | 201 | 2DE | 2DD | 326 | 31F | 34D |
| 01 | 000 | 029 | 20F | 288 | 293 | 282 | 2E2 | 304 | 300 | 37B | 363 | 386 |
| 02 | 001 | 02B | 213 | 2CF | 289 | 2D8 | 306 | 32F | 328 | 3DA | 3AE | 3C3 |
| 03 | 001 | 02D | 218 | 2F8 | 2F6 | 308 | 32D | 35D | 352 | 038 | 3FD | 001 |
| 04 | 002 | 02F | 220 | 304 | 31B | 341 | 358 | 38E | 380 | 098 | 04C | 03E |
| 05 | 003 | 031 | 229 | 321 | 356 | 37D | 386 | 3C2 | 3B0 | 0FB | 097 | 07B |
| 06 | 005 | 033 | 234 | 340 | 398 | 3BD | 386 | 3F7 | 3E1 | 131 | 0DC | 083 |
| 07 | 007 | 035 | 242 | 362 | 3DC | 3FF | 3E7 | 02C | 013 | 169 | 118 | 0F7 |
| 08 | 00A | 037 | 255 | 384 | 023 | 040 | 018 | 061 | 045 | | | |
| 09 | 00F | 03A | 268 | 3A8 | 068 | 080 | 049 | 093 | 075 | | | |
| 0A | 015 | 03C | 286 | 3CD | 0A9 | 0BC | 079 | 0C2 | 0A3 | | | |
| 0B | 01F | 03F | 2A8 | 3F2 | 0E4 | 0F3 | 0A7 | 0EE | 0CE | | | |
| 0C | 028 | 042 | 2CF | 017 | 119 | 123 | 0D2 | 116 | 0F6 | | | |
| 0D | 03D | 046 | 2FD | 03C | 146 | 14C | 0F9 | 139 | 118 | | | |
| 0E | 056 | 049 | 332 | 061 | 16C | 16F | 11D | 158 | 13C | | | |
| 0F | 000 | 04C | 36C | 085 | 18C | 18D | 13E | 173 | 159 | | | |
| 10 | | 04F | 3AA | 0A7 | | | | | | | | |
| 11 | | 053 | 3FB | 0C7 | | | | | | | | |
| 12 | | 057 | 02D | 0E6 | | | | | | | | |
| 13 | | 05A | 06E | 103 | | | | | | | | |
| 14 | | 05F | 0AB | 11E | | | | | | | | |
| 15 | | 063 | 0E3 | 136 | | | | | | | | |
| 16 | | 067 | 115 | 14D | | | | | | | | |
| 17 | | 06B | 140 | 162 | | | | | | | | |
| 18 | | 070 | 165 | 174 | | | | | | | | |
| 19 | | 076 | 184 | 185 | | | | | | | | |
| 1A | | 07B | 19D | 194 | | | | | | | | |
| 1B | | 081 | 1B2 | 1A1 | | | | | | | | |

TABLE VI-continued

| | DECODED PARAMETERS | | | | | | | | | | | |
|---|---|---|---|---|---|---|---|---|---|---|---|---|
| CODE | E | P | K1 | K2 | K3 | K4 | K5 | K6 | K7 | K8 | K9 | K10 |
| 1C | | 086 | 1C3 | 1AD | | | | | | | | |
| 1D | | 08C | 1D0 | 1B7 | | | | | | | | |
| 1E | | 093 | 1DA | 1C1 | | | | | | | | |
| 1F | | 099 | 1E2 | 1FA | | | | | | | | |

TABLE VII

DATA OUTPUTTED FROM K-STACK 302 TO RECODING LOGIC 301 BY TIME PERIODS

| K-STACK OUTPUT | | TIME PERIODS | | | | | | | | | |
|---|---|---|---|---|---|---|---|---|---|---|---|
| BIT | LINE | T8 | T9 | T10 | T11 | T12 | T13 | T14 | T15 | T16 | T17 |
| LSB | 32-1 | $K_2$ | $K_1$ | A | $K_9$ | $K_8$ | $K_7$ | $K_6$ | $K_5$ | $K_4$ | $K_3$ |
| | 32-2 | $K_2$ | $K_1$ | A | $K_9$ | $K_8$ | $K_7$ | $K_6$ | $K_5$ | $K_4$ | $K_3$ |
| | 32-3 | $K_2$ | $K_1$ | A | $K_9$ | $K_8$ | $K_7$ | $K_6$ | $K_5$ | $K_4$ | $K_3$ |
| | 32-4 | $K_2$ | $K_1$ | A | $K_9$ | $K_8$ | $K_7$ | $K_6$ | $K_5$ | $K_4$ | $K_3$ |
| | 32-5 | $K_3$ | $K_2$ | $K_1$ | A | $K_9$ | $K_8$ | $K_7$ | $K_6$ | $K_5$ | $K_4$ |
| | 32-6 | $K_3$ | $K_2$ | $K_1$ | A | $K_9$ | $K_8$ | $K_7$ | $K_6$ | $K_5$ | $K_4$ |
| | 32-7 | $K_4$ | $K_3$ | $K_2$ | $K_1$ | A | $K_9$ | $K_8$ | $K_7$ | $K_6$ | $K_5$ |
| | 32-8 | $K_4$ | $K_3$ | $K_2$ | $K_1$ | A | $K_9$ | $K_8$ | $K_7$ | $K_6$ | $K_5$ |
| | 32-9 | $K_5$ | $K_4$ | $K_3$ | $K_2$ | $K_1$ | A | $K_9$ | $K_8$ | $K_7$ | $K_6$ |
| MSB | 32-10 | $K_5$ | $K_4$ | $K_3$ | $K_2$ | $K_1$ | A | $K_9$ | $K_8$ | $K_7$ | $K_6$ |
| | | T18 | T19 | T20 | T21 | T22 | T23 | T24 | T25 | T26 | T27 |
| LSB | 32-1 | $K_2$ | $K_1$ | $K_{10}$ | $K_9$ | $K_8$ | $K_7$ | $K_6$ | $K_5$ | $K_4$ | $K_3$ |
| | 32-2 | $K_2$ | $K_1$ | $K_{10}$ | $K_9$ | $K_8$ | $K_7$ | $K_6$ | $K_5$ | $K_4$ | $K_3$ |
| | 32-3 | $K_2$ | $K_1$ | $K_{10}$ | $K_9$ | $K_8$ | $K_7$ | $K_6$ | $K_5$ | $K_4$ | $K_3$ |
| | 32-4 | $K_2$ | $K_1$ | $K_{10}$ | $K_9$ | $K_8$ | $K_7$ | $K_6$ | $K_5$ | $K_4$ | $K_3$ |
| | 32-5 | $K_3$ | $K_2$ | $K_1$ | $K_{10}$ | $K_9$ | $K_8$ | $K_7$ | $K_6$ | $K_5$ | $K_4$ |
| | 32-6 | $K_3$ | $K_2$ | $K_1$ | $K_{10}$ | $K_9$ | $K_8$ | $K_7$ | $K_6$ | $K_5$ | $K_4$ |
| | 32-7 | $K_4$ | $K_3$ | $K_2$ | $K_1$ | $K_{10}$ | $K_9$ | $K_8$ | $K_7$ | $K_6$ | $K_5$ |
| | 32-8 | $K_4$ | $K_3$ | $K_2$ | $K_1$ | $K_{10}$ | $K_9$ | $K_8$ | $K_7$ | $K_6$ | $K_5$ |
| | 32-9 | $K_5$ | $K_4$ | $K_3$ | $K_2$ | $K_1$ | $K_{10}$ | $K_9$ | $K_8$ | $K_7$ | $K_6$ |
| MSB | 32-10 | $K_5$ | $K_4$ | $K_3$ | $K_2$ | $K_1$ | $K_{10}$ | $K_9$ | $K_8$ | $K_7$ | $K_6$ |

TABLE VIII

| | CHIRP ROM CONTENTS | |
|---|---|---|
| ADDRESS | CHIRP FUNCTION VALUE | STORED VALUE (COMPLEMENTED) |
| 00 | 00 | FF |
| 01 | 2A | D5 |
| 02 | D4 | 2B |
| 03 | 32 | CD |
| 04 | B2 | 4D |
| 05 | 12 | ED |
| 06 | 25 | DA |
| 07 | 14 | EB |
| 08 | 02 | FD |
| 09 | E1 | 1E |
| 10 | C5 | 3A |
| 11 | 02 | FD |
| 12 | 5F | A0 |
| 13 | 5A | A5 |
| 14 | 05 | FA |
| 15 | 0F | F0 |
| 16 | 26 | D9 |
| 17 | FC | 03 |
| 18 | A5 | 5A |
| 19 | A5 | 5A |
| 20 | D6 | 29 |
| 21 | DD | 22 |
| 22 | DC | 23 |
| 23 | FC | 03 |
| 24 | 25 | DA |
| 25 | 2B | D4 |
| 26 | 22 | DD |
| 27 | 21 | DE |
| 28 | 0F | F0 |
| 29 | FF | 00 |
| 30 | F8 | 07 |
| 31 | EE | 11 |
| 32 | ED | 12 |
| 33 | EF | 10 |

TABLE VIII-continued

| | CHIRP ROM CONTENTS | |
|---|---|---|
| ADDRESS | CHIRP FUNCTION VALUE | STORED VALUE (COMPLEMENTED) |
| 34 | F7 | 08 |
| 35 | F6 | 09 |
| 36 | FA | 05 |
| 37 | 00 | FF |
| 38 | 03 | FC |
| 39 | 02 | FD |
| 40 | 01 | FE |

TABLE IX-O LEARNING AID INSTRUCTION SET

| Address | Instruction | Branch Line | Line | Name | Title | | Comments |
|---|---|---|---|---|---|---|---|
| 0000 | 000101110 | | 0055 | KD3 | TAMZA | | ADD 5 TO KEY |
| 0001 | 001111010 | | 0056 | | ACACC | 5 | CODE EACH TIME |
| 0003 | 001000111 | | 0057 | | TCY | 14 | R-LINE POINTER IS DECREMENTED |
| 0007 | 111011000 | 0112 | 0058 | | CALL | ADDCARRY | |
| 000F | 101010111 | 0080 | 0059 | | BRANCH | KD2 | |
| 001F | 001100000 | | 0060 | KEYDOWN | TCMIY | 0 | RESET DEBOUNCE COUNTER |
| 003F | 010011000 | | 0061 | | LDX | 1 | |
| 007F | 001000111 | | 0062 | | TCY | 14 | |
| 007F | 000001010 | | 0063 | | TKM | | |
| 007D | 000110011 | | 0064 | | MNEZ | | DOUBLE CHECK KEY DOWN |
| 007B | 101011111 | 0068 | 0065 | | BRANCH | KD1 | |
| 0077 | 010010000 | | 0066 | | LDX | 0 | |
| 006F | 100110110 | 0133 | 0067 | | BRANCH | CAR3 | KEY NOT DOWN |
| 005F | 010010000 | | 0068 | KD1 | LDX | 0 | |
| 003E | 001100000 | | 0069 | | TCMIY | 0 | |
| 007C | 001100000 | | 0070 | | TCMIY | 0 | |
| 0079 | 001001011 | | 0071 | | TCY | 13 | |
| 0073 | 000101010 | | 0072 | | TMY | | |
| 0067 | 000110110 | | 0073 | | RSTR | | RESET PRESENT R-LINE |
| 004F | 001001011 | | 0074 | | TCY | 13 | |
| 001E | 000000110 | | 0075 | | CLA | | |
| 003D | 001110110 | | 0076 | | ACACC | 6 | PUT 6 IN ACC |
| 007A | 000001110 | | 0077 | | KNEZ | | SEE IF KEY IS ON VSS |
| 0075 | 101010111 | 0080 | 0078 | | BRANCH | KD2 | VSS |
| 006B | 000101001 | | 0079 | | TMA | | |
| 0057 | 000101111 | | 0080 | KD2 | TAM | | * STORE 6 IF K=VSS |
| 002F | 001001011 | | 0081 | | TCY | 13 | |
| 005C | 000000111 | | 0082 | | DMAN | | |
| 0038 | 100000000 | 0055 | 0083 | | BRANCH | KD3 | |
| 0070 | 010011000 | | 0084 | SUMSIT | LDX | ONE | * BUMP ROUTINE TO CALCUL VALUE OF KP |
| 0061 | 001000111 | | 0085 | | TCY | VALUE | ** |
| 0043 | 000101001 | | 0086 | | TMA | | ** |
| 0006 | 011100100 | | 0087 | | ALEC | 2 | |
| 000D | 101010011 | 0096 | 0088 | | BRANCH | ARND+5 | |
| 001B | 001111111 | | 0089 | | ACACC | 15 | |
| 0037 | 011101100 | | 0090 | | ALEC | 3 | |
| 006E | 101010011 | 0096 | 0091 | | BRANCH | ARND+5 | |
| 005D | 001111011 | | 0092 | | ACACC | 13 | |
| 003A | 011100010 | | 0093 | | ALEC | 4 | |
| 0074 | 101010011 | 0096 | 0094 | | BRANCH | ARND+5 | |

```
0069 001111101           0095          ACACC     10
0053 001111111           0096 ARNO+5   ACACC     MINUS$1              **
0026 010010000           0097          LDX       ZERO                 **
004C 001100111           0098          TCY       VALUE                **
0018 111011000  0112     0099          CALL      ADDCARRY
0031 010001111           0100 EVL$OUT  BL        KEY$EVL
0062 100001100  2282     0101
                         0102 * THIS ROUTINE USES ,CARRY, TO INCREMENT THE RANDOM NUMBER/TIMEOUT COUNTER
0045 001000011           0103 TIMEUP   TCY       12
000A 000001110           0104          KNEZ
0015 100011101  0128     0105          BRANCH    CAR2
002B 010011100           0106 TIMEUP1  LDX       3
0056 001000001           0107          TCY       8
002C 100000010  0116     0108          BRANCH    CARRYON
                         0109 *
                         0110 *   CARRY:  FOR ADDITION IN ROM ADDR SECTION OF RAM
                         0111 *
0058 000010101           0112 ADDCARRY AMAAC
0030 101000001  0115     0113          BRANCH    CARRY
0060 100001011  0118     0114          BRANCH    NOCARRY
0041 000101101           0115 CARRY    TAMIYC                         CARRY
0002 000110010           0116 CARRYON  IMAC                           INCREMENT MEM IF CARRY
0005 101000001  0115     0117          BRANCH    CARRY
000B 000101111           0118 NOCARRY  TAM
0017 010111111           0119          RETN
002F 001000011           0120          TCY       12
005E 000101001           0121          TMA
003C 011101100           0122          ALEC      3                    CHECK TIMEOUT COUNTER
0078 101000111  0126     0123          BRANCH    CAR1
0071 001001011           0124 OFF      TCY       13
0063 000110110           0125          RSTR                           TURNS OFF CALCULATOR
0047 010010000           0126 CAR1     LDX       0
000E 100110110  0133     0127          BRANCH CAR3
001D 000101001           0128 CAR2     TMA
003B 001000101           0129 CAR4     TCY       10
0076 000100011           0130          TBIT      3                    TEST DEBOUNCE COUNTER
006D 101011001  0135     0131          BRANCH    CAR5                 ACCEPT KEY IF COUNTER>7
005B 001100000           0132          TCMIY     0                    RESET DEBOUNCE COUNTER
0036 010001111           0133 CAR3     BL        DISP/KB1
006C 100110010  2245     0134
0059 011101011           0135 CAR5     ALEC      13                   *TEST TO SEE IF SPEECH IS
0032 100110110  0133     0136          BRANCH    CAR3                 *FINISHED (TEST TALK COUNTER=14)
0064 100011111  0060     0137          BRANCH    KEYDOWN
                         0138 *
```

```
                                  *
                                  *
                                  *
0049 010010001                    GAME#3  LDX     8
0012 001001110                            TCY     7
0025 000101001                            TMA
004A 011100110                            ALEC    6
0014 101010010  0148                      BRANCH  FIRST
0029 100100001  0152                      BRANCH  GM3A
0052 001101110                    FIRST   TCMIY   7
0024 010100010                            SBIT    1
0046 010001000                            CALLL   CLEAR
0010 110111010  0236
0021 010001010                    GM3A    CALLL   CURLEVL
0042 111101111  0769
0004 001100000                            TCMIY   0
0009 001100001                            TCMIY   8          * TO 008C; 008C=008D
                                  *                          * CONTAIN ADDRESS FOR
                                  *                          * RAMDOM LETTER TABLE
0013 010000101                            CALLL   MEMADDR    ADDRESS 0350
0027 111011000  1501
004E 010001110                            CALLL   LOADRESS   * LOAD DATA FROM 0350 INTO
001C 111000010  1121
                                  *                          * ROM ADDRESS LOCATION
0039 010011100                            LDX     3
0072 001001001                            TCY     9
0065 010100111                            RBIT    3
0048 000101001                            TMA
0016 010011000                            LDX     1          * ADD
0020 001001101                            TCY     11         * TO
005A 111011000  0112                      CALL    ADDCARRY   * ROM ADDRESS
0034 010011100                            LDX     3          GET LSD OF RANDOM NUMBER
0068 001100001                            TCY     8          GET MSD OF RANDOM NUMBER
0051 000101001                            TMA
0022 010011000                            LDX     1
0044 001000101                            TCY     10
0008 111011000  0112                      CALL    ADDCARRY   * ADD TO ROM ADDRESS
0011 010000101                            CALLL   MEMADDR    LOAD ADDRESS TO 0350
0023 111011000  1501
0046 010001110                            CALLL   OUTADDR2   GET LSD OF RANDOM LETTER
000C 111000001  1083
0019 010010000                            LDX     0
0033 001000111                            TCY     14
```

```
0066  000101111          0182            TAM
004D  010001110          0183            CALLL     OUTADDR2       GET MSD OF RANDOM LETTER
001A  111000001   1083   0184
0035  010010000          0185            LDX       0              * STORE
006A  001001111          0186            TCY       15             * LIKE A
0055  000101111          0187            TAM                      * KEYPRESS
002A  010010100          0188            LDX       2
0054  001100000          0189            TCMIY     0
0028  010001011          0190            BL        TRANSFER       ** SAYS LETTER AND
0050  101011111   1875   0191                                     ** PUTS IT IS DISPLAY
                         0192      *
```

TABLE IX-1

```
                         0193            ORGPG     1
0000  000101101          0194  NOTFULL   TAMIYC
0001  001101000          0195            TCMIY     1
0003  001000111          0196            TCY       14
0007  000101001          0197            TMA
000F  001001101          0198            TCY       11
001F  000101010          0199            TMY
003F  010011000          0200            LDX       1
007F  000101101          0201            TAMIYC
007E  001100011          0202            TCMIY     12
007D  010010000          0203            LDX       0
007B  001001101          0204            TCY       NXTSDSP        **
0077  000110010          0205            IMAC                     **
006F  000101111          0206            TAM                      **
005F  010000010          0207            BL        NOSTRANS       **
003E  100101100   0680   0208
                         0209      *
                         0210      *  GO ROUTINE==> DECIDES WHICH MODE YOUR IN AND BRANCHES
                         0211      *         TO THAT MODE, ELSE GOES TO DISP/KB.
                         0212      *
```

```
007C 010001010        0213  GO      BL      RANDOM
0079 100000000   0753 0214
0073 010010001        0215  RANRTN  LDX     8            DAM
0067 001000110        0216          TCY     6
004F 010100110        0217          RBIT    1
001E 001000001        0218          TCY     8            SET GO MODE FLAG
003D 010100010        0219          SBIT    1            *
007A 001001110        0220          TCY     7            TEST WHICH MODE
0075 000101001        0221          TMA
006B 010011010        0222          LDX     5
0057 001001011        0223          TCY     13
002E 001100000        0224          TCMIY   0
005C 010001101        0225          CALLL   CORRSSPL
0038 110000000   1582 0226
0070 010000100        0227          LDP     2
0061 011101000        0228          ALEC    1            SPELL?
0043 100000000   0342 0229          BRANCH  USPELL       *
0006 010000001        0230          LDP     8            *
000D 011101100        0231          ALEC    3            LEARN?
001B 100110001   1209 0232          BRANCH  ULRN+1
0037 010001101        0233          LDP     11
006E 011101010        0234          ALEC    5            GAME#1?
005D 101111110   1590 0235          BRANCH  CORR+1
003A 001000000        0236  CLEAR   TCY     0
0074 010010000        0237  HERE    LDX     0
0069 001101000        0238          TCMIY   1
0053 000000100        0239          DYN
0026 010011000        0240          LDX     1
004C 001101101        0241          TCMIY   11
0018 001010001        0242          YNEC    8
0031 101110100   0237 0243          BRANCH  HERE
0062 001000000        0244          TCY     0
0045 001100011        0245          TCMIY   12
000A 010010000        0246          LDX     0
0015 001001101        0247          TCY     11
002B 001100000        0248          TCMIY   0
0056 010111111        0249          RETN
002C 101110011   0215 0250  REPLAY  BRANCH  RANRTN
                      0251  *
                      0252  *  ENTER-  ROUTINE TO PROCESS ENTER KEY DEPRESS
                      0253  *
0058 010010001        0254  ENTER   LDX     8            DAM
0030 001001110        0255          TCY     7            FLAG
```

```
0060  000110011         0256                MNEZ                             SPELL MODE?
0041  100000101   0259  0257                BRANCH   TST4A3                  NO
0002  101100011   0273  0258                BRANCH   SPACE-3
0005  000101010         0259  TST4A3        TMY
0008  001011100         0260                YNEC     3                       SPELL IT MODE?
0017  101011110   0263  0261                BRANCH   TST4A6                  NO
002F  101100011   0273  0262                BRANCH   SPACE-3
005F  001010110         0263  TST4A6        YNEC     6                       GAME 2 MODE?
003C  101100011   0273  0264                BRANCH   SPACE-3
0078  010000110         0265                BL       CRYPTO
0071  100000000   0894  0266
                        0267  *
                        0268  *  TEST FOR CURSER POSITION
                        0269  *  FIRST POSITION? ---RETURN
                        0270  *  ELSE, REPLACE CURSER WITH SPACE
                        0271  *
                        0272  *  TEST FOR POSITION OF CURSER AND REPLACE WITH SPACE
0063  001001110         0273  SPACE-3       TCY      7                       LAST CHAR
0047  010011000         0274                LDX      1
000E  000000110         0275  SPACE-2       CLA                              ACC=8
001D  001111101         0276                ACACC    11                      1B=SPACE
003B  000001001         0277                MNEA                             MEM=11?
0076  101011001   0283  0278                BRANCH   CHAROR+                 NO
006D  010010000         0279                LDX      0                       YES
005B  000110011         0280                MNEZ                             BLANK?
0036  100100001   0296  0281                BRANCH   SPACE-1                 YES, GO TO SPACE-1
006C  100100100   0293  0282                BRANCH   CHAR                    ELSE, CHAR
0059  010011000         0283  CHAROR+       LDX      1
0032  001111000         0284                ACACC    1                       ACC=12 FOR CURSER
0064  000001001         0285                MNEA
0049  100100100   0293  0286                BRANCH   CHAR                    CHAR
0012  010010000         0287                LDX      0                       TEST MSW
0025  000110011         0288                MNEZ                             CURSER
004A  100101001   0291  0289                BRANCH   CUR-1                   YES
0014  100100100   0293  0290                BRANCH   CHAR                    NO, THEN CHAR
0029  010011000         0291  CUR-1         LDX      1                       LSW
0052  001101101         0292                TCMIY    11
0024  010111111         0293  CHAR          RETN
0048  010000100         0294                BL       SPLENTER                GO TO SPELL ROUTINE
```

```
0010 101010111  0373 0295
0021 000000100       0296 SPACE-1  DYN                        SEARCH FOR CURSER
0042 010011000       0297          LDX       1                *
0004 100001110  0275 0298          BRANCH    SPACE-2          *
                     0299 *
                     0300 *
                     0301 *  NOPHRASE LOADS ROM ADDR WITH SECOND WRONG RESPONSE
                     0302 *      THEN CONTINUES TO NEXT WORD
                     0303 *
0009 010011100       0304 NOPHRASE LDX       3                FLAG
0013 001001011       0305          TCY       13               *
0027 001101100       0306          TCMIY     3
004E 010001010       0307          CALLL     CURLEVL
001C 111101111  0769 0308
0039 001100100       0309          TCMIY     2
0072 001100110       0310          TCMIY     6
0065 010000101       0311 SPK4     CALLL     MEMADDR
0048 111011000  1501 0312
0016 010001110       0313          CALLL     LOADRESS
002D 111000010  1121 0314
005A 010000101       0315          CALLL     MEMADDR
0034 111011000  1501 0316
0068 010000011       0317          BL        LNKSET           ALWAYS BRANCH
0051 100111000  1751 0318
0022 010010100       0319 F-SCORE  LDX       2                RETNSBCH FLAG
0044 001000111       0320          TCY       14
0008 001101000       0321          TCMIY     1
0011 001100000       0322          TCMIY     0                *
0023 010001010       0323          CALLL     CURLEVL          ZERO ROM ADDR
0046 111101111  0769 0324
000C 010000110       0325          LDP       6
0019 011101001       0326          ALEC      9                10 CORRECT?????
0033 100101111  0955 0327          BRANCH    F2               NO,
0066 010010000       0328          LDX       0
0040 001000100       0329          TCY       2
001A 001100100       0330          TCMIY     2
0035 010011000       0331          LDX       1                ELCE--------
006A 001001000       0332          TCY       1
0055 001101000       0333          TCMIY     1
002A 001100000       0334          TCMIY     0
0054 010010100       0335          LDX       2
0028 001000111       0336          TCY       14
0050 000110010       0337          IMAC
0020 010001101       0338          BL        TONE22
0040 101100011  1656 0339
```

```
                        0340            ORGPG    2
                        0341  *
0000 010110010          0342  USPELL    COMX8                    ADDRESS DAM
0001 001100010          0343            TCY      4
0003 001100000          0344            TCMIY    0
0007 010001000          0345  USPELL+1  CALLL    CLEAR           * BLANK DISPLAY = INPUT CURSER
000F 110111010   0236   0346
                        0347  *  LOAD PHRASE INTO ROM ADDRESS REG
001F 010001010          0348  DISSPELL  CALLL    CURLEVL
003F 111101111   0769   0349
007F 001100010          0350            TCMIY    4
007E 001100110          0351            TCMIY    6
007D 010110010          0352  ADDCTR    COMX8                    ADDRESS DAM
007B 001000010          0353            TCY      4               PHRASE COUNTER==>ACC
0077 000101001          0354            TMA                      *
006F 010011000          0355            LDX      1
005F 001000101          0356            TCY      10
003E 010111111          0357            RETN
007C 010000000          0358            CALLL    ADDCARRY
0079 111011000   0112   0359
                        0360  *  SET UP WORD ADDRESS IN LNK/EDT
0073 010010100          0361            LDX      2
0067 001001111          0362            TCY      15
004F 001101001          0363            TCMIY    9
001E 010000101          0364            CALLL    MEMADDR
003D 111011000   1501   0365
007A 010001110          0366            CALLL    LOADRESS
0075 111000010   1121   0367
006B 101011011   0423   0368            BRANCH   NBIT3
                        0369  *
                        0370  *  SPLENTER= BEGINS BY COMPARING CORRECT SPELLING BUFFER
                        0371  *           TO DISPLAY BUFFER
                        0372  *
0057 001000000          0373  SPLENTER  TCY      0               FIRST LETTER==LSW
002E 010011100          0374  SPLNTR+1  LDX      3               *
005C 000101001          0375            TMA
0038 010011000          0376            LDX      1               DISPLAY BUFFER
0070 000001001          0377            MNEA                     SAME?
0061 101101100   0425   0378            BRANCH   MISS1
0043 010010100          0379            LDX      2               YES, TEST MSW
0006 000000110          0380            CLA
000D 000100000          0381            TBIT     0
```

```
0018 101101110  0384  0382            BRANCH  CONXT1
0037 101011101  0385  0383            BRANCH  CONXT2
006E 001111000        0384  CONXT1    ACACC   1
005D 010010000        0385  CONXT2    LDX     0
003A 000001001        0386            MNEA                       SAME?
0074 101101100  0425  0387            BRANCH  MISS1
0069 000000110        0388            CLA
0053 010111111        0389            RETN
0026 000000101        0390            IYC                        NEXT LETTER
004C 001010001        0391            YNEC    8
0018 100101110  0374  0392            BRANCH  SPLNTR+1           NO
                      0393  *   SPELLING IS CORRECT
0031 010110010        0394            COMX8                      ADDRESS DAM
0062 001000110        0395            TCY     6                  FLAG
0045 000100000        0396            TBIT    0                  BIT 0==>0=FIRST TRY
000A 100101011  0400  0397            BRANCH  NBIT               *        1==>MORE TN ONE
0015 010100000        0398            SBIT    0
                      0399  *   BEGIN LOADING PRAISE PHRASE
0028 010011100        0400  NBIT      LDX     3
0056 001001011        0401            TCY     13                 FLAG
002C 001101000        0402            TCMIY   1
0058 010110010        0403            COMX8
0030 001001000        0404            TCY     1
0060 001100000        0405            TCMIY   0
0041 010010100        0406            LDX     2
0002 001001111        0407            TCY     15
0005 001101100        0408            TCMIY   3
0008 010001010        0409            CALLL   CURLEVL
0017 111101111  0769  0410
002F 001100001        0411            TCMIY   8
005E 001101010        0412            TCMIY   5
003C 111111101  0352  0413            CALL    ADDCTR
0078 011100110        0414            ALEC    6
0071 101110110  0421  0415            BRANCH  NBIT2
0063 010110010        0416            COMX8
0047 001000010        0417            TCY     4
000E 001100000        0418            TCMIY   0
001D 000000110        0419            CLA
0038 010110010        0420            COMX8
0076 010000000        0421  NBIT2     LDP     0
006D 111011000  0112  0422            CALL    ADDCARRY
005B 010000010        0423  NBIT3     BL      ADDCTR6
0036 101011001  0704  0424
```

```
0060  000000110        0425   MISS1    CLA
0059  001110011        0426            ACACC    12
0032  010010000        0427            LDX      0
0064  010111111        0428            RETN
0049  010000101        0429            BL       MISSPELL
0012  100111001  1546  0430
0025  010001000        0431   F3       CALLL    CLEAR          CLEAR DISPLAY
004A  110111010  0236  0432
0014  010010001        0433            LDX      8
0029  001000001        0434            TCY      8
0052  010100001        0435            SBIT     2
0024  010100110        0436            RBIT     1
0048  001001000        0437            TCY      1
0010  010010000        0438            LDX      0
0021  001100100        0439            TCMIY    2
0042  001001110        0440            TCY      7
0004  001100100        0441            TCMIY    2
0009  010011000        0442            LDX      1
0013  001000000        0443            TCY      0
0027  001101011        0444            TCMIY    13
004E  001000110        0445            TCY      6
001C  001100111        0446            TCMIY    14
0039  010011010        0447            LDX      5
0072  001001011        0448            TCY      13
0065  000101001        0449            TMA
0048  010011000        0450            LDX      1
0016  001001110        0451            TCY      7
002D  000101111        0452            TAM
005A  010001110        0453            CALLL    FL2
0034  110001100  1145  0454
0068  010011000        0455            LDX      1
0051  001001000        0456            TCY      1
0022  000101111        0457            TAM
0044  010001000        0458            BL       F-SCORE
0008  100100010  0319  0459
                       0460   *  LEARN MODE BEGINS HERE
                       0461   *
0011  010010001        0462   SPELL    LDX      8
0023  001001110        0463            TCY      7
0046  001100000        0464            TCMIY    0
000C  101001101  0469  0465            BRANCH   SPELL9
```

| | | | | | | |
|---|---|---|---|---|---|---|
| 0019 | 010010001 | | 0466 | LEARN | LDX | 8 |
| 0033 | 001001110 | | 0467 | | TCY | 7 |
| 0066 | 001100100 | | 0468 | | TCMIY | 2 |
| 0040 | 010001111 | | 0469 | SPELL9 | BL | DSP7 |
| 001A | 101110000 | 2188 | 0470 | | | |
| 0035 | 001111100 | | 0471 | MISS3 | ACACC | 3 |
| 006A | 000101111 | | 0472 | | TAM | |
| 0055 | 010000010 | | 0473 | | LDP | 4 |
| 002A | 011100110 | | 0474 | | ALEC | 6 |
| 0054 | 100101100 | 0680 | 0475 | | BRANCH | NOSTRANS |
| 002B | 010001100 | | 0476 | | BL | IWIN |
| 0050 | 100101100 | 0541 | 0477 | | | |

TABLE IX-3

| | | | | | | | |
|---|---|---|---|---|---|---|---|
| | | | 0478 | | ORGPG | 3 | |
| 0000 | 010010100 | | 0479 | GAME#1 | LDX | 2 | |
| 0001 | 000000110 | | 0480 | | CLA | | |
| 0003 | 001001011 | | 0481 | | TCY | 13 | |
| 0007 | 000101111 | | 0482 | | TAM | | CLEAR GUESS COUNTER |
| 000F | 010011100 | | 0483 | | LDX | 3 | |
| 001F | 001100111 | | 0484 | | TCMIY | 14 | HANGMAN FLAG |
| 003F | 001000101 | | 0485 | | TCY | 10 | |
| 007F | 000100000 | | 0486 | | TBIT | 0 | * TEST RANDOM COUNTER |
| 007E | 101111011 | 0489 | 0487 | | BRANCH | HANG2 | * BIT AND PUT 2 OR 3 |
| 007D | 001111000 | | 0488 | | ACACC | 1 | * IN ACC |
| 007B | 001110100 | | 0489 | HANG2 | ACACC | 2 | * |
| 0077 | 010011000 | | 0490 | | LDX | 1 | |
| 006F | 001001111 | | 0491 | | TCY | 15 | * STORE 2 OR 3 IN LEVEL |
| 005F | 000101111 | | 0492 | | TAM | | * OF DIFFICULTY |
| 003E | 010010001 | | 0493 | | LDX | 8 | DAM |
| 007C | 001001110 | | 0494 | | TCY | 7 | |
| 0079 | 001101010 | | 0495 | | TCMIY | 5 | SET HANGMAN MODE |
| 0073 | 010001010 | | 0496 | | BL | CURLEVL | |
| 0067 | 101101111 | 0769 | 0497 | | | | |

```
                         0498   * 'RANDOM' GENERATES A RANDOM WORD,
                         0499   * PUTS IT IN THE CORRECT SPELLING
                         0500   * BUFFER AND RETURNS TO 'HANG'
004F 010001000           0501   HANG     CALLL    CLEAR         PUT BLANKS IN DISPLAY
001F 110111010     0236  0502
0030 001000001           0503            TCY      8
007A 000000100           0504   HANG3    DYN
0075 010000100           0505            CALLL    SPLNTR+1      * COMPARE DISPLAY DIGIT TO
006B 110101110     0374  0506
0057 011100000           0507            ALEC     0             * DIGIT IN CORRECT
002E 101111010     0504  0508            BRANCH   HANG3         * SPELLING BUFFER
                         0509   * FINDS THE FIRST DIGIT THAT IS NOT A
                         0510   * BLANK, STARTING FROM THE RIGHT SIDE;
                         0511   * THE ROUTINE BELOW THEN PUTS CURSORS IN
                         0512   * THE DIGITS CORRESPONDING TO LETTERS
005C 010011000           0513            LDX      1
0038 000101100           0514   HANG4    TAMDYN
0070 100111000     0514  0515            BRANCH   HANG4
0061 010001101           0516   SONG     BL       TONES
0043 101000111     1657  0517
                         0518   * IF THE HANGMAN FLAGS ARE SET UP, LETTER
                         0519   * KEYS GO TO 'HANG1' AFTER SPEAKING THE LETTER
                         0520   ** THIS ROUTINE COMPARES LETTER ENTERED TO CORRECT SPELLING
0006 001001011           0521   HANG1    TCY      13
000D 010010000           0522            LDX      0             * BIT 1= WORD NOT COMPLETE
001B 001100000           0523            TCMIY    0             * BIT 0=CORRECT LETTER
0037 001000001           0524            TCY      8
006E 010100011           0525   HANG5    SBIT     3             BIT IS SET AFTER EACH DIGIT IS COMPARED
005D 000000100           0526            DYN
003A 101011011     0562  0527            BRANCH   HANG6
0074 001000001           0528            TCY      8             COMPARISONS ARE COMPLETE
0069 010100111           0529   HANG10   RBIT     3             RESET BIT 3 IN EACH DIGIT
0053 000000100           0530            DYN
0026 101101001     0529  0531            BRANCH   HANG10
004C 001001011           0532            TCY      13
0018 000100000           0533            TBIT     0             WAS THE LETTER CORRECT?
0031 101100011     0555  0534            BRANCH   HANG11
0062 010010100           0535            LDX      2             NO
0045 000110010           0536            IMAC                   * ADD 1 TO INCORRECT
000A 000101111           0537            TAM                    * GUESS COUNTER
```

```
0015 010001111        0538            LDP      15
0028 011100110        0539            ALEC     6
0056 100101100   2219 0540            BRANCH   DISP/KB
002C 010011000        0541   IWIN     LDX      1
0058 001000101        0542            TCY      10
0030 001100000        0543            TCMIY    0
0060 001101110        0544            TCMIY    7
0041 001100000        0545   IWIN1    TCMIY    0
0002 001100000        0546            TCMIY    0
0005 001001111        0547            TCY      15
0008 010010100        0548            LDX      2
0017 001100000        0549            TCMIY    0
002F 010010001        0550            LDX      8           CLEAR HANGMAN
005E 001000001        0551            TCY      8
003C 010100110        0552            RBIT     1
0078 010000101        0553            BL       LOADDISP
0071 101111001   1456 0554
0063 000100010        0555   HANG11   TBIT     1
0047 101100001   0516 0556            BRANCH   SONG
000E 001000101        0557   YOUWIN   TCY      10          YES
001D 010011000        0558            LDX      1
003B 001100100        0559            TCMIY    2
0076 001101110        0560            TCMIY    7           * 'YOU WIN'
006D 101000001   0545 0561            BRANCH   IWIN1
005B 010000100        0562   HANG6    CALLL    SPLNTR+1    *CHECK IF CORRECT
0036 110101110   0374 0563
006C 011100000        0564            ALEC     0           *LETTER HAS ALREADY
0059 101101110   0525 0565            BRANCH HANG5         *BEEN ENTERED IN EACH DIGIT
0032 001001111        0566            TCY      15          NO
0064 000101001        0567   FINDIT   TMA                  PUT LETTER CODE IN ACC
0049 001000001        0568            TCY      8           * FIND THE FIRST LETTER
0012 000000100        0569   HANG7    DYN                  * THAT HASN,T YET
0025 000100011        0570            TBIT     3           * BEEN ENTERED
004A 100011010   0569 0571            BRANCH   HANG7       * CORRECTLY
0014 010111111        0572            RETN                 *
0029 000101111        0573            TAM                  STORE LETTER CODE
0052 001001111        0574            TCY      14          *GET OTHER HALF OF
0024 010001100        0575            CALLL    FINDIT      *LETTER CODE AND STORE IT
0048 111100100   0567 0576
0010 010011000        0577            LDX      1           *
```

```
0021  000101111                  TAM                       *
0042  010000100                  CALLL     SPLNTR+1        CHECK TO SEE IF
0004  110101110  0374
0009  011100000                  ALEC      0               NEW LETTER MATCHES
0013  100101101  0591            BRANCH    HANG8
0027  010011000                  LDX       1               * DOES NOT MATCH
004E  000101011                  TYA                       * PUT BLANK BACK
001C  001100011                  TCMIY     12              * IN DISPLAY
0039  010010000                  LDX       0
0072  001001011                  TCY       13
0065  010100010                  SBIT      1               SET FLAG FOR WORD NOT COMPLETE
0048  000101000                  TAY
0016  100110100  0593            BRANCH    HANG9           SET
002D  000101011        HANG8     TYA                       CORRECT LETTER GUESS
005A  001001011                  TCY       13              *
0034  010100000        HANG9     SBIT      0               * CORRECT LETTER FLAG IF Y=13
0068  000101000                  TAY
0051  101101110  0525            BRANCH    HANG5
                       *
                       *  NXTWORD--RESETS FLAGS, INCREMENTS COUNTERS AND POINTERS
                       *
0022  010110010        NXTWORD   COMX8                     *
0044  001000010                  TCY       4               INCREMENT PHRASE COUNTER
0008  000101001                  TMA
0011  001110100                  ACACC     2
0023  011100001                  ALEC      8
0046  100011001  0606            BRANCH    NXT2
000C  000000110                  CLA
0019  000101111        NXT2      TAM
0033  001000110                  TCY       6               RESET BITS FLAG6
0066  010100100                  RBIT      0
004D  010100110                  RBIT      1
001A  001000000                  TCY       0               INCREMENT RWE POINTER
0035  000110010                  IMAC                      *
006A  000101111                  TAM                       *
0055  000101010                  TMY                       *
002A  010000100                  LDP       2
0054  001010101                  YNEC      10              *
0028  100000111  0345            BRANCH    USPELL+1
0050  010000100                  BL        F3
0020  100100101  0431
```

```
                        0619              ORGPG   4
0000 010001000          0620  GAME#2      CALLL   CLEAR     PUTS BLANKS AND CURSOR IN DISPLAY
0001 110111010  0236    0621
0003 010010001          0622              LDX     8         DAM
0007 001001110          0623              TCY     7
000F 001100110          0624              TCMIY   6         SET MODE FOR CODE BREAKER
001F 010100010          0625              SBIT    1         SET GO FLAG
003F 010001101          0626              BL      TONES
007F 101000111  1657    0627
                        0628  *
007E 010010001          0629  DIFFSLV     LDX     8
007D 001001110          0630              TCY     SEVEN     **
007B 000101001          0631              TMA
0077 010010000          0632              LDX     0
006F 001000000          0633              TCY     0
005F 001101000          0634  BLANKM      TCMIY   1
003F 001010001          0635              YNEC    8
007C 101011111  0634    0636              BRANCH  BLANKM
0079 001001000          0637              TCY     1
0073 011100000          0638              ALEC    0
0067 101000011  0656    0639              BRANCH  LZEROS
                        0640  *
004F 001100000          0641              TCMIY   0         A
001E 001000010          0642              TCY     4
003D 001100000          0643              TCMIY   0         I
                        0644  *
007A 010011000          0645              LDX     ONE       **
0075 001000000          0646              TCY     DISPLAY   **
006B 001100100          0647              TCMIY   2         S
0057 001100000          0648              TCMIY   0         A
002E 001100001          0649              TCMIY   8         V
005C 001101101          0650              TCMIY   11
0038 001100001          0651              TCMIY   8         I
0070 001101100          0652              TCMIY   3         T
0061 101110100  0665    0653              BRANCH  BLANK
                        0654  *
                        0655  *
0043 001100000          0656  LZEROS      TCMIY   0         PUT ,SPELL, IN DISPLAY
0006 001011010          0657              YNEC    5
000D 101000011  0656    0658              BRANCH  LZEROS
                        0659  *
001B 010011000          0660              LDX     ONE       **
```

```
0037  001000000        0661           TCY     DISPLAY          **
006F  001100100        0662           TCMIY   LSWSS            **
0059  001101111        0663           TCMIY   LSWSP            **
003A  001100010        0664           TCMIY   LSWSE            **
0074  001101101        0665  BLANK    TCMIY   11
0069  001010001        0666           YNEC    8
0053  101110100  0665  0667           BRANCH  BLANK
0026  001001111        0668  PUTSLVL  TCY     LEVEL            * PUT LEVEL IN DISPLAY
004C  000101001        0669           TMA                      **
001B  001001110        0670           TCY     7
0031  000101111        0671           TAM                      **
                       0672  *
0062  010010000        0673           LDX     ZERO             **
0045  001100000        0674           TCMIY   0
                       0675  *
000A  010110010        0676           COMX8                    * CLEAR GO FLAG
0015  001000001        0677           TCY     FLAG2            **
002B  001100000        0678           TCMIY   0
0056  010111111        0679           RETN                     **
002C  010010000        0680  NOSTRANS LDX     0                CALCULATE LETTER ADDRESS
005A  001001111        0681           TCY     15
0030  000101001        0682           TMA
0060  010011000        0683           LDX     1
0041  001000011        0684           TCY     12
0002  001100000        0685           TCMIY   0
0005  001100000        0686           TCMIY   0
000B  001001101        0687           TCY     11
0017  000101111        0688           TAM
002F  010000000        0689           CALLL   ADDCARRY
005E  111011000  0112  0690
003C  010010000        0691           LDX     0
0078  001000111        0692           TCY     14
0071  000101001        0693           TMA
0063  010011000        0694           LDX     1
0047  001000101        0695           TCY     10
000F  000101111        0696           TAM
001D  010000000        0697           CALLL   ADDCARRY
003B  111011000  0112  0698
0076  000000110        0699           CLA
006D  001110011        0700           ACACC   12
005B  001000101        0701           TCY     10
0036  010000000        0702           CALLL   ADDCARRY
006C  111011000  0112  0703
0059  010000101        0704  ADDCTR6  CALLL   MEMADDR
```

```
0032  111011000  1501
0064  010001110             CALLL    LOADRESS
0049  111000010  1121
0012  010000111             BL       ADDWDS2
0025  100001010  2057
004A  010010100   RETNSBCH  LDX      2                 RETNSBCH FLAG=ACC
0014  001001111             TCY      15                *
0029  000101001             TMA
0052  010001111             LDP      15
0024  011101000             ALEC     1                 SPELL?
0048  100101100  2219       BRANCH   DISP/KB
0010  010001101             LDP      11
0021  011100100             ALEC     2
0042  101000010  1680       BRANCH   NXTTONE
0004  010001100             LDP      3
0009  011101100             ALEC     3                 NXTWORD?
0013  100100010  0599       BRANCH   NXTWORD
0027  010000101             LDP      10
004E  011100010             ALEC     4                 NEG?
001C  100001001  1540       BRANCH   MSPEL3
0039  010000001             LDP      8
0072  011101010             ALEC     5                 SAY IT?
0065  101100011  1232       BRANCH   DISLP=5
0048  010001001             LDP      9
0016  011100110             ALEC     6                 SPEAK LETTER?
0020  101110110  1372       BRANCH   LET+4
005A  010001100             LDP      3
0034  011101110             ALEC     7
0068  100000110  0521       BRANCH   HANG1
0051  011100001             ALEC     8
0022  100000000  0479       BRANCH   GAME#1
0044  010000101             LDP      10
0008  011101001             ALEC     9
0011  101101010  1570       BRANCH   ADDCTR2
0023  010000001             LDP      8
0046  011100101             ALEC     10
000C  101100011  1232       BRANCH   DISLP=5
                  *   TSTBIT2-->USED IN LOADING LNK/EDT TO TI   FOR 3 WORDS OF ZERO
                  *        1 WORD OF 0001
                  *
0019  010110010   TSTBIT2   COMX8                      DAM EG
0033  001000100             TCY      2
0066  010100110             RBIT     1
004D  010100101             RBIT     2
001A  010110010             COMX8
0035  010111111             RETN
```

```
                               ORGPG    5             **
                        * STORE SEED NUMBER
0000 010010010          RANDOM LDX      4
0001 001000101                 TCY      10
0003 000000110                 CLA
0007 010001111                 CALLL    FILSLOOP
000F 110101110  2183
001F 001001110                 TCY      7
003F 010010001                 LDX      8
007F 010001110                 LDP      7
007E 000100000                 TBIT     0
007D 101110011  1039           BRANCH   LDPREV
007B 010100000                 SBIT     0
0077 010001010                 LDP      5
                        *  CURLEVL==>
                        *  STORES NUMBER OF ENTRIES IN CURRENT LEVEL
                        *  INTO RAM
                        *
006F 001000101          CURLEVL TCY     10
005F 010011000                 LDX      1
                        *   ZERO OUT ROM ADDR
003E 001100000                 TCMIY    0
007C 001100000                 TCMIY    0
0079 001100000                 TCMIY    0
0073 001100000                 TCMIY    0
0067 001000101                 TCY      10
004F 010111111                 RETN
                        *  FIND DIFFICULTY LEVEL
001E 001001111                 TCY      1
003D 000101001                 TMA
007A 001000101                 TCY      1
0075 000101111                 TAM
006B 010000111                 CALLL    A
0057 110001100  2139
002E 010000101                 CALLL    MEMA
005C 111011000  1501
                        *  OUTPUT # OF ENTRIES ;   IS LEVEL
0038 010001110                 CALLL    OUTAI
0070 111000001  1083
0061 001001111                 TCY      15
0043 010011010                 LDX      5
0006 000101111                 TAM
```

```
0000  010001110        0793            CALLL   OUTADDR2
0018  111000001  1083  0794
0037  001001111        0795            TCY     15
006E  010010010        0796            LDX     4
005D  000101111        0797            TAM
003A  010011010        0798            LDX     5
0074  000000111        0799            DMAN
0069  100011000  0804  0800            BRANCH  DECMEM
0053  000101111        0801            TAM
0026  010010010        0802            LDX     4
004C  000000111        0803            DMAN
0018  000101111        0804  DECMEM    TAM
0031  010011100        0805            LDX     3
0062  001000001        0806            TCY     8
0045  000101001        0807            TMA
000A  010011010        0808            LDX     5
0015  001000000        0809            TCY     0
002B  000101111        0810            TAM
0056  010011100        0811            LDX     3
002C  001001001        0812            TCY     9
0058  000101001        0813            TMA
0030  010010010        0814            LDX     4
0060  001000000        0815            TCY     0
0041  000101111        0816            TAM
                       0817  * DETERMINE IF SEED IS '>' NUMBER OF ENTRIES
0002  001001111        0818  DECLOOP   TCY     15
0005  000000001        0819            ALEM
000B  101111000  0825  0820            BRANCH  RANOK
0017  001000000        0821            TCY     0
002F  001111100        0822            ACACC   3
005E  000101111        0823            TAM
003C  100000010  0818  0824            BRANCH  DECLOOP
0078  000001001        0825  RANOK     MNEA
0071  101011001  0837  0826            BRANCH  RANOK2
0063  001000000        0827            TCY     0
0047  010011010        0828            LDX     5
000E  000101001        0829            TMA
001D  001001111        0830  DECLOOP3  TCY     15
003B  000000001        0831            ALEM
0076  101011001  0837  0832            BRANCH  RANOK2
006D  001000000        0833            TCY     0
005B  001111100        0834            ACACC   3
0036  000101111        0835            TAM
```

TABLE IX-5 (Continued)

| | | | | | | |
|---|---|---|---|---|---|---|
| 006C | 100011101 | 0830 | 0836 | | BRANCH | DECLOOP3 |
| 0059 | 010110010 | | 0837 | RANOK2 | COMX8 | |
| | | | 0838 | * ZERO RWE POINTER | | |
| 0032 | 001000000 | | 0839 | | TCY | 0 |
| 0064 | 001100000 | | 0840 | | TCMIY | 0 |
| 0049 | 010011010 | | 0841 | RPLOOP | LDX | 5 |
| 0012 | 010001101 | | 0842 | | CALLL | RCOMX8 |
| 0025 | 111001100 | 1631 | 0843 | | | |
| 004A | 000101001 | | 0844 | | TMA | |
| 0014 | 000000101 | | 0845 | | IYC | |
| 0029 | 001111000 | | 0846 | | ACACC | 1 |
| 0052 | 110101000 | 0888 | 0847 | | CALL | INCARRY |
| 0024 | 000101100 | | 0848 | | TAMDYN | |
| 0048 | 010010010 | | 0849 | | LDX | 4 |
| 0010 | 000101001 | | 0850 | | TMA | |
| 0021 | 000000101 | | 0851 | | IYC | |
| 0042 | 000010101 | | 0852 | | AMAAC | |
| 0004 | 000101111 | | 0853 | | TAM | |
| 0009 | 010001101 | | 0854 | RANARND | CALLL | RCOMX8 |
| 0013 | 111001100 | 1631 | 0855 | | | |
| 0027 | 000101001 | | 0856 | | TMA | |
| 004E | 001001111 | | 0857 | | TCY | 15 |
| 001C | 000000001 | | 0858 | | ALEM | |
| 0039 | 101100101 | 0861 | 0859 | | BRANCH | RANCNT |
| 0072 | 101000100 | 0870 | 0860 | | BRANCH | ZRORAND |
| 0065 | 000001001 | | 0861 | RANCNT | MNEA | |
| 0048 | 101100110 | 0878 | 0862 | | BRANCH | RANCOMP |
| 0016 | 010011010 | | 0863 | | LDX | 5 |
| 002D | 010001101 | | 0864 | | CALLL | RCOMX8 |
| 005A | 111001100 | 1631 | 0865 | | | |
| 0034 | 000101001 | | 0866 | | TMA | |
| 0068 | 001001111 | | 0867 | | TCY | 15 |
| 0051 | 000000001 | | 0868 | | ALEM | |
| 0022 | 101100110 | 0878 | 0869 | | BRANCH | RANCOMP |
| 0044 | 010001101 | | 0870 | ZRORAND | CALLL | RCOMX8 |
| 0008 | 111001100 | 1631 | 0871 | | | |
| 0011 | 001100000 | | 0872 | | TCMIY | 0 |
| 0023 | 000000100 | | 0873 | | DYN | |
| 0046 | 010010010 | | 0874 | | LDX | 4 |
| 000C | 001100000 | | 0875 | | TCMIY | 0 |
| 0019 | 001100000 | | 0876 | | TCMIY | 0 |

```
0033  101001001  0841  0877            BRANCH   RPLOOP
0066  001000000        0878  RANCOMP   TCY      0
                       0879  *  COMPARE RANDOM # TO # OF ENTRIES
0040  010110010        0880            COMXB
001A  000110010        0881            IMAC
0035  000101111        0882            TAM
006A  011101001        0883            ALEC     9
0055  101001001  0841  0884            BRANCH   RPLOOP
002A  010001110        0885            BL       RANSTOP
0054  100000000  1021  0886
                       0887  *
0028  000101111        0888  INCARRY   TAM
0050  010010010        0889            LDX      8
0020  000110010        0890            IMAC
0040  010111111        0891            RETN
```

TABLE IX-6

```
                       0892            ORGPG    6            **
                       0893  ****      CODE     BREAKER      ******
0000  010001000        0894  CRYPTO    CALLL    SPACE=3      ELIMINATE CURSOR FROM DISPLAY
0001  111100011  0273  0895
0003  001000000        0896            TCY      0
0007  010010000        0897  CRY1      LDX      0
000F  000110011        0898            MNEZ                  TEST MSB OF DISPLAY CHARACTER
001F  100111101  0915  0899            BRANCH   CRY2         BRANCH IF MSB=1
003F  010011000        0900  COMPL     LDX      1
007F  000110010        0901            IMAC                  * COMPLEMENT THE LSD OF
007E  000110001        0902            CPAIZ                 * THE DISPLAYED LETTER
007D  010111111        0903            RETN
007B  011101001        0904            ALEC     9            * IF A CHARACTER CODE
0077  100111110  0908  0905            BRANCH   CRY3         * PAST 'Z' HAS BEEN
006F  001110110        0906            ACACC    6            * CREATED, ADD 6 TO GET A LETTER
005F  101010111  0919  0907            BRANCH   CRY6         BET
003E  000101111        0908  CRY3      TAM                   STORE COMPLEMENT OF LSD
007C  010010000        0909  CRY5      LDX      0
0079  001101000        0910            TCMIY    1            SET MSB TO 1
0073  001010001        0911  CRY4      YNEC     8            ARE ALL LETTERS FINISHED?
0067  100000111  0897  0912            BRANCH CRY1           NO, CONTINUE
```

```
004F  010011101          0913  CRY12   BL       TONES
001F  101000111   1657   0914
003D  010100110          0915  CRY2    CALLL    COMPL
007A  110111111   0900   0916
0075  011101010          0917          ALEC     5           * TEST FOR CODES OTHER
0068  101111100   0909   0918          BRANCH   CRY5        * THAN LETTERS AND SKIP THEM
0057  001101111          0919  CRY6    TAM
002E  010010000          0920          LDX      0
005C  001100000          0921          TCMIY    0           SET MSB TO ZERO
003B  101110011   0911   0922          BRANCH   CRY4        RET
0070  010011100          0923  CLUE    LDX      3
0061  001000001          0924          TCY      8
0043  000101001          0925          TMA                  GET HEX RANDOM NUMBER
0006  011101110          0926          ALEC     7           * IF NUMBER IS GREATER
000D  100110111   0929   0927          BRANCH   CLUE1       * THAN 7, ADD 8
001B  001110001          0928          ACACC    8           *
0037  000101000          0929  CLUE1   TAY                  SET Y RANDOMLY 0- 7
006E  000000100          0930  CLUE2   DYN                  * LOOK FOR FIRST
005D  101110100   0933   0931          BRANCH   YOK
003A  001001110          0932          TCY      7
0074  010000100          0933  YOK     CALLL    SPLNTR+1    * LETTER THAT HASN'T
0069  110101110   0374   0934
0053  011100000          0935          ALEC     0           * BEEN CORRECTLY ENTERED
0026  101101110   0930   0936          BRANCH   CLUE2
004C  010010100          0937          LDX      2
0018  000100000          0938          TBIT     0           MSB IS A ONE?
0031  100000101   0952   0939          BRANCH   CLUE3       YES
0062  010011100          0940  GETIT   LDX      3           NO
0045  000101001          0941          TMA                  * GET LSD OF LETTER
000A  010010000          0942          LDX      0           * FROM CORRECT SPELLING
0015  001100111          0943          TCY      14          * BUFFER AND PUT IT IN
002B  000101101          0944          TAMIYC               * KEY CODE
0056  010111111          0945          RETN
002C  001100000          0946          TCMIY    0           SET MSB=0
005B  001001011          0947  CLUE4   TCY      13
0030  010010100          0948          LDX      2
0060  [illegible]        0949          TMA
0041  [illegible]        0950          BL       MISS3
0002  [illegible] 0471   0951
0005  [illegible] 0940   0952  CLUE3   CALL     GETIT
[illegible] [illegible]  0953          TCMIY    1           SET MSB=1
[illegible] [illegible] 0947 0954      BRANCH   CLUE4       RET
[illegible] [illegible]  0955  F2      TAY
[illegible] [illegible]  0956          YNEC     0
```

```
003C  101001111  0913  0957           BRANCH  CRY12
0078  010010000        0958           LDX     0          10
0071  001001010        0959           TCY     5
0063  001101000        0960           TCMIY   1
0047  001100100        0961           TCMIY   2
000E  001100100        0962           TCMIY   2
001D  010011000        0963           LDX     1
003B  001001010        0964           TCY     5
0076  001100111        0965           TCMIY   14
006D  001101000        0966           TCMIY   1
005B  001100000        0967           TCMIY   0
0036  101001111  0913  0968           BRANCH  CRY12
006C  010011100        0969   F5      LDX     3
0059  001001011        0970           TCY     13         LNK/EDT VALUE
0032  001100000        0971           TCMIY   0
0064  010011000        0972   F2LOOP  LDX     1
0049  001000101        0973           TCY     10
0012  001100100        0974           TCMIY   2
0025  001100010        0975           TCMIY   4
004A  001100000        0976           TCMIY   0
0014  001100000        0977           TCMIY   0
0029  010011010        0978           LDX     5
0052  001001011        0979           TCY     13         # OF CORRECT SCORES
0024  000101001        0980           TMA
0048  000010101        0981           AMAAC              CORRY?
0010  101001101  1012  0982           BRANCH  NOF2
0021  010011000        0983           LDX     1
0042  001000101        0984           TCY     10
0004  000010101        0985           AMAAC
0009  101101010  1015  0986           BRANCH  NOF3
0013  000101111        0987           TAM
0027  010111111        0988   FINL2   RETN
004E  010000101        0989           CALLL   MEMADDR
001C  111011000  1501  0990
0039  010001110        0991           CALLL   LOADRESS   LOAD ADDRESS
0072  111000010  1121  0992
0065  010011000        0993           LDX     1
004B  010000011        0994           CALLL   TRANS=1    STORE N DAM
0016  110100011  1836  0995
002D  010001001        0996           BL      F4
```

```
005A 1[illegible]     1122                TCY      10
0034 001000101               FINL3        TCY      10
0068 010011000               FINL6        LDX      1
0051 000101001                            TMA
0022 010010010                            LDX      4
0044 000101101                            TAMIYC
0008 001010111                            YNEC     14
0011 101101000        0999                BRANCH   FINL6
0023 010001010                            CALLL    CURLEVL
0046 111101111        0769
000C 001100010                            TCMIY    4
0019 001101110                            TCMIY    7
0033 010001000                            BL       SPK4
0066 101100101        0311
                             *
0040 010011000               NOF2         LDX      1
001A 001000101                            TCY      10
0035 000010101                            AMAAC
006A 000101101               NOF3         TAMIYC
0055 000110010                            IMAC
002A 000101111                            TAM
0054 100100111        0988                BRANCH   FINL2
```

TABLE IX-7

```
                                          ORGPG    7                     **
                             * LOADED 10 VALUES =STORE LAST VALUE
0000 001100000               RANSTOP      TCMIY    0
0001 001000101                            TCY      10
0003 010011010                            LDX      5
0007 000101001                            TMA
000F 001000111                            TCY      14
001F 000101111                            TAM
003F 010010010                            LDX      4
007F 001000101                            TCY      10
007E 000101001                            TMA
007D 001000111                            TCY      14
007B 000101111                            TAM
0077 010011010               RSCRAM2      LDX      5
006F 111110000        1052                CALL     RSCRAM
```

```
005F  010010010         1034            LDX       4
003E  111110000  1052   1035            CALL      RSCRAM
007C  010001000         1036            BL        RANRTN
0079  101110011  0215   1037
                        1038  *  LDPREV==> LOADS NEXT VALUE NTO RWE
0073  001000111         1039  LDPREV    TCY       14
0067  010010010         1040            LDX       4
004F  000101001         1041            TMA
001E  001000000         1042            TCY       0
003D  000101111         1043            TAM
007A  001000111         1044            TCY       14
0075  010011010         1045            LDX       5
006B  000101001         1046            TMA
0057  001000000         1047            TCY       0
002E  000101111         1048            TAM
005C  010001010         1049            LDP       5
0038  101011001  0837   1050            BRANCH    RANOK2
                        1051  *  SCRAMBLES RWE WORDS
0070  001000000         1052  RSCRAM    TCY       0
0061  000101001         1053            TMA
0043  001000110         1054            TCY       6
0006  000000011         1055            XMA
000D  001000000         1056            TCY       0
001B  000101101         1057            TAMIYC
0037  000101001         1058            TMA
006E  001001110         1059            TCY       7
005D  000000011         1060            XMA
003A  001001000         1061            TCY       1
0074  000101101         1062            TAMIYC
0069  000101001         1063            TMA
0053  001001010         1064            TCY       5
0026  000000011         1065            XMA
004C  001000100         1066            TCY       2
0018  000101101         1067            TAMIYC
0031  000101001         1068            TMA
0062  001000001         1069            TCY       8
0045  000000011         1070            XMA
000A  001001100         1071            TCY       3
0015  000101101         1072            TAMIYC
002B  000101001         1073            TMA
0056  001001001         1074            TCY       9
002C  000000011         1075            XMA
0058  001000010         1076            TCY       4
0030  000000011         1077            XMA
0060  010111111         1078            RETN
```

```
                                    *
                                    *   OUTADDR2:
                                    *   LOADS 4 BITS INTO K=LINES USING PDC AND OUTPUT 4 BITS
                                    *
0041  001000011                     OUTADDR2 TCY     12          ** CHIP SELECT
0002  000001101                              SETR                **
0005  001001101                              TCY     11          L/R = 0
000B  000001101                              SETR
0017  001000101                              TCY     10
002F  000000110                              CLA                 ACC=OUTPUT 4 BITS COMMAND
005F  001110001                              ACACC   EIGHT       **
003C  000001101                              SETR                **
0078  000110110                              RSTR                **
0071  000001101                              SETR                **
0063  000110110                              RSTR                **
0047  000001101                              SETR                **
000E  000110110                              RSTR                **
001D  000001101                              SETR                **
003B  000110110                              RSTR                **
0076  000000110                              CLA                 **
006D  001110010                              ACACC   FOUR        **
005B  000001101                              SETR                1ST PDC LOADS COMMAND
0036  000110110                              RSTR                *
006C  001001101                              TCY     11
0059  000110110                              RSTR
0032  001000101                              TCY     10
0064  000001101                              SETR                2ND PDC APPLIES SR TO K=LINES
0049  000110110                              RSTR                *
0012  001110000                              ACACC   0
0025  000001000                              TKA                 LOAD INTO ACC
004A  000001101                              SETR                3RD PDC DISCONNECTS SR
0014  000110110                              RSTR                *
0029  001001101                              TCY     11
0052  000001101                              SETR
0024  010010100                              LDX     2
0048  000100011                              TBIT    3
0010  101001011   1131                       BRANCH  LSHIFT=1
0021  010111111                              RETN
                                    *
                                    *  END OF OUTADDR2 SUBROUTINE
                                    *
                                    *
```

```
0042  001001101         1121  LOADRESS TCY     11
0004  010010100         1122           LDX     2
0009  010100011         1123           SBIT    3              *
0013  001000101         1124           TCY     10
0027  000000110         1125           CLA
004E  001111100         1126           ACACC   3
001C  010010100         1127           LDX     2              MEMORY FOR LOOP
0039  000101110         1128  LOADR+1  TAMZA
0072  010011000         1129           LDX     1
0065  101000001   1083  1130           BRANCH  OUTADDR2
004B  001001011         1131  LSHIFT-1 TCY     13
0016  010011000         1132           LDX     1
002D  000000011         1133  LSHIFT   XMA                    SHIFT ROUTINE
005A  000000100         1134           DYN                    *
0034  001011001         1135           YNEC    9              *
0068  100101101   1133  1136           BRANCH  LSHIFT         *
0051  001000101         1137           TCY     10             TEST LOOP COUNT
0022  010010100         1138           LDX     2              *
0044  000000111         1139           DMAN                   *
0008  100111001   1128  1140           BRANCH  LOADR+1        *
0011  001001101         1141           TCY     11
0023  010100111         1142           RBIT    3
0046  010111111         1143           RETN
                        1144  *
000C  010011010         1145  FL2      LDX     5
0019  001001011         1146           TCY     13
0033  000000110         1147           CLA
0066  001110101         1148           ACACC   10
004D  000000011         1149           XMA
001A  000110000         1150           SAMAN
0035  000101111         1151           TAM
006A  010111111         1152           RETN
0055  001000110         1153  ROM      TCY     6
002A  010010001         1154           LDX     8
0054  000101001         1155           TMA
0028  001110001         1156           ACACC   8
0050  000101111         1157           TAM
0020  010001111         1158           BL      DISP/KB
0040  100101100   2219  1159
```

```
                              1160            ORGPG     8
                              1161      *
                              1162      *  CALADDR==> STICKS ADDRESS WANTED INTO LNK/EDT
                              1163      *
0000  001000111               1164      CALADDR   TCY       14
0001  001100101               1165                TCMIY     10
0003  001001001               1166                TCY       9
0007  010011000               1167                LDX       1
000F  000101001               1168                TMA
001F  001111111               1169                ACACC     15
003F  010110010               1170                COMX8               ADDRESS DAM
007F  000101111               1171                TAM
007E  001000101               1172                TCY       10
007D  000101001               1173      TMAA      TMA
007B  010011000               1174                LDX       1
0077  000101101               1175                TAMIYC
006F  010110010               1176                COMX8               ADDRESS DAM
005F  001010111               1177                YNEC      14
003E  101111101     1173      1178                BRANCH    TMAA
007C  111001111     1183      1179      CALL+2    CALL      CAL+1
0079  010011110               1180                LDX       7
0073  000101111               1181                TAM                 STORE WORD
0067  010110010               1182                COMX8               ADDRESS DAM
004F  001000111               1183      CAL+1     TCY       14        GET Y POINTER
001E  000110010               1184                IMAC                *
003D  000101111               1185                TAM                 *
007A  000101010               1186                TMY                 *
0075  000000100               1187                DYN
006B  000101001               1188                TMA
0057  001001001               1189      OUTSRTN   TCY       9         GET LNK/EDT POINTER
002E  000101010               1190                TMY                 *
005C  010110010               1191                COMX8               EXIT DAM
0038  010111111               1192                RETN
0070  010010110               1193                LDX       6         STORE WORD
0061  000101111               1194                TAM                 *
0043  010110010               1195                COMX8               ADDRESS DAM
0006  001001001               1196                TCY       9
000D  000110010               1197                IMAC
001B  000101111               1198                TAM
0037  001000111               1199                TCY       14
006E  000101010               1200                TMY
005D  001010111               1201                YNEC      14        Y=14? IF YES,
003A  101111100     1179      1202                BRANCH    CALL+2    LOAD 2 MSW
```

```
0074 001000100            TCY    2
0069 010100101            RBIT   2
0053 010011000            LDX    1
0026 001001001            TCY    9
004C 010000011            BL     LNKCNT2
0018 101101100 1798
0031 010011100  ULRN+1    LDX    3
0062 001001011            TCY    13
0045 001101010            TCMIY  5
000A 010001101  ULRN+2    BL     CORR+1
0015 101111110 1590
                *                           * CALCULATES ADDRESS
                *                           * LOADS CSB
0028 001100000  DISLP-1   TCMIY  0
0056 010000101            BL     LOADDISP
002C 101111001 1456
0058 010000111  DISLP7    CALLL  SPEAK+1
0030 110000001 2010
0060 010000011            CALLL  TRANS-1
0041 110100011 1836
0002 010010100  DISLP+2   LDX    2
0005 001001111            TCY    15         *
0008 001101010            TCMIY  5
0017 010001010            CALLL  CURLEVL
002F 111101111 0769
005E 001100111            TCMIY  14
003C 001100110            TCMIY  6
0078 010000010            BL     ADDCTR6
0071 101011001 0704
0063 001001111  DISLP-5   TCY    15
0047 010110010            COMX8             ADDRESS DAM
000E 001101111            TCMIY  15
001D 010110010  DISPLOOP  COMX8             EXIT DAM
003B 001000111            TCY    14
0076 010011100            LDX    3
006D 010100000            SBIT   0
0058 010001111            BL     DISP/KB
0036 100101100 2219
006C 010110010  DISLP+1   COMX8             ADDRESS DAM
0059 001001111            TCY    15         LOOP
0032 000000111            DMAN              *
```

```
0064  000101111         1244            TAM                    *
0049  000110011         1245            MNEZ                   *
0012  100011101   1235  1246            BRANCH   DISPLOOP      * ELSE
0025  001000111         1247            TCY      14
004A  010011100         1248            LDX      3
0014  010100100         1249            RBIT     0
0029  010010001         1250            LDX      8
0052  010001001         1251            LDP      9
0024  001000100         1252            TCY      2
0048  000100011         1253            TBIT     3
0010  101010011   1341  1254            BRANCH   LET4
0021  000100001         1255            TBIT     2
0042  101001010   1385  1256            BRANCH   RESTO2
0004  010000001         1257            LDP      8
0009  010010100         1258            LDX      2
0013  001001111         1259            TCY      15
0027  000101001         1260            TMA
004E  011101001         1261            ALEC     9
001C  101110010   1264  1262            BRANCH   DISP8
0039  101101000   1271  1263            BRANCH   DISP5
0072  001100101         1264  DISP8     TCMIY    10
0065  010011000         1265            LDX      1
004B  010110010         1266            COMXA
0016  010000011         1267  DISP9     CALLL    TRANS=1       ADDRESS DAM
002D  110100011   1836  1268
005A  010000111         1269            BL       ADDWDS2
0034  100001010   2057  1270
0068  010001001         1271  DISP5     CALLL    DELAY2
0051  110100111   1398  1272
0022  010110010         1273            COMXA
0044  001000000         1274            TCY      0             INCREMENT RWE POINTER
0008  000110010         1275            IMAC                   *
0011  000101101         1276            TAMIYC
0023  001100000         1277            TCMIY    0
0046  011101001         1278            ALEC     9
000C  101010000   1291  1279            BRANCH   DISP6
0019  001000000         1280            TCY      0
0033  001100000         1281            TCMIY    0
0066  001100000         1282            TCMIY    0
004D  010011010         1283            LDX      5
001A  010001110         1284            CALLL    RSCRAM
0035  111110000   1052  1285
```

```
006A 010010010        1286                LDX     4
0055 010001110        1287                CALLL   RSCRAM
0024 111110000  1052  1288
0054 010000100        1289                BL      USPELL+1
0028 100000111  0345  1290
0050 010010001        1291   DISP6        CALLL   DELAY2
0020 110100111  1346  1292
0040 100110001  1209  1293                BRANCH  ULRN+1
```

TABLE IX-9

```
                      1294                ORGPG   9
                      1295   *
                      1296   *  LETTER-->TRANSFERS LETTERS TO BE SPOKEN, FROM THE CSB
                      1297   *    INTO THE LINK/EDIT AND THEN CALCULATES THE ADDRESS FOR L/E.
                      1298   *
0000 010001111        1299   LETTER   TCY     15
0001 010000110        1300            CLA
0003 010000111        1301            CALLL   RETURN4
0007 110000100  2113  1302
000F 010001000        1303            CALLL   CLEAR
001F 110111010  0236  1304
003F 001001000        1305            TCY     1
007F 010110010        1306            COMX8                      *
007E 001100000        1307            TCMIY   0                  *
007D 001001111        1308            TCY     15
007B 001101000        1309            TCMIY   1
0077 010011100        1310   LETTER+1 LDX     3                  LOAD LSW -->ACC
006F 001001000        1311            TCY     1                  *
005F 010001111        1312            CALLL   COMX8              *
003E 110011000  1632  1313
007C 000101001        1314            TMA                        *
0079 010011110        1315            LDX     7                  STORE IN LNK/EDT
0073 001000000        1316            TCY     0                  *
0067 000101111        1317            TAM                        *
004F 010010100        1318            LDX     2                  MSW
001E 001001000        1319            TCY     1                  GET Y POINTER
003D 010001101        1320            CALLL   COMX8              *
```

```
007A  110011000  1632  1321
0075  000101001        1322                TMA                 LOAD MSW
0068  010000101        1323                LDP      10
0057  000100001        1324                TBIT     2          LAST LETTER?
002E  111010011  1485  1325                CALL     SETBIT2    YES, SETBIT2
005C  010001111        1326                LDP      15
0038  000100011        1327                TBIT     3          SYLLABLE?
0070  111010101  2291  1328                CALL     SETBIT3    SET SYLLABLE FLAG
0061  001000000        1329                TCY      0          *
0043  010010110        1330                LDX      6          *
0006  000101111        1331                TAM                 *
000D  010100101        1332                RBIT     2
001B  010100111        1333                RBIT     3
                       1334   *  CALCULATE ADDRESS OF LETTER
0037  001000100        1335                TCY      2          FLAG WORD
006E  010010001        1336                LDX      8
0050  010000001        1337                LDP      8
003A  000100011        1338                TBIT     3          SYLLABLE?
0074  100011101  1235  1339                BRANCH   DISPLOOP
0069  010001001        1340                LDP      9
0053  001000000        1341   LET4         TCY      0
0026  010010110        1342                LDX      6
004C  000101001        1343                TMA
0018  000010101        1344                AMAAC               MULTIPLY BY 2
0031  000101111        1345                TAM
0062  010011110        1346                LDX      7          *
0045  000101001        1347                TMA
000A  000010101        1348                AMAAC
0015  111000010  1394  1349                CALL     TLETTER    CARRY, GO TO TLETTER
002B  000101111        1350                TAM
0056  010011110        1351                LDX      7
002C  000101001        1352                TMA
0058  001110011        1353                ACACC    12
0030  111000010  1394  1354                CALL     TLETTER
0060  000101111        1355                TAM
                       1356   *  LOADS LETTER ADDRESS INTO FOM ADDR AREA (RAM)
0041  010000111        1357                CALLL    SPEAK+1
0002  110000001  2010  1358
0005  010011100        1359                LDX      3          FLAG
000B  001001011        1360                TCY      13         *
0017  001110011        1361                TCMIY    12
002F  010010100        1362                LDX      2          FLAG
```

```
005E  001001111               TCY      15                    *
003C  001100110               TCMIY    6
0078  001001000               TCY      1
0071  010001101               CALLL    COMX8
0063  110011000   1632
0047  010000101               CALLL    DPLOAD
000E  111110011   1457
001D  010000010               BL       ADDCTR6
0038  101011001   0704
0076  001000100      LET+4    TCY      2
                     *   SPEAKS LETTER
0060  010110010               COMX8                          *
005B  010100111               RBIT     3
0036  000100001               TBIT     2                     *
006C  100010010   1383        BRANCH   RESTO
0059  001001000               TCY      1
0032  000110010               IMAC                           BUMP POINTER FOR CSB
0064  000101111               TAM                            *
0049  101110111   1310        BRANCH   LETTER+1              GET NEXT LETTER--ALWAYS B.
                     *   RESTORE LNK/EDT POINTER AND RETURN TO CONTINUE SPEAKING
0012  010000001      RESTO    BL       DISLP-5
0025  101100011   1232
004A  010100101      RESTO2   RBIT     2
0014  010010100               LDX      2
0029  001001111               TCY      15
0052  001101100               TCMIY    3
0024  001001000               TCY      1
0048  010110010               COMX8
0010  010000101               BL       REPT2
0021  100000011   1439
                     *   INCREMENT WHEN OVERFLOW OCCURS
0042  000101111      TLETTER  TAM
0004  010010110               LDX      6
0009  000110010               IMAC
0013  010111111               RETN
0027  000000110      DELAY2   CLA
004E  010010100               LDX      2                     DELAY BUFFER--RAM
001C  001000001               TCY      8                     *
0039  001100000               TCMIY    0                     CLEAR
0072  001100000               TCMIY    0                     *
0065  001100000               TCMIY    0
004B  001000001               TCY      8
```

```
0016  000101111         1405  DELAY2+1  TAM
0020  000110010         1406            IMAC
005A  101101000   1409  1407            BRANCH    PLUSONE
0034  100010110   1405  1408            BRANCH    DELAY2+1
006B  000101101         1409  PLUSONE   TAMIYC
0051  000110010         1410            IMAC
0022  100010001   1414  1411            BRANCH    WORD3
0044  000101100         1412            TAMDYN
0008  100010110   1405  1413            BRANCH    DELAY2+1
0011  000101101         1414  WORD3     TAMIYC
0023  000110010         1415            IMAC
0046  101100110   1420  1416            BRANCH    QUIT
000C  000101100         1417            TAMDYN
0019  000000100         1418            DYN
0033  100010110   1405  1419            BRANCH    DELAY2+1
0066  010111111         1420  QUIT      RETN
                        1421  *
004D  010001110         1422  F4        CALLL     FL2              STORE # OF WRONG RESPONSES
001A  110001100   1145  1423
0035  010000110         1424            CALLL     F2LOOP
006A  111100100   0972  1425
0055  010000101         1426            CALLL     MEMADDR
002A  111011000   1501  1427
0054  010001110         1428            CALLL     LOADRESS
002B  111000010   1121  1429
0050  010000110         1430            BL        FINL3
0020  100110100   0998  1431
```

TABLE IX-10

```
                          1432              ORGPG     10
                          1433    *
                          1434    *   REPEAT ROUTINE-->REPEATS PHRASE PREVIOUSLY SPOKEN
                          1435    *          TWO REPEATS OR MORE CAUSES PHRASE TO BE SPOKEN SLOWER
                          1436    *
0000  010010100           1437    REPEAT    LDX       2
0001  001001111           1438              TCY       15
0003  001100000           1439    REPT2     TCMIY     0
0007  010011000           1440              LDX       1
000F  001000101           1441              TCY       10
001F  010110010           1442    RPT+1     COMX8                         DAM REG
003F  000101001           1443              TMA                           STORE WORD-->ACC
007F  010110010           1444              COMX8                         EXIT DAM
007E  000101101           1445              TAMIYC
007D  001010111           1446              YNEC      14                  *
007B  100011111    1442   1447              BRANCH    RPT+1               *
0077  010110010           1448              COMX8
006F  001001000           1449              TCY       1
005F  001100000           1450              TCMIY     0
003E  010000111           1451              BL        ADDWDS2
007C  100001010    2057   1452
                          1453    *   LOADDISP-->
                          1454    *   SUBROUTINE TO DISPLAY WORD BEING USED IN LEARN MODE
                          1455    *
0079  001000000           1456    LOADDISP  TCY       0                   INITIALIZE Y/POINTER
0073  010011100           1457    DPLOAD    LDX       3                   TRANSFER LSW'S
0067  000101001           1458              TMA                           *
004F  010011000           1459              LDX       1                   *
001E  000101111           1460              TAM                           *
003D  010010100           1461              LDX       2                   TRANSFER MSW'S
007A  000101001           1462              TMA                           *
0075  010010000           1463              LDX       0                   *
006B  000101111           1464              TAM
0057  010111111           1465              RETN
002E  000100000           1466              TBIT      0
005C  101100001    1470   1467              BRANCH    LDONE
0038  001100000           1468              TCMIY     0
0070  101000011    1471   1469              BRANCH    LDONE+1
0061  001101000           1470    LDONE     TCMIY     1
0043  001010001           1471    LDONE+1   YNEC      8
0006  101110011    1457   1472              BRANCH    DPLOAD              NO, LOOP--ELSE,
000D  010010001           1473              LDX       8
```

```
0018  001101110        1474                TCY      7
0037  000101010        1475                TMY
006E  010000001        1476                LDP      8
0059  001011010        1477                YNEC     5
003A  101011000  1219  1478                BRANCH   DISLP7
0074  010000010        1479                RL       ADDCTR6
0069  101011001  0704  1480
                       1481   *
                       1482   *
                       1483   *   SETBIT2  -  SUBROUTINE TO USE DAM REG FOR FLAG PURPOSES
                       1484   *
0053  010110010        1485   SETBIT2    COMXA                    DAM REG
0026  001000100        1486              TCY      2
004C  010100001        1487              SBIT     2               TEST BIT 2
0018  001001000        1488              TCY      1
0031  000101010        1489              TMY
0062  010110010        1490              COMXA                    EXIT DAM
0045  010111111        1491              RETN
                       1492   *
000A  010110010        1493   SETBIT1    COMXA
0015  001000100        1494              TCY      2
002B  010100010        1495              SBIT     1
0056  010110010        1496              COMXA
002C  010111111        1497              RETN
                       1498   *
                       1499   * MEMLOOP- LOADS ADDRESS INTO ROM ADDRESS, 4 BITS AT A TIME
                       1500   *
005A  001001011        1501   MEMADDR    TCY      12              CHIP SELECT
0030  000001101        1502              SETR
0060  001001101        1503              TCY      11              L/R = 1 (INPUT)
0041  000001101        1504              SETR                     R11 = 1
0002  001000101        1505              TCY      10
0005  000000110        1506              CLA
000B  001111100        1507              ACACC    3               FOR LOOP COUNT, ACC = 3
0017  010011100        1508              LDX      2               MEMORY FOR LOOP (SAVE ADDR)
002F  000101110        1509   MEMLOOP    TAMZA
005E  010011000        1510              LDX      1
003C  001110100        1511              ACACC    TWO
0078  000001111        1512              SETR                     LOADS COMMAND
0071  000011110        1513              RSTR                     *
0063  000101001        1514              TMA                      4 BITS OF ADDR ==>ACC
0047  001110000        1515              ACACC    0
```

```
000E  000001101         1516            SETR                    LOADS DATA
0010  000110110         1517            RSTR                    *
0038  001001011         1518            TCY      13
0076  000000011         1519  SHIFTUP   XMA                     SHIFT ROUTINE        *
006D  000000100         1520            DYN                     *    SHIFT UP IN     *
0058  001011001         1521            YNEC     9              *    SAME REGISTER   *
0036  101110110   1519  1522            BRANCH   SHIFTUP        * * * * * * * * * * *
006C  001000101         1523            TCY      10             ORIGINAL WORD
0059  010010100         1524            LDX      2              REG=6
0032  000000111         1525            DMAN                    MEM=1,==> ACC  LOOP
0064  100101111   1509  1526            BRANCH   MEMLOOP
0049  000101111         1527            TAM
0012  001111100         1528            ACACC    3
0025  000001101         1529            SETR
004A  000110110         1530            RSTR
0014  000000110         1531            CLA
0029  000001101         1532            SETR
0052  000110110         1533            RSTR
0024  010011000         1534  MEMORED   LDX      ONE        * DUMMY READ TO SETUP MEMORY ADDRESS
0048  001000101         1535            TCY      TEN            **
0010  001110001         1536            ACACC    EIGHT          **
0021  000001101         1537            SETR                    **
0042  000110110         1538            RSTR                    **
0004  010111111         1539            RETN
0009  010001000         1540  MSPEL3    CALLL    CLEAR
0013  110111010   0236  1541
0027  010001001         1542            CALLL    DELAY2
004E  110100111   1398  1543
001C  100000000   1437  1544            BRANCH   REPEAT
                        1545  *  SPELLING IS INCORRECT
0039  010111111         1546  MISSPELL  RETN
0072  010110010         1547            COMX8
0065  001000110         1548            TCY      6              FLAG
004B  010001000         1549            LDP      1
0016  000100010         1550            TBIT     1              BIT 1==>0=FIRST TRY
002D  100001001   0304  1551            BRANCH   NOPHRASE       BIT 1==>1=SECOND TRY
005A  010100010         1552            SBIT     1              *
                        1553  *  LOAD NEGATIVE RESPONSE INTO L/E
0034  010011010         1554  SCORE     LDX      5
006B  001001011         1555            TCY      13
0051  000110010         1556            IMAC
0022  000101111         1557            TAM
```

```
0044  010011100          1558           LDX     3
0008  001001011          1559           TCY     13              FLAG
0011  001100100          1560           TCMIY   2
0023  010001010          1561           CALLL   CURLEVL
0046  111101111   0769   1562
000C  000000101          1563           IYC
0019  001101110          1564           TCMIY   6
0033  010010100          1565           LDX     2               FLAG
0066  001001111          1566           TCY     15              *
004D  001100010          1567           TCMIY   4
001A  010001000          1568           BL      SPK4
0035  101100101   0311   1569
006A  001100000          1570   ADDCTR2 TCMIY   0               FOR RETNSBCH
0055  010011100          1571           LDX     3
002A  001001011          1572           TCY     13
0054  001100010          1573           TCMIY   4
0028  010001101          1574           BL      CORR+1
0050  101111110   1590   1575
                         1576   *
```

TABLE IX-11

```
                         1577           ORGPG   11
                         1578   *
                         1579   *  POINTERS DAM=WORD 0==> RANDOM WORD ENTRY POINTER
                         1580   *  POINTER DAM=WORD 1 ==> CORRECR SPELLING BUFFER POINTER
                         1581   *
0000  010110010          1582   CORR$SPL COMXB                  DAM REG=POINTER
0001  001000000          1583           TCY     0
0003  001100000          1584           TCMIY   0               ZEROS OUT POINTER
0007  001100000          1585           TCMIY   0
000F  001100000          1586           TCMIY   0
001F  001100000          1587           TCMIY   0
003F  010110010          1588           COMXB                   OUT OF DAM REG
007F  010111111          1589           RETN
007E  010001010          1590   CORR+1  CALLL   CURLEVL
007D  111101111   0769   1591
007B  001001111          1592           TCY     15
0077  000101001          1593           TMA
006F  000010101          1594           AMAAC
```

```
005F 001110010        1595           ACACC    4
003E 001000101        1596           TCY      10
007C 000101111        1597           TAM
0079 010000111        1598           CALLL    ADD8
0073 110001100  2139  1599
0067 010000101        1600           CALLL    MEMADDR
004F 111011000  1501  1601
001E 010001110        1602           CALLL    LOADRESS
0030 111000010  1121  1603
                      1604  *
                      1605  *  RESIDENT:
                      1606  *     LOOP TO TRANSFER ADDRESS FROM RESIDENT (RAM) TO ADDRESS
                      1607  *     REGION (RAM)
                      1608  *
007A 001001110        1609  RESIDENT TCY      7              OLD BLKCSB ROUTINE
0075 000000110        1610  CSB2     CLA
006B 001111000        1611           ACACC    1
0057 010010100        1612           LDX      2
002E 000101111        1613           TAM
005C 010011100        1614           LDX      3
0038 001110101        1615           ACACC    10
0070 000101100        1616           TAMDYN
0061 101110101  1610  1617           BRANCH   CSB2
0043 010011000        1618           LDX      1
0006 001000001        1619           TCY      8
000D 001100100        1620           TCMIY    2
001B 010011010        1621  ADRSCALC LDX      5              LSW
0037 111001100  1631  1622           CALL     RCOMX8
006E 000101001        1623  ADD2ROM  TMA                     READY FOR ADDITION
005D 010011000        1624           LDX      1              LSW OF ROM ADDR REGION
003A 001000101        1625           TCY      10
0074 010000000        1626           CALLL    ADDCARRY
0069 111011000  0112  1627
0053 010010010        1628           LDX      4
0026 001000000        1629           TCY      0              *
                      1630  *
004C 001000000        1631  RCOMX8   TCY      0
001B 010110010        1632  COMX8    COMX8
0031 000101010        1633           TMY
0062 010110010        1634           COMX8
0045 010111111        1635           RETN
0004 000101001        1636           TMA
```

```
0015  010011000          1637              LDX      1           ROM ADDR REGION
0028  001001101          1638              TCY      11          *
0056  010000000          1639              CALLL    ADDCARRY
002C  111011000   0112   1640
0058  001000001          1641              TCY      8           *
0030  000000111          1642              DMAN                 ADD2ROM TO BE EXECUTED TWICE
0060  000101111          1643              TAM                  *
0041  000110011          1644              MNEZ
0002  100011011   1621   1645              BRANCH   ADRSCALC
0005  010000101          1646              CALLL    MEMADDR
0008  111011000   1501   1647
0017  010001110          1648              CALLL    LOADRESS
002F  111000010   1121   1649
005E  010000101          1650              CALLL    MEMADDR
003C  111011000   1501   1651
                         1652    *
0078  010000011          1653              BL       OUTADDR
0071  100000000   1723   1654
                         1655    *
0063  000101111          1656    TONE22    TAM
0047  010001010          1657    TONES     CALLL    CURLEVL
000E  111101111   0769   1658
001D  001100001          1659              TCMIY    8
0038  001101110          1660              TCMIY    7           *
0076  010011100          1661              LDX      3
006D  001000001          1662              TCY      8
005B  010100100          1663              RBIT     0
0036  010100111          1664              RBIT     3
006C  000101001          1665              TMA
0059  010011000          1666              LDX      1
0032  001000101          1667              TCY      10
0064  000010101          1668              AMAAC
0049  100100100   1676   1669              BRANCH   TONCARRY
0012  000101111          1670    TONE3     TAM
0025  010010100          1671              LDX      2
004A  001001111          1672              TCY      15
0014  001100100          1673              TCMIY    2
0029  010000010          1674              BL       ADDCTR6
0052  101011001   0704   1675
0024  000101101          1676    TONCARRY  TAMIYC
0048  000110010          1677              IMAC
0010  000101111          1678              TAM
```

```
0021  100010010  1670  1679             BRANCH   TONE3
0042  001001110        1680  NXTTONE    TCY      7
0004  010010001        1681             LDX      8
0009  000101010        1682             TMY
0013  001011010        1683             YNEC     5
0027  101100101  1689  1684             BRANCH   CRY24
004E  010010100        1685             LDX      2
001C  001001111        1686             TCY      15
0039  001101110        1687             TCMIY    7
0072  101001011  1692  1688             BRANCH   TONESCOR
0065  001100000        1689  CRY24      TCMIY    0
                       1690  *  RETURN TO ROUTINE
                       1691  *
0048  010010001        1692  TONESCOR   LDX      8
0016  001000001        1693             TCY      8
0020  000100001        1694             TBIT     2
0054  101010001  1698  1695             BRANCH   TON12
0034  010001111        1696             BL       DISP/KB
0068  100101100  2219  1697
0051  010010100        1698  TON12      LDX      2
0022  001000111        1699             TCY      14
0044  000000111        1700             DMAN
0008  101100011  1656  1701             BRANCH   TONE22
0011  010010001        1702             LDX      8
0023  001000001        1703             TCY      8
0046  010100101        1704             RBIT     2
000C  010011010        1705             LDX      5
0019  001001011        1706             TCY      13
0033  000101001        1707             TMA
0066  010011000        1708             LDX      1
0040  010000110        1709             LDP      6
0014  011101001        1710             ALEC     9
0035  101101100  0969  1711             BRANCH   F5
006A  010001010        1712             CALLL    CURLEVL
0055  111101111  0769  1713
002A  001100110        1714             TCMIY    6
0054  001101110        1715             TCMIY    7
0028  010000010        1716             BL       ADDCTR6
0050  101011001  0704  1717
```

TABLE IX-12

```
                          1718             ORGPG     12
                          1719      *
                          1720      *   OUTADDR=
                          1721      *      LOADS CORRECT SPELLING BUFFER WITH ACTUAL SPELLING CODE
                          1722      *
0000  010001110           1723      OUTADDR  CALLL     OUTADDR2
0001  111000001   1083    1724
0003  010011100           1725             LDX       3
0007  001001000           1726             TCY       1               *
000F  010001101           1727             CALLL     COMX8
001F  110011000   1632    1728
003F  000101111           1729             TAM
007F  010001110           1730             CALLL     OUTADDR2        PDC FOR OUTPUT COMMAND
007E  111000001   1083    1731
007D  010010100           1732             LDX       2
007B  001001000           1733             TCY       1
0077  010001101           1734             CALLL     COMX8
006F  110011000   1632    1735
005F  010000101           1736             LDP       10
003E  000101111           1737             TAM
007C  000100001           1738             TBIT      2               END OF SPELLING?
0079  110001010   1493    1739             CALL      SETBIT1
0073  010000011           1740             LDP       12
0067  010110010           1741             COMX8
004F  001001000           1742             TCY       1
001E  000110010           1743             IMAC                      INCREMENT COR SPEL POINTER
003D  000101111           1744             TAM
007A  001000100           1745             TCY       2
0075  000100010           1746             TBIT      1               TEST FLAG
006B  100111000   1751    1747             BRANCH    LNKSET
0057  100101110   1749    1748             BRANCH    EXDAM2
002E  010110010           1749      EXDAM2   COMX8
005C  100000000   1723    1750             BRANCH    OUTADDR         ADDR--> ALWAYS BRANCH
0038  000000110           1751      LNKSET   CLA
0070  001001001           1752             TCY       9
0061  010011000           1753             LDX       1
0043  000101111           1754      LNKSET+1 TAM
0006  010001110           1755             CALLL     OUTADDR2        PDC FOR OUTPUT 4 BITS
000D  111000001   1083    1756
001B  010000101           1757             LDP       10
0037  011100000           1758             ALEC      0
006E  111010011   1485    1759             CALL      SETBIT2
```

```
0050  010000011             1760           LDP     12
003A  011100000             1761           ALEC    0
0074  101001100  1766       1762           BRANCH  LNKON
0065  010000101             1763           LDP     10
0053  011101000             1764           ALEC    1
0026  110001010  1493       1765           CALL    SETBIT1
004C  010000011             1766  LNKON    CALLL   LNKPTR2
0018  111011110  1785       1767
0031  010001110             1768           CALLL   OUTADDR2       PDC
0062  111000001  1083       1769
0045  010000010             1770           LDP     4
000A  001111111             1771           ACACC   15
0015  110011001  0745       1772           CALL    TSTBIT2
002B  001111000             1773           ACACC   1
0056  010000111             1774           CALLL   LNKPTR
002C  111101000  2130       1775
0058  000110010             1776           IMAC
0030  000101111             1777           TAM                    *
0060  010001110             1778           CALLL   OUTADDR2       PDC'S
0041  111000001  1083       1779
0002  010000010             1780           LDP     4
0005  001111111             1781           ACACC   15
000B  110011001  0745       1782           CALL    TSTBIT2
0017  010000011             1783           LDP     12
002F  001111000             1784           ACACC   1
005E  010011000             1785  LNKPTR2  LDX     1
003C  001001001             1786           TCY     9              *
0078  000101010             1787           TMY                    *
0071  010011110             1788           LDX     7
0063  000101111             1789           TAM                    STORE WORD
0047  001000101             1790           TCY     10             R10
000E  010111111             1791           RETN
001D  010001110             1792           CALLL   OUTADDR2
003B  111000001  1083       1793
0076  011100000             1794           ALEC    0
006D  101100100  1801       1795           BRANCH  LNKEND
005B  010000111             1796  LNKCNT   CALLL   LNKPTR
0036  111101000  2130       1797
006C  000110010             1798  LNKCNT2  IMAC
0059  101000010  1813       1799           BRANCH  ENDSPEL          GO TO ENDSPEL
0032  101000011  1754       1800           BRANCH  LNKSET+1       ELSE
0069  010111010             1801  LNKEND   COMXA
```

```
0049  001000100          1802            TCY      2
0012  000100010          1803            TBIT     1
0025  100000100   1814   1804            BRANCH   ENDSPEL1
004A  000100001          1805            TBIT     2
0014  101010010   1808   1806            BRANCH   LNK4
0029  101011011   1796   1807            BRANCH   LNKCNT
0052  000100000          1808  LNK4      TBIT     0
0024  100010001   1833   1809            BRANCH   F9
0048  010100000          1810            SBIT     0
0010  010000001          1811            BL       CALADDR
0021  100000000   1164   1812
0042  010110010          1813  ENDSPEL   COMX8                    ADDRESS DAM
0004  001000100          1814  ENDSPEL1  TCY      2
0009  001100000          1815            TCMIY    0
0013  010011100          1816            LDX      3
0027  001001011          1817            TCY      13
004E  000101001          1818            TMA
001C  010000111          1819            LDP      14
0039  011101100          1820            ALEC     3
0072  100000000   2009   1821            BRANCH   SPEAK
0065  010000011          1822            LDP      12
004B  011100010          1823            ALEC     4               'SPELL'
0016  100101010   1847   1824            BRANCH   USPELL3
002D  010000001          1825            LDP      8
005A  011101010          1826            ALEC     5               'SAY IT'
0034  100101011   1216   1827            BRANCH   DISLP-1
0068  010001100          1828            LDP      3
0051  011100111          1829            ALFC     14
0022  101001111   0501   1830            BRANCH   HANG
0044  010001111          1831            BL       DISP/KB
0008  100101100   2219   1832
0011  010010010          1833  F9        LDX      4
                         1834  *   TRANS-->STORES CALCULATED ADDRESS IN DAM FOR USE IN LINK/EDIT
                         1835  *
0023  001000101          1836  TRANS-1   TCY      10
0046  000101001          1837  TRANS     TMA                      LOAD ACC
000C  010110010          1838            COMX8
0019  000101101          1839            TAMIYC
0033  010110010          1840            COMX8
0066  001101111          1841            YNEC     14
0040  101000110   1837   1842            BRANCH   TRANS
0014  010111111          1843            RETN
```

```
0035  010110010            1844                COMXB
006A  010000001            1845                BL        CALADDR
0055  100100000     1164   1846
002A  010000111            1847     USPELL3    CALLL     SPEAK+1
0054  110000001     2010   1848
0028  010000011            1849                CALLL     TRANS-1
0050  110100011     1836   1850
0020  010000111            1851                BL        SPEAK
0040  100000000     2009   1852
```

TABLE IX-13

```
                           1853                ORGPG     13
                           1854     *
                           1855     *
                           1856     *
                           1857     *          THE FOLLOWING ROUTINE DIRECTS THE PROGRAM FLOW ACCORDING TO THE
                           1858     *          KEY PRESSED.
                           1859     *
0000  000100010            1860     KEY00      TBIT      1
0001  100111011     1933   1861                BRANCH    KEY2
0003  010010001            1862     KEY0       LDX       8              * LETTER KEYS
0007  001000001            1863                TCY       8
000F  000100010            1864                TBIT      1              TEST GO FLAG
001F  101011111     1875   1865                BRANCH    TRANSFER
003F  001001110            1866                TCY       7
007F  000100001            1867                TBIT      2              TEST FOR MODE OTHER THAN SPELL
                           1868     *                                   *  OR LEARN
007E  101011111     1875   1869                BRANCH    TRANSFER
0070  011101100            1870                ALEC      3              A,B,C,D?
007B  101100001     1892   1871                BRANCH    KEY1
0077  010000010            1872     KEY13      BL        DIFF           CHANGE LEVL IN DISPLAY
006F  101111110     0629   1873
                           1874     *
005F  001001110            1875     TRANSFER   TCY       7
003E  010010001            1876                LDX       8
007C  000101010            1877                TMY
0079  001011010            1878                YNEC      5
0073  100011110     1882   1879                BRANCH    TRAN83
0067  010000010            1880                BL        NOSTRANS
004F  100101100     0680   1881
```

| | | | | | | | |
|---|---|---|---|---|---|---|---|
| 001E | 001001111 | | 1882 | TRANS3 | TCY | 15 | |
| 003D | 010010000 | | 1883 | | LDX | 0 | |
| 007A | 000101001 | | 1884 | | TMA | | |
| 0075 | 001001101 | | 1885 | | TCY | 11 | |
| 006B | 000101010 | | 1886 | | TMY | | |
| 0057 | 010001000 | | 1887 | | LDP | 1 | |
| 002E | 001010001 | | 1888 | | YNEC | 8 | |
| 005C | 100000000 | 0194 | 1889 | | BRANCH | NOTFULL | |
| 0038 | 010001011 | | 1890 | | LDP | 13 | |
| 0070 | 100010100 | 1946 | 1891 | | BRANCH | NOP | |
| 0061 | 001001111 | | 1892 | KEY12 | TCY | 15 | * STORE |
| 0043 | 010011000 | | 1893 | | LDX | 1 | * NEW |
| 0006 | 000101111 | | 1894 | | TAM | | * DIFFICULTY LEVEL |
| 000D | 101110111 | 1872 | 1895 | | BRANCH | KEY13 | |
| 001B | 011100101 | | 1896 | KEY1 | ALEC | 10 | * MSD=1 |
| 0037 | 101000111 | 1930 | 1897 | | BRANCH | KEY15 | |
| 006E | 011100111 | | 1898 | | ALEC | 14 | |
| 0050 | 101101001 | 1902 | 1899 | | BRANCH | KEY7 | |
| 003A | 010000010 | | 1900 | | BL | GAME#2 | KEY=1F * CODEBREAKER |
| 0074 | 100000000 | 0620 | 1901 | | | | |
| 0069 | 011101011 | | 1902 | KEY7 | ALEC | 13 | |
| 0053 | 100011000 | 1906 | 1903 | | BRANCH | KEY8 | |
| 0026 | 010001100 | | 1904 | | BL | GAME#1 | KEY=1E * HANGMAN |
| 004C | 100000000 | 0479 | 1905 | | | | |
| 0018 | 010010001 | | 1906 | KEY8 | LDX | 8 | |
| 0031 | 001001110 | | 1907 | | TCY | 7 | |
| 0062 | 000101010 | | 1908 | | TMY | | PUT MODE # IN Y |
| 0045 | 011101101 | | 1909 | | ALEC | 11 | |
| 000A | 101000001 | 1918 | 1910 | | BRANCH | KEY14 | |
| 0015 | 001011010 | | 1911 | | YNEC | 5 | * CHECK MODE -- |
| 002B | 100101100 | 1914 | 1912 | | BRANCH | K10A | * IGNORE ERASE AND |
| 0056 | 100010100 | 1946 | 1913 | | BRANCH | NOP | |
| 002C | 001000001 | | 1914 | K10A | TCY | 8 | |
| 0058 | 000100010 | | 1915 | | TBIT | 1 | TEST GO FLAG |
| 0030 | 100000101 | 1921 | 1916 | | BRANCH | KEY10 | |
| 0060 | 100010100 | 1946 | 1917 | | BRANCH | NOP | |
| 0041 | 010001110 | | 1918 | KEY14 | BL | ROM | |
| 0002 | 101010101 | 1153 | 1919 | | | | |
| | | | 1920 | * | | | * HANGMAN MODE |
| 0005 | 011100011 | | 1921 | KEY10 | ALEC | 12 | |
| 0009 | 100010001 | 1974 | 1922 | | BRANCH | ERASE | KEY=1C * ERASE |
| 0017 | 001001110 | | 1923 | | TCY | 7 | |
| 002F | 000101010 | | 1924 | | TMY | | |

```
005F 001011110        1925          YNEC    7         * IGNORE ENTER
003C 101110001  1928  1926          BRANCH  KEY9      * IN RANDOM LETTER
0078 100010100  1946  1927          BRANCH  NOP       * MODE
0071 010001000        1928  KEY9    BL      ENTER     KEY=1D * ENTER
0063 110111000  0254  1929
0047 000101011        1930  KEY15   TYA               PUT 15 IN ACC
000E 010001011        1931          BL      KEY0      * LETTERS Q-Z
001D 100000011  1862  1932
003B 010010001        1933  KEY2    LDX     8         MSD=2
0076 001001110        1934          TCY     7
006D 011101100        1935          ALEC    3
005B 101010010  1949  1936          BRANCH  KEY3
0036 011100110        1937          ALEC    6
006C 101110010  1962  1938          BRANCH  KEY6
0059 000101010        1939          TMY               PUT MODE IN Y
0032 001011010        1940          YNEC    5         * IGNORE CLUE
0064 100010100  1946  1941          BRANCH  NOP       * KEY UNLESS
0049 010010110        1942          LDP     6
0012 001000001        1943          TCY     8         * IN HANGMAN MODE
0025 000100010        1944          TBIT    1         * AND GO FLAG
004A 101110000  0923  1945          BRANCH  CLUE
0014 010001111        1946  NOP     BL      DISP/KB   * ENTER KEYS IN
0029 100101100  2219  1947
                      1948  *                         KEY=27 * CLUE
0052 011100100        1949  KEY3    ALEC    2
0024 100100001  1953  1950          BRANCH  KEY4
0048 010000000        1951          BL      OFF       KEY=23 * OFF
0010 101110001  0124  1952
0021 011101000        1953  KEY4    ALEC    1
0042 100010011  1957  1954          BRANCH  KEY5
0004 010000100        1955          BL      SPELL
0009 100010001  0462  1956
0013 010000000        1957  KEY5    LDP     0
0027 011100000        1958          ALFC    0
004E 101001001  0142  1959          BRANCH  GAME#3    KEY=20 * RANDOM LETTER
001C 010000100        1960          BL      LEARN     KEY=21 * LEARN
0039 100011001  0466  1961
0072 000100001        1962  KEY6    TBIT    2         * TEST FOR MODES OTHER
0065 100010100  1946  1963          BRANCH  NOP       * THAN SPELL OR LEARN
004B 011100010        1964  K16     ALFC    4
0016 101001100  1972  1965          BRANCH  K17
002D 001000001        1966          TCY     8
```

| | | | | | | | |
|---|---|---|---|---|---|---|---|
| 005A | 000100010 | | 1967 | | TBIT | 1 | GO FLAG |
| 0034 | 100001100 | 1977 | 1968 | | BRANCH | K19 | |
| 0068 | 011101010 | | 1969 | | ALEC | 5 | REPLAY? |
| 0051 | 101001101 | 19A1 | 1970 | | BRANCH | K23 | |
| 0022 | 100010100 | 1946 | 1971 | | BRANCH | NOP | |
| 0044 | 010001000 | | 1972 | K17 | BL | GO | KEY=24 * GO |
| 000B | 101111100 | 0213 | 1973 | | | | |
| 0011 | 010001000 | | 1974 | ERASE | CALLL | CLEAR | |
| 0023 | 110111010 | 0236 | 1975 | | | | |
| 0046 | 100010100 | 1946 | 1976 | | BRANCH | NOP | |
| 000C | 011101010 | | 1977 | K19 | ALEC | 5 | |
| 0019 | 100100000 | 1990 | 1978 | | BRANCH | K21 | |
| 0033 | 010000101 | | 1979 | | BL | REPEAT | |
| 0066 | 100000000 | 1437 | 1980 | | | | |
| 004D | 010010000 | | 1981 | K23 | LDX | 0 | |
| 001A | 001000000 | | 1982 | | TCY | 0 | |
| 0035 | 000110011 | | 1983 | | MNEZ | | |
| 006A | 100101010 | 1986 | 1984 | | BRANCH | K20 | |
| 0055 | 100010100 | 1946 | 1985 | | BRANCH | NOP | |
| 002A | 010011000 | | 1986 | K20 | LDX | 1 | |
| 0054 | 001110001 | | 1987 | | ACACC | 8 | ACC=13 AFTER THIS INSTRUCTION |
| 0028 | 000001001 | | 1988 | | MNEA | | |
| 0050 | 100010100 | 1946 | 1989 | | BRANCH | NOP | |
| 0020 | 010001000 | | 1990 | K21 | BL | REPLAY | |
| 0040 | 100101100 | 0250 | 1991 | | | | |

TABLE IX-14

```
                          ORGPG     14
          ***********************************************************************
          * SPEAK                                                               *
          * ROUTINE TO CONTROL SPEECH TO AND FROM SYNTHESIZER                   *
          *                                                                     *
          * IF SS--SET, SPEAK WAS CALLED                                        *
          * IF SS--RESET, MEMADDR WAS CALLED                                    *
          *                                                                     *
          * IF SS=1, ADDRESSES ARE TRANSFERED FROM FILES 6 AND 7 TO FILE        *
          * 1, WORDS 10-13, ELSE IF SS=0, ADDRESS IS IN FILE 1 PRIOR TO CALL    *
          *                                                                     *
          * 2 POINTERS USED                                                     *
          *    1) LINK/EDIT POINTER FOR WORDS IN FILES 6 AND 7                  *
          *    2) ROM ADDR POINTER FOR WORDS IN FILE 1.                         *
          *                                                                     *
          ***********************************************************************
          *
0000 010110101    SPEAK     SEAC
0001 010011000    SPEAK+1   LDX     1
0003 001000001              TCY     8
0007 001100101              TCMIY   10         INITIALIZE ROM ADDR POINTER
000F 001100000              TCMIY   0          INITIALIZE LNK/EDT POINTER
001F 001001001    SPKLOP-1  TCY     9
003F 000101010    SPKLOOP   TMY
007F 010011110              LDX     7          GET WORD FROM LNK/EDT
007E 000101001              TMA                LOAD WORD IN ACC
007D 010011000              LDX     1          POINTER
007B 001000001              TCY     8          *
0077 000101010              TMY                *
006F 000101111              TAM                STORE WORD
005F 001000001              TCY     8          BUMP POINTER
003E 000110010              IMAC               *
007C 000101111              TAM                *
0079 001001001              TCY     9          GET FILE FOR NEXT WORD
0073 000101010              TMY
0067 000000000              COMX               FILE 6
004F 000101001              TMA                WORD--ACC
001E 000000000              COMX               FILE 1
003D 001000001              TCY     8          POINTER
007A 000101010              TMY                *
0075 000101111              TAM                STORE WORD
006B 001001001              TCY     9          BUMP LNK/EDT POINTER
```

```
0057 000110010       2034          IMAC                   IF > 15, RETURN
002E 100100001  2111 2035          BRANCH   RETURN
005C 000101111       2036          TAM                    STORE INCREMENT
0038 001000001       2037          TCY      8             BUMP ROM AREA POINTER
0070 000110010       2038          IMAC                   *
0061 000101110       2039          TAMZA
0043 000101010       2040          TMY                    *
0006 001010111       2041          YNEC     14            IS Y = 14?
000D 100011111  2014 2042          BRANCH   SPKLOP-1
001B 010111111       2043          RETN
0037 001000101       2044          TCY      10            YES, CONTINUE
006E 010000111       2045 ADDWDS   LDP      14
005D 000010101       2046          AMAAC
003A 100001010  2057 2047          BRANCH   ADDWDS2
0074 010000111       2048          LDP      14
0069 000000101       2049          IYC                    LOOP COUNT
0053 001010111       2050          YNEC     14            *
0026 101101110  2045 2051          BRANCH   ADDWDS        *
004C 011101000       2052          ALEC     1
001B 100100001  2111 2053          BRANCH   RETURN        IF YES, RETURN
0031 010001001       2054          LDP      9
0062 011100100       2055          ALEC     2             ACC-->2?
0045 100000000  1299 2056          BRANCH   LETTER
000A 010000101       2057 ADDWDS2  CALLL    MEMADDR
0015 111011000  1501 2058
                     2059 *        ROM ADDRESSING SUBROUTINE:                      *
                     2060 *        ASSUMES X AND Y HAVE BEEN DEFINED PRIOR TO CALLING *
                     2061 *                                                        *
                     2062 *                                                        *
                     2063 *        LOADS ADDRESS INTO ROM ADDRESS AREA             *
                     2064 *        ALL R LINES, ETC.... REMAIN THE SAME AS WHEN    *
                     2065 *        ENTERING SUBROUTINE.                            *
                     2066 *                                                        *
                     2067 *********************************************************
                     2068 *                                                        *
                     2069 *                                                        *
                     2070 *        END OF ROUTINE
                     2071 *
002B 001000011       2072 MEMADDR2 TCY      12            CS , GIVING SYN, COMMANDS
0056 000001101       2073          SETR                   R12 = 1
002C 000000110       2074          CLA
0058 001110101       2075 SPKREG   ACACC    TEN
```

```
0030  001000101        2076            TCY     10
0060  000001101        2077            SETR
0041  000110110        2078            RSTR                  *
0002  000000110        2079  SPKREG+1  CLA
0005  001000011        2080            TCY     12
000B  000001101        2081            SETR
0017  001000101        2082            TCY     10
002F  001110111        2083            ACACC   14
005E  000001101        2084            SETR                  1ST PDC LOADS COMMAND
003C  000110110        2085            RSTR                  *
0078  001001101        2086            TCY     11
0071  000110110        2087            RSTR
0063  001000101        2088            TCY     10
0047  000001101        2089            SETR                  2ND PDC APPLIES TALK TO CTL8
000E  000110110        2090            RSTR                  *
001D  001110000        2091            ACACC   0
003B  000001000        2092            TKA
0076  000001101        2093            SETR                  3RD PDC RELEASES OUTPUT
006D  000110110        2094            RSTR                  *
005B  001001101        2095            TCY     11
0036  000001101        2096            SETR
006C  010011100        2097            LDX     3
0059  001001111        2098            TCY     15
0032  000101111        2099            TAM
0064  000100000        2100            TBIT    0
0049  101011010  2125  2101            BRANCH  BITSETO
0012  010011000        2102            LDX     1
0025  001000001        2103            TCY     8
004A  001100101        2104            TCMIY   10
0014  000010010        2105            CCLA
0029  011100000        2106            ALEC    ZERO
0052  101001000  2109  2107            BRANCH  RETS
0024  100011111  2014  2108            BRANCH  SPKLOP-1
0048  010011000        2109  RETS      LDX     1
0010  001000001        2110            TCY     8
0021  000101110        2111  RETURN    TAMZA                 ACC = ZERO
0042  001001111        2112            TCY     15
0004  010010110        2113  RETURN4   LDX     SIX
0009  000101111        2114            TAM
0013  010011110        2115            LDX     SEVEN
0027  000101100        2116            TAMDYN
004E  100000100  2113  2117            BRANCH  RETURN4
```

```
001C  010111111         2118                RETN
0039  010111100         2119     RETURN+1   REAC
0072  001001111         2120     RETURN+2   TCY     15            TALK BIT
0065  010011100         2121                LDX     3             *
004B  010100100         2122                RBIT    0             *
0016  010000010         2123                FL      RETNSBCH
002D  101001010   0710  2124
005A  010001111         2125     BITSETO    LDP     15
0034  100101110   2219  2126                BRANCH  DISP/KB
                        2127     *
                        2128     *          END OF SPEECH CONTROL SUBROUTINE
                        2129     *
0068  010011000         2130     LNKPTR     LDX     1             POINTER FOR LNK/EDT
0051  001001001         2131                TCY     9             *
0022  000101010         2132                TMY                   *
0044  010010110         2133                LDX     6
0008  000101111         2134                TAM                   STORE WORD
0011  010011000         2135                LDX     1             POINTER
0023  001001001         2136                TCY     9             *
0046  010111111         2137                RETN
                        2138     *
000C  001000110         2139     ADDR       TCY     6
0019  010010001         2140                LDX     8
0033  000100011         2141                TBIT    3
0066  100011010   2144  2142                BRANCH  RADD8
004D  101010101   2147  2143                BRANCH  RADD2
001A  010011000         2144     RADD8      LDX     1
0035  001001011         2145                TCY     13
006A  001100001         2146                TCMIY   8
0055  010111111         2147     RADD2      RETN
```

TABLE IX-15

```
                          2148          ORGPG     15
                          2149   *
                          2150   *                POWER UP / CLEAR ROUTINE
                          2151   *
                          2152   *      THIS ROUTINE SETS UP INITIAL CONDITIONS IN RAM
                          2153   *
                          2154   *
                          2155   *
0000  001001111           2156   START   TCY      FIFTEEN      * RESET ALL R-LINES
0001  000110110           2157   LOOP$ST RSTR                  **
0003  000000100           2158           DYN                   **
0007  100000001    2157   2159           BRANCH   LOOP$ST      **
000F  001001011           2160           TCY      13
001F  000001101           2161           SETR
003F  001001111           2162           TCY      15
007F  010111111           2163           RETN                  **
007E  000000110           2164           CLA                   **
007D  010010001           2165           LDX      8
007B  110101110    2183   2166           CALL     FIL$LOOP     **
0077  010011110           2167           LDX      SEVEN        **
006F  110101110    2183   2168           CALL     FIL$LOOP     **
005F  010010110           2169           LDX      SIX          **
003E  110101110    2183   2170           CALL     FIL$LOOP     **
007C  010011010           2171           LDX      FIVE         **
0079  110101110    2183   2172           CALL     FIL$LOOP     **
0073  010010010           2173           LDX      FOUR         **
0067  110101110    2183   2174           CALL     FIL$LOOP     **
004F  010011100           2175           LDX      THREE        **
001E  110101110    2183   2176           CALL     FIL$LOOP     **
003D  010010100           2177           LDX      TWO          **
007A  110101110    2183   2178           CALL     FIL$LOOP     **
0075  010011000           2179           LDX      ONE          **
006B  110101110    2183   2180           CALL     FIL$LOOP     **
0057  010010000           2181           LDX      ZERO         **
                          2182   *
002E  000101100           2183   FIL$LOOP TAMDYN               * ROUTINE FILLS FILE WITH CONTENTS
005C  100101110    2183   2184           BRANCH   FIL$LOOP     **OF ACC.
0038  010111111           2185           RETN                  **
                          2186   *
```

```
0070 010001000        2187  *
0070 010001000        2188  DSP7     CALLL    CLEAR
0061 110111010  0236  2189
                      2190  *
0043 010000010        2191           CALLL    DIFFSLV            * DISPLAY DIFF LEVEL A = SPELL MODE
0006 111111110  0629  2192
000D 000000110        2193           CLA
001B 001001101        2194           TCY      11
0037 000110110        2195           RSTR
006E 001000011        2196           TCY      12
005D 000001101        2197           SETR
003A 001000101        2198           TCY      10
0074 000001101        2199           SETR
0069 000110110        2200           RSTR
0053 000001101        2201           SETR
0026 000110110        2202           RSTR
004C 001001101        2203           TCY      11
0018 000001101        2204           SETR
0031 001000101        2205           TCY      10
0062 000001101        2206           SETR
0045 000110110        2207           RSTR
000A 010000101        2208           CALLL    MEMORED
0015 110100100  1534  2209
002B 010001101        2210           BL       TONES
0056 101000111  1657  2211
                      2212  *
                      2213  *
                      2214  *                 KEYBOARD SCAN / DISPLAY ROUTINE
                      2215  *
                      2216  *        THIS ROUTINE DISPLAYS THE CONTENTS OF 'DISPLAY BUFFER' AND
                      2217  *        CHECKS FOR A KEYPRESS.
                      2218  *
002C 010011100        2219  DISP/KB  LDX      3
0058 001001101        2220           TCY      11
0030 001100000        2221           TCMIY    0                  RESET TIMEOUT COUNTER
0060 000110110        2222           RSTR                        RESET R12 TO ENABLE DISPLAY
0041 001100000        2223           TCMIY    0
0002 000000110        2224           CLA
0005 001000011        2225  DSP1     TCY      12
0008 010010000        2226           LDX      0
0017 000101101        2227           TAMIYC                      STORE DEBOUNCE COUNTER; SET Y=0
002F 001100000        2228           TCMIY    0                  RESET R-LINE POINTER
```

```
0005E  001001111         2229            TCY      15
003C   000001101         2230            SETR                R=15, TURN ON FILAMENT
0078   001000000         2231            TCY      0
0071   010011000         2232  DSP2      LDX      1          *
0063   000101001         2233            TMA                 *
0047   010110000         2234            TDO                 * LOAD SEGMENT PLA
000E   010010000         2235            LDX      0          *
001D   000101001         2236            TMA                 *
003B   000001001         2237            MNEA                *
0076   010110000         2238            TDO                 *
006D   000001101         2239            SETR                TURN ON NEW R=LINE
005B   001001111         2240            TCY      15
0036   000110110         2241            RSTR                R=15, TURN OFF FILAMENT
006C   010000000         2242            BL       TIMEUP     * INCREMENT RANDOM NUMBER GENERATOR/
0059   101000101   0103  2243
                         2244  *                             * TIMEOUT COUNTER
0032   001001011         2245  DISP/KB1  TCY      13
0064   000110010         2246            IMAC                INCREMENT R=LINE POINTER
0049   000101111         2247            TAM
0012   001001111         2248            TCY      15
0025   000001101         2249            SETR                TURN ON FILAMENT
004A   000101000         2250            TAY
0014   000000100         2251            DYN
0029   000110110         2252            RSTR                RESET LAST R=LINE
0052   000000101         2253            TYC
0024   001010001         2254            YNEC     8          SCAN COMPLETE?
0048   101110001   2232  2255            BRANCH   DSP2       NO
0010   001001111         2256            TCY      15         YES
0021   000110110         2257            RSTR                RESET FILAMENT
0042   010000000         2258            CALLL    TIMEUP1    INCREMENT RANDOM NUMBER/TIMEOUT COUNTER
0004   110101011   0106  2259
                         2260  *                             ONE EXTRA TIME. TOTAL=9 PER DISPLAY SCAN
0009   010010000         2261            LDX      0
0013   001000101         2262            TCY      10
0027   000110010         2263            IMAC                INCREMENT DEBOUNCE COUNTER
004E   100111001   2266  2264            BRANCH   DSP3
001C   000101111         2265            TAM
0039   001000011         2266  DSP3      TCY      12
0072   000110010         2267            IMAC
```

```
0065  011100101         2268             ALEC     10
004B  100000101   2225  2269             BRANCH   DSP1          CONTINUE DISPLAY IF<8
0016  010000111         2270             LDP      14
002D  001001111         2271             TCY      15
005A  010011100         2272             LDX      3
0034  000100000         2273             TBIT     0
0068  101011000   2075  2274             BRANCH   SPKREG + 1    TEST TALK
0051  010000001         2275             LDP      8
0022  001000111         2276             TCY      14
0044  000101011         2277             TYA                    SET ACC=14
0008  000100000         2278             TBIT     0
0011  101101100   1241  2279             BRANCH   DISLP+1
0023  010001111         2280             LDP      15
0046  100000101   2225  2281             BRANCH   DSP1          RET
000C  010010000         2282   KEYSEVL   LDX      0
0019  001000111         2283             TCY      14            * PUT LSD OF KEY CODE
0033  000101001         2284             TMA                    * IN ACC
0066  001001111         2285             TCY      15
004D  010001011         2286             LDP      13
001A  000100000         2287             TBIT     0
0035  100011011   1896  2288             BRANCH   KEY1
006A  100000000   1A60  2289             BRANCH   KEY00
                        2290   *
0055  010010001         2291   SETBIT3   LDX      8
0024  001000100         2292             TCY      2
0054  010100011         2293             SBIT     3             SET BIT 3
002A  010111111         2294             RETN
                        2295   *
                        2296             END
```

TABLE X

| $I_0/I_1$ COMMANDS | | |
|---|---|---|
| $I_0$ | $I_1$ | |
| 0 | 0 | No Operation |
| 0 | 1 | Load Address (LA) |
| 1 | 0 | Transfer Bit (TB) |
| 1 | 1 | Read and Branch (RB) |

TABLE XI

Counter 619/PLA 620 Timing Sequence

| STEP | COUNTER CONTENTS (HEX) | SIGNALS GENERATED |
|---|---|---|
| 1 | 0 | $\overline{LA1}$, TB8 |
| 2 | 8 | $\overline{LA2}$ |
| 3 | C | $\overline{LA3}$ |
| 4 | E | $\overline{LA4}$ |
| 5 | F | |
| 6 | 7 | |
| 7 | 3 | |
| 8 | 1 | |

TABLE XII

TB8 READ SEQUENCE

| STEP | COUNTER 623 CONTENTS (BINARY) | COUNTER 624 CONTENTS (HEX) | SIGNALS GENERATED |
|---|---|---|---|
| 1 | 10 | F | SAD, INC |
| 2 | 10 | E | DC, INC |
| 3 | 10 | C | DC, INC |
| 4 | 10 | 8 | DC, INC |
| 5 | 10 | 0 | DC, INC |
| 6 | 10 | 1 | DC, INC |
| 7 | 10 | 3 | SAM, DC, INC |
| 8 | 10 | 7 | PC, $\overline{ZERO}$ |

TABLE XIII

TB8 READ SEQUENCE

| STEP | COUNTER 623 CONTENTS (BINARY) | COUNTER 624 CONTENTS (HEX) | SIGNALS GENERATED |
|---|---|---|---|
| 1 | 11 | F | SAD, INC |
| 2 | 11 | E | DC, INC |
| 3 | 11 | C | DC, INC |
| 4 | 11 | 8 | DC, INC |
| 5 | 11 | 0 | DC, INC |
| 6 | 11 | 1 | DC, INC |
| 7 | 11 | 3 | SAM, DC, INC |
| 8 | 11 | 7 | PC |
| 9 | 01 | F | SAD, TF |
| 10 | 01 | E | BR, PC |
| 11 | 01 | C | BR, DC |
| 12 | 01 | 8 | BR, DC |
| 13 | 01 | 0 | BR, DC |
| 14 | 01 | 1 | DC |
| 15 | 01 | 3 | SAM, DC |
| 16 | 01 | 7 | PC |
| 17 | 00 | F | SAD, TF |
| 18 | 00 | E | BR |
| 19 | 00 | C | BR |
| 20 | 00 | 8 | BR |
| 21 | 00 | 0 | |
| 22 | 00 | 1 | |
| 23 | 00 | 3 | |
| 24 | 00 | 7 | PC |
| 25 | 10 | F | SAD, INC |
| 26 | 10 | E | DC, INC |
| 27 | 10 | C | DC, INC |
| 28 | 10 | 8 | DC, INC |
| 29 | 10 | 0 | DC, INC |
| 30 | 10 | 1 | DC, INC |
| 31 | 10 | 3 | SAM, DC, INC |
| 32 | 10 | 7 | PC, $\overline{ZERO}$ |

What is claimed is:

1. A system for generating synthetic human speech comprising:
   (a) first memory means for storing a plurality of digital speech values including digital speech values representative of digital filter coefficients;
   (b) second memory means for storing digital data including at least one selected address location of said first memory means;
   (c) controller means coupled to said first and second memory means for accessing selected portions of said plurality of digital speech values including said digital speech values representative of digital filter coefficients in said first memory means in response to said selected address location in said second memory means;
   (d) digital filter speech synthesis means coupled to said controller means comprising:
      (i) an excitation generator for generating excitation signals;
      (ii) a single multiplier circuit coupled to said first memory means and to said excitation generator and having a selective feedback multiplex network interconnecting the output and the input thereof in a closed feedback loop for selectively multiplying said excitation signals with said accessed digital speech values representative of digital filter coefficients in a multiplexing multiply operation; and
      (iii) digital-to-analog converter means for converting the output of said single multiplier circuit to analog signals representative of human speech; and
   (e) audio means coupled to said digital-to-analog converter means for converting said analog signals into audible sounds.

2. The system according to claim 1 wherein said first memory means comprises a non-volatile read only memory.

3. The system according to claim 1 wherein said controller means comprises a microprocessor.

4. The system according to claim 3 wherein said system further includes operator input means for receiving inputs from an operator and coupled to said microprocessor for controlling said microprocessor.

5. The system according to claim 4 wherein said operator input means comprises a keyboard.

6. The system according to claim 1 wherein said single multiplier circuit is an array multiplier.

7. The system according to claim 1 wherein said audio means comprises a speaker.

8. The system according to claim 1 wherein said digital filter speech synthesis means is implemented on a single integrated circuit device.

9. A system for generating synthetic human speech comprising:
   (a) first memory means for storing a plurality of digital speech values including digital speech values representative of digital filter coefficients;
   (b) second memory means for storing digital data including at least one selected address location of said first memory means;
   (c) digital control means coupled to said first and second memory means for accessing sequences of digital speech values including said digital speech values representative of digital filter coefficients in said first memory means in response to said selected address location in said second memory means;

(d) digital filter speech synthesis means for generating analog signals representative of human speech, said digital filter speech synthesis means comprising:

(i) filter excitation generator means coupled to said first memory means and responsive to selected ones of said sequences of digital speech values for generating digital excitation signals;

(ii) a single multiplier circuit coupled to said first memory means and to said filter excitation generator means and having a selective feedback multiplex network interconnecting the output and the input thereof in a closed feedback loop for selectively multiplying said accessed digital speech values representative of digital filter coefficients with said digital excitation signals in a multiplexing multiply operation;

(iii) digital-to-analog converter means for converting the output of said multiplier circuit to analog signals representative of human speech; and (e) audio means coupled to said digital-to-analog converter means for converting said analog signals into audible sounds.

10. The system according to claim 9 wherein said first memory means comprises a non-volatile read-only-memory.

11. The system according to claim 9 wherein said second memory means comprises a non-volatile read-only-memory.

12. The system according to claim 9 wherein said digital control means comprises a microprocessor.

13. The system according to claim 12 wherein said system further includes operator input means for receiving inputs from an operator and coupled to said microprocessor for controlling said microprocessor.

14. The system according to claim 13 wherein said operator input means comprises a keyboard.

15. The system according to claim 9 wherein said single multiplier circuit comprises an array multiplier.

16. The system according to claim 9 wherein said audio means comprises a speaker.

17. The system according to claim 9 wherein said digital filter speech synthesis means is implemented on a single integrated circuit device.

18. A system for generating synthetic human speech comprising:

(a) first memory means for storing a plurality of digital speech values indicative of pitch, amplitude, and digital filter coefficients;

(b) second memory means for storing digital data including at least one selected address location of said first memory means;

(c) controller means coupled to said first and second memory means for accessing selected portions of said plurality of digital speech values in response to said selected address location in said second memory means;

(d) operator input means for receiving inputs from an operator and coupled to said controller means for directing the operation of said controller means;

(e) digital filter speech synthesis means coupled to said controller means comprising:

(i) an excitation generator for generating excitation signals;

(ii) a single multiplier circuit having first and second inputs and being coupled to said first memory means via said first input and to said excitation generator via said second input for selectively multiplying said excitation signals with said accessed digital speech values indicative of amplitude and digital filter coefficients;

(iii) a selective feedback network operatively interconnected between the output of said single multiplier circuit and said second input thereof in a closed feedback loop including an adder wherein excitation signals and intermediate products of previously accessed digital speech values are combined prior to reintroduction to said single multiplier circuit via said second input thereof in a repetitive sequence for a further multiplying operation with succeeding digital speech values indicative of amplitude and digital filter coefficients in a multiplexing multiply operation; and (iv) digital-to-analog converter means for converting the output of said single multiplier circuit to analog signals representative of human speech; and (f) audio means coupled to said digital-to-analog converter means for converting said analog signals into audible sounds.

19. A system for generating synthetic human speech according to claim 18, wherein said first memory means comprises a non-volatile read only memory.

20. A system for generating synthetic human speech according to claim 18, wherein said operator input means comprises a keyboard.

21. A system for generating synthetic human speech according to claim 18, wherein said single multiplier circuit is an array multiplier.

22. A system for generating synthetic human speech according to claim 18, wherein said audio means comprises a speaker.

23. A system for generating synthetic human speech according to claim 18, wherein said digital filter speech synthesis means is implemented on a single integrated circuit device.

24. The system according to either of claims 1 or 18, wherein the digital speech values as stored in said first memory means are in a predetermined coded format as coded digital speech values, and further including decoder means coupled between said first memory means and said controller means for decoding the coded digital speech values accessed by said controller means.

25. The system according to claim 9, wherein the digital speech values as stored in said first memory means are in a predetermined coded format as coded digital speech values, and further including decoder means coupled between said first memory means and said digital control means for decoding the coded digital speech values accessed by said digital control means.

26. The system according to any of claims 1, 9, or 18, further including means operably associated with said second memory means for incrementing the address location contained therein.

27. The system according to claim 26, wherein said second memory means comprises an address register.

28. The system according to any of claims 2, 10, or 19, wherein said second memory means comprises a second non-volatile read only memory separate from the first non-volatile read only memory comprising said first memory means.

29. The system according to claim 28, wherein said controller means comprises a microprocessor and said second non-volatile read only memory is included as a component thereof.

* * * * *